US 9,229,320 B2

(12) United States Patent
Ichikawa et al.

(10) Patent No.: US 9,229,320 B2
(45) Date of Patent: *Jan. 5, 2016

(54) RESIST COMPOSITION AND METHOD FOR PRODUCING RESIST PATTERN

(75) Inventors: Koji Ichikawa, Osaka (JP); Satoshi Yamamoto, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,446

(22) Filed: Aug. 2, 2011

(65) Prior Publication Data

US 2012/0034563 A1    Feb. 9, 2012

(30) Foreign Application Priority Data

Aug. 3, 2010    (JP) ................................. 2010-174198

(51) Int. Cl.
*G03F 7/004*    (2006.01)
*G03F 7/039*    (2006.01)
*G03F 7/20*    (2006.01)

(52) U.S. Cl.
CPC ............ *G03F 7/0045* (2013.01); *G03F 7/0046* (2013.01); *G03F 7/0397* (2013.01); *G03F 7/2041* (2013.01); *G03F 7/2059* (2013.01)

(58) Field of Classification Search
CPC .... G03F 7/0045; G03F 7/0046; G03F 7/0397
See application file for complete search history.

(56) References Cited

U.S. PATENT DOCUMENTS

| | | | |
|---|---|---|---|
| 2005/0153232 A1* | 7/2005 | Li et al. ....................... | 430/270.1 |
| 2008/0081293 A1* | 4/2008 | Harada et al. ............... | 430/287.1 |
| 2008/0248421 A1* | 10/2008 | Fukuhara et al. ........... | 430/281.1 |
| 2009/0197204 A1* | 8/2009 | Shiono et al. ............... | 430/286.1 |
| 2009/0202945 A1 | 8/2009 | Nakagawa et al. | |
| 2009/0311627 A1* | 12/2009 | Kurosawa et al. .......... | 430/286.1 |
| 2009/0325103 A1* | 12/2009 | Sato et al. .................. | 430/270.1 |
| 2010/0022730 A1* | 1/2010 | Hatakeyama et al. ........ | 526/246 |
| 2010/0168358 A1* | 7/2010 | Shimamaki et al. .......... | 526/242 |
| 2010/0183980 A1* | 7/2010 | Yamaguchi ................. | 430/281.1 |
| 2011/0177455 A1* | 7/2011 | Harada et al. ............... | 430/281.1 |
| 2012/0100482 A1* | 4/2012 | Masuyama et al. ......... | 430/285.1 |
| 2012/0100483 A1* | 4/2012 | Masuyama et al. ......... | 430/285.1 |
| 2013/0022912 A1 | 1/2013 | Sato et al. | |
| 2013/0115556 A1 | 5/2013 | Iwato et al. | |

FOREIGN PATENT DOCUMENTS

| | | |
|---|---|---|
| JP | 11-52575 A | 2/1999 |
| JP | 2010-18777 A | 1/2010 |
| JP | 2011-162768 A | 8/2011 |
| JP | 2012-8500 A | 1/2012 |
| KR | 10-2009-0039492 A | 4/2009 |
| KR | 20090108935 A * | 10/2009 |
| WO | WO 2007/116664 A1 | 10/2007 |
| WO | WO 2008/015876 A1 | 2/2008 |
| WO | WO 2010/067898 A2 | 6/2010 |
| WO | WO 2010067898 A2 * | 6/2010 |
| WO | WO 2011/125684 A1 | 10/2011 |

OTHER PUBLICATIONS

Machine translation of KR20090108935, Oct. 19, 2009.*
The Office Action, dated Feb. 10, 2015, issued in the corresponding Japanese Patent Application No. 2011-168117.

* cited by examiner

*Primary Examiner* — Anca Eoff
*Assistant Examiner* — Alyssa L Cepluch
(74) *Attorney, Agent, or Firm* — Birch, Stewart, Kolasch & Birch, LLP

(57) ABSTRACT

A resist composition contains; a resin having a structural unit derived from a compound represented by the formula (a); and an acid generator represented by the formula (B1).

(a)

$$R^1\text{-}C(=\text{O})\text{-}O\text{-}A^{10}\text{-}W^1\text{-}(A^{20}\text{-}R^2)_n$$
$$\text{(with }CH_2\text{ group)}$$

(B1)

$$Z^+ \ ^-O_3S\text{-}C(Q^1)(Q^2)\text{-}L^{b1}\text{-}Y$$

wherein $R^1$ represents a hydrogen atom or a methyl group; $A^{10}$ represents a single bond, an optionally substituted $C_1$ to $C_6$ alkanediyl group or a group represented by formula (a-1) defined in the specification; $W^1$ represents an optionally substituted $C_4$ to $C_{36}$ alicyclic hydrocarbon group; $A^{20}$ in each occurrence independently represents an optionally substituted $C_1$ to $C_6$ aliphatic hydrocarbon group; $R^2$ in each occurrence independently represents a $C_1$ to $C_{12}$ perfluoroalkyl group; n represents 1 or 2; $Q^1$ and $Q^2$ independently represent a fluorine atom or a $C_1$ to $C_6$ perfluoroalkyl group; $L^{b1}$ represents an optionally substituted $C_1$ to $C_{17}$ divalent aliphatic hydrocarbon group; Y represents an optionally substituted $C_1$ to $C_{18}$ aliphatic hydrocarbon group; and $Z^+$ represents an organic cation.

4 Claims, No Drawings

RESIST COMPOSITION AND METHOD FOR PRODUCING RESIST PATTERN

CROSS-REFERENCE TO RELATED APPLICATIONS

This application claims priority to Japanese Application No. 2010-174198 filed in Japan on Aug. 3, 2010. The entire disclosures of Japanese Application No. 2010-174198 is incorporated hereinto by reference.

BACKGROUND OF THE INVENTION

1. Field of the Invention

The present invention relates to a resist composition and a method for producing a resist pattern.

2. Background Information

Various kinds of photolithographic technique in which short wavelength light such as ArF excimer laser (193 nm of wavelength) is a exposure light source have been actively studied in the past as the semiconductor microfabrication. A resist composition used for such photolithographic technique contains a resist which changes its solubility in an alkali aqueous solution by the action of the acid, and a photoacid generator (hereinafter is referred to as "acid generator").

A resist composition, which contains a polymer polymerized a compound represented by the formula (A), a compound represented by the formula (B) and a compound represented by the formula (C); a polymer polymerized a compound represented by the formula (B) and a compound represented by the formula (D); and p-cyclohexylphenyl diphenylsulfonium perfluorobutanesulfonate as an acid generator, is described in Patent document, pamphlet of WO 2007/116664.

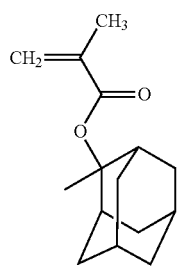

(A)

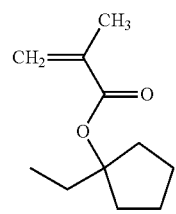

(B)

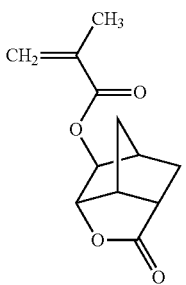

(C)

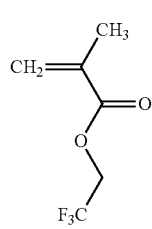

(D)

However, with the conventional resist composition, the focus margin (DOF) at producing a resist pattern may be not always satisfied with, and number of the defect of the resist pattern to be produced from the resist composition may quite increase.

SUMMARY OF THE INVENTION

The present invention provides following inventions.

<1> A resist composition comprising;
a resin having a structural unit derived from a compound represented by the formula (a); and
an acid generator represented by the formula (B1).

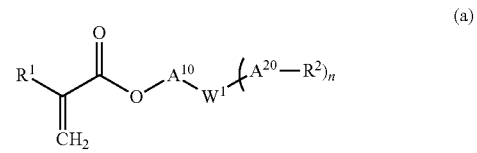

(a)

wherein $R^1$ represents a hydrogen atom or a methyl group;
$A^{10}$ represents a single bond, an optionally substituted $C_1$ to $C_6$ alkanediyl group or a group represented by the formula (a-1);
$W^1$ represents an optionally substituted $C_4$ to $C_{36}$ alicyclic hydrocarbon group, and the —$CH_2$— contained in the alicyclic hydrocarbon group may be replaced by —O— or —CO—;
$A^{20}$ in each occurrence independently represents an optionally substituted $C_1$ to $C_6$ aliphatic hydrocarbon group, and the —$CH_2$— contained in the aliphatic hydrocarbon group may be replaced by —O— or —CO—;
$R^2$ in each occurrence independently represents a $C_1$ to $C_{12}$ perfluoroalkyl group, at least one of the fluorine atom contained in the perfluoroalkyl group may be replaced by a hydroxy group or a hydroxymethyl group; and
n represents 1 or 2;

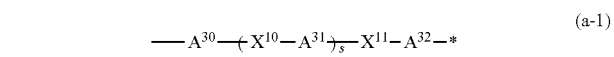

(a-1)

wherein s represents an integer of 0 to 3;
$X^{10}$ in each occurrence independently represents an oxygen atom, a carbonyl group, a carbonyloxy group or an oxycarbonyl group;
$X^{11}$ represents an oxygen atom, a carbonyl group, a carbonyloxy group or an oxycarbonyl group;
$A^{31}$ in each occurrence independently represents an optionally substituted $C_1$ to $C_{17}$ aliphatic hydrocarbon group;
$A^{30}$ represents an optionally substituted $C_1$ to $C_{17}$ aliphatic hydrocarbon group;
$A^{32}$ represents a single bond or an optionally substituted $C_1$ to $C_{17}$ aliphatic hydrocarbon group; and

* represent a bond to $W^1$;

provided that a total number of the carbon atom of $A^{30}$, $A^{31}$, $A^{32}$, $X^{10}$ and $X^{11}$ is 1 to 17;

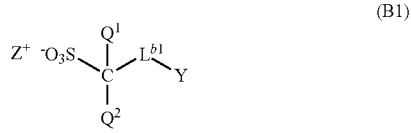

(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and the —$CH_2$— contained in the aliphatic hydrocarbon group may be replaced by —O— or —CO—;

Y represents an optionally substituted $C_1$ to $C_{18}$ aliphatic hydrocarbon group or an optionally substituted $C_3$ to $C_{18}$ alicyclic hydrocarbon group, and a —$CH_2$— contained in the aliphatic hydrocarbon group and alicyclic hydrocarbon group may be replaced by —O—, —CO— or —$SO_2$—; and $Z^+$ represents an organic cation.

<2> The resist composition according to <1>, wherein the resin (A) is a resin having a structural unit derived from a compound (a) in which $W^1$ is a alicyclic hydrocarbon group containing an adamantane ring or cyclohexane ring.

<3> The resist composition according to <1> or <2>, wherein the acid generator (B) is a salt in which Y is an optionally substituted $C_3$ to $C_{18}$ alicyclic hydrocarbon group in the formula (B1).

<4> A method for producing a resist pattern comprising steps of;

(1) applying the resist composition according to any one of <1> to <3> onto a substrate;

(2) drying the applied composition to form a composition layer;

(3) exposing the composition layer;

(4) heating the exposed composition layer; and (5) developing the heated composition layer.

According to a resist composition of the present invention, it is possible to produce a resist pattern with excellent DOF (wide DOF) at producing the resist pattern, and with defect-free in the pattern.

DETAILED DESCRIPTION OF THE PREFERRED EMBODIMENTS

In the present specification, any group exemplified below is applicable to any of the chemical formulae having a similar group with optionally selecting the number of carbon atoms, unless otherwise specified. When a group enables linear and branched chain and/or cyclic structures, all structures may be included and may simultaneously present in one group, unless otherwise specified. When there is a stereoisomeric form, all stereoisomeric forms are included. Each group enables monovalent, or di- or more-valent group depending on the bonded position and bonding form.

A hydrocarbon group includes an aliphatic hydrocarbon group and an aromatic group. The aliphatic hydrocarbon group includes a chain aliphatic hydrocarbon group, an alicyclic hydrocarbon group and a combination thereof. The aliphatic hydrocarbon group may include a carbon-carbon double bond, but a saturated aliphatic hydrocarbon group is preferable.

Examples of a monovalent chain aliphatic hydrocarbon group include methyl, ethyl, propyl, butyl group, pentyl, hexyl, heptyl, octyl, decyl, dodecyl, hexadecyl, pentadecyl, hexadecyl, heptadecyl and octadecyl groups. The aliphatic hydrocarbon group may be any of a liner and a branched chain aliphatic hydrocarbon groups.

Examples of a divalent chain aliphatic hydrocarbon group include a group in which one hydrogen atom is removed from the above the monovalent chain aliphatic hydrocarbon group.

The cyclic aliphatic hydrocarbon group may be any of a monocyclic or a polycyclic aliphatic hydrocarbon groups. The cyclic aliphatic hydrocarbon group hereinafter may be referred to as "alicyclic hydrocarbon group".

Examples of a monovalent alicyclic hydrocarbon group include a group in which one hydrogen atom is removed from an alicyclic hydrocarbon. Examples of a divalent alicyclic hydrocarbon group include a group in which two hydrogen atoms are removed from the alicyclic hydrocarbon group.

Examples of the alicyclic hydrocarbon typically include a cycloalkane below.

(KA-1)

(KA-2)

(KA-3)

(KA-4)

(KA-5)

(KA-6)

(KA-7)

(KA-8)

(KA-9)

(KA-10)

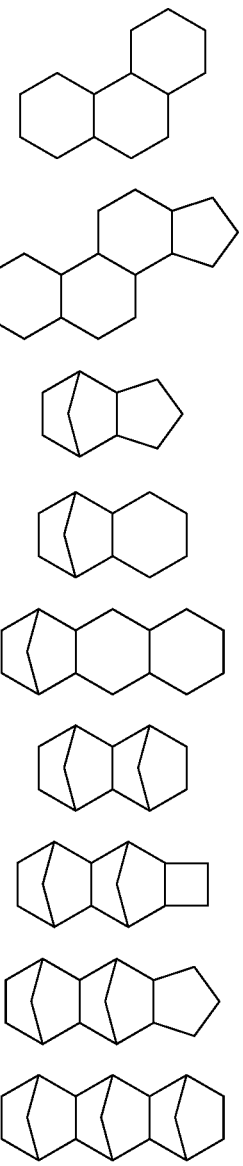

(KA-11)
(KA-12)
(KA-13)
(KA-14)
(KA-15)
(KA-16)
(KA-17)
(KA-18)
(KA-19)

Examples of the aromatic hydrocarbon group typically include an aryl group such as phenyl, naphthyl, anthryl, biphenyl, phenanthryl and fluorenyl groups.

The aliphatic hydrocarbon group and the aromatic hydrocarbon group may be substituted with a substituent.

Typical examples of the substituent of the aliphatic hydrocarbon group include a halogen atom, an alkoxy group, an alkylthio group, an acyl group, an aryl group, an aralkyl group and an aryloxy group.

Typical examples of the substituent of the aromatic hydrocarbon group include a halogen atom, an alkoxy group, an alkylthio group, an acyl group, an alkyl group and an aryloxy group.

Examples of the halogen atom include fluorine, chlorine, bromine and iodine atoms.

Examples of the alkoxyl group include methoxy, ethoxy, propoxy, butoxy, pentyloxy, hexyloxy, octyloxy, decyloxy and dodecyloxy groups. The alkoxyl group may be any of a liner and a branched chain alkoxyl groups.

Examples of the alkylthio group include a group in which an oxygen atom in the alkoxy group is replaced by a sulfur atom.

Examples of the acyl group include a group bonding a carbonyl group to the alkyl group, such as, acetyl, propionyl, butyryl, valeryl, hexylcarbonyl, heptylcarbonyl, octylcarbonyl, decylcarbonyl and dodecylcarbonyl groups, and a group bonding a carbonyl group to the aryl group. The alkyl group in the acyl group may be any of a liner and a branched chain alkyl groups.

Examples of the aryloxy group include a group bonding an oxygen atom to the aryl group.

Examples of the aralkyl group include benzyl, phenethyl, phenylpropyl, trityl, naphthylmethyl and naphthylethyl groups.

Examples of the aryl group and the alkyl group include the same as defined above.

"(meth)acrylic monomer" means at least one monomer having a structure of "$CH_2=CH-CO-$" or "$CH_2=C(CH_3)-CO-$", as well as "(meth)acrylate" and "(meth)acrylic acid" mean "at least one acrylate or methacrylate" and "at least one acrylic acid or methacrylic acid", respectively.

<Resist Composition>

A resist composition of the present invention contains
a resin (hereinafter may be referred to as "resin (A)"), and
an acid generator (hereinafter may be referred to as "acid generator (B)").

Further, the resist composition may contain a solvent and an additive such as a basic compound which is known as a quencher in this technical field, as needed.

By containing the resin (A) in the resist composition, a resist pattern can be produced from the resist composition with wide focus margin (DOF) and free-defects through the synergism of the resin (A) and the acid generator (B).

<Resin (A)>

The resin (A) has a structural unit derived from a compound represented by the formula (a) (hereinafter may be referred to as "compound (a)").

<Compound (a)>

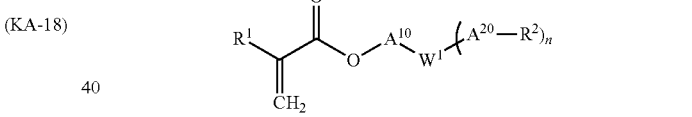

(a)

wherein $R^1$ represents a hydrogen atom or a methyl group;

$A^{10}$ represents a single bond, an optionally substituted $C_1$ to $C_6$ alkanediyl group or a group represented by the formula (a-1) (hereinafter may be referred to as "group (a-1)");

$W^1$ represents an optionally substituted $C_4$ to $C_{36}$ alicyclic hydrocarbon group, and the $-CH_2-$ contained in the alicyclic hydrocarbon group may be replaced by $-O-$ or $-CO-$;

$A^{20}$ in each occurrence independently represents an optionally substituted $C_1$ to $C_6$ aliphatic hydrocarbon group, and the $-CH_2-$ contained in the aliphatic hydrocarbon group may be replaced by $-O-$ or $-CO-$;

$R^2$ in each occurrence independently represents a $C_1$ to $C_{12}$ perfluoroalkyl group, at least one of the fluorine atom contained in the perfluoroalkyl group may be replaced by a hydroxy group or a hydroxymethyl group; and n represents 1 or 2;

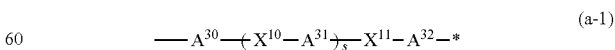

(a-1)

wherein s represents an integer of 0 to 3;

$X^{10}$ in each occurrence independently represents an oxygen atom, a carbonyl group, a carbonyloxy group or an oxycarbonyl group;

$X^{11}$ represents an oxygen atom, a carbonyl group, a carbonyloxy group or an oxycarbonyl group;

$A^{31}$ in each occurrence independently represents an optionally substituted $C_1$ to $C_{17}$ aliphatic hydrocarbon group;

$A^{30}$ represents an optionally substituted $C_1$ to $C_{17}$ aliphatic hydrocarbon group;

$A^{32}$ represents a single bond or an optionally substituted $C_1$ to $C_{17}$ aliphatic hydrocarbon group; and

* represent a bond to $W^1$;

provided that a total number of the carbon atom of $A^{30}$, $A^{31}$, $A^{32}$, $X^{10}$ and $X^{11}$ is 1 to 17.

The alkanediyl group of the $A^{10}$ may be either a linear or a branched chain alkanediyl group. Examples of the alkanediyl group include a linear alkanediyl group such as methylene, ethylene, propane-1,3-diyl, propane-1,2-diyl, butane-1,4-diyl, pentane-1,5-diyl, pentane-1,4-diyl, hexane-1,6-diyl and hexane-1,5-diyl; a branched chain alkanediyl group such as 1-methyl-1,3-propylene, 2-methyl-1,3-propylene, 2-methyl-1,2-propylene, 1-methyl-1,4-butylene and 2-methyl-1,4-butylen groups.

Examples of the substituent of the alkanediyl group include a hydroxy group and a $C_1$ to $C_6$ alkoxy group.

The group (a-1) of the $A^{20}$ is a divalent group characterized in that an oxygen atom, a carbonyl group, a carbonyloxy group or an oxycarbonyl group is included such as $X^{10}$ and $X^{11}$.

Examples of the group (a-1) containing an oxygen atom include as below. * represent a bond with $W^1$ in groups (a-1) below.

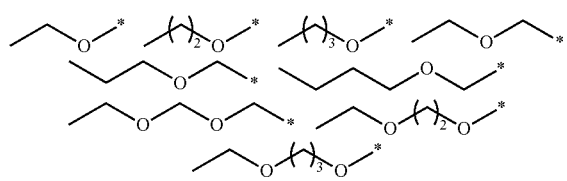

Examples of the group (a-1) containing a carbonyl group include as below.

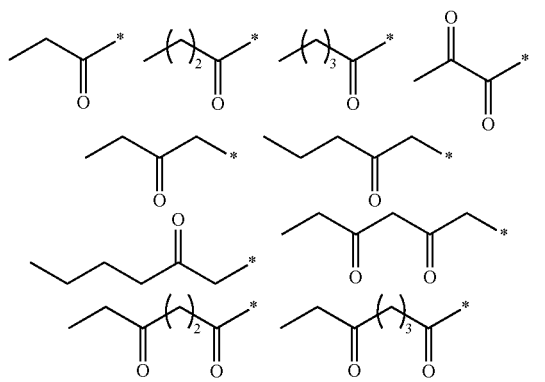

Examples of the group (a-1) containing a carbonyloxy group include as below.

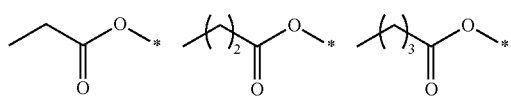

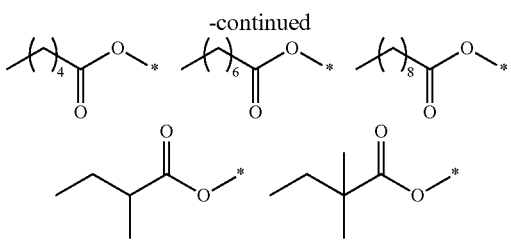

Examples of the group (a-1) containing an oxycarbonyl group include as below.

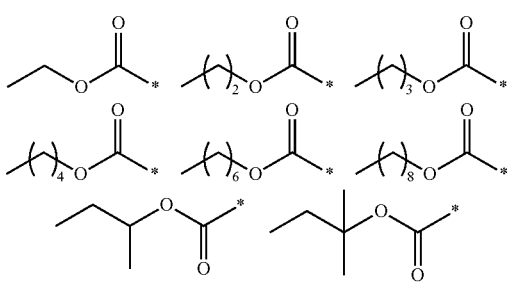

The group (a-1) may contain two or more of atom/group consisting of an oxygen atom, carbonyl group, oxycarbonyl group and carbonyloxy group.

Examples of such group (a-1) include below.

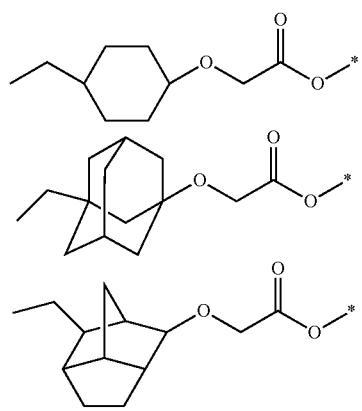

Among theses, $A^{10}$ is preferably a single bond as the compound (a) used for producing the resin (A).

Examples of the alicyclic hydrocarbon group of $W^1$ include a monocyclic or polycyclic saturated hydrocarbon groups such as cyclopropyl, cyclobutyl, cyclopentyl, cyclohexyl, cycloheptyl, cyclooctyl, cyclononyl, cyclodecyl, norbornyl (i.e., bicyclo[2.2.1]hexyl), 1-adamantyl, 2-adamantly) and isobornyl groups.

Among these, cyclohexyl, adamantyl and bicyclo[2.2.1] hexyl groups are preferable, and cyclohexyl and adamantyl groups are more preferable.

It is preferably a $C_5$ to $C_{18}$ alicyclic hydrocarbon group as $W^1$, and more preferably a $C_6$ to $C_{12}$ alicyclic hydrocarbon group. In the alicyclic hydrocarbon group of $W^1$ in which the —$CH_2$— contained therein may be replaced by —O— or —CO—, the carbon number means a carbon number before a —$CH_2$— contained in the alicyclic hydrocarbon group is replaced by a group described above.

Preferable examples of the alicyclic hydrocarbon group include an alicyclic hydrocarbon group containing an adamantine ring, a cyclohexane ring or a norbornene ring. Among these, an alicyclic hydrocarbon group containing an adamantine ring or a cyclohexane ring is more preferable. In such group, n hydrogen atom(s) is removed for bond(s) with $A^{20}$, wherein n represents the same meaning as defined above. Examples of the substituent of $W^1$ include a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group.

Examples of a group —$W^1$-$A^{20}$-$R^2$ typically include a group represented by the formula (a1-A) and a group represented by the formula (a1-B).

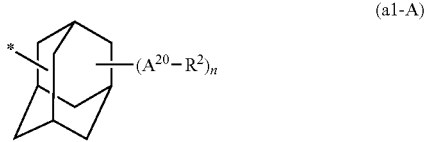

(a1-A)

wherein $A^{20}$, $R^2$ and n are the same definition in the formula (a), the —$CH_2$— contained in the adamantane ring may be replaced by —O— or —CO—, a hydrogen atom contained in the adamantane ring may be replaced by a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group;

* represents a single bond to $A^{10}$.

When the —$CH_2$— in the adamantane ring is replaced by —O— or —CO—, the number of the —$CH_2$— in the adamantane ring replaced is at most about two.

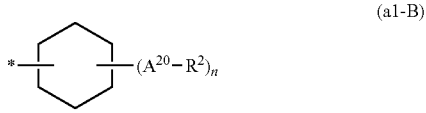

(a1-B)

wherein $A^{20}$, $R^2$ and n is the same definition in the formula (a), the —$CH_2$— contained in the cyclohexane ring may be replaced by —O— or —CO—, a hydrogen atom contained in the cyclohexane ring may be replaced by a hydroxy group, a $C_1$ to $C_{12}$ alkyl group, a $C_1$ to $C_{12}$ alkoxy group, a $C_3$ to $C_{12}$ alicyclic hydrocarbon group or a $C_6$ to $C_{10}$ aromatic hydrocarbon group;

* represents a single bond to $A^{10}$.

When the —$CH_2$— in the cyclohexane ring is replaced by —O— or —CO— group, the number of the —$CH_2$— in the cyclohexane ring replaced may be at most about two.

When a hydrogen atom contained in the adamantine ring is replaced by an alkyl group, alkoxy group, an alicyclic hydrocarbon group or an aromatic hydrocarbon group, the number of the hydrogen atom in the adamantine ring replaced may be at most about three, and when the number of the substituent is 2 or more, the substituents may be independently to other(s). Here, "a hydrogen atom contained in the adamantine ring" is a hydrogen atom which is bonded to the atom constituting the adamantine ring.

In the similar way, when a hydrogen atom contained in the cyclohexane ring is replaced by an alkyl group, alkoxy group, an alicyclic hydrocarbon group or an aromatic hydrocarbon group, the number of the hydrogen atom in the cyclohexane ring replaced may be at most about three, and when the number of the substituent is 2 or more, the substituents may be independently to other(s). Here, "a hydrogen atom contained in the cyclohexane ring" is a hydrogen atom which is bonded to the atom constituting the cyclohexane ring.

Examples of the alkyl group include methyl, ethyl, propyl, butyl, hexyl and octyl groups, these may be either a liner chain or a branched alkyl group.

Examples of the alkoxyl group include methoxy, ethoxy, propoxy, butoxy, hexyloxy and octyloxy groups, 2-ethylhexyloxy, nonyloxy, decyloxy, undecyloxy and dodecyloxy groups, these may be either a liner chain or a branched alkoxy group.

Examples of the alicyclic hydrocarbon group include below.

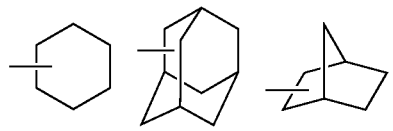

Examples of the aromatic hydrocarbon group include phenyl and naphtyl groups.

The aliphatic hydrocarbon group of $A^{20}$ is preferably saturated aliphatic hydrocarbon group, which is typically an alkanediyl group. Examples of the alkanediyl group include a group as the same groups as described in $A^{10}$.

Examples of the group in which a —$CH_2$— contained in the aliphatic hydrocarbon group is replaced by-O— or —CO— include below. * represents a bond to $W^1$.

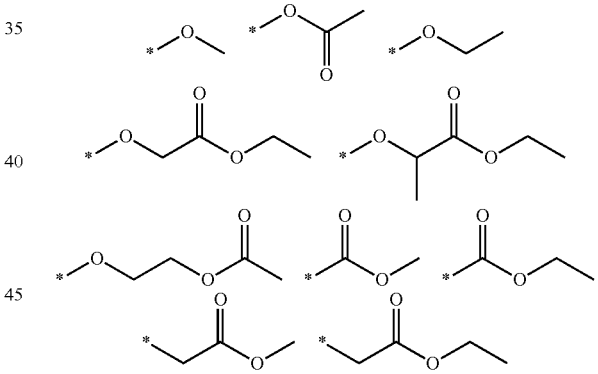

Examples of the perfluoroalkyl group of $R^2$ include trifluoromethyl, perfluoroethyl, perfluoropropyl, perfluorobutyl, perfluorohexyl, perfluoroheptyl and perfluorooctyl groups. These may be either a liner chain or a branched chain perfluoroalky group, but a liner chain perfluoroalkyl group is preferable.

n represents 1 or 2, but a compound (a) in which n is 1 is preferable for producing the resin (A). Examples of the compound (a) in which n is 1 includes below. The compounds described below are compounds in which $W^1$ is an alicyclic hydrocarbon group having an adamantane ring. In addition, examples of the compound (a) also include compounds in which the adamantane ring in the compound below is replaced by the cyclohexane ring. When n is 2, examples of the compound (a) may includes compounds in which a hydrogen atom contained in the adamantane group is replaced by -$A^{20}$-$R^2$ (the definitions of $A^{20}$ and $R^2$ are the same meaning in the formula (a)).

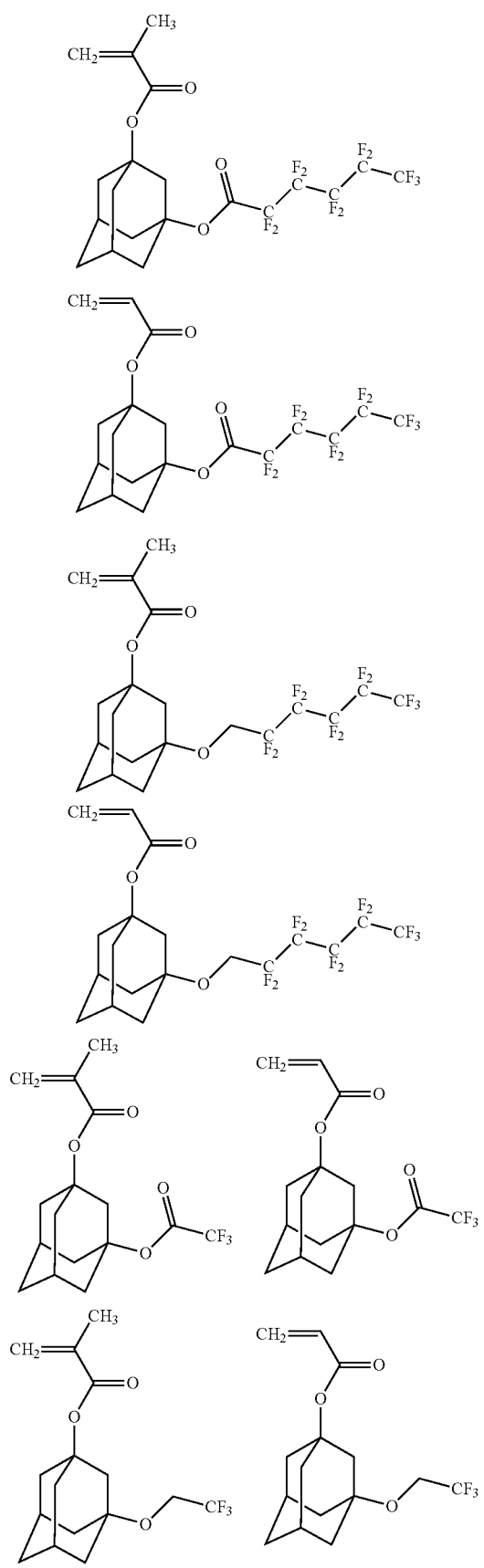

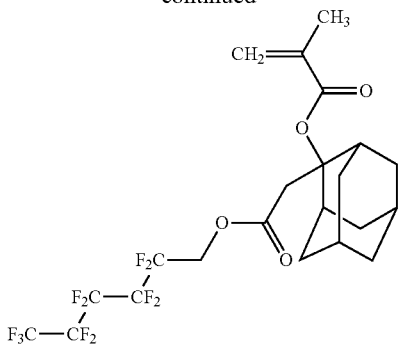
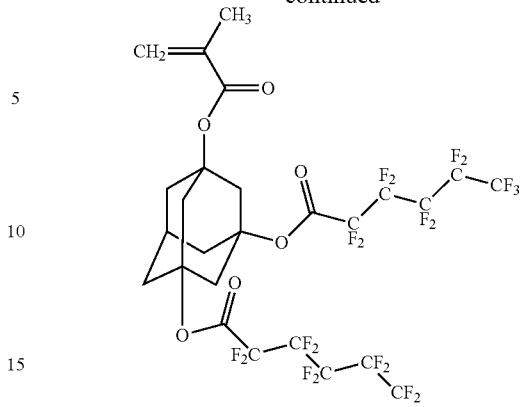

Among these, a compound (a) in which $W^1$ is an alicyclic hydrocarbon group having an adamantane ring is more preferably the compounds for producing the resin (A).

The compound (a) can be produced by a method according to the method described in the pamphlet of WO 2008/015876.

The content of the structural units derived from the compound (a) in the resin (A) are generally 1 to 100 mole %, preferably 5 to 95 mole %, and more preferably 10 to 90 mole %, with respect to the total structural units (100 mole %) constituting the resin (A). For falling the content of the structural unit derived from the compound (a) in the resin (A) within the above range, the amount of the compound (a) used can be adjusted with respect to the total amount of the monomer used when the resin (A) is produced (the same shall apply hereinafter for corresponding adjustment of the content).

<Resin (AA)>

The present resist composition preferably contains the resin having properties that are insoluble or poorly soluble in alkali aqueous solution and that convert to a resin becoming soluble in an alkali aqueous solution by the action of an acid as described above. Such resin having the properties and having the structural unit derived from the compound (a) hereinafter may be referred to as "resin (AA)". Thus, the present resist composition preferably contains the resin (AA) as the resin (A).

Here "a resin becoming soluble in an alkali aqueous solution by the action of an acid" means a resin that is insoluble or poorly soluble in aqueous alkali solution before contacting with the acid but becomes soluble in aqueous alkali solution after contacting with an acid. The resin (AA) therefore contains at least one hydrophilic group which is protected by a protecting group which can be leave by the action of an acid, and preferably all hydrophilic groups are protected by the protecting group. Such protecting groups will deprotect by the action of the acid, and resin (AA) will convert to a resin which is soluble in an alkali aqueous solution. Hereinafter the hydrophilic group protected by the protecting group may refer to as an "acid-labile group". Examples of the acid-labile group include a hydroxy group and a carboxy group, and a carboxy group is preferable. That is, the "acid-labile group" means a group in which an elimination group (i.e., the protecting group) is cleaved in contact with the acid and resulting in having a hydrophilic group such as a carboxy or a hydroxy group. The resin (AA) can be produced by polymerizeing the compound (a) with a monomer having the acid-labile group.

<Monomer (a1)>

The monomer having an acid-labile group hereinafter may be referred to as "monomer (a1)". Examples of the acid-labile group when the hydrophilic group is carboxy group include a group in which a hydrogen atom of the carboxyl group (i.e., —COOH) is placed with an organic group and an atom of the organic group which bonds to —O— of the carboxyl group is tertiary carbon atom.

Among such the acid-labile group, preferred examples thereof include a group represented by the formula (1) below. Hereinafter the group represented by the formula (1) may refer to as an "acid-labile group (1)".

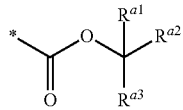
(1)

wherein $R^{a1}$ to $R^{a3}$ independently represent a $C_1$ to $C_8$ aliphatic hydrocarbon group or $R^{a1}$ and $R^{a2}$ may be bonded together with a carbon atom bonded to $R^{a1}$ and $R^{a2}$ to form a $C_3$ to $C_{20}$ ring, at least one —CH$_2$— contained in the aliphatic hydrocarbon group or the ring may be replaced by —O—, —S— or —CO—, * represents a bond.

Examples of the aliphatic hydrocarbon group of $R^{a1}$ to $R^{a3}$ include an alkyl group and an alicyclic hydrocarbon group.

Examples of the alkyl group include methyl, ethyl, n-propyl, iso-propyl, n-butyl, sec-butyl, tert-butyl, iso-butyl, n-pentyl, iso-pentyl, tert-pentyl, neo-pentyl, 1-methylbutyl, 2-methylbutyl, n-hexyl, 1-methylpentyl, 1,2-dimethylpropyl, and 1-ethylpropyl groups. Among these, the alkyl group preferably has 1 to 8 carbon atoms.

Examples of the alicyclic hydrocarbon group include a monocyclic or polycyclic saturated hydrocarbon groups such as cyclopropyl, cyclobutyl, cyclopentyl, cyclohexyl, cycloheptyl, cyclooctyl When $R^{a1}$ and $R^{a2}$ are bonded together to form a ring, examples of the group —C($R^{a1}$)($R^{a2}$)($R^{a3}$) include a group below.

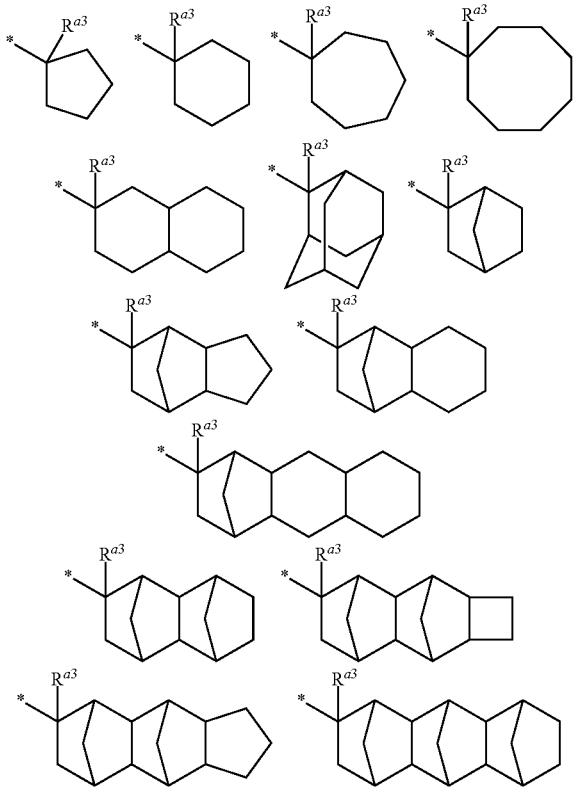

The ring preferably has 3 to 12 carbon atoms.

Specific examples of the acid-labile group include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom forms adamantyl group, and $R^{a3}$ is alkyl group, in the formula (1)), and 1-(adamantine-1-yl)-1-alkylalkoxycarbonyl group (a group in which Ral and $R^{a2}$ are alkyl group, and $R^{a3}$ is adamantyl group, in the formula (1)).

Examples of the acid-labile group when the hydrophilic group is a hydroxy group include a group in which a hydrogen atom of the hydroxy group is replaced with an organic group and resulting in having an acetal structure. Among such the acid-labile group, preferred examples thereof include a group represented by the formula (2) below. Hereinafter the group represented by the formula (2) may refer to as an "acid-labile group (2)".

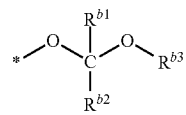
(2)

wherein $R^{b1}$ and $R^{b2}$ independently represent a hydrogen atom or a $C_1$ to $C_{12}$ hydrocarbon group, $R^{b3}$ represents a $C_1$ to $C_{20}$ hydrocarbon group, or $R^{b2}$ and $R^{b3}$ may be bonded together with a carbon atom and an oxygen atom bonded to $R^{b2}$ and $R^{b3}$ to form a $C_3$ to $C_{20}$ ring, respectively. One or more —CH$_2$— contained in the hydrocarbon group and the ring may be replaced by —O—, —S— or —CO—, * represents a bond.

The hydrocarbon group of $R^{b1}$ to $R^{b3}$ includes any of an aliphatic hydrocarbon group and an aromatic hydrocarbon group.

Examples of the aliphatic hydrocarbon group include the same examples described above.

Examples of the aromatic hydrocarbon groups include an aryl group such as phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the ring which is formed by bonding with $R^{b2}$ and $R^{b3}$ include the same rings which are formed by bonding with $R^{a1}$ and Rae.

At least one of $R^{b1}$ and $R^{b2}$ is preferably a hydrogen atom.

Specific examples of the acid-labile group (2) include a group below.

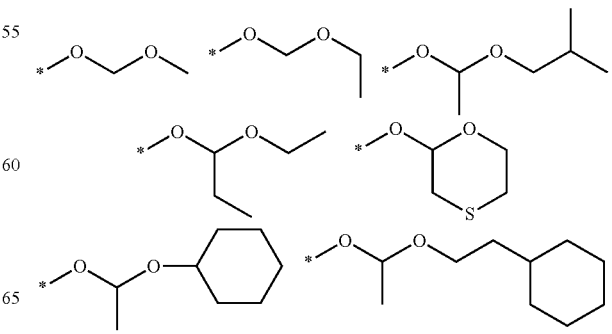

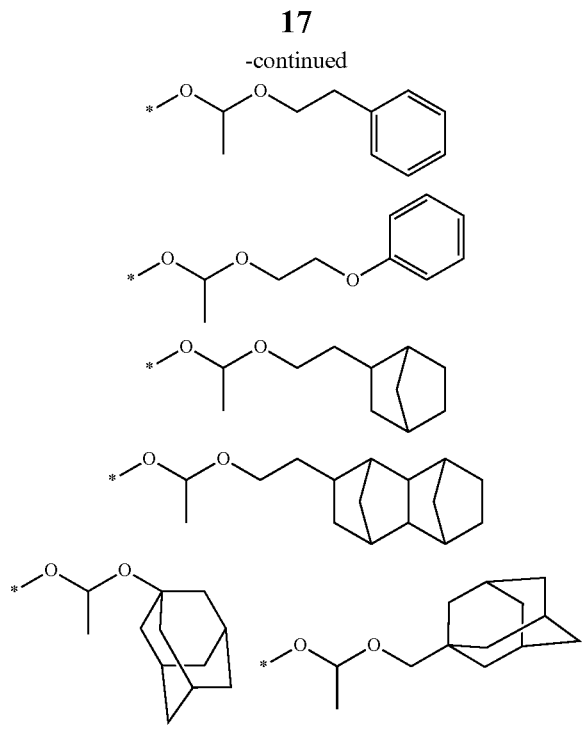

The monomer having an acid-labile group (a1) is preferably a monomer having an acid-labile group and a carbon-carbon double bond, for example, a monomer having an acid-labile group (1) and/or an acid-labile group (2) and a carbon-carbon double bond, and more preferably a (meth)acrylic monomer having an acid-labile group, for example, a (meth)acrylic monomer having an acid-labile group (1).

Among the (meth)acrylic monomer having an acid-labile group, it is preferably a monomer having a $C_5$ to $C_{20}$ alicyclic hydrocarbon group. When a resin which can be obtained by polymerizing monomers having bulky structure such as the alicyclic hydrocarbon group is used, the resist composition having excellent resolution tends to be obtained.

Examples of the alicyclic hydrocarbon group include the same examples as the alicyclic hydrocarbon group in $R^{a1}$ to $R^{a3}$.

Among the (meth)acrylic monomer having the acid-labile group and the alicyclic hydrocarbon group, a monomer having an adamantyl group represented by the formula (a1-1) and a monomer having a cycloalkyl group represented by the formula (a1-2) are preferable. These may be used singly or mixture of two or more.

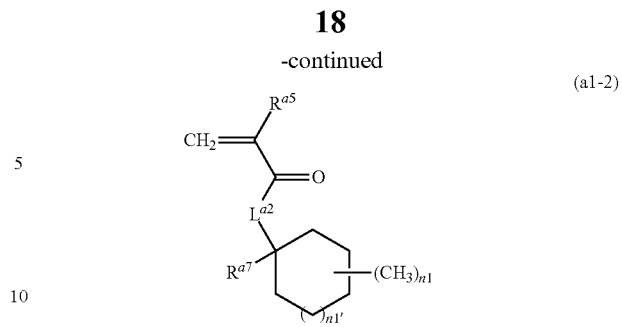

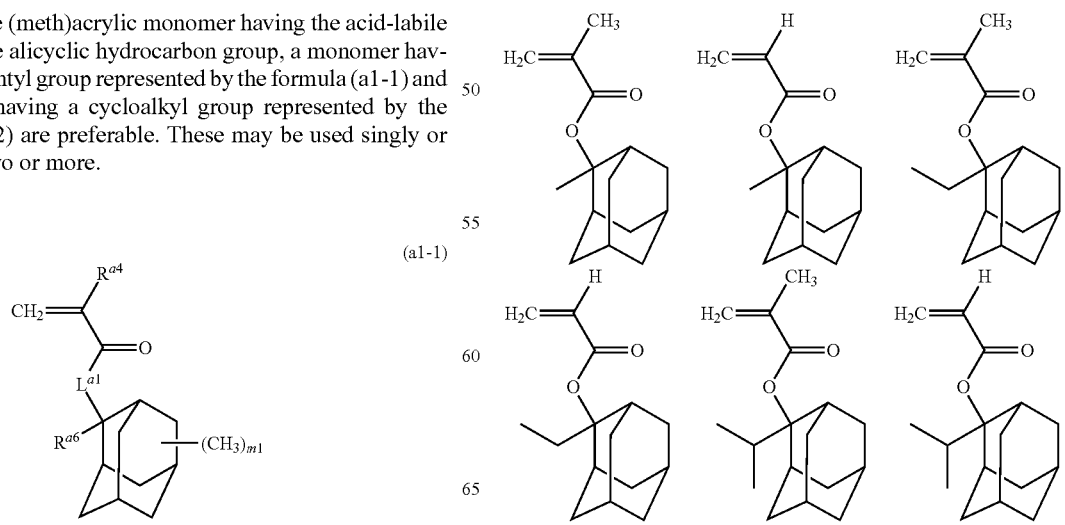

wherein $L^{a1}$ and $L^{a2}$ independently represent *—O— or *—O—$(CH_2)_{k1}$—CO—O—, k1 represents an integer of 1 to 7, * represents a bond to the carbonyl group (—CO—);

$R^{a4}$ and $R^{a5}$ independently represent a hydrogen atom or a methyl group;

$R^{a6}$ and $R^{a7}$ independently represent a $C_1$ to $C_{10}$ aliphatic hydrocarbon group; and m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably —O— or *—O—$(CH_2)_{k1'}$—CO—O—, here k1' represents an integer of 1 to 4, more preferably —O— or *—O—$CH_2$—CO—O—, and still more preferably —O—.

$R^{a4}$ and $R^{a5}$ are preferably a methyl group.

The aliphatic hydrocarbon groups of $R^{a6}$ and $R^{a7}$ are independently preferably a $C_1$ to $C_8$ alkyl group or $C_3$ to $C_{10}$ alicyclic hydrocarbon group, more preferably a $C_1$ to $C_8$ alkyl group or $C_3$ to $C_8$ alicyclic hydrocarbon group, and still more preferably a $C_1$ to $C_6$ alkyl group or $C_3$ to $C_6$ alicyclic hydrocarbon group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the monomer (a1-1) include a group below.

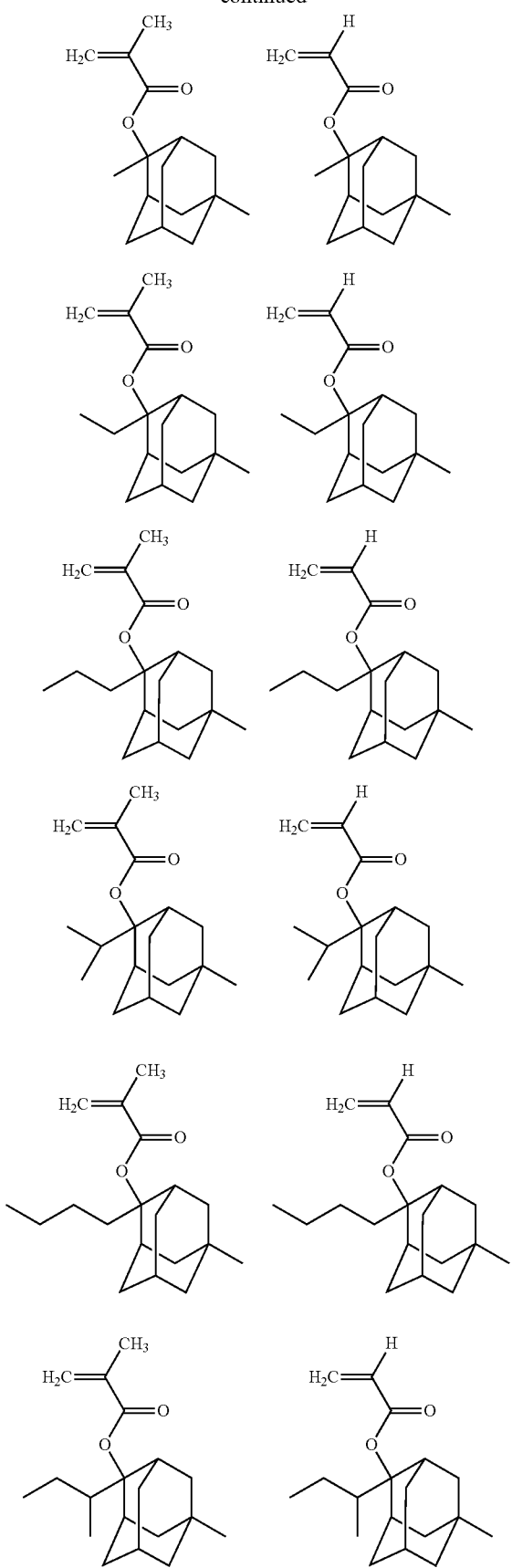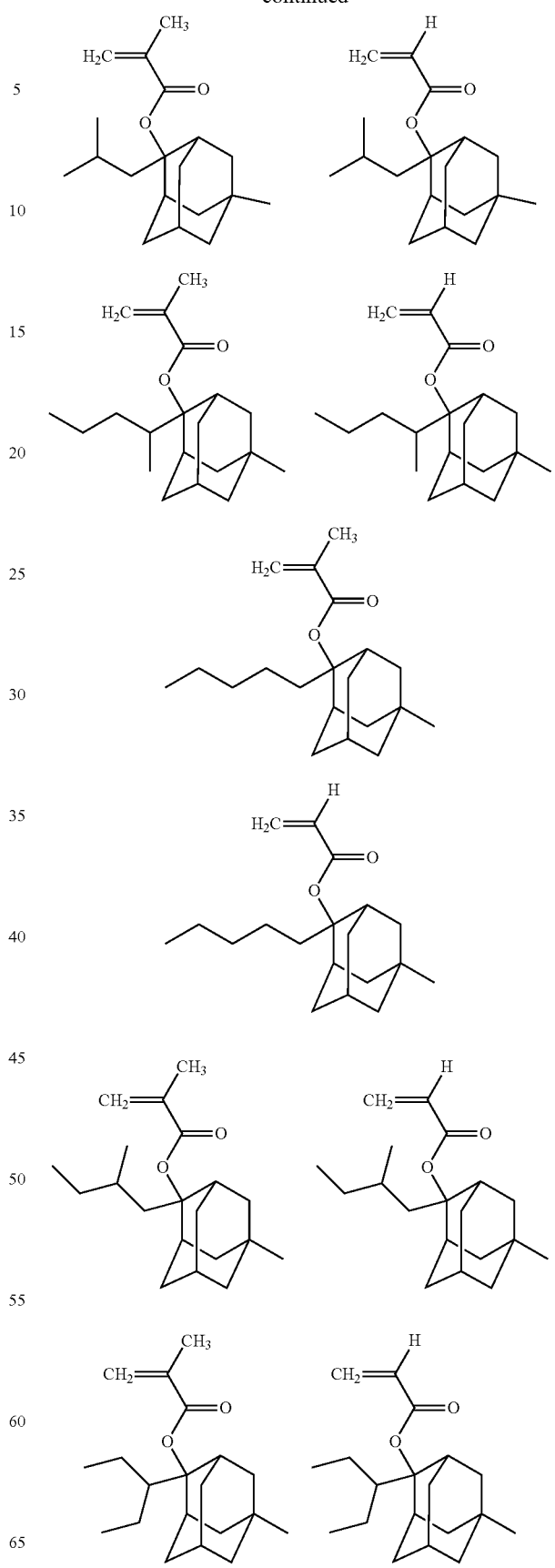

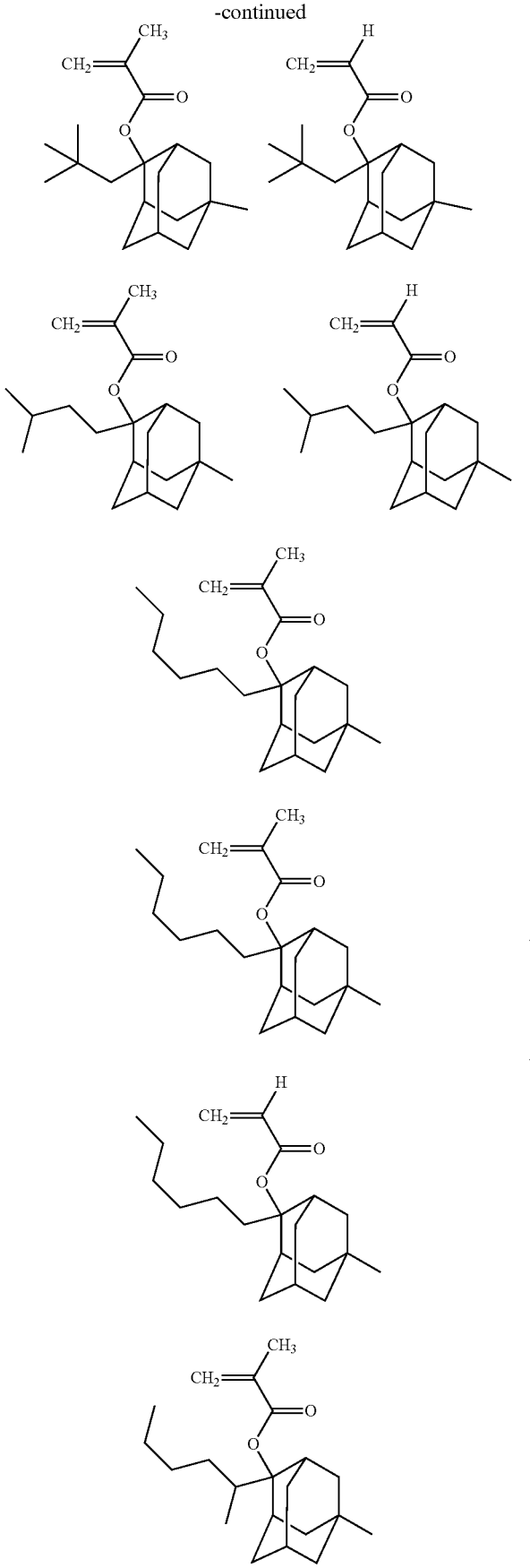
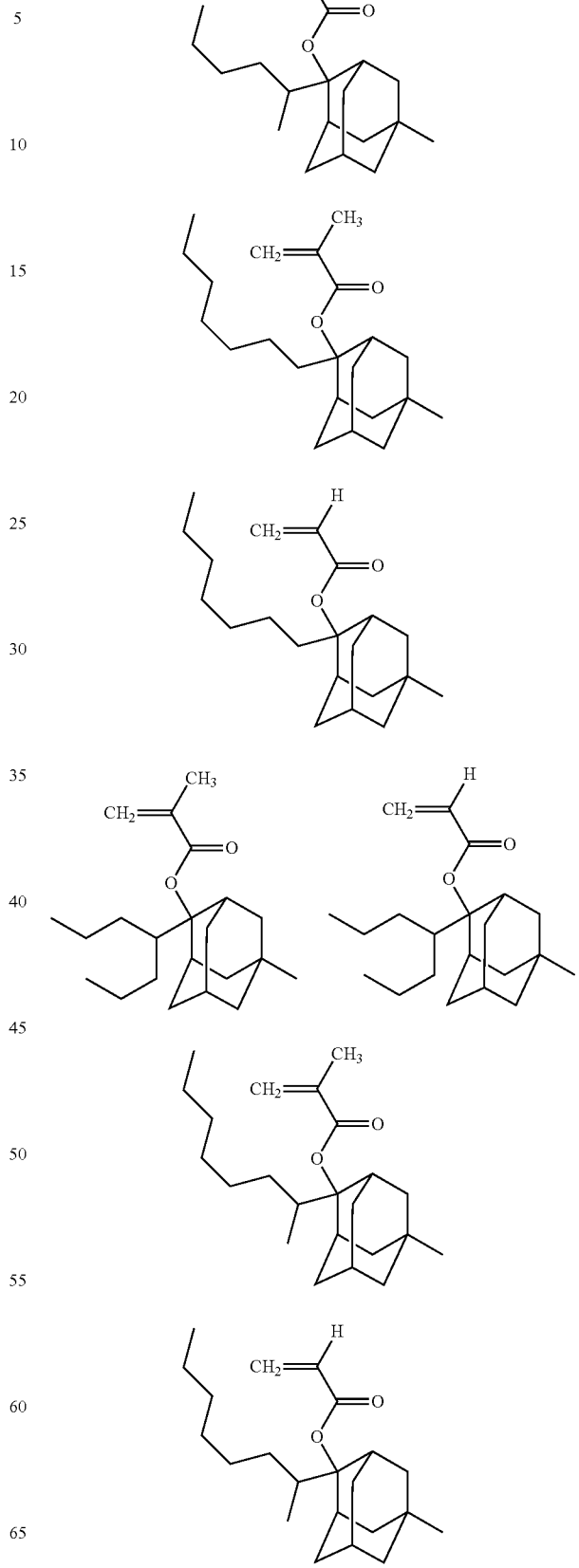

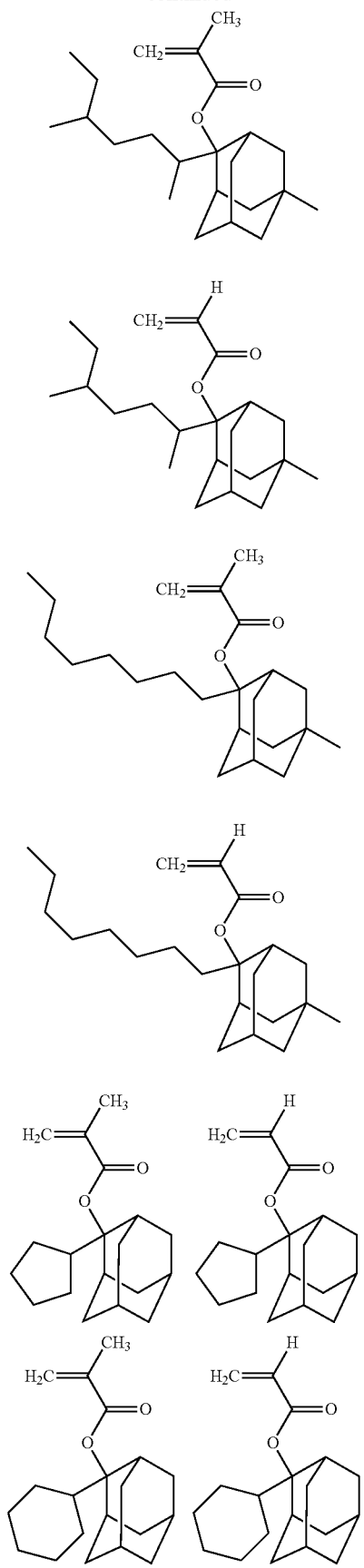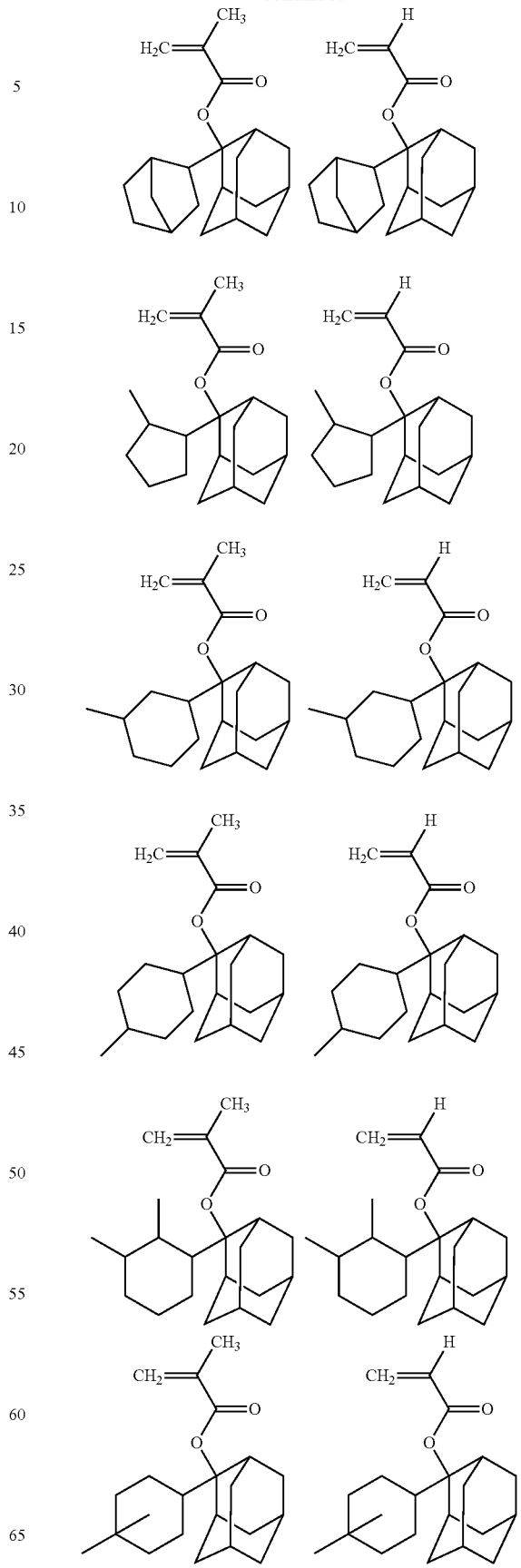

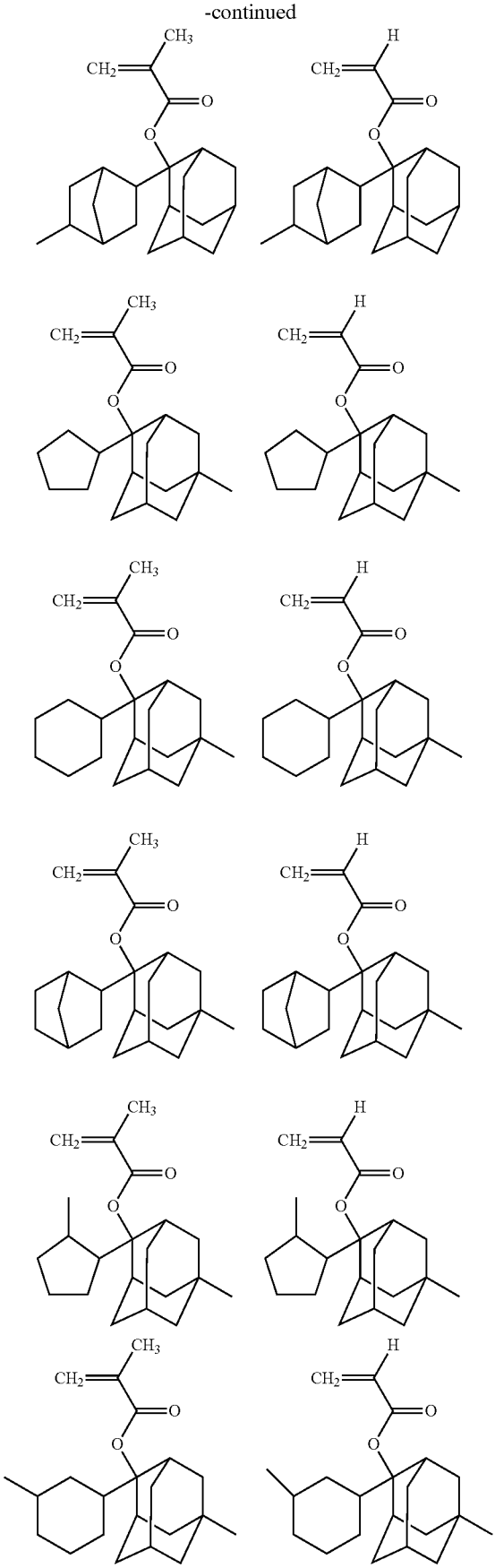
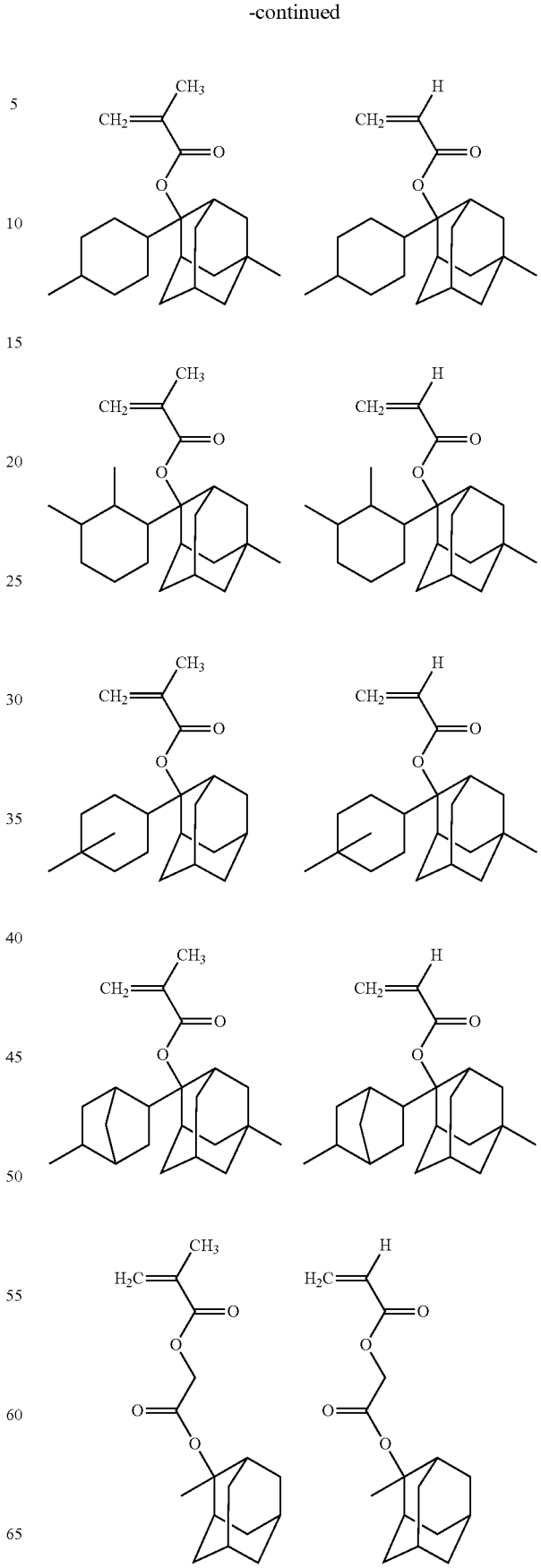

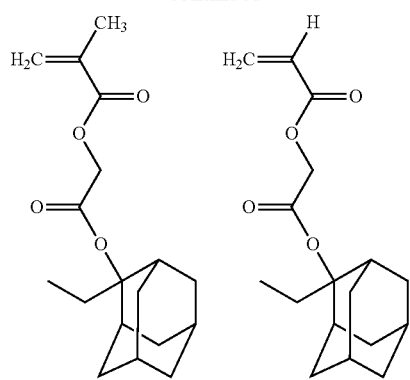
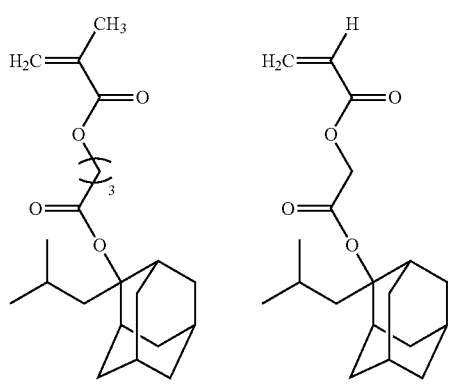
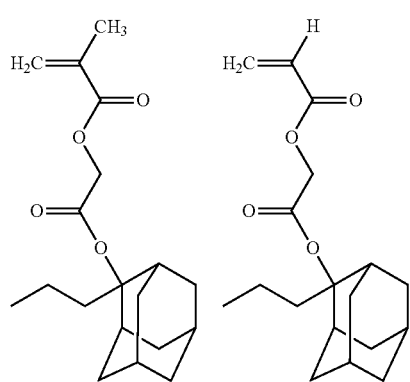
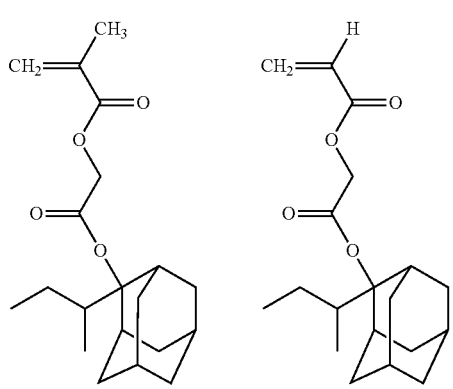
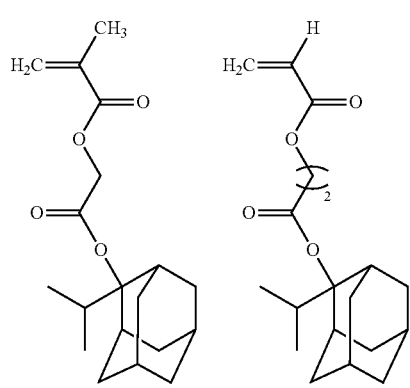
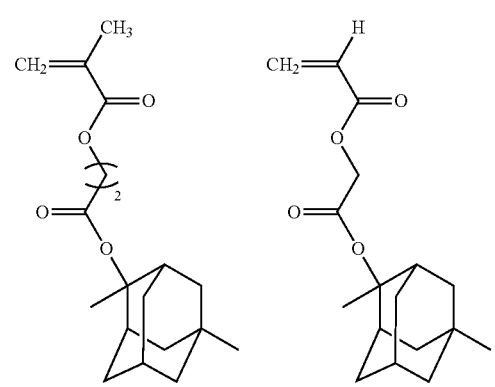
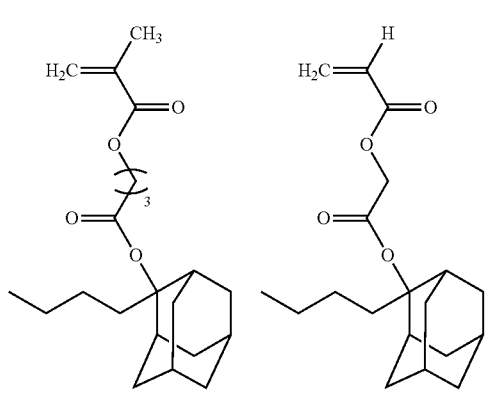
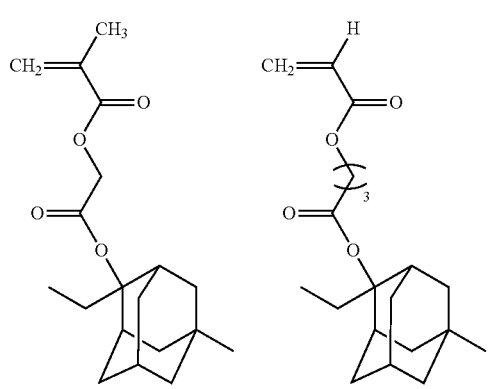

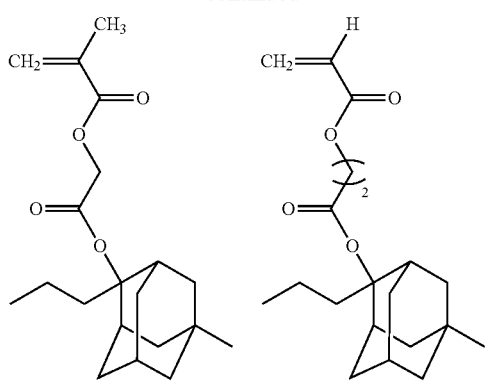
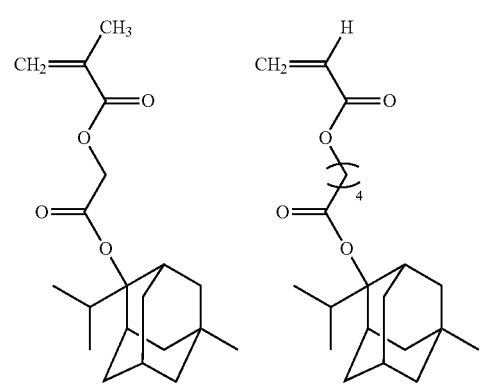
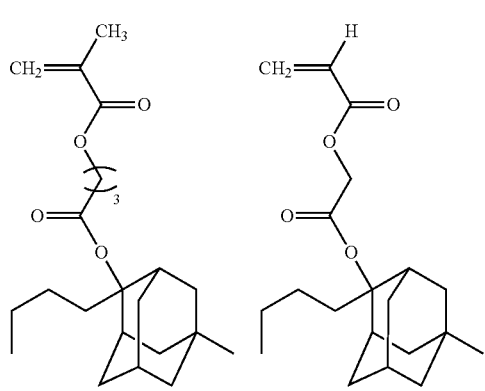
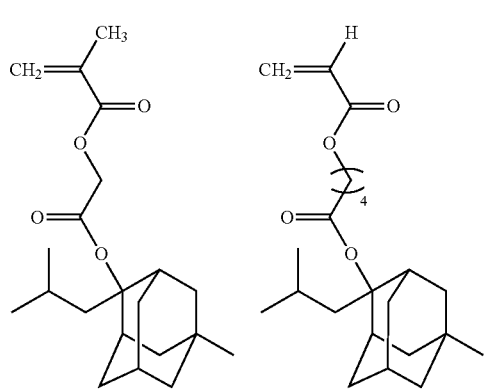
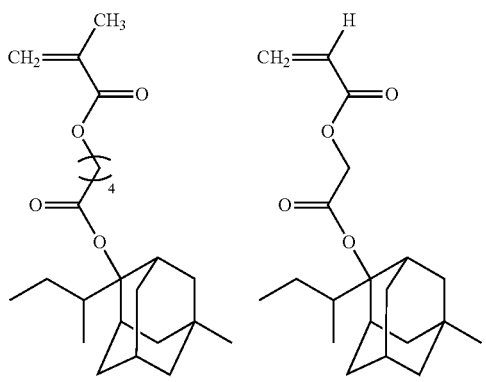
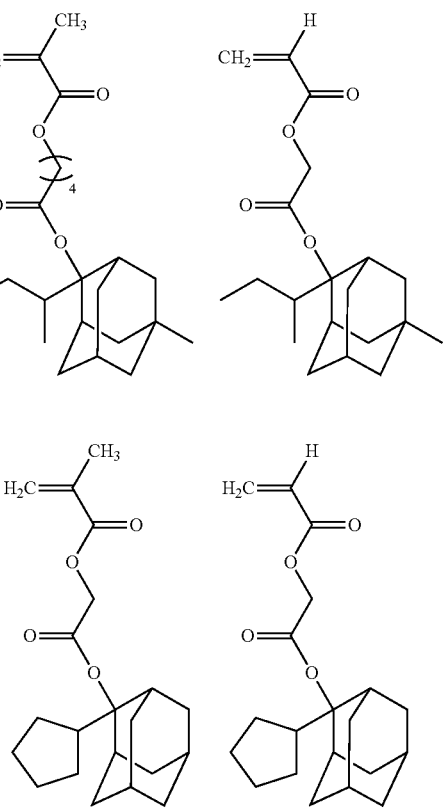
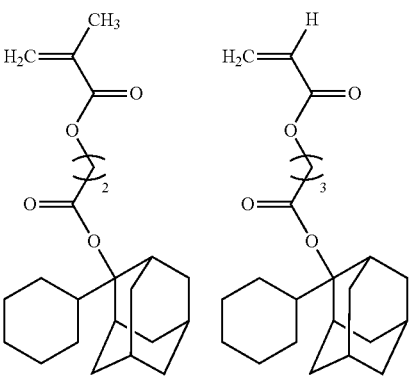
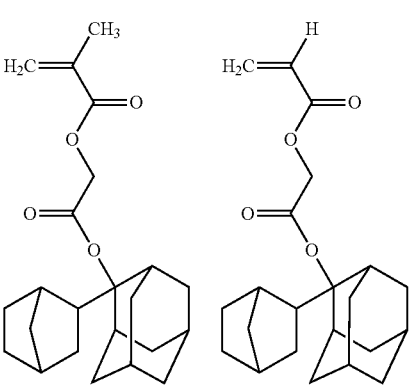

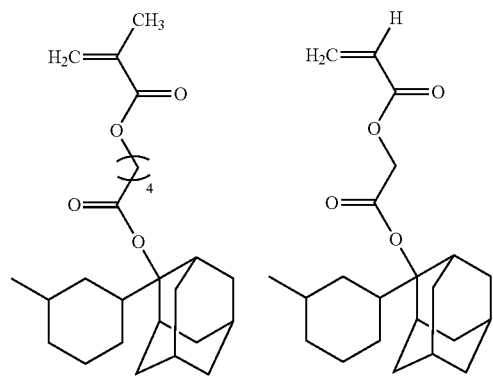
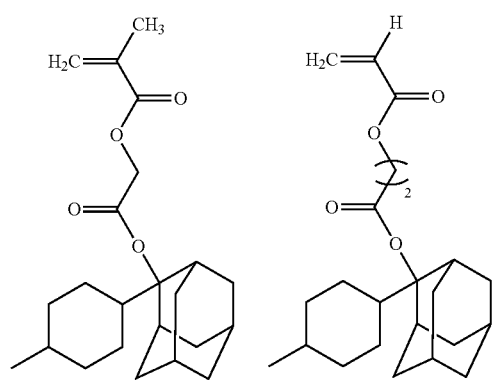
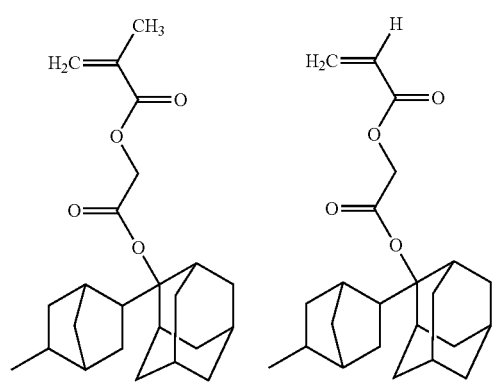
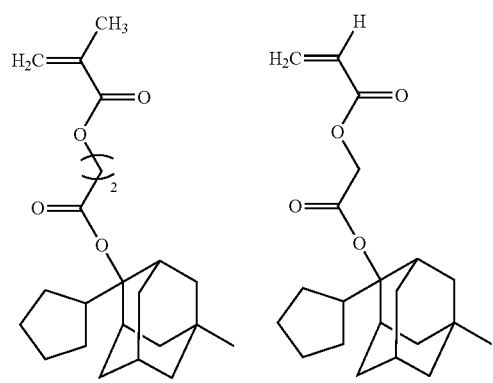
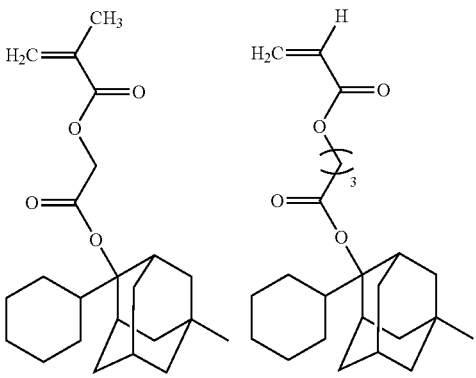
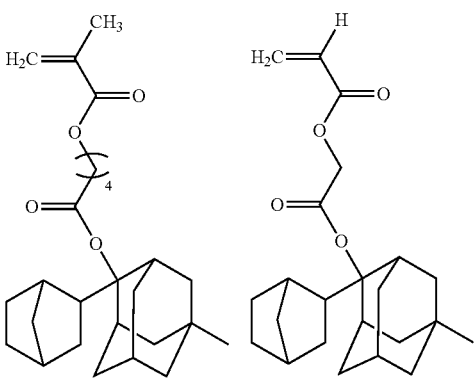
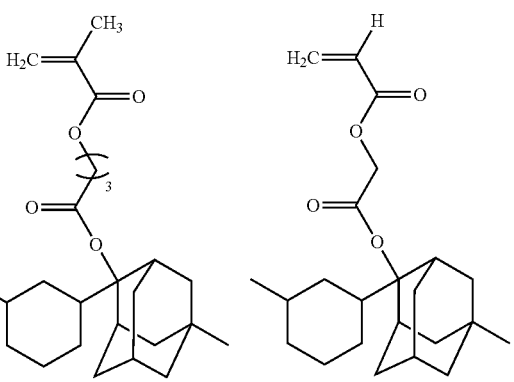
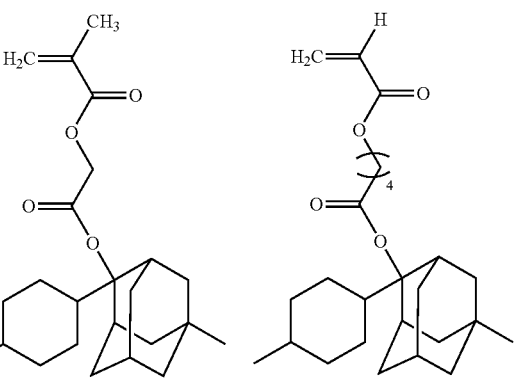

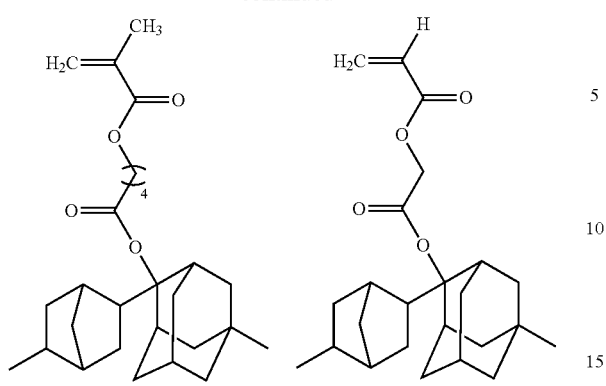

Among these, 2-methyladamantane-2-yl(meth)acrylate, 2-ethyladamantane-2-yl(meth)acrylate and 2-isopropyladamantane-2-yl(meth)acrylate are preferable, and 2-methyladamantane-2-yl methacrylate, 2-ethyladamantane-2-yl methacrylate and 2-isopropyladamantane-2-yl methacrylate are more preferable, as a monomer (a1-1).

Examples of the monomer (a1-2) include a group below.

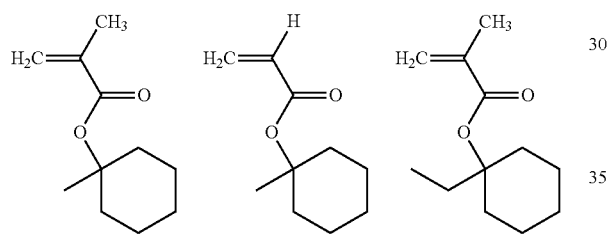
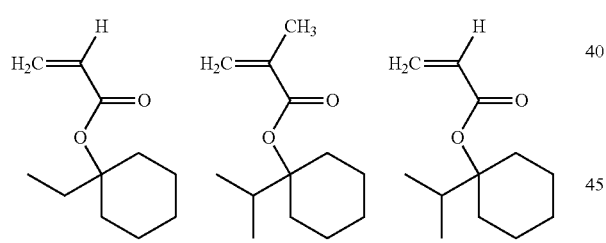
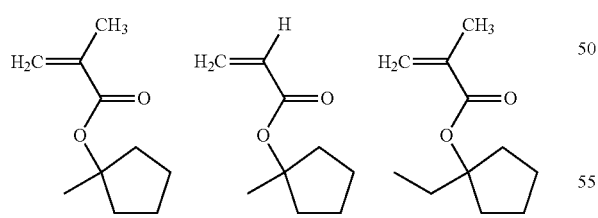
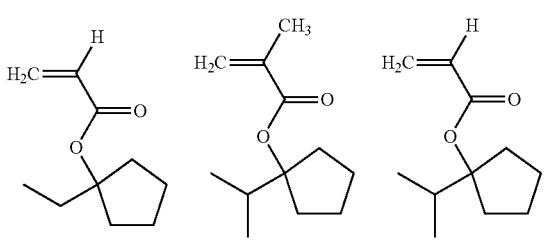
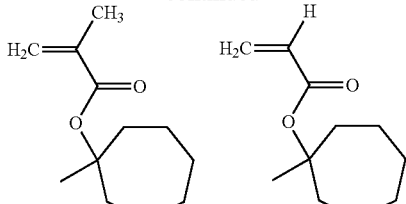
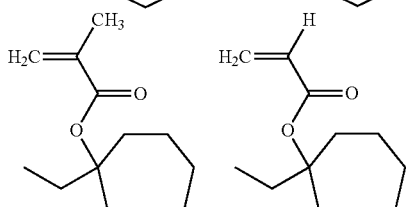
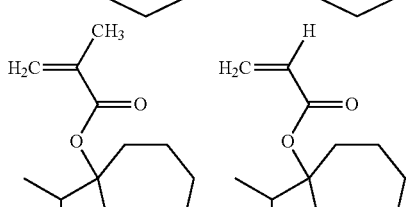
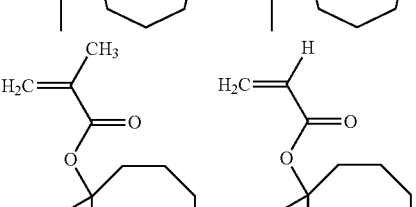
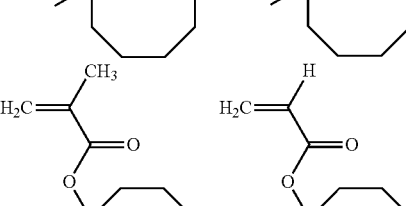
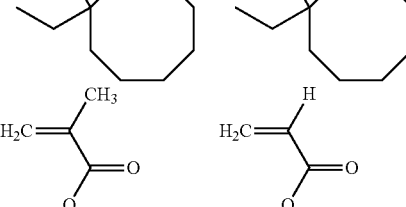

Among these, 1-ethylcyclohexane-1-yl(meth)acrylate is preferable, and 1-ethylcyclohexane-1-yl methacrylate is more preferable, as a monomer (a1-2).

When the resin (AA) contains the structural unit derived from the monomer (a1-1) and/or the monomer (a1-2), the total content thereof is generally 10 to 95 mol %, preferably 15 to 90 mol %, and more preferably 20 to 85 mol %, with respect to the total structural units of the resin (AA).

The content of the structural units derived from the monomer (a1-1) is generally 10 to 80 mol %, preferably 20 to 60 mol %, with respect to the total structural units of the resin (AA), and the content of the structural units derived from the monomer (a1-2) is generally 10 to 80 mol %, preferably 20 to 60 mol %, with respect to the total structural units of the resin (AA).

Monomers having an acid-labile group and a carbon-carbon double bond includes a monomer having norbornene ring presented by the formula (a1-3).

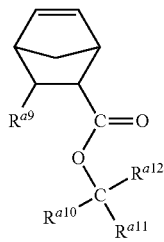

(a1-3)

wherein $R^{a9}$ represents a hydrogen atom, an optionally substituted $C_1$ to $C_3$ aliphatic hydrocarbon group (e.g., hydroxy group), a carboxy group, a cyano group or a —COOR$^{a13}$, R$^{a13}$ represents a $C_1$ to $C_{20}$ aliphatic hydrocarbon group, one or more hydrogen atom contained therein may be replaced with hydroxy group, one or more —$CH_2$— contained therein may be replaced by —O— or —CO—;

$R^{a10}$ to $R^{a12}$ independently represent a $C_1$ to $C_{20}$ aliphatic hydrocarbon group, or $R^{a10}$ and $R^{a11}$ may be bonded together to form a ring, one or more hydrogen atom contained therein may be replaced with a hydroxy group or the like, one or more —$CH_2$— contained therein may be replaced by —O— or —CO—.

Examples of the aliphatic hydrocarbon group which may be substituted with a substituent of $R^{a9}$ include methyl, ethyl, propyl, hydroxymethyl and 2-hydroxyethyl groups.

Examples of $R^{a13}$ include methyl, ethyl, propyl, 2-oxo-oxolane-3-yl and 2-oxo-oxolane-4-yl groups. $R^{13}$ is preferably a $C_1$ to $C_8$ alkyl or a $C_3$ to $C_{20}$ alicyclic hydrocarbon group.

Examples of $R^{a10}$ to $R^{a12}$ include methyl, ethyl, cyclohexyl, methylcyclohexyl, hydroxycyclohexyl, oxocyclohexyl and adamantyl groups.

Examples of the ring formed together with $R^{a10}$, $R^{a11}$ and carbon atom bonded thereto include cyclohexyl and adamantyl groups.

Examples of the monomer having a norbornene ring (a1-3) include, for example, tert-butyl 5-norbornene-2-carboxylate, 1-cyclohexyl-1-methylethyl 5-norbornene-2-carboxylate, 1-methylcyclohexyl 5-norbornene-2-carboxylate, 2-methy-2-adamantane-2-yl 5-norbornene-2-carboxylate, 2-ethy-2-adamantane-2-yl 5-norbornene-2-carboxylate, 1-(4-methy-cyclohexyl)-1-methylethyl 5-norbornene-2-carboxylate, 1-(4-hydroxycyclohexyl)-1-methylethyl 5-norbornene-2-carboxylate, 1-methyl-(4-oxocyclohexyl)-1-ethyl 5-norbornene-2-carboxylate, and 1-(1-adamantane-1-yl)-1-methylethyl 5-norbornene-2-carboxylate.

A resin having a structural unit derived from the monomer (a1-3) can improve the resolution of the obtained resist composition because it has a bulky structure, and also can improve a dry-etching tolerance of the obtained resist composition because of incorporated a rigid norbornene ring into a main chain of the resin (AA).

When the resin (A) contains the structural unit derived from the monomer represented by the formula (a-3), the content thereof is generally 10 to 95 mol %, preferably 15 to 90 mol %, and more preferably 20 to 85 mol %, with respect to the total structural units constituting the resin (A).

Examples of a monomer having an acid-labile group and a carbon-carbon double bond include a monomer represented by the formula (a1-4).

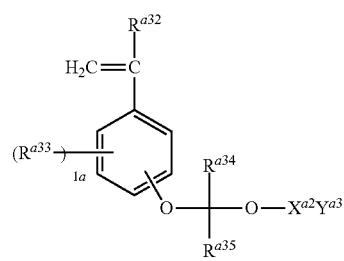

(a1-4)

wherein $R^{a32}$ represents a hydrogen atom, a halogen atom or a $C_1$ to $C_6$ alkyl group that optionally has a halogen atom;

$R^{a33}$ in each occurrence independently represent a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;

la represents an integer 0 to 4;

$R^{a34}$ and $R^{a35}$ independently represent a hydrogen atom or a $C_1$ to $C_{12}$ hydrocarbon group;

$X^{a2}$ represents a single bond or an optionally substituted $C_1$ to $C_{17}$ divalent aliphatic hydrocarbon group, and one or more —$CH_2$— contained therein may be replaced by —CO—, —O—, —S—, —$SO_2$— or —N($R^c$)—, $R^c$ represents a hydrogen atom or a $C_1$ to $C_6$ alkyl group;

$Y^{a3}$ represents a $C_1$ to $C_{18}$ hydrocarbon group, a hydrogen atom contained therein may be substituted with a halogen atom, a hydroxy group, a $C_1$ to $C_6$ alkyl group, a $C_1$ to $C_6$ alkoxy group, a $C_2$ to $C_4$ acyl group, and a $C_2$ to $C_4$ acyloxy group.

Examples of the alkyl group that optionally has a halogen atom of $R^{a32}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, trichloromethyl, perburomomethyl and periodomethyl groups.

Examples of the alkyl group, the alkoxy group and the like include the same examples described above.

Examples of the acyl group include acetyl, propionyl and butyryl groups.

Examples of the acyloxy group include acetyloxy, propionyloxy and butyryloxy groups.

In the formula (a1-4), the alkyl group of $R^{a32}$ and $R^{a33}$ is preferably a $C_1$ to $C_4$ alkyl group, more preferably a $C_1$ to $C_2$ alkyl group, and still more preferably methyl group.

The alkoxy group of $R^{a33}$ is preferably a $C_1$ to $C_4$ alkoxy group, more preferably a $C_1$ to $C_2$ alkoxy group, and still more preferably methoxy group.

Examples of the hydrocarbon group of $R^{a34}$ and $R^{a35}$ include any of an aliphatic hydrocarbon group, an alicyclic hydrocarbon group and an aromatic hydrocarbon group.

Preferred examples of the aliphatic group include iso-propyl, n-butyl, sec-butyl, tert-butyl, pentyl, hexyl, octyl, and 2-ethylhexylpentyl groups.

Preferred examples of the alicyclic hydrocarbon group include a monocyclic or polycyclic saturated hydrocarbon groups such as cyclohexyl, adamantyl, 2-alkyl-2-adamantan-2-ly, 1-(1-adamantan-1-yl)-1-alkyl and isobornyl groups.

Preferred examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Preferred examples of the hydrocarbon group of $Y^{a3}$ include a $C_1$ to $C_{18}$ aliphatic hydrocarbon group, a $C_3$ to $C_{18}$ alicyclic hydrocarbon group and a $C_6$ to $C_{18}$ aromatic hydrocarbon group.

Preferred examples of the substituent that may be optionally substituted to $X^{a2}$ and $Y^{a3}$ includes a hydroxy group.

Examples of the monomer represented by the formula (a1-4) include a monomer below.

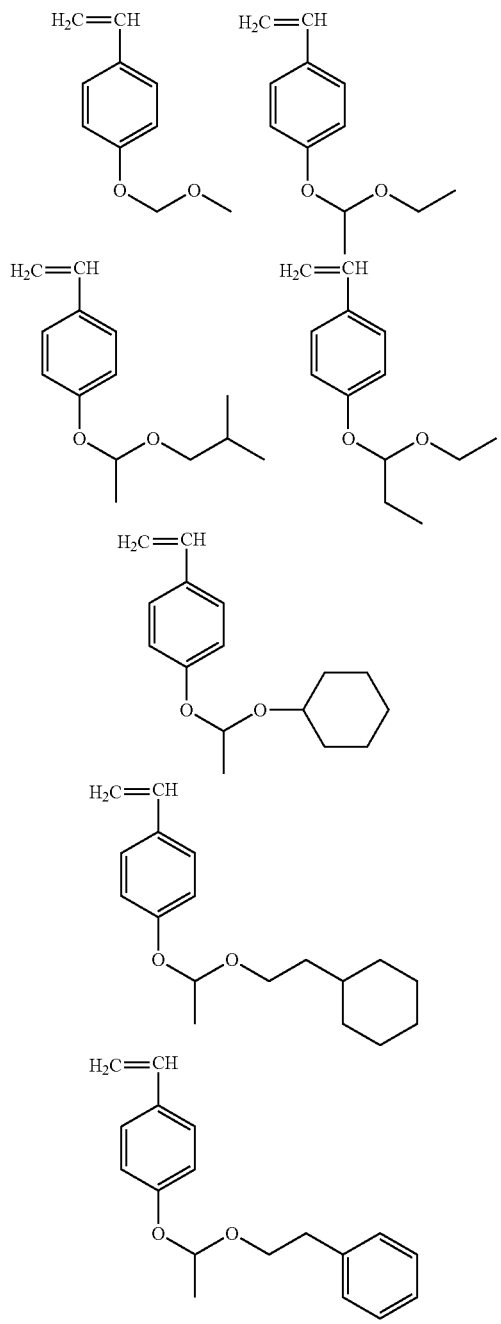
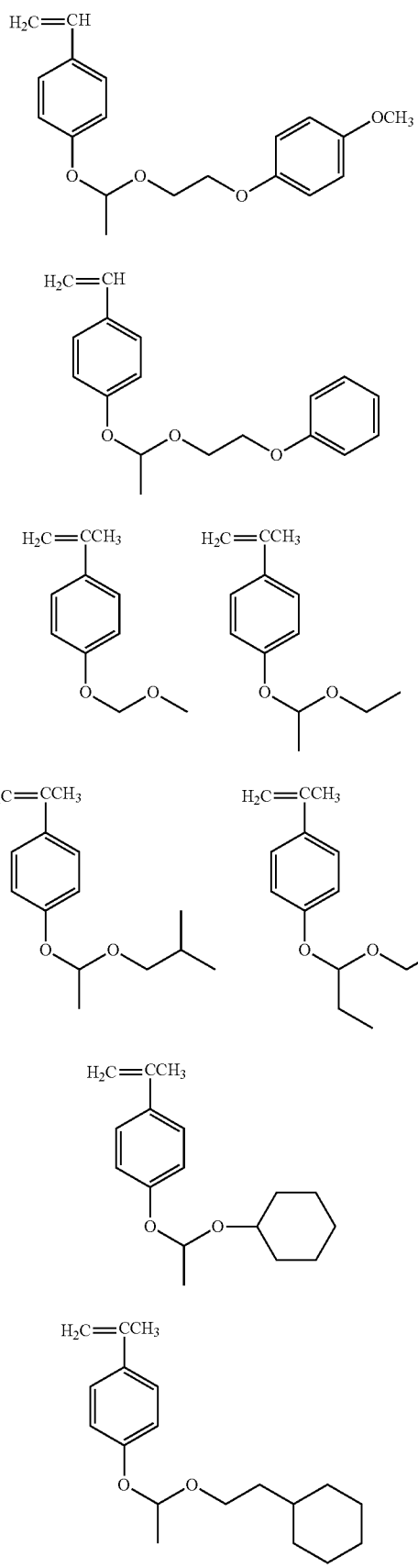

-continued
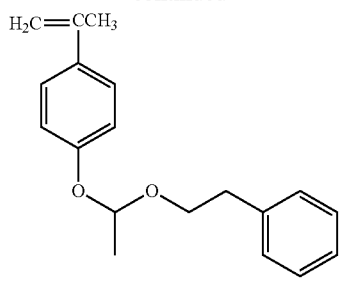
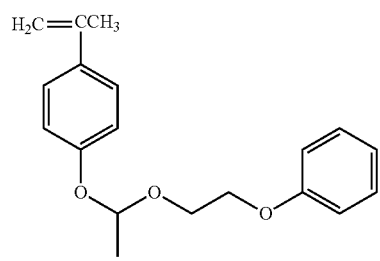
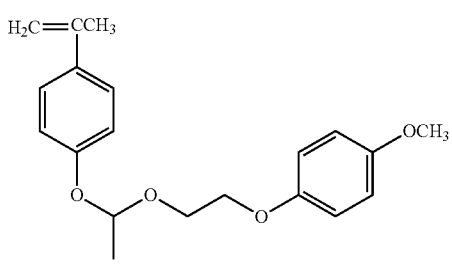
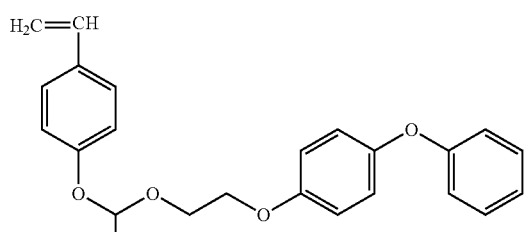
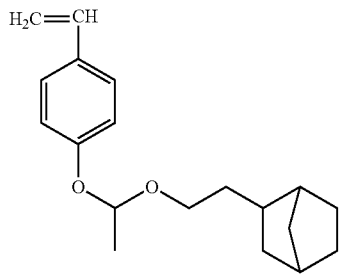
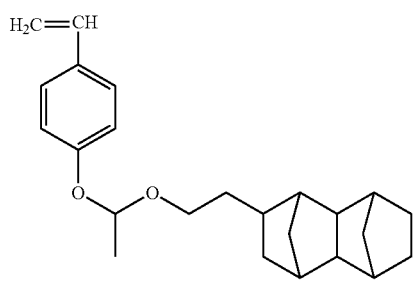
-continued
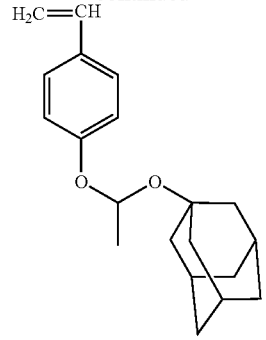
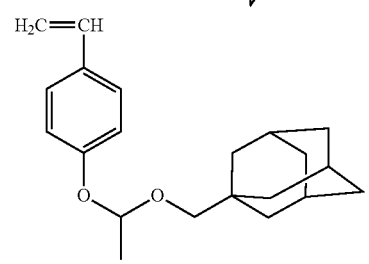
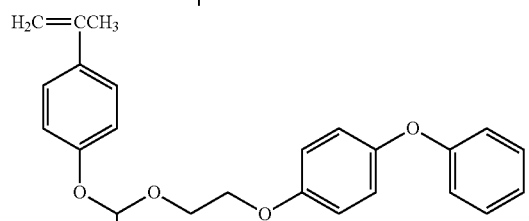
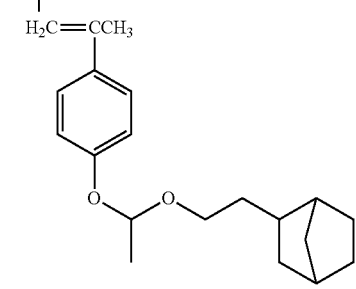
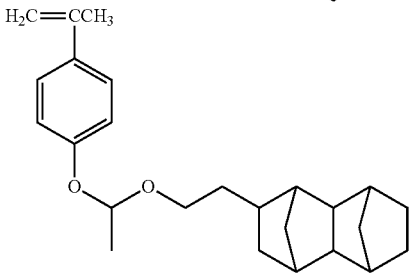
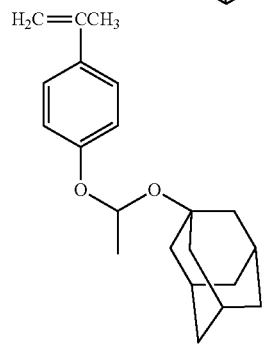

41
-continued
42
-continued
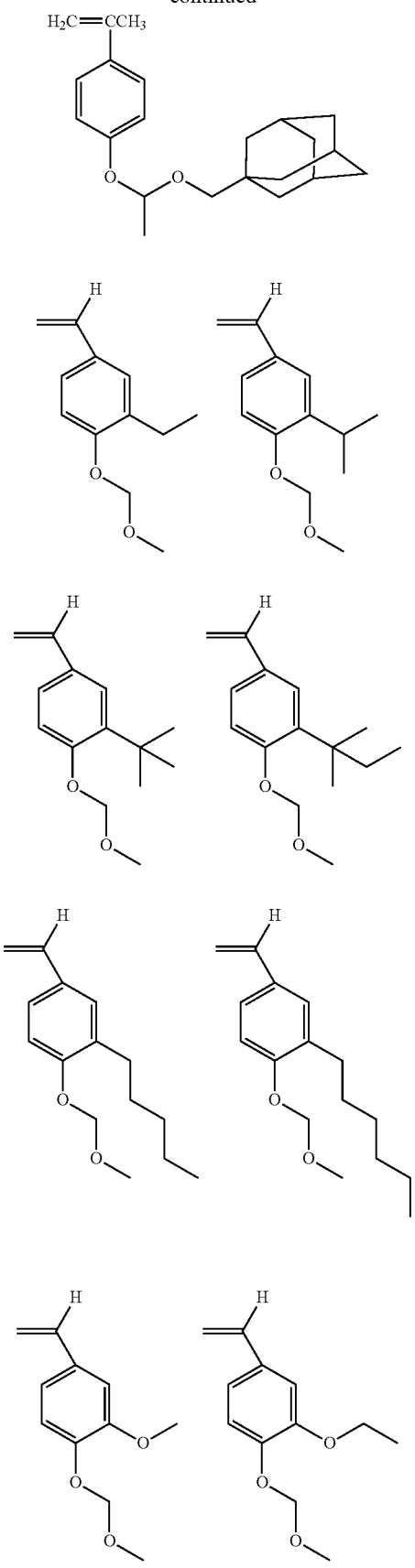
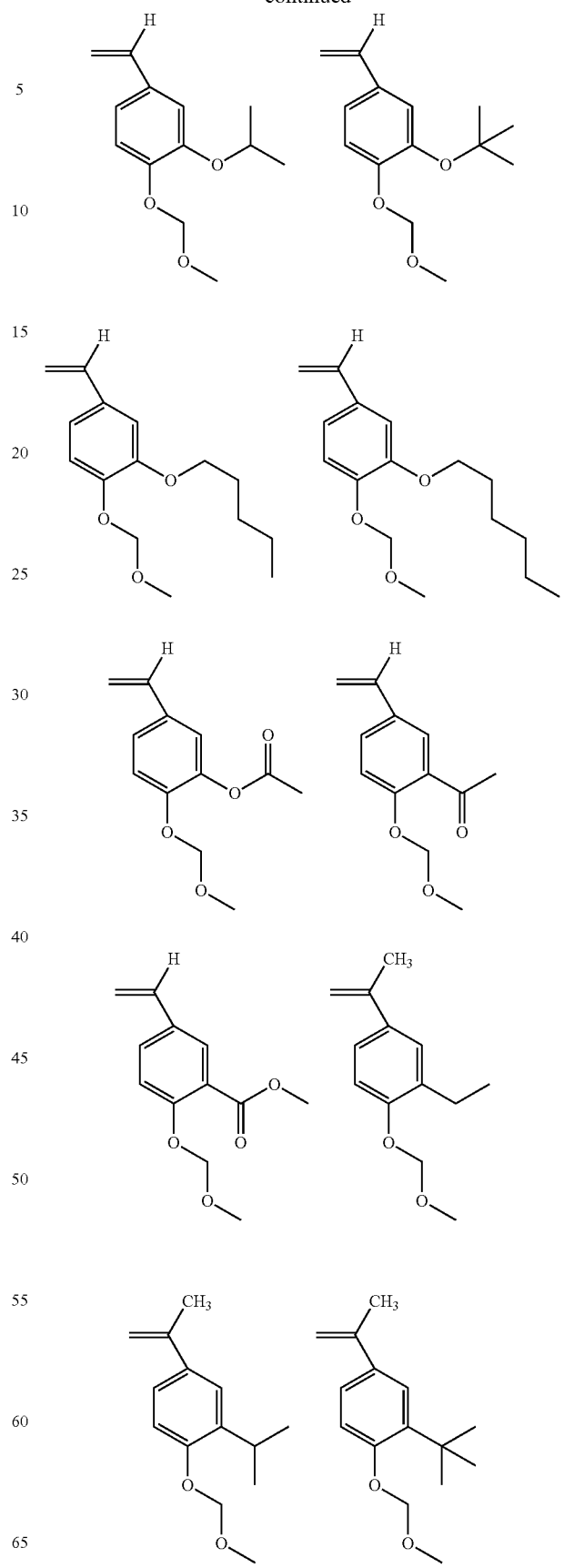

-continued

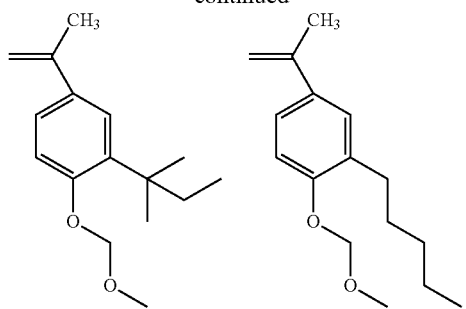
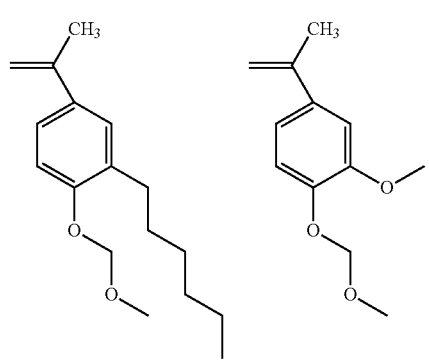
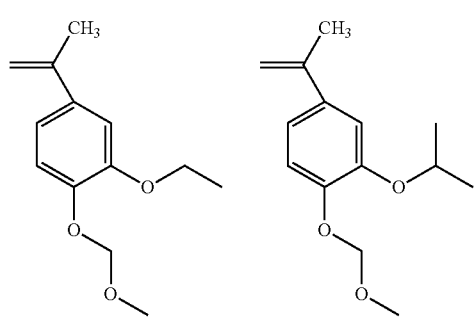
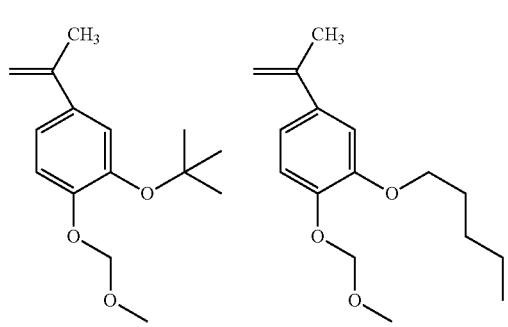
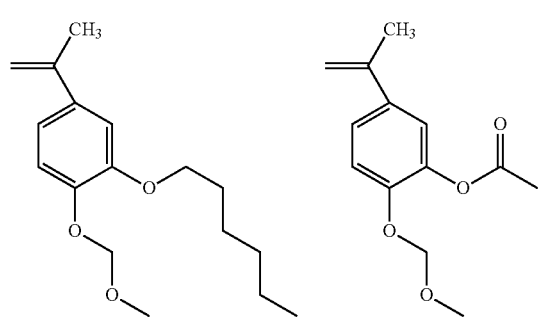

-continued

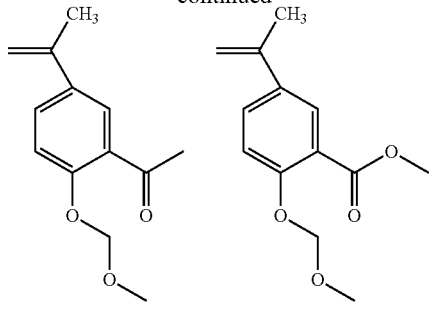
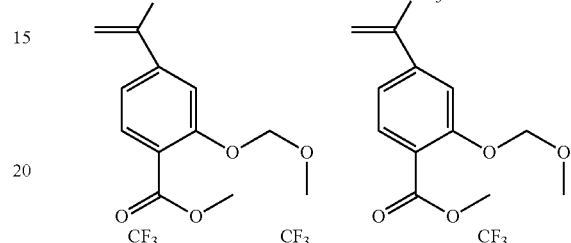
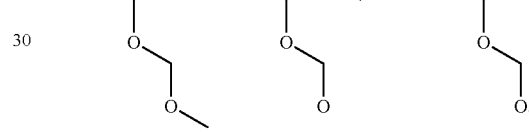

When the resin (AA) contains the structural unit derived from the monomer represented by the formula (a1-4), the content thereof is generally 10 to 95 mol %, preferably 15 to 90 mol %, more preferably 20 to 85 mol %, with respect to the total structural units constituting the resin (AA).

<Compound Represented by the Formula (a1-5)>

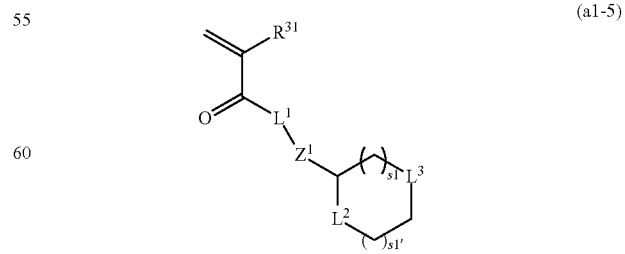

(a1-5)

wherein $R^{31}$ represents a hydrogen atom, a halogen atom or a $C_1$ to $C_6$ alkyl group that optionally has a halogen atom;

L¹ to L³ independently represent *—O—, *—S— or *—O—(CH$_2$)$_{k1}$—CO—O—, k1 represents an integer of 1 to 7, * represents a bond to the carbonyl group (—CO—);

s1 represents an integer of 1 to 4;

s1' represents an integer of 0 to 4;

Z¹ represents a single bond or an alkanediyl group, and the —CH$_2$— contained in the alkanediyl group may be replaced by —O— or —CO—.

In the formula (a1-5), $R^{31}$ is preferably a hydrogen atom, a methyl group or a trifluoromethyl group;

L¹ is preferably —O—;

L² and L³ are preferably —O— for one and —S— for another;

s1 is preferably 1;

s1' is preferably an integer of 0 to 2;

Z¹ is preferably a single bond or —CH$_2$—CO—O—.

Examples of the compound represented by the formula (a1-5) include compounds below.

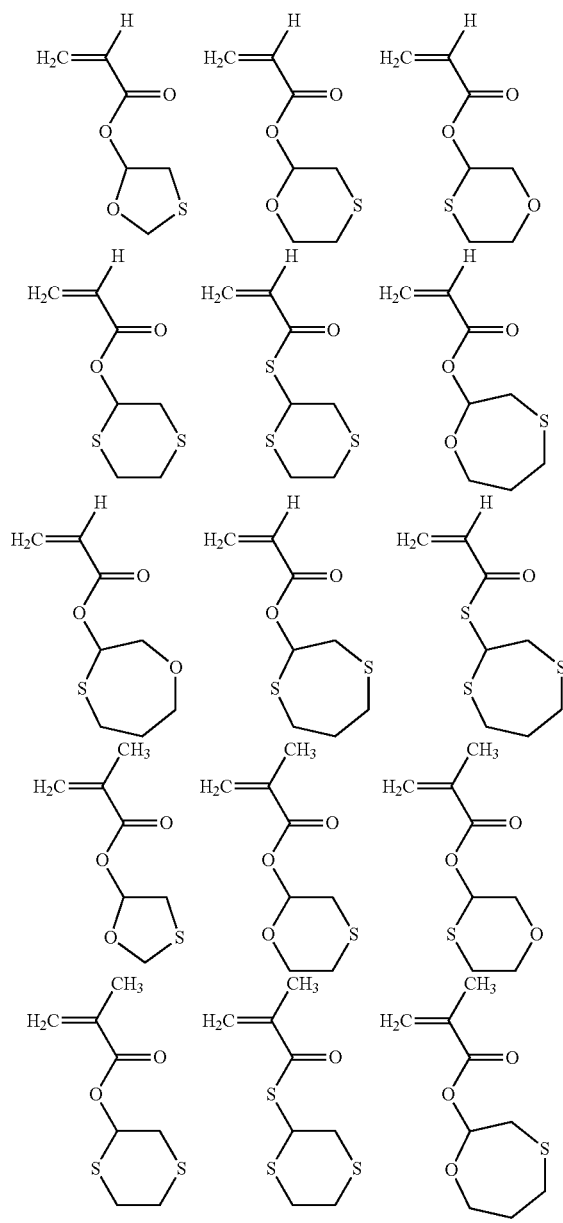

-continued

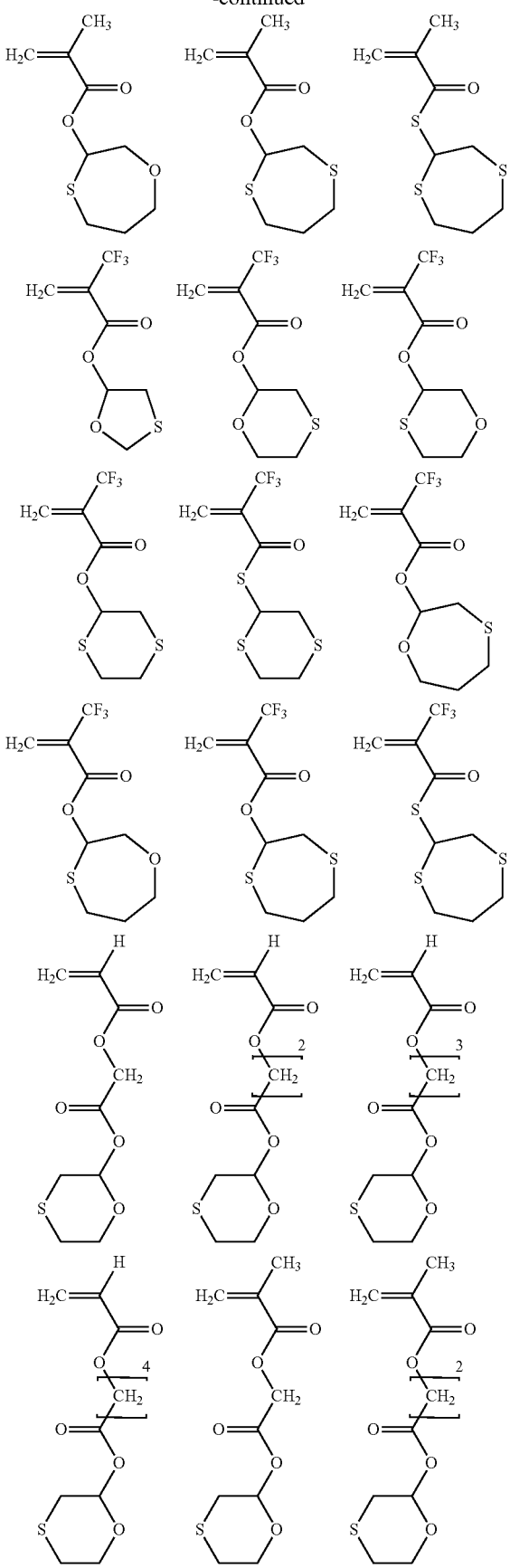

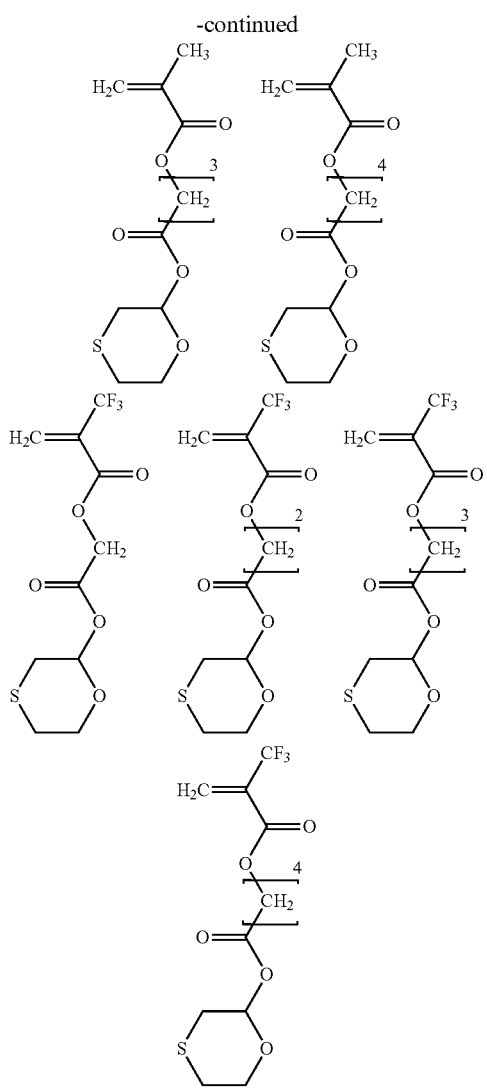

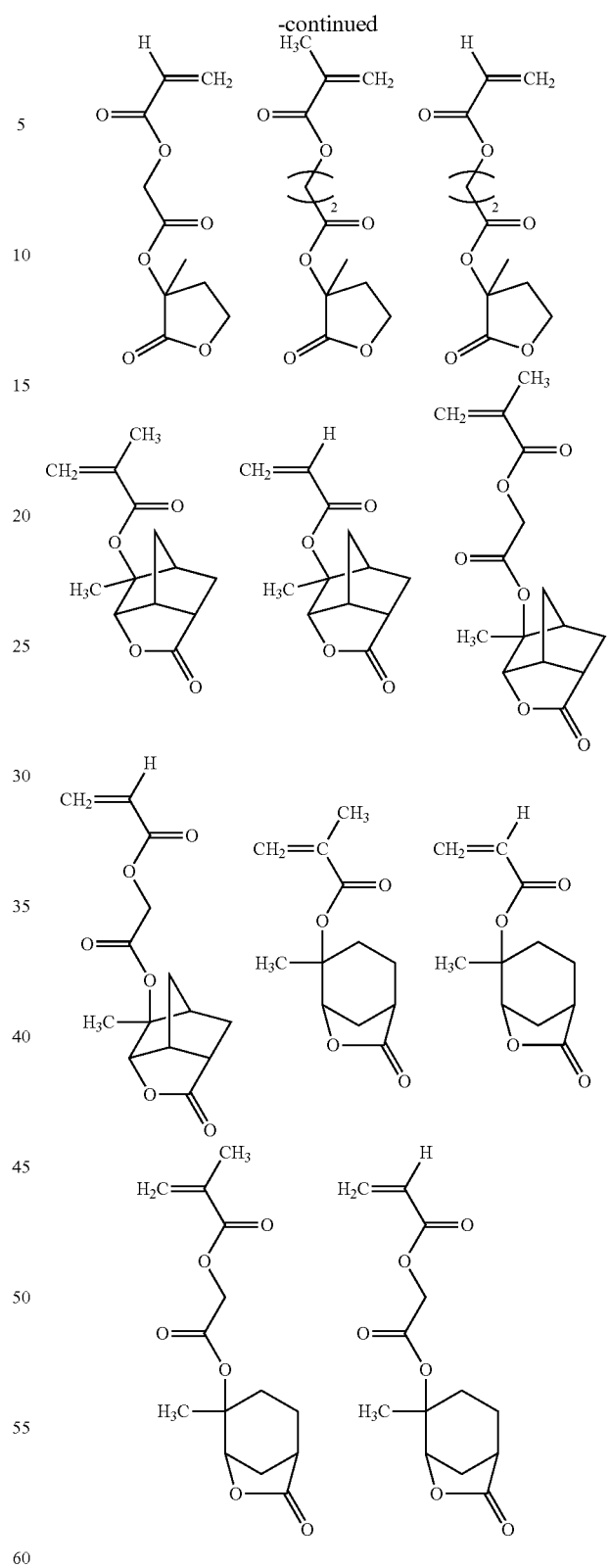

When the resin (AA) contains the structural unit derived from the monomer represented by the formula (a1-5), the content thereof is generally 10 to 95 mol %, preferably 15 to 90 mol %, and more preferably 20 to 85 mol %, with respect to the total structural units constituting the resin (AA).

Further, a monomer derived from another structural unit having an acid-labile group and carbon-carbon double bond may be used for the resin (AA).

Specific examples of such another monomer include a monomer below.

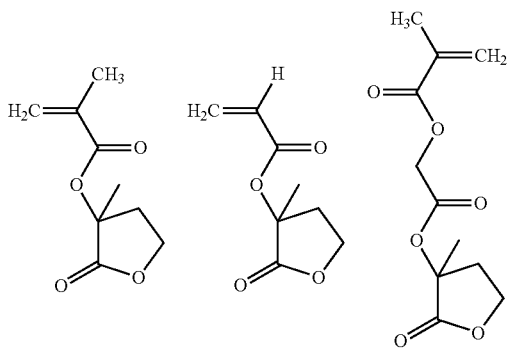

When the resin (AA) contains the structural unit derived from the other acid-labile monomer, the total content thereof is generally 10 to 95 mol %, preferably 15 to 90 mol %, and more preferably 20 to 85 mol %, with respect to the total structural units constituting the resin (AA).

When the resin (A) contains the structural unit derived from the monomer (a1), the total content thereof is generally 10 to 95 mol %, preferably 20 to 85 mol %, with respect to the total structural units of the resin (A).

<Acid-Stable Monomer>

The resin (AA) is preferably a copolymer of the compound (a), the monomer having the acid-labile group (a-1) and a monomer not having the acid-labile group (hereinafter may be referred to as an "acid-stable monomer"). The acid-stable monomer may be used singly or mixture of two or more.

As the acid-stable monomer, a monomer having a hydroxy group or a lactone ring is preferable. When a resin containing the structural unit derived from the acid-stable monomer having hydroxy group or the acid-stable monomer having a lactone ring is used, the adhesiveness of resist to a substrate and resolution of resist tend to be improved.

<Acid-Stable Monomer (a2)>

When KrF excimer laser lithography (248 nm), or high-energy irradiation such as electron beam or EUV light is used for the resist composition, using the acid-stable monomer having a phenolic hydroxy group (a2-0) such as hydroxystyrenes as the acid-stable monomer having the hydroxy group is preferable. When ArF excimer laser lithography (193 nm), i.e., short wavelength excimer laser lithography is used, using the acid-stable monomer having a hydroxy adamantyl group represented by the formula (a2-1) as the acid-stable monomer having the hydroxy group is preferable. The acid-stable monomer having hydroxy group may be used singly or mixture of two or more.

Examples of the acid-stable monomer having phenolic hydroxy group include styrene monomer represented by the formula (a2-0) such as p- or m-hydroxystyrene.

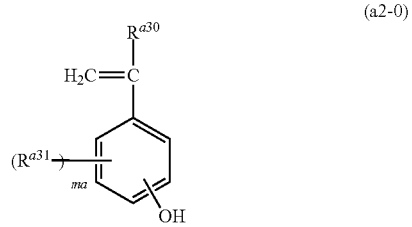

(a2-0)

wherein $R^{a30}$ represents a hydrogen atom, a halogen atom or a $C_1$ to $C_6$ alkyl group that optionally has a halogen atom;
$R^{a31}$ in each occurrence independently represents a halogen atom, a hydroxy group, a $C_1$ to $C_6$ alkyl group, a $C_1$ to $C_6$ alkoxy group, a $C_2$ to $C_4$ acyl group, a $C_2$ to $C_4$ acyloxy group, an acryloyl group or methacryloyl group;
ma represents an integer 0 to 4.

In the formula (a2-0), the alkyl group of $R^{a30}$ and $R^{a31}$ is preferably a $C_1$ to $C_4$ alkyl group, more preferably a $C_1$ to $C_2$ alkyl group, and still more preferably methyl group.

The alkoxy group is preferably a $C_1$ to $C_4$ alkoxy group of $R^{a31}$, more preferably a $C_1$ to $C_2$ alkoxy group, and still more preferably methoxy group.

ma is preferably 0, 1 or 2, more preferably 0 or 1, and still more preferably 0.

When the resin (A) is produced using the acid-stable monomer having a phenolic hydroxy group (a2-0), a monomer in which the phenolic hydroxy group is protected by a protecting group can be used. Such protecting group may be a group which can be deprotected by contacting with an acid. Because the phenolic hydroxy group protected by the protecting group is deprotected by contacting with the acid, the acid-stable monomer (a2-0) can be easily obtained. However, when the phenolic hydroxy group protected by the protecting group is depeotected, the phenolic hydroxy group is preferably placed in contact with a base to deprotect so that the acid-labile group does not become seriously impaired because the resin (AA) has the structural unit derived from the monomer having the acid-labile group (a1) as described above. Examples of the protecting group which is deprotectable by the base include an acetyl group. Examples of the base include 4-dimethylaminopyrizine and triethylamine.

Specific examples of the acid-stable monomer (a2-0) include a monomer below.

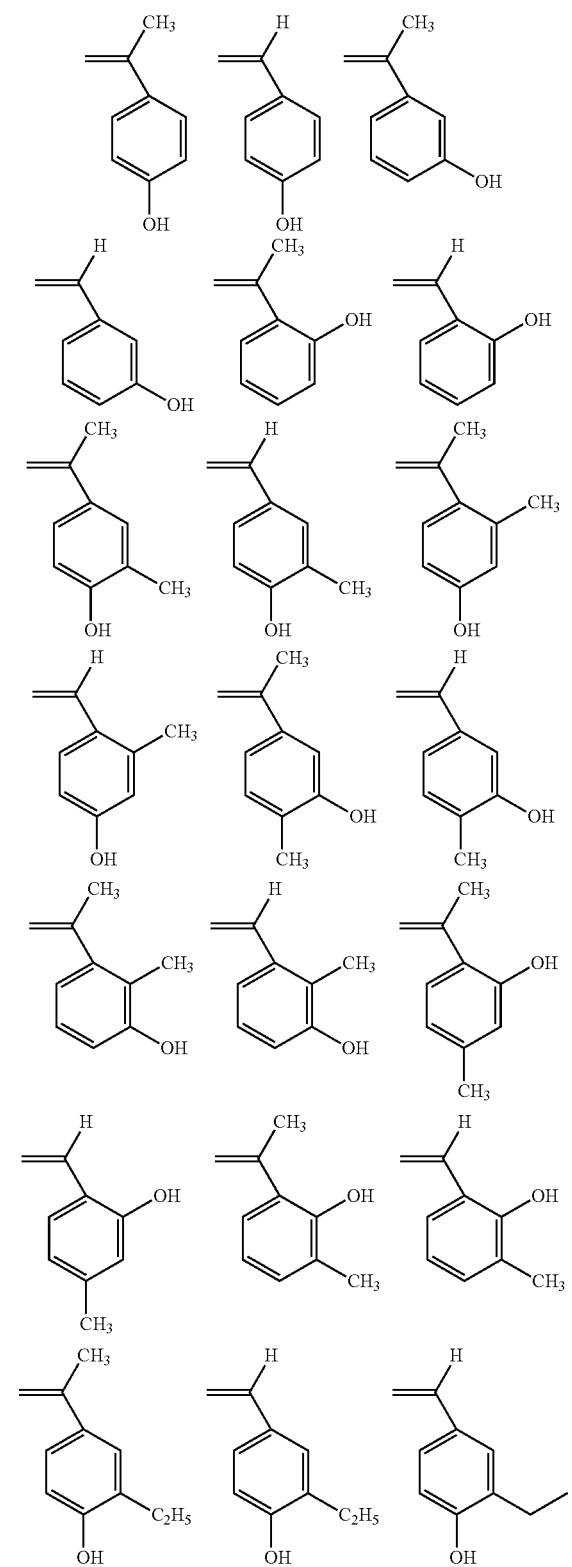

-continued

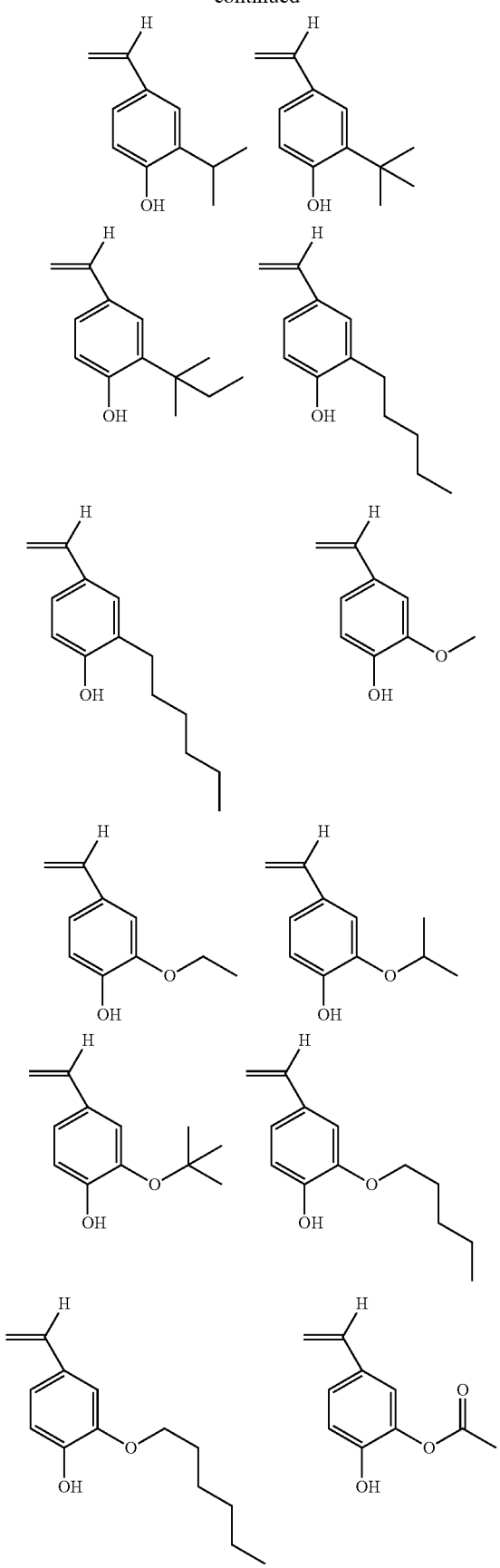
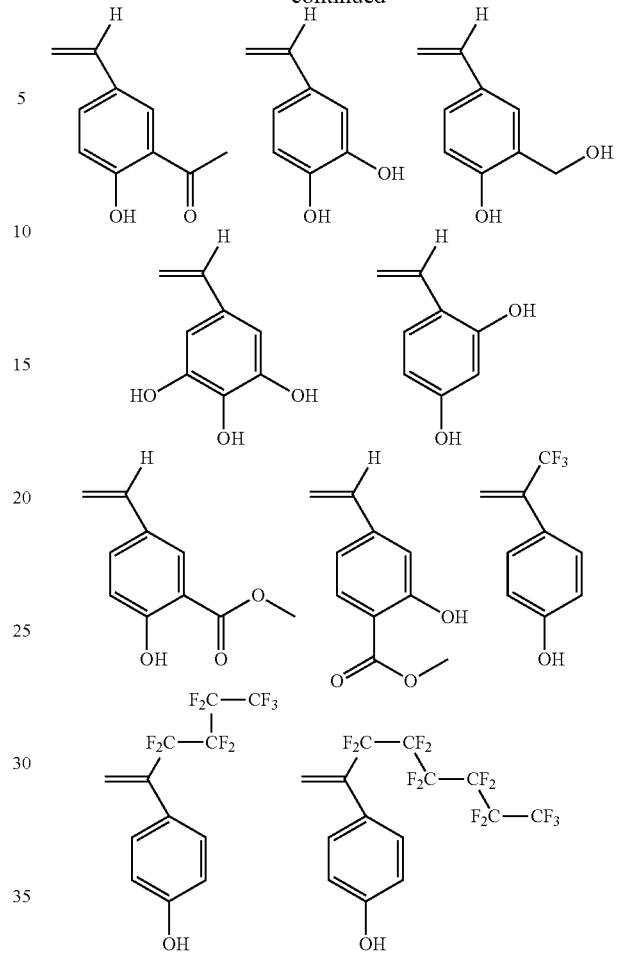

Among these, 4-hydroxystyrene and 4-hydroxy-a-methyl-styrene are preferable. These 4-hydroxystyrene and 4-hydroxy-a-methylstyrene may be protected its phenolic hydroxy group by an appropriate protecting group.

When the resin (AA) contains the structural unit derived from the monomer represented by the formula (a2-1), the content thereof is generally 5 to 95 mol %, preferably 10 to 80 mol %, and more preferably 15 to 80 mol %, with respect to the total structural units constituting the resin (AA).

Examples of the acid-stable monomer having a hydroxy adamantyl group include a monomer represented by the formula (a2-1).

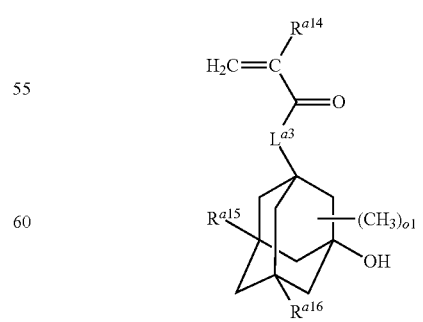

(a2-1)

wherein $L^{a3}$ represents *—O— or *—O—$(CH_2)_{k2}$—CO—O—, k2 represents an integer of 1 to 7, * represents a bond to a carbonyl group (—CO—);

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably *—O—, *—O—$(CH_2)_{k2}$—CO—O—, here k2 represents an integer of 1 to 4, and more preferably *—O—;

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid-stable monomer having the hydroxy adamantyl group include a monomer below. Among these, 3-hydroxyadamantane-1-yl(meth)acrylate, 3,5-dihydroxyadamantane-1-yl(meth)acrylate and 1-(3,5-dihydroxyadamantane-1-yl oxycarbonyl) methyl (meth)acrylate are preferable, and 3-hydroxyadamantane-1-yl(meth)acrylate and 3,5-dihydroxyadamantane-1-yl(meth)acrylate are more preferable, and 3-hydroxyadamantane-1-yl methacrylate and 3,5-dihydroxyadamantane-1-yl methacrylate are still more preferable.

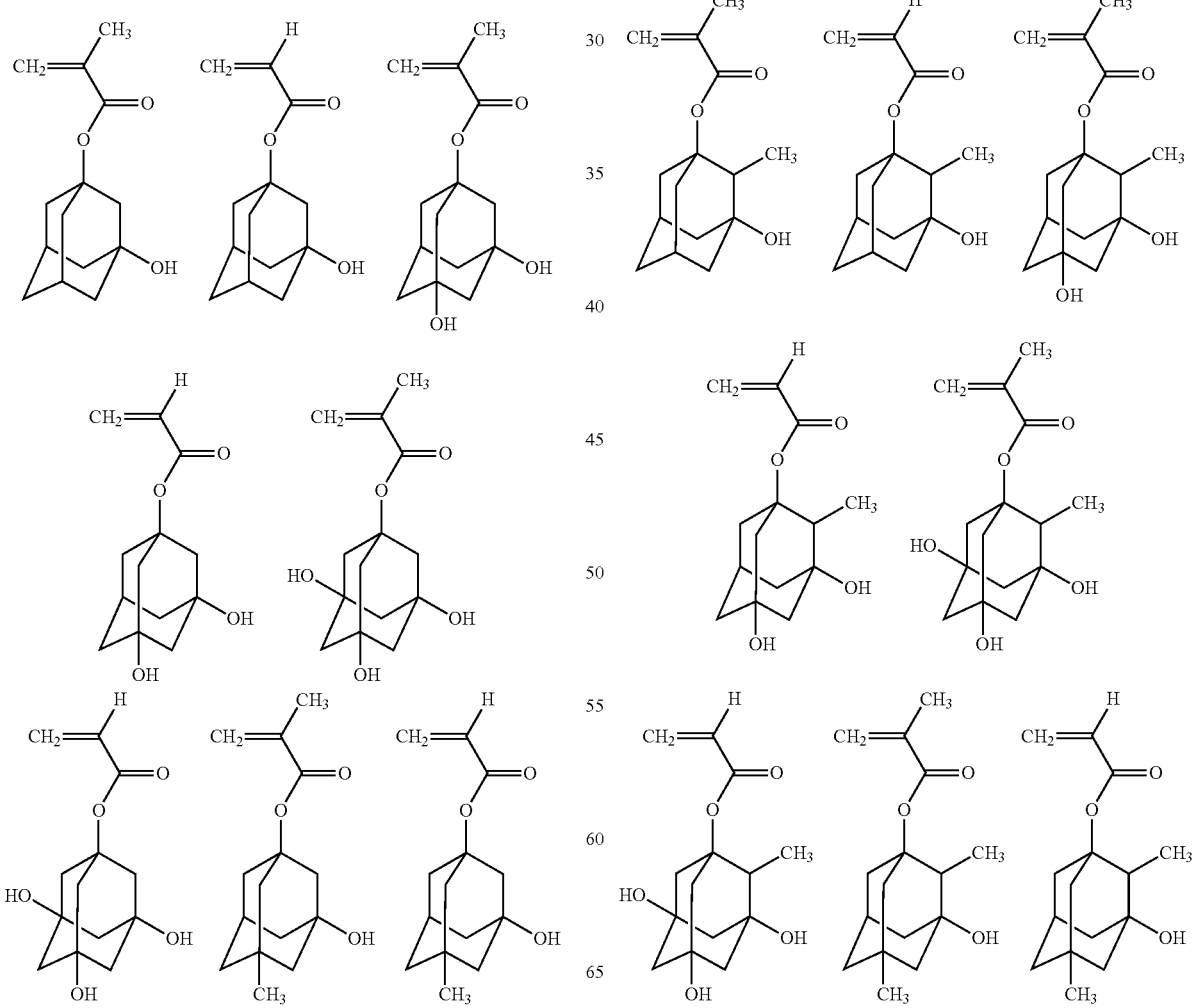

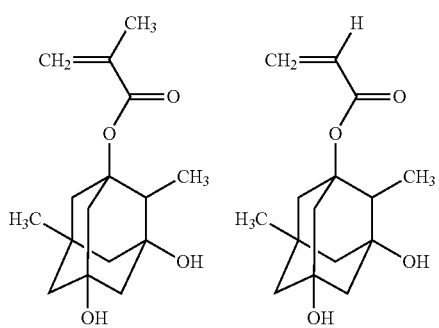
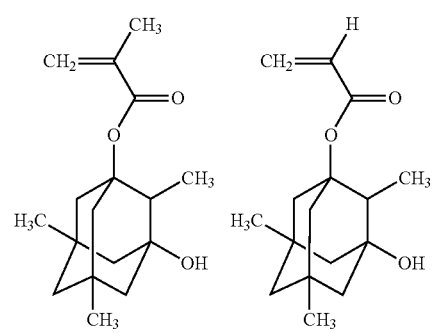
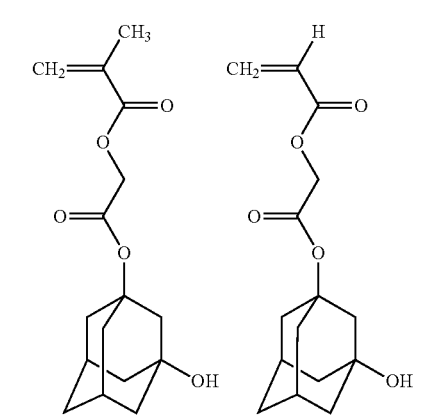
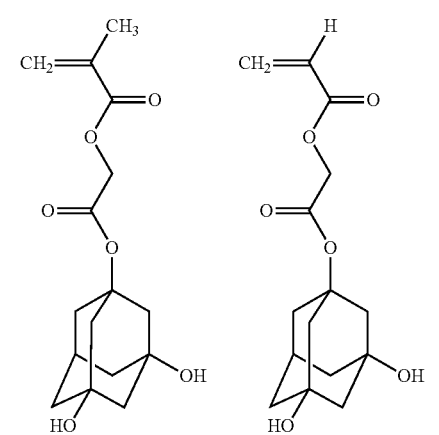
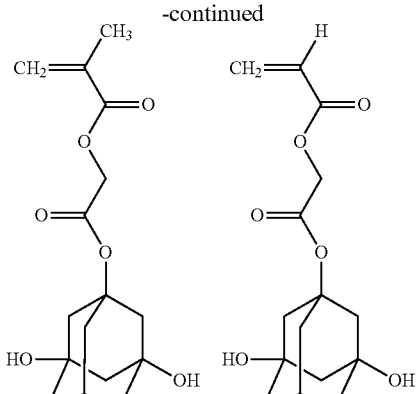
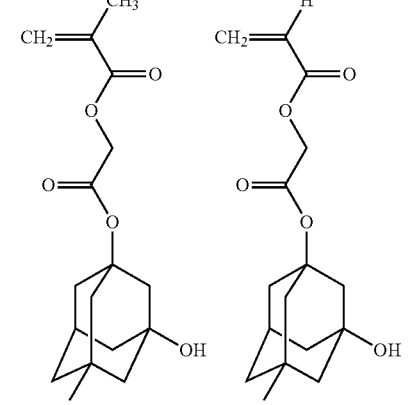
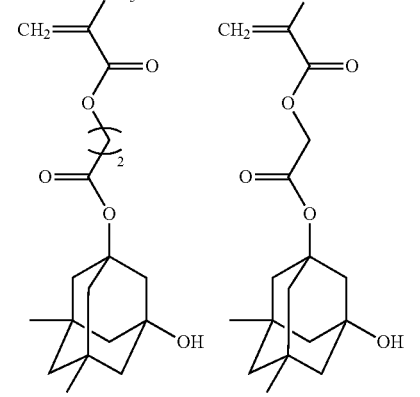
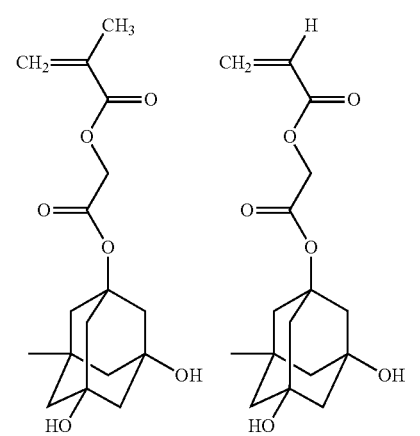

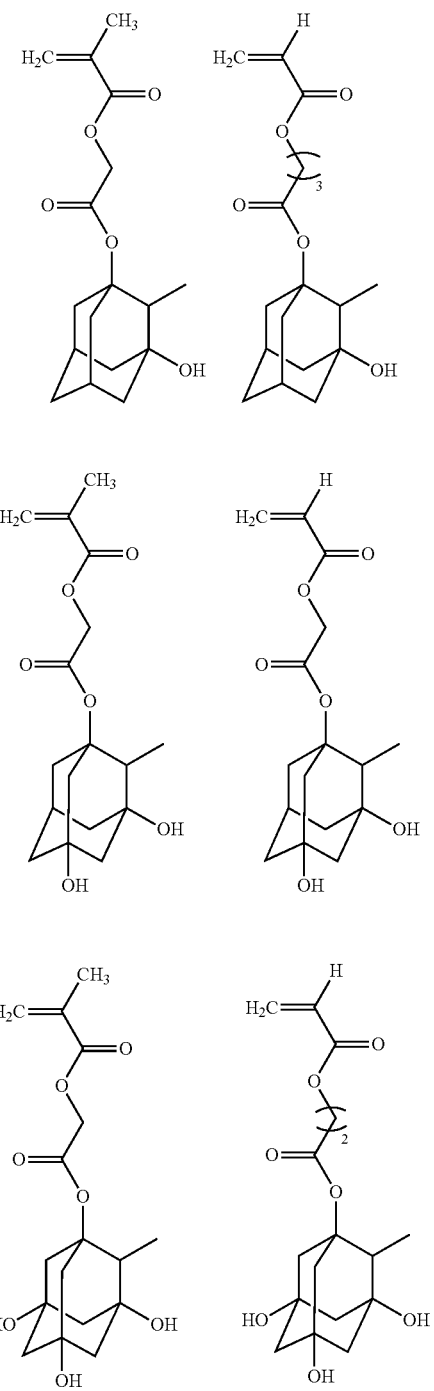

When the resin (AA) contains the structural unit derived from the monomer represented by the formula (a2-1), the content thereof is generally 3 to 40 mol %, preferably 5 to 35 mol %, and more preferably 5 to 30 mol %, with respect to the total structural units constituting the resin (AA).

<Acid-Stable Monomer (a3)>

The lactone ring included in the acid-stable monomer (a3) may be a monocyclic compound such as β-propiolactone ring, γ-butyrolactone, δ-valerolactone, or a condensed ring with monocyclic lactone ring and other ring. Among these, γ-butyrolactone and condensed ring with γ-butyrolactone and other ring are preferable.

Examples of the acid-stable monomer having the lactone ring include monomers represented by any of the formula (a3-1), the formula (a3-2) or the formula (a3-3). These monomer may be used singly or mixture of two or more.

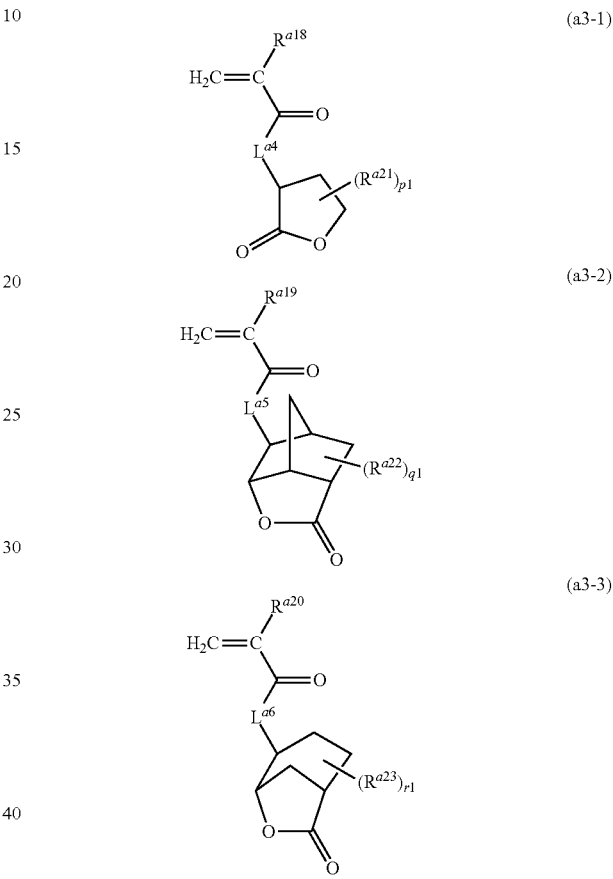

wherein $L^{a4}$ to $L^{a6}$ independently represents *—O— or *—O—$(CH_2)_k$—CO—O—, k represents an integer of 1 to 7, * represents a bond to a carbonyl group;

$R^{a18}$ to $R^{a20}$ independently represents a hydrogen atom or a methyl group;

$R^{a21}$ represents a $C_1$ to $C_4$ alkyl group;

$R^{a22}$ and $R^{a23}$ independently represent a carboxy group, a cyano group or a $C_1$ to $C_4$ alkyl group;

p1 represents an integer of 0 to 5;

q1 and r1 independently represent an integer of 0 to 3.

In the formulae (a3-1) to (a3-3), $L^{a4}$ to $L^{a6}$ is independently preferably *—O—, *—O—$(CH_2)_f$—CO—O—, here f represents an integer of 1 to 4, and more preferably *—O—. $R^{a18}$ to $R^{a20}$ is preferably a methyl group.

$R^{a21}$ is preferably a methyl group.

$R^{a22}$ and $R^{a23}$ are independently preferably a carboxy group, a cyano group or a methyl group.

p1, q1 and r1 are independently preferably an integer of 0 to 2, and more preferably 0 or 1.

Examples of the acid-stable monomers having γ-butyrolactone ring (a3-1) include a monomer below.

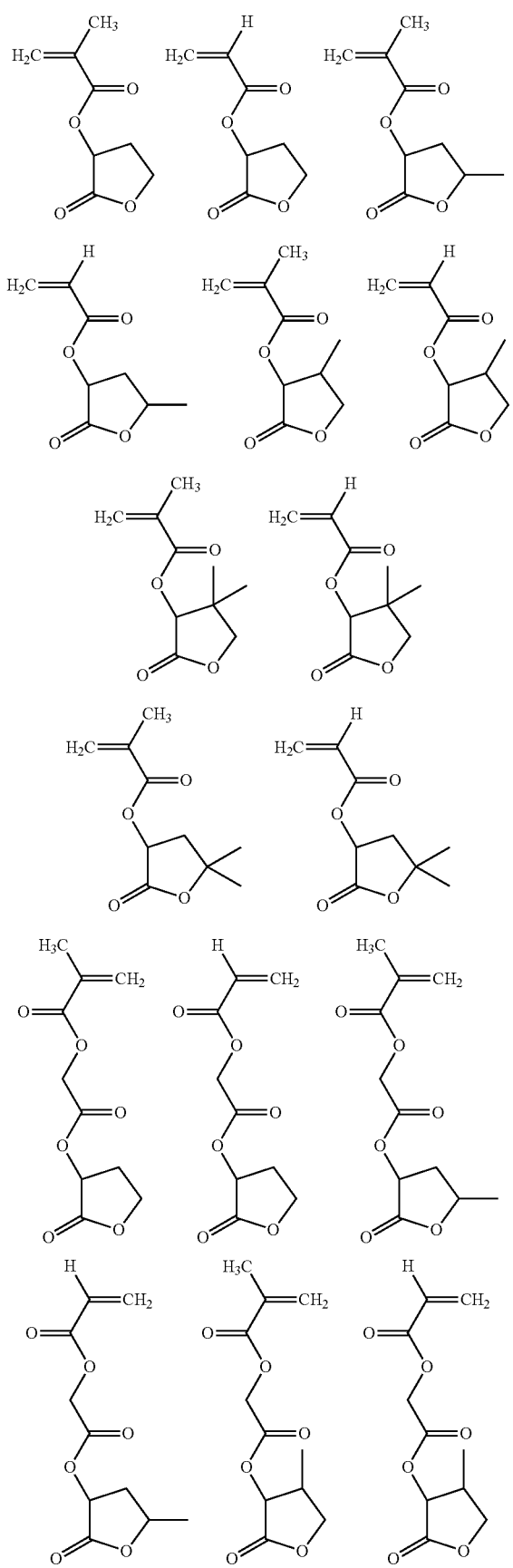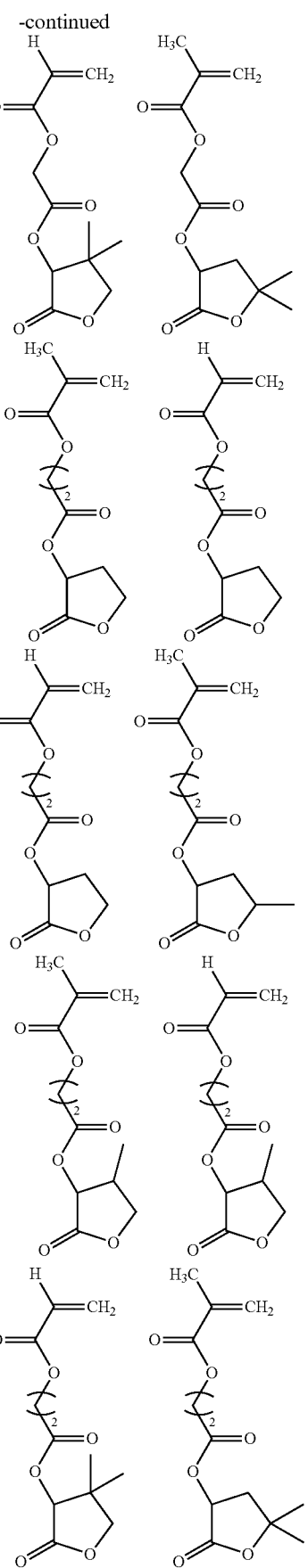

-continued
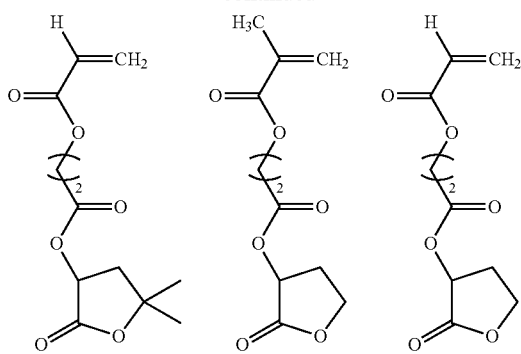
Examples of the acid-stable monomers having γ-butyrolactone ring and norbornene ring represented by the formula (a3-2) include a monomer below.
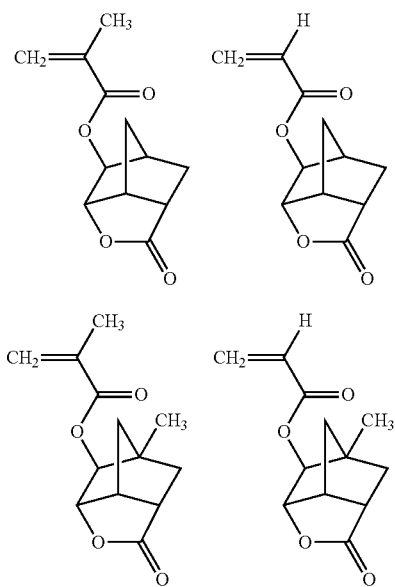
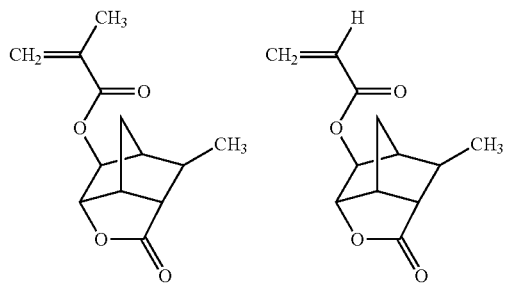
-continued
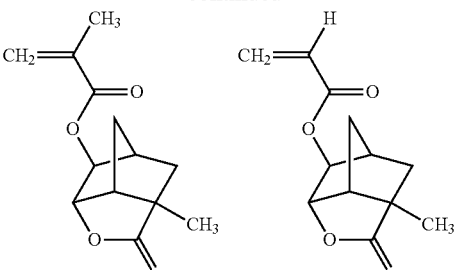
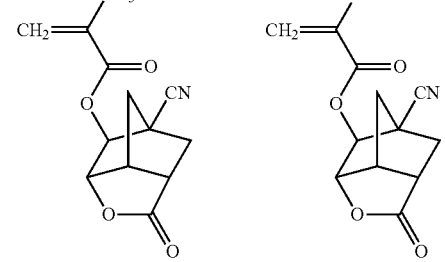
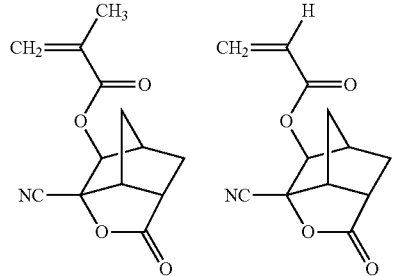
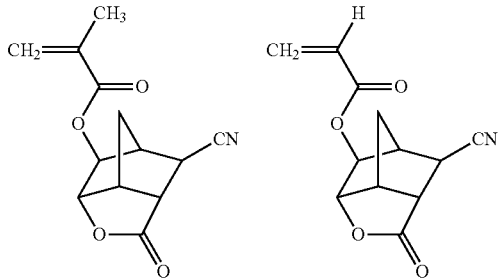
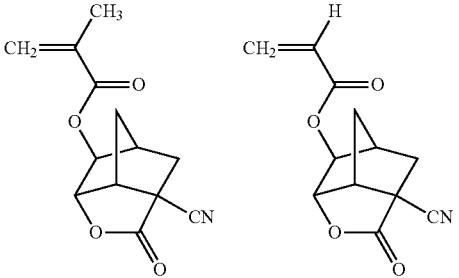
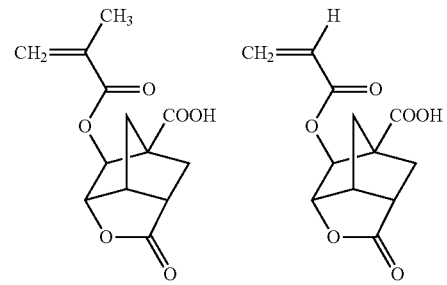

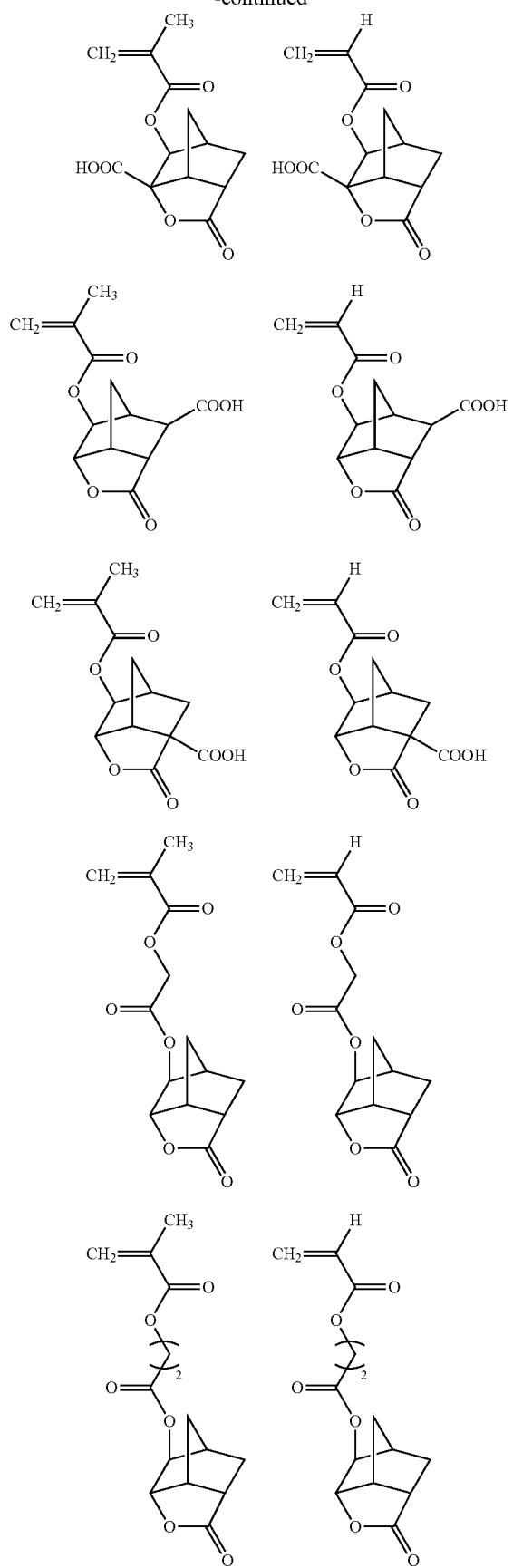
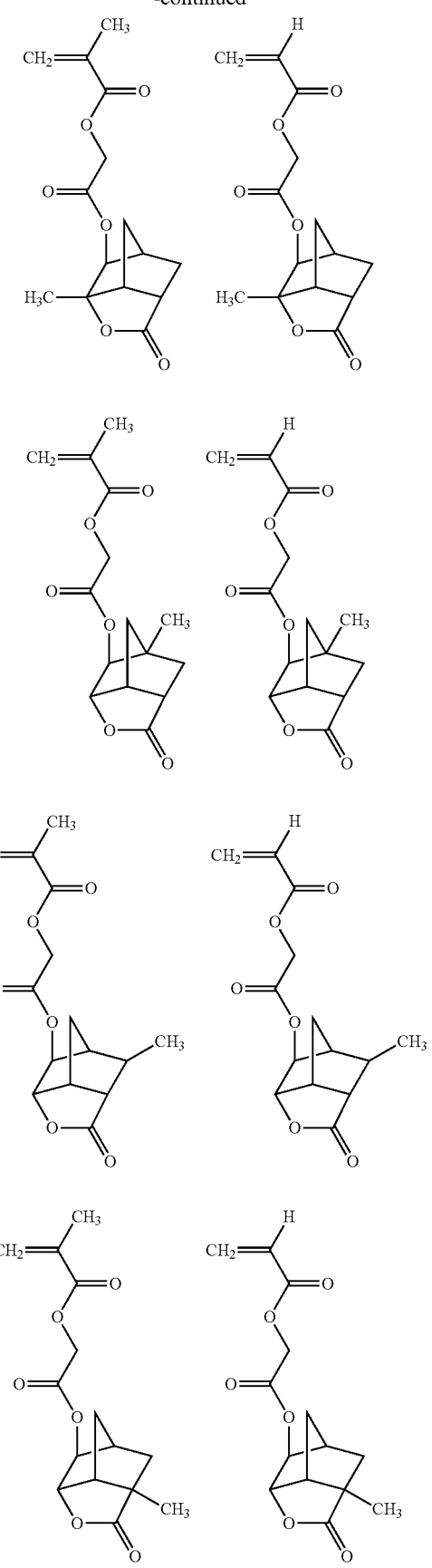

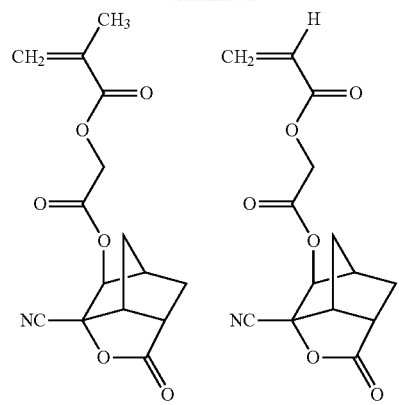
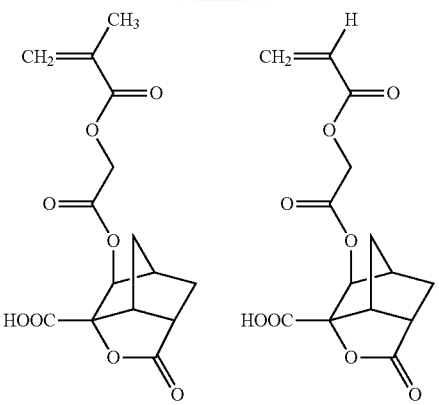
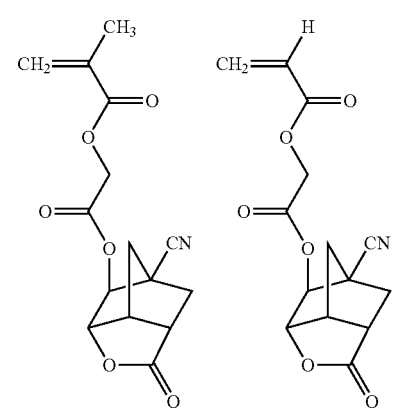
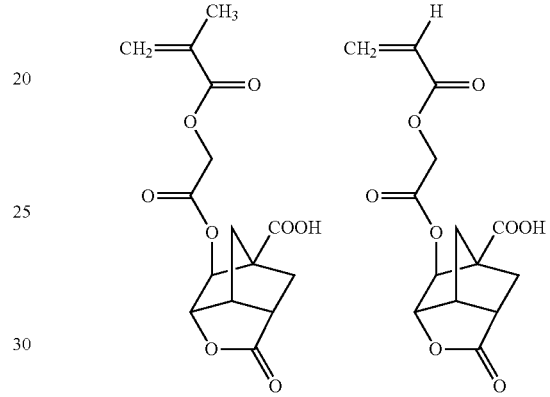
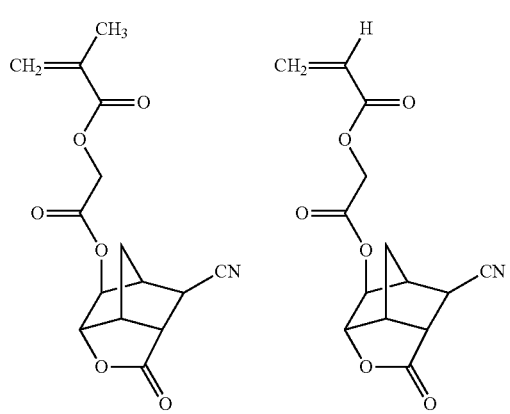
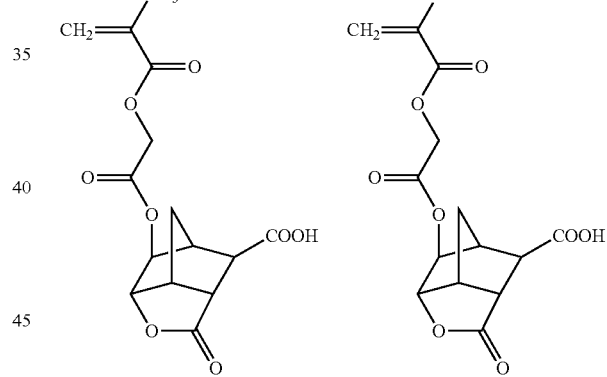
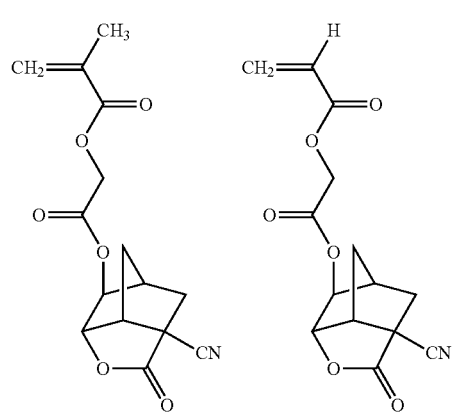
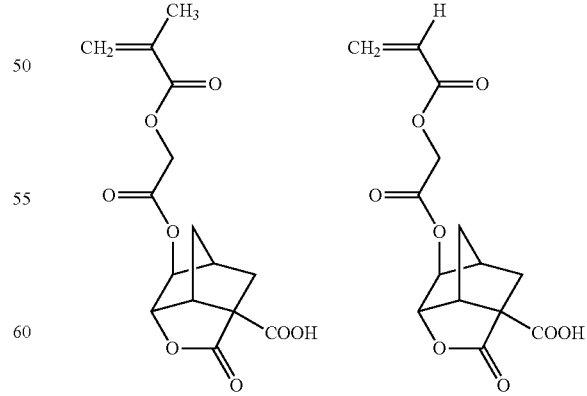
Examples of the acid-stable monomers having a condensed ring with γ-butyrolactone ring and cyclohexane ring represented by the formula (a3-3) include a monomer below.

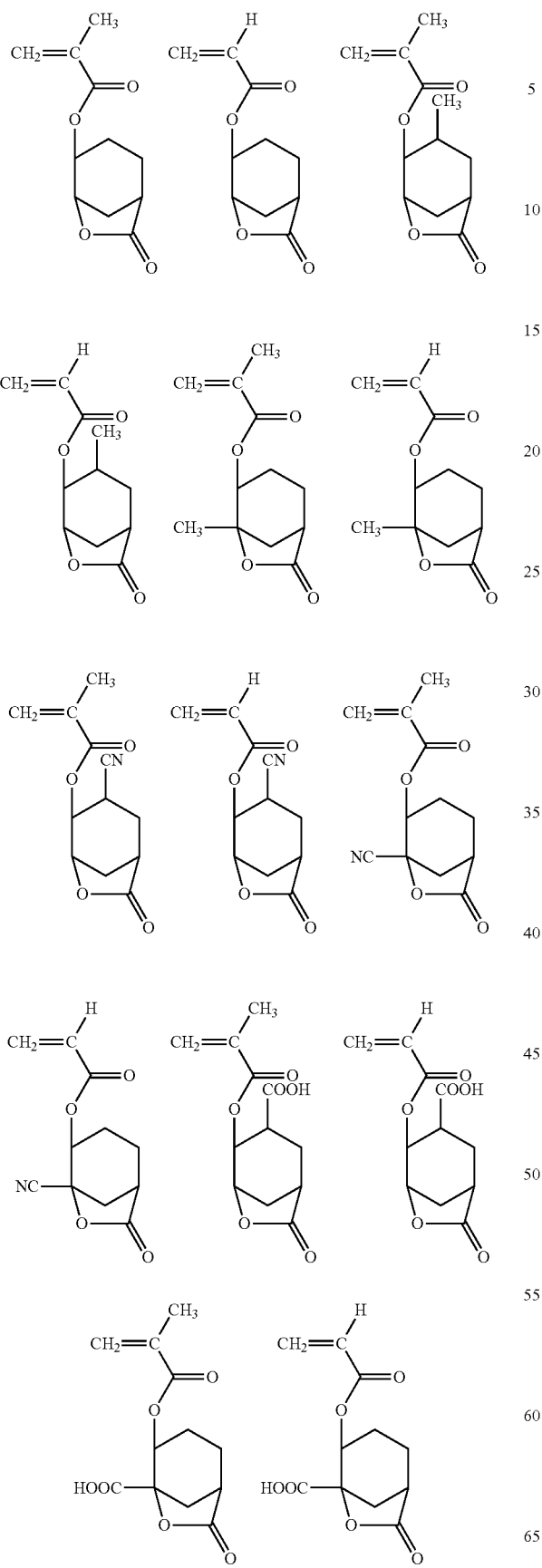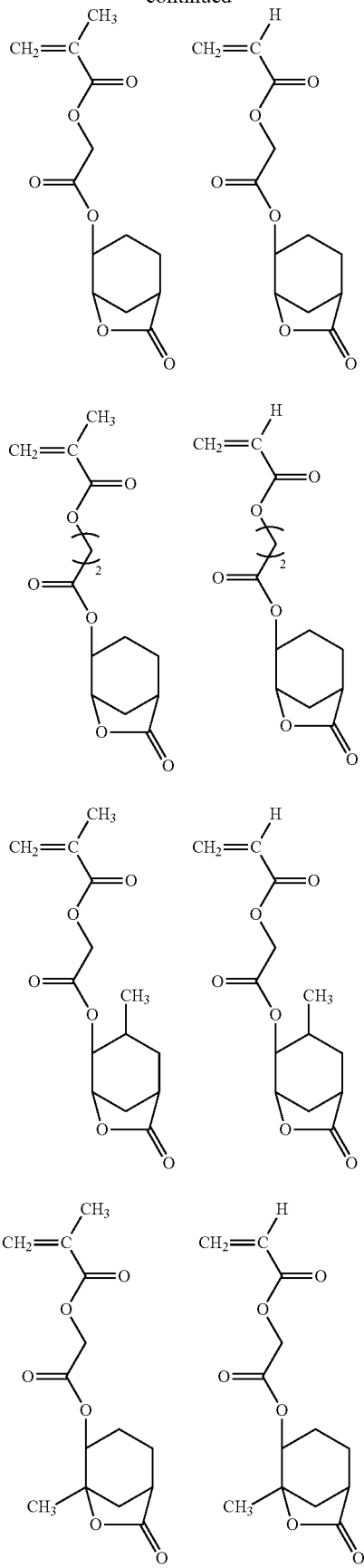

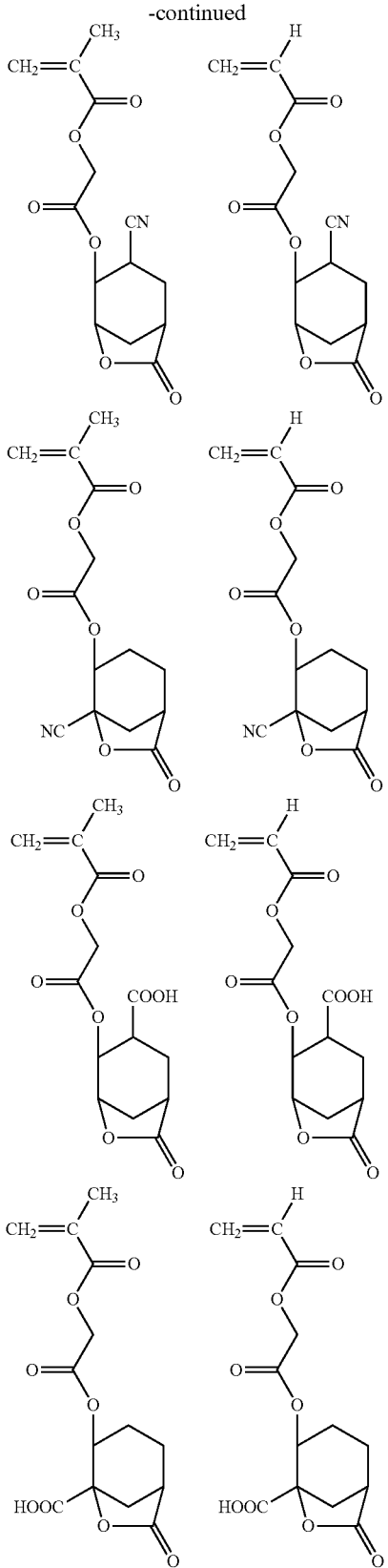

atricyclo[4.2.1.0$^{3,7}$]nonane-2-yloxy)-2-oxoethyl(meth)acrylate are preferable, and the (meth)acrylate compounds are more preferable.

When the resin (AA) contains the structural unit derived from the monomer represented by the formula (a3-1), the structural unit derived from the monomer represented by the formula (a3-2) and/or the structural unit derived from the monomer represented by the formula (a3-3), the content thereof is generally 5 to 50 mol %, preferably 10 to 40 mol %, and more preferably 15 to 40 mol %, respectively, with respect to the total structural units constituting the resin (AA).

When the resin (AA) contains the structural unit derived from the monomer (a3) having a lactone ring, the total content thereof is preferably 5 to 60 mol %, and more preferably 15 to 55 mol %, with respect to the total structural units constituting the resin (AA).

<Acid-Stable Monomer (a4)>

An acid-stable monomer (a4) and an acid-stable monomer (a5) may be used for the production of the resin (AA).

The acid-stable monomer (a4) has a group represented by the formula (3) below.

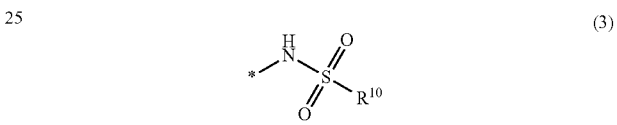

(3)

wherein $R^{10}$ represents a $C_1$ to $C_6$ fluorinated alkyl group.

Examples of the fluorinated alkyl group include difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, 1-(trifluoromethyl)-1,2,2,2-tetratrifluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoromethyl)-2,2,2-trifluoroethyl, 2-(perfluoropropyl)ethyl, 1,1,2,2,3,3,4,4-octafluoropentyl, perfluoropentyl, 1,1,2,2,3,3,4,4,5,5-decafluoropentyl, 1,1-bis(trifluoromethyl)-2,2,3,3,3-pentafluoropropyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexyl groups.

The fluorinated alkyl group preferably has 1 to 4 carbon atom, more preferably trifluoromethyl, perfluoroethyl and perfluoropropyl groups, and still more preferably trifluoromethyl group.

Specific examples of the acid stable monomer (a4) having the group represented by the formula (3) include a monomer below.

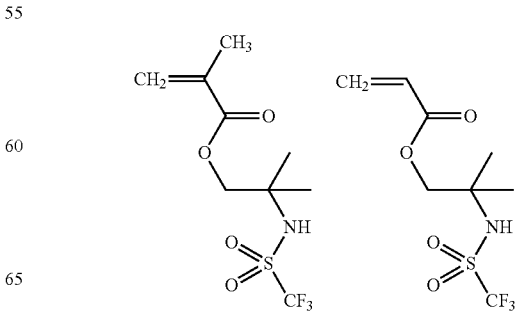

Among the acid-stable monomer having lactone ring (a3), (5-oxo-4-oxatricyclo[4.2.1.0$^{3,7}$]nonane-2-yl)(meth)acrylate, tetrahydro-2-oxo-3-furyl(meth)acrylate, and 2-(5-oxo-4-ox- -continued
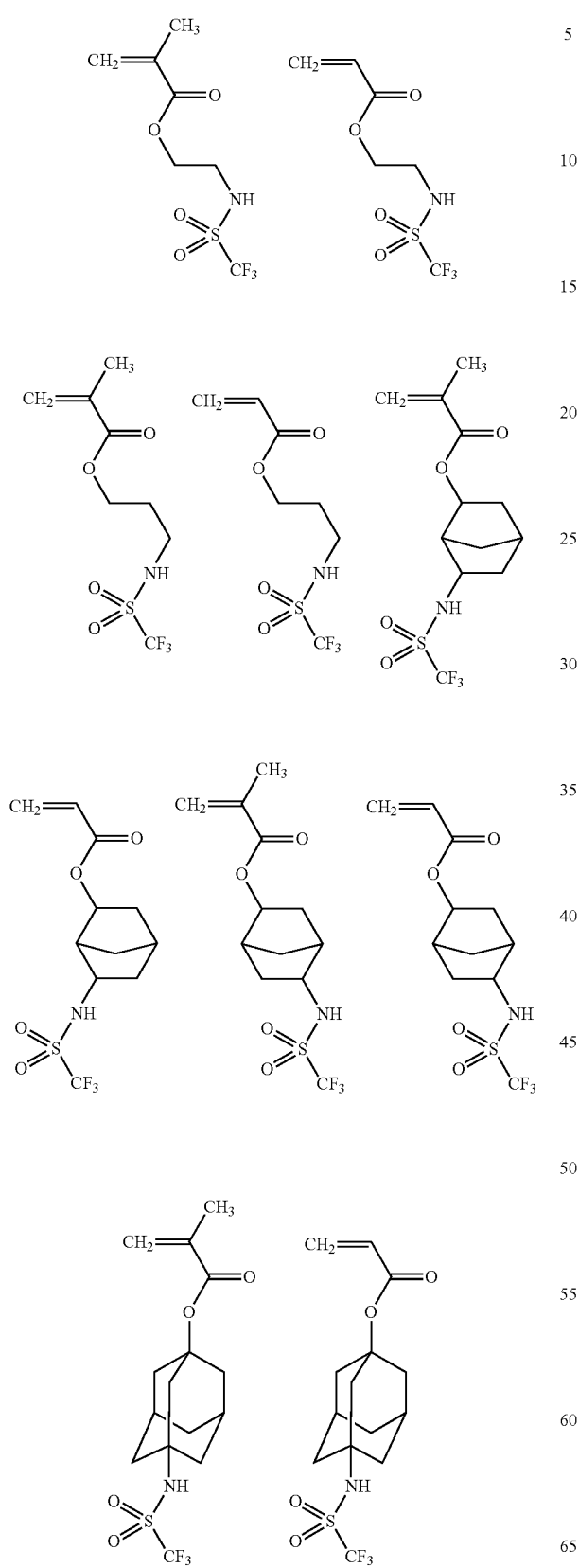
-continued
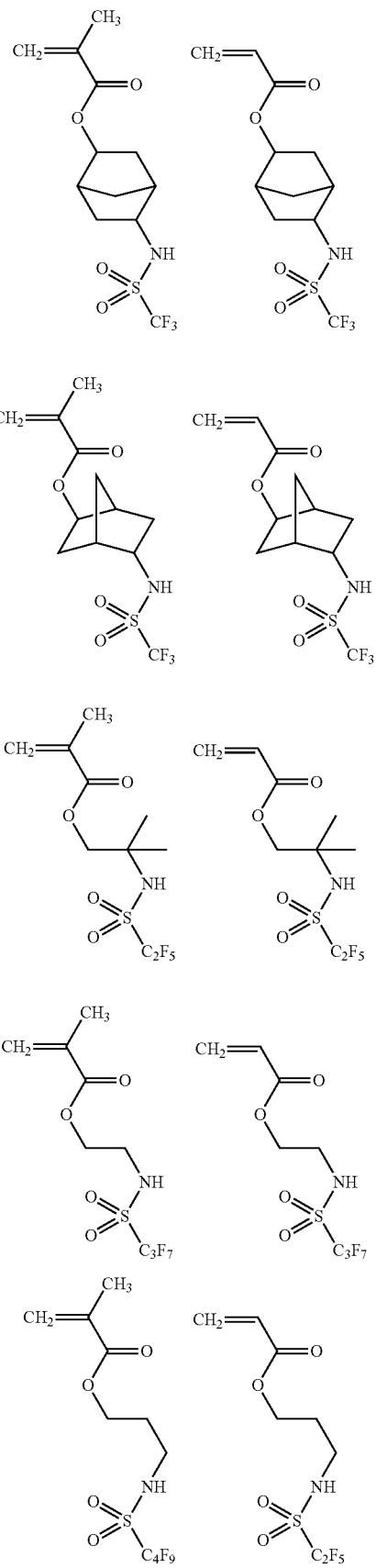

-continued

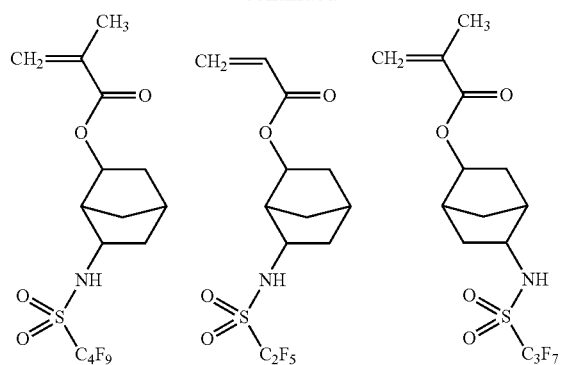

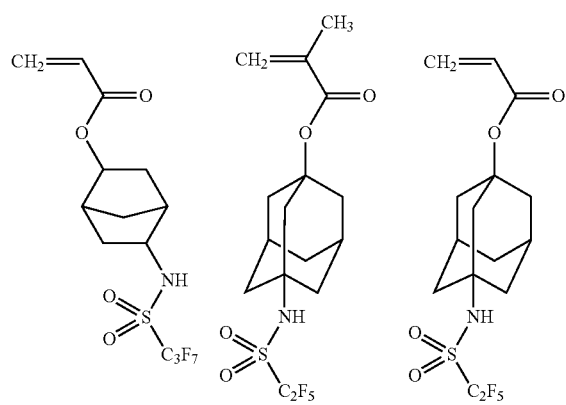

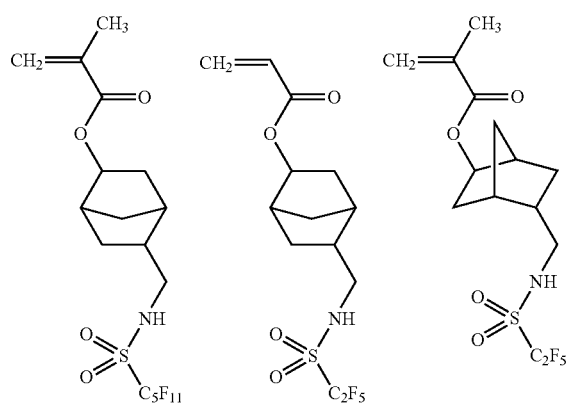

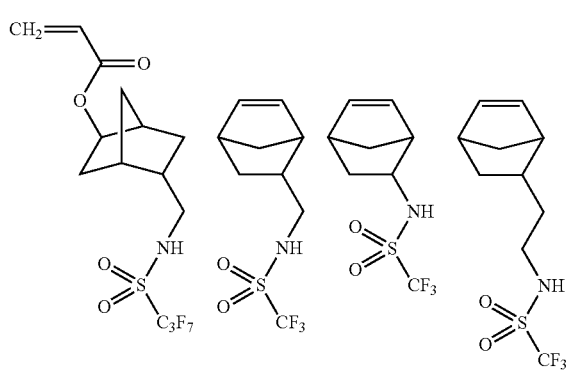

-continued

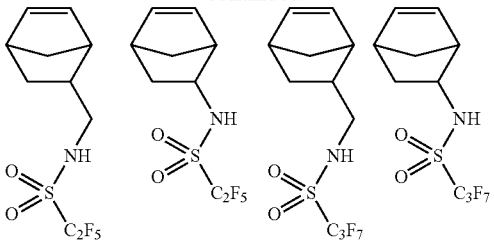

When the resin (AA) contains the structural unit derived from the acid-stable monomer represented by the formula (a4), the content thereof is generally 5 to 90 mol %, preferably 10 to 80 mol %, and more preferably 20 to 70 mol %, with respect to the total structural units (100 mole %) of the resin (AA).

<Acid-Stable Monomer (a5)>

The acid-stable monomer (a5) has a group represented by the formula (4).

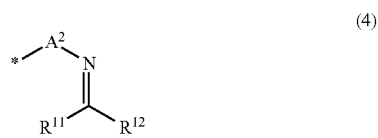

(4)

wherein $R^{11}$ represents an optionally substituted $C_6$ to $C_{12}$ aromatic hydrocarbon group;

$R^{12}$ represents an optionally substituted $C_1$ to $C_{12}$ hydrocarbon group, the hydrocarbon group may be contain a hetero atom;

$A^2$ represents a single bond, $—(CH_2)_m—SO_2—O—*$ or $—(CH_2)_m—CO—O—*$, the $—CH_2—$ contained in the $[—(CH_2)_m—]$ may be replaced by $—O—$, $—CO—$ or $—SO_2$-sulfonyl group, a hydrogen atom contained in the $[—(CH_2)_m—]$ may be replaced by a fluorine atom;

m represents an integer 1 to 12.

Examples of the aromatic hydrocarbon group of $R^{11}$ include an aryl group such as phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups. A hydrogen atom contained in the aromatic hydrocarbon group may be replaced by a $C_1$ to $C_4$ alkyl group, a halogen atom, a phenyl group, a nitro group, a cyano group, a hydroxy group, a phenyloxy group and tert-butylphenyl group. Examples of an alkyl group substituted aromatic hydrocarbon group include the same examples of the aralkyl group.

Specific examples of the preferable group for $R^{11}$ include a group below. * represents a bond to carbon atom.

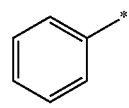

($R^{11}$-1)

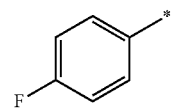

($R^{11}$-2)

(R¹¹-3) 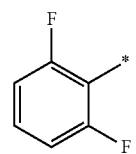

(R¹¹-4) 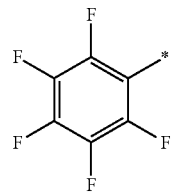

(R¹¹-5) 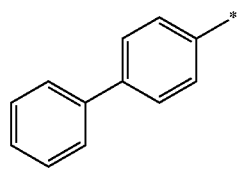

(R¹¹-6) 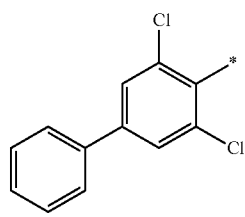

(R¹¹-7) 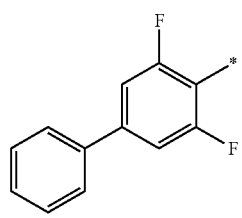

(R¹¹-8) 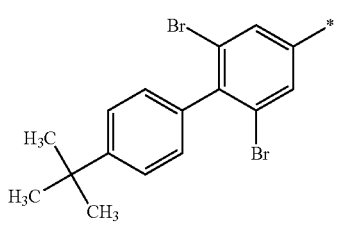

(R¹¹-9) 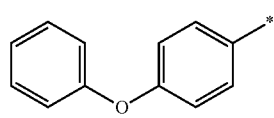

(R¹¹-10) 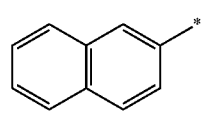

(R¹¹-11) 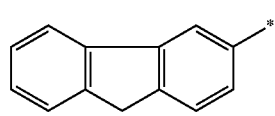

(R¹¹-12) 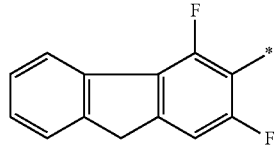

(R¹¹-13) 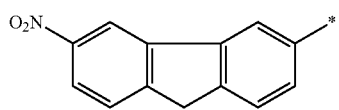

(R¹¹-14) 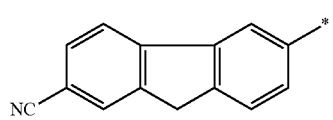

The hydrocarbon group may be any of a liner chain aliphatic hydrocarbon group, an alicyclic hydrocarbon group and an aromatic hydrocarbon group.

Typical examples of the aliphatic hydrocarbon group include an alkyl group, and examples of the alkyl group include the same groups described above.

Examples of the alicyclic hydrocarbon group include the same examples described above.

When $R^{12}$ is an aliphatic hydrocarbon group or an alicyclic hydrocarbon group, these may contain a hetero atom. Examples of the hetero atom include a halogen atom, a sulfur atom, an oxygen atom and a nitrogen atom, and may include a configuration of linking group such as a sulfonyl group and a carbonyl group.

Specific examples of $R^{12}$ containing such hetero atom include a group below.

$*-CF_3$ (R¹²-1)

$*-CN$ (R¹²-2)

$*-CH_3$ (R¹²-3)

$*-CF_2CH_3$ (R¹²-4)

$*-CF_2CF_3$ (R¹²-5)

$*-CF_2CF_2CF_3$ (R¹²-6)

$*-CF_2C_2H_5$ (R¹²-7)

$*-CF_2CF_2CF_2-CO_2-CH_3$ (R¹²-8)

(R¹²-9) 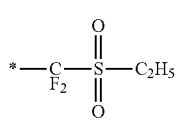

(R¹²-10) 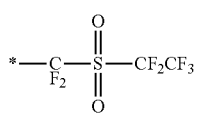

-continued
(R$^{12}$-11) 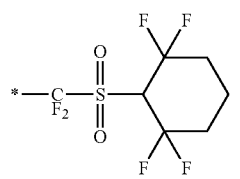
(R$^{12}$-12) 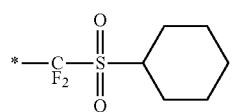
(R$^{12}$-13) 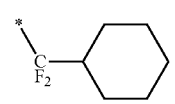
(R$^{12}$-14) 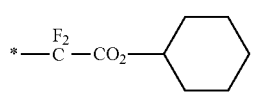
(R$^{12}$-15) 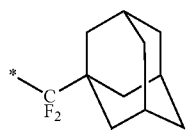
(R$^{12}$-16) 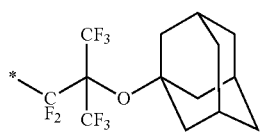
(R$^{12}$-17) 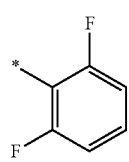
(R$^{12}$-18) 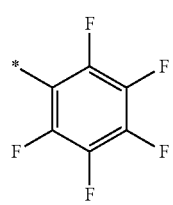
When R$^{12}$ is an aromatic hydrocarbon group, specific examples thereof include the same examples as R$^{11}$.
Specific examples of A$^2$ include a group below.
(A$^2$-1) ──
(A$^2$-2) 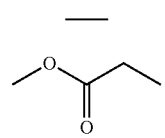
(A$^2$-3) 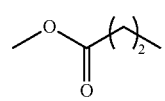
-continued
(A$^2$-4) 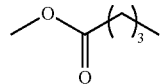
(A$^2$-5) 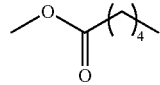
(A$^2$-6) 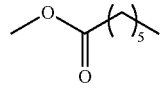
(A$^2$-7) 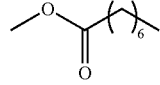
(A$^2$-8) 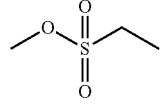
(A$^2$-9) 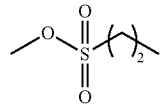
(A$^2$-10) 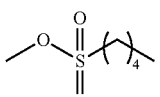
(A$^2$-11) 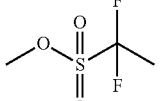
(A$^2$-12) 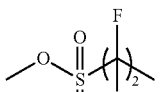
(A$^2$-13) 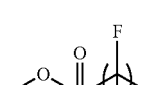
(A$^2$-14) 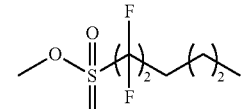
(A$^2$-15) 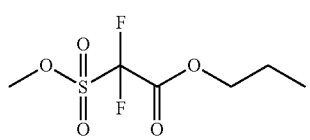

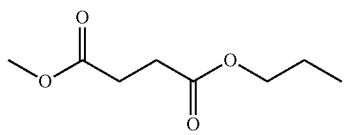
(A²-16)

An acid-stable monomer (a5) containing a group represented by the formula (4) include an acid-stable monomer (a5-1) represented by the formula (a5-1)

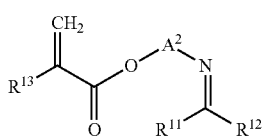
(a5-1)

wherein $R^{13}$ represents a hydrogen atom or a methyl group; $R^{11}$, $R^{12}$ and A is the same definition described above.

Specific examples of the acid-stable monomer (a5-1) include a monomer below.

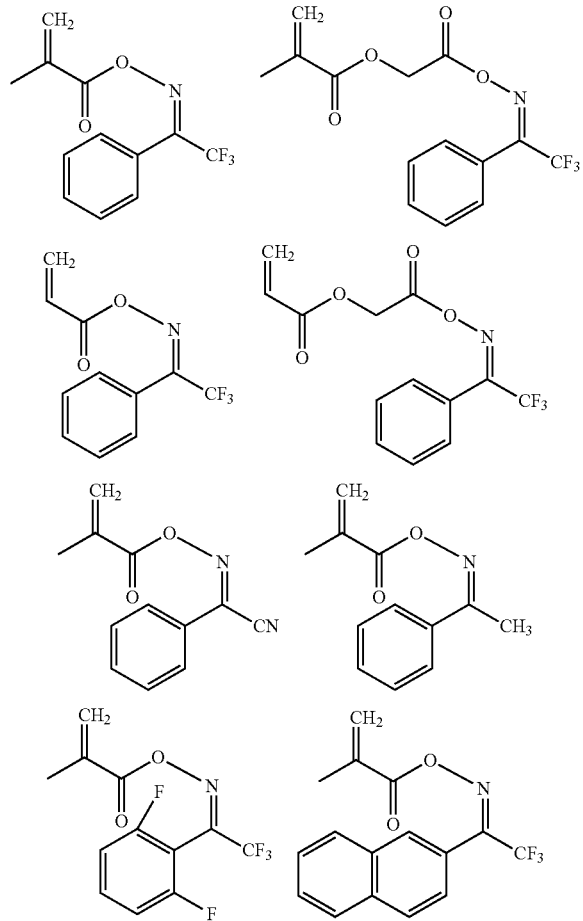

When the resin (AA) contains the structural unit derived from the monomer represented by the formula (a5-1), the content thereof is generally 5 to 95 mol %, preferably 10 to 80 mol %, and more preferably 20 to 70 mol %, with respect to the total structural units constituting the resin (AA).

<Acid-Stable Monomer (6a)>

Examples of the acid-stable monomer other than the above include maleic anhydride represented by the formula (a6-1), itaconic anhydride represented by the formula (a6-2) or an acid-stable monomer having norbornene ring represented by the formula (a6-3), for example.

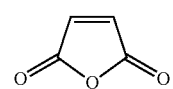
(a6-1)

(a6-2)

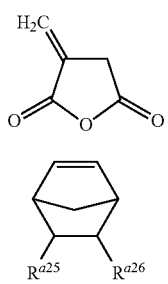

(a6-3)

wherein $R^{a25}$ and $R^{a26}$ independently represent a hydrogen atom, an optionally substituted $C_1$ to $C_3$ alkyl group (e.g., with a hydroxy group), a cyano group, a carboxy group or —COOR$^{a27}$, or $R^{a25}$ and $R^{a26}$ may be bonded together to form —CO—O—CO—, $R^{a27}$ represents a $C_1$ to $C_{18}$ aliphatic hydrocarbon group, one or more —CH$_2$— contained in the aliphatic hydrocarbon group may be replaced by —O— or —CO—, provided that excluding a group in which the —COOR$^{a27}$ is an acid-labile group, that is, $R^{a27}$ does not include a group in which the tertiary carbon atom bonds to —O—.

Examples of the optionally substituted alkyl group of $R^{a25}$ and $R^{a26}$ include, for example, methyl, ethyl, propyl, hydroxymethyl and 2-hydroxyethyl groups.

The aliphatic hydrocarbon group of $R^{a27}$ has preferably a $C_1$ to $C_8$ alkyl group and a $C_4$ to $C_{18}$ alicyclic hydrocarbon group, and more preferably a $C_1$ to $C_6$ alkyl group and a $C_4$ to $C_{12}$ alicyclic hydrocarbon group, and still more preferably a methyl, ethyl, propyl, 2-oxo-oxolane-3-yl and 2-oxo-oxolane-4-yl groups.

Specific examples of the acid-stable monomer having the norbornene ring (a6-3) include 2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol and 5-norbornene-2,3-dicarboxylic acid anhydride.

When the resin (AA) contains the structural unit derived from the monomer represented by the formula (a6-1), the monomer represented by the formula (a6-2) or the monomer represented by the formula (a6-3), the total content thereof is generally 2 to 40 mol %, preferably 3 to 30 mol %, and more preferably 5 to 20 mol %, with respect to the total structural units constituting the resin (AA).

Further, examples of the acid-stable monomer other than the above include a monomer having a sultone ring represented by the formula (a6-4).

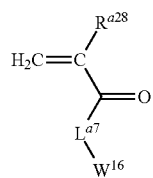

(a6-4)

wherein $L^{a7}$ represents an oxygen atom or *-T-(CH$_2$)$_{k2}$—CO—O—, k2 represents an integer of 1 to 7, T represents an oxygen atom or NH, * represents a single bond to carbonyl group;

$R^{a28}$ represents a hydrogen atom or a methyl group;

$W^{16}$ represent a group having an optionally substituted sultone ring.

The sultone ring contained in the group is ring in which two of adjacent methylene groups are replaced by an oxygen atom and a sulfonyl group, respectively, and examples thereof include a ring below. The sultone ring group is a group in which a hydrogen atom contained in the sultone ring below is replaced by a bond, which correspond to a bond to $L^{a7}$ in the formula (a6-4)

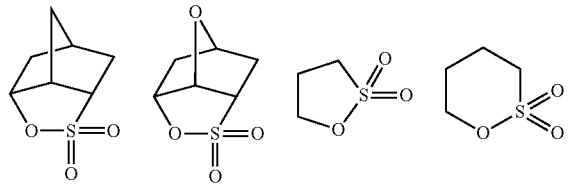

The optionally substituted sultone ring group means a ring in which a hydrogen atom other than a hydrogen atom which has been replaced by a bond contained in the sultone ring is replaced by a substituent (monovalent group other than a hydrogen atom), and examples thereof include a hydroxy group, cyano group, a $C_1$ to $C_6$ alkyl group, a $C_1$ to $C_6$ alkyl group, a $C_1$ to $C_6$ fluorinated alkyl group, a $C_1$ to $C_6$ hydroxy alkyl group, a $C_1$ to $C_6$ alkoxy group, a $C_1$ to $C_7$ alkoxycarbonyl group, a $C_1$ to $C_7$ acyl group and a $C_1$ to $C_8$ acyloxy group.

Specific examples of the acid-stable monomer (a6) having a sultone ring include a monomer below.

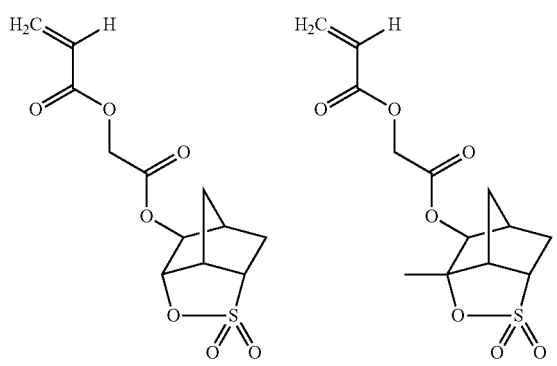

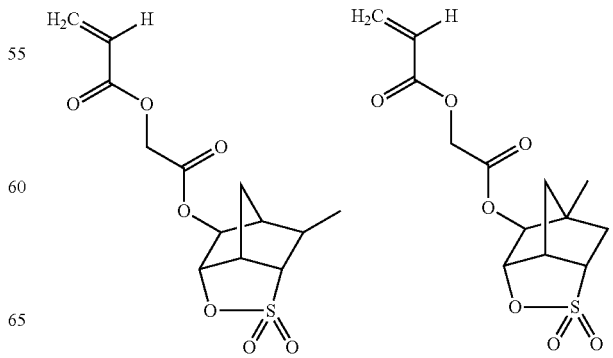

-continued
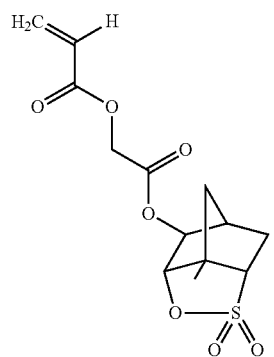 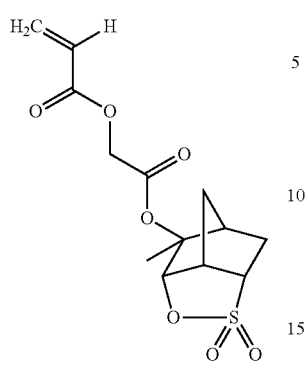 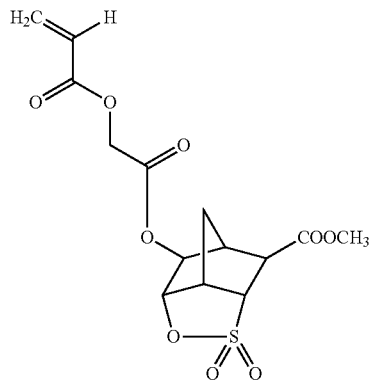
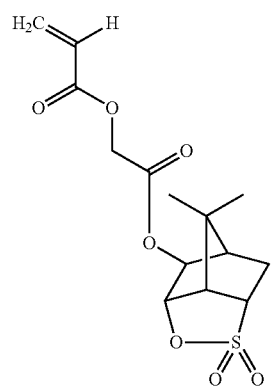 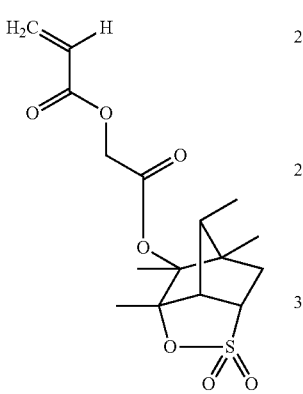 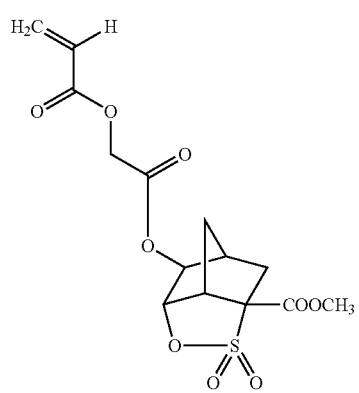
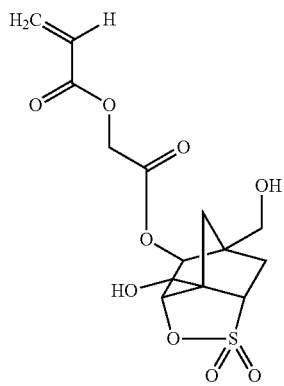 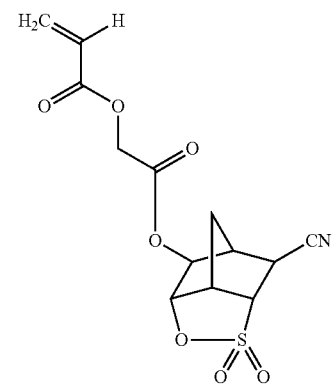
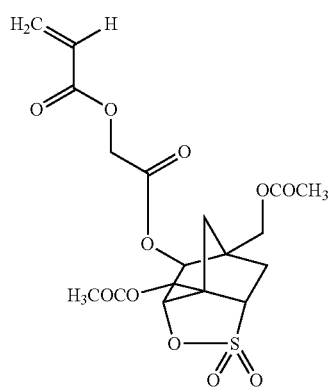 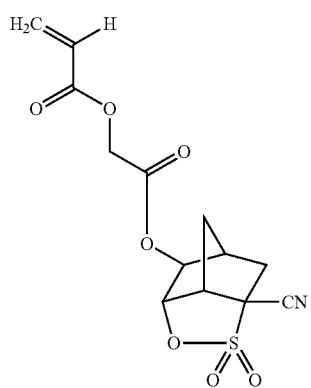

85
-continued
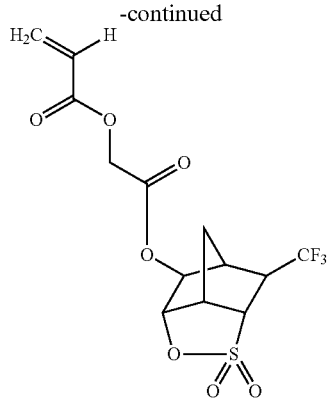
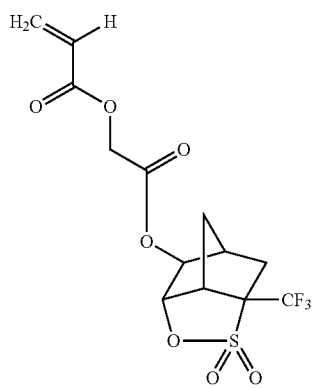
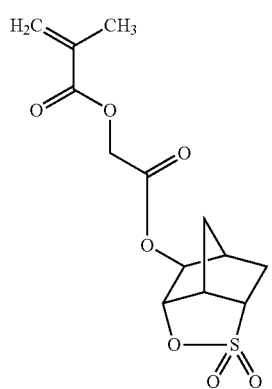
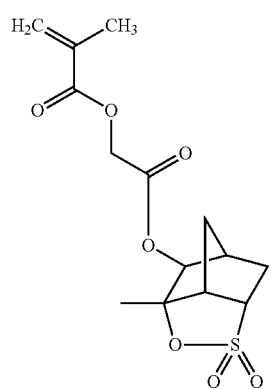
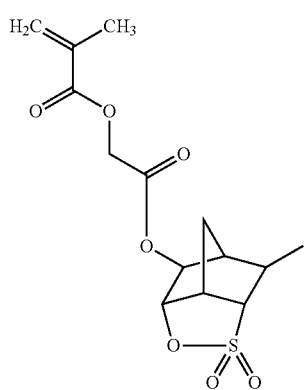
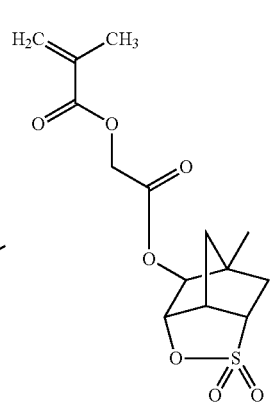
86
-continued
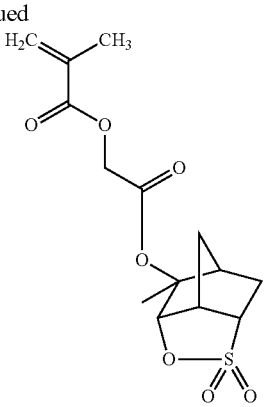
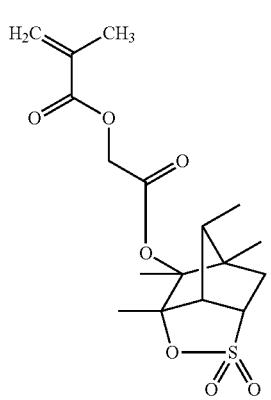
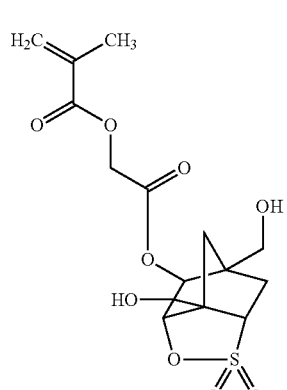
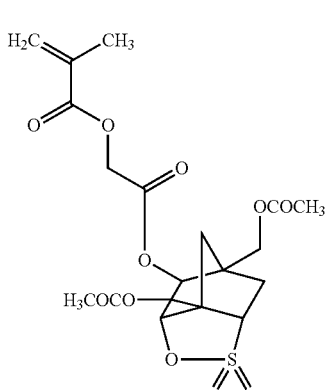

87
-continued
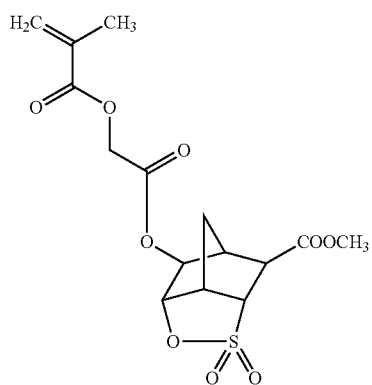
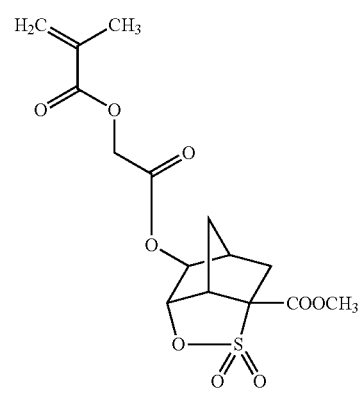
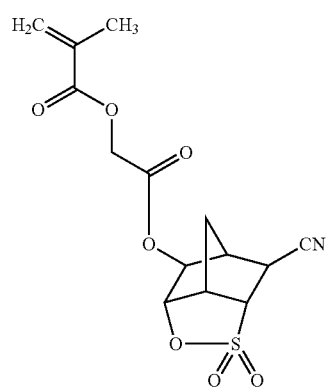
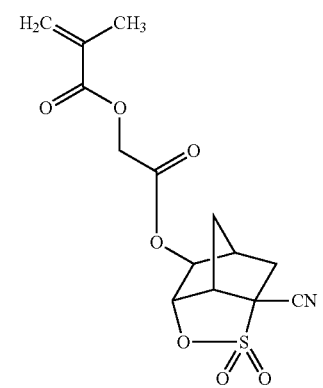
88
-continued
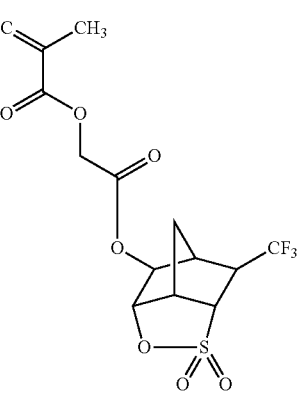
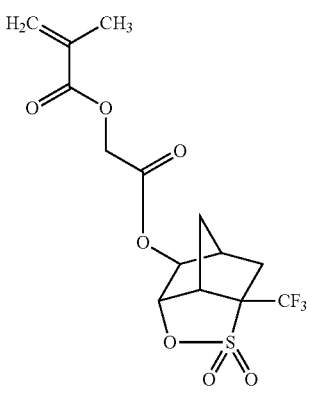
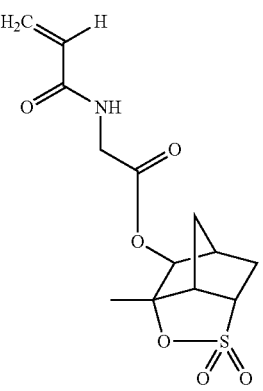
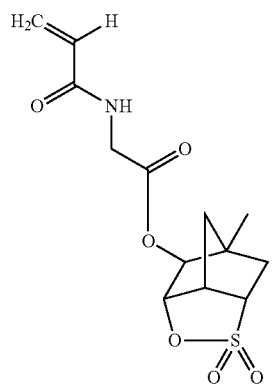

89
-continued
90
-continued
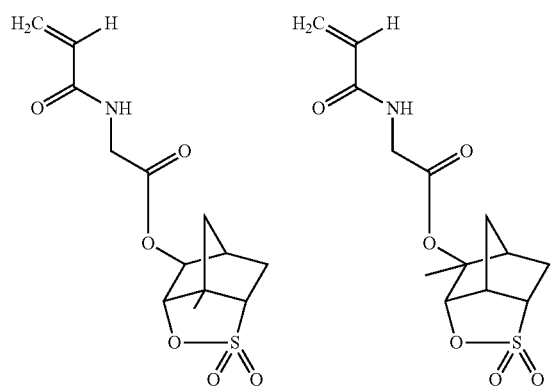
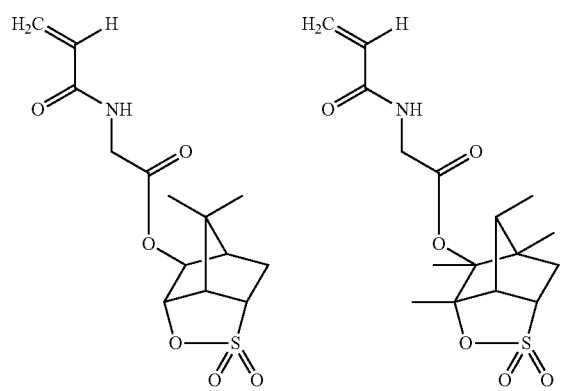
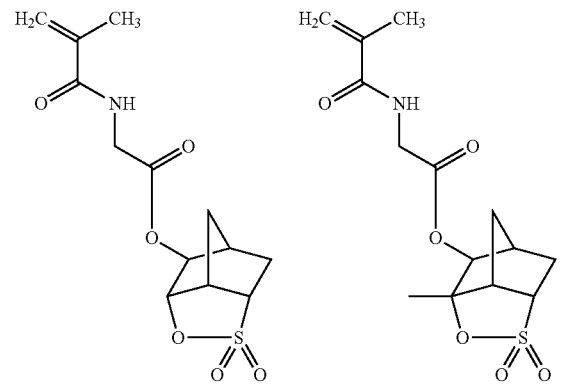
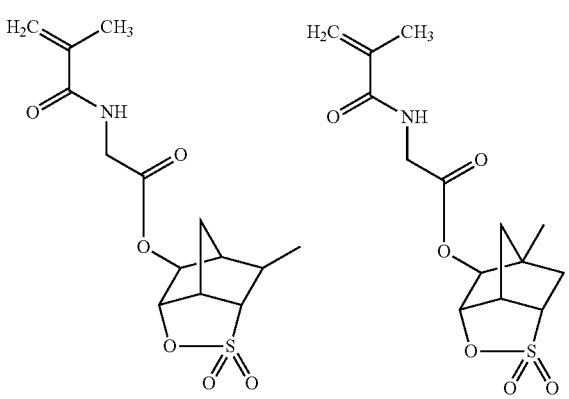

91
-continued
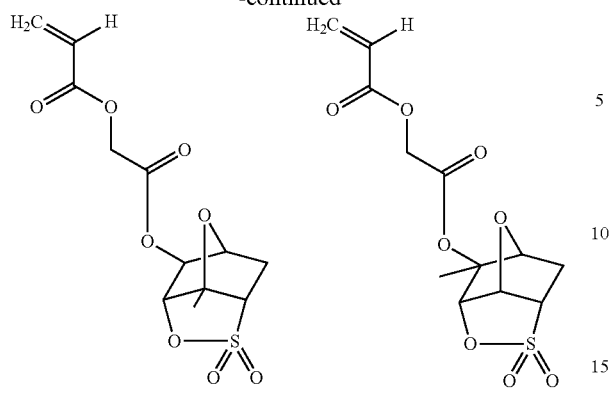
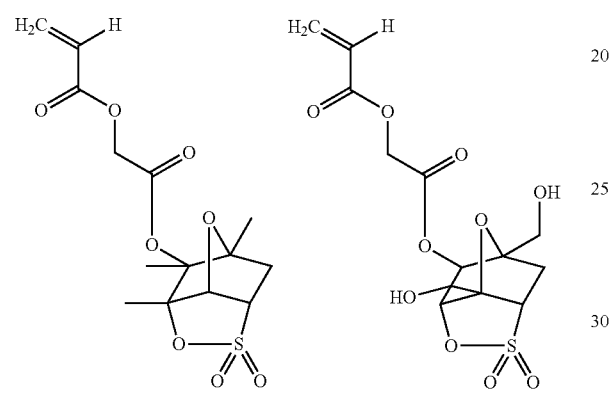
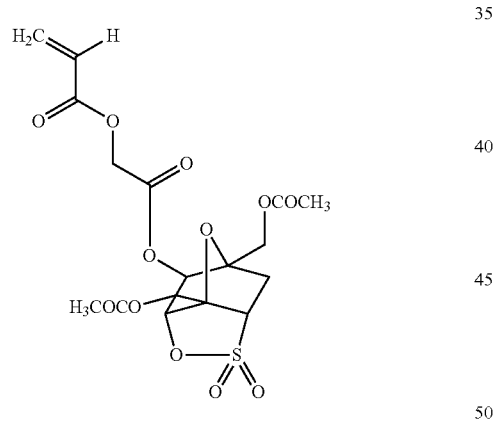
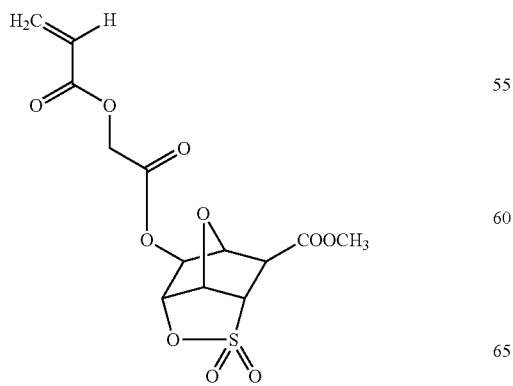
92
-continued
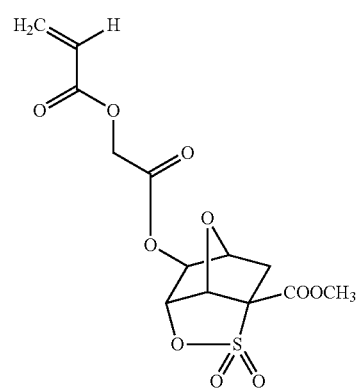
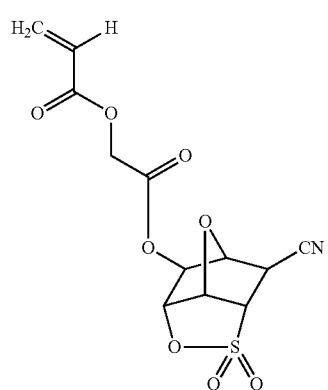
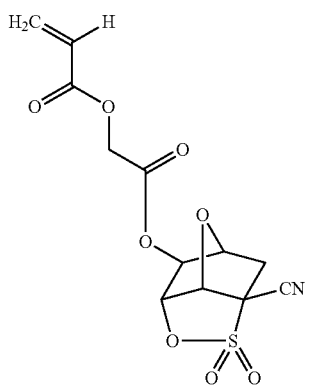
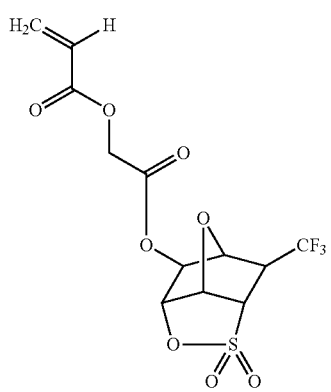

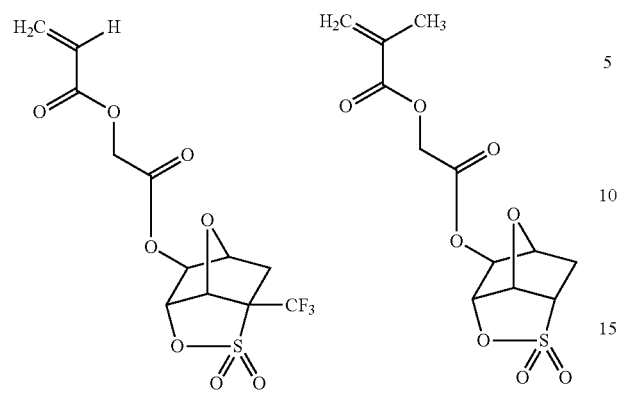
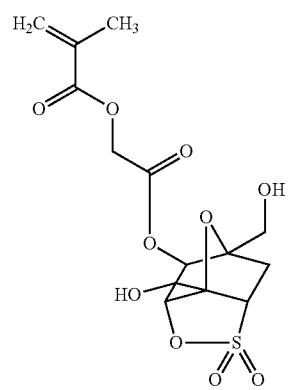
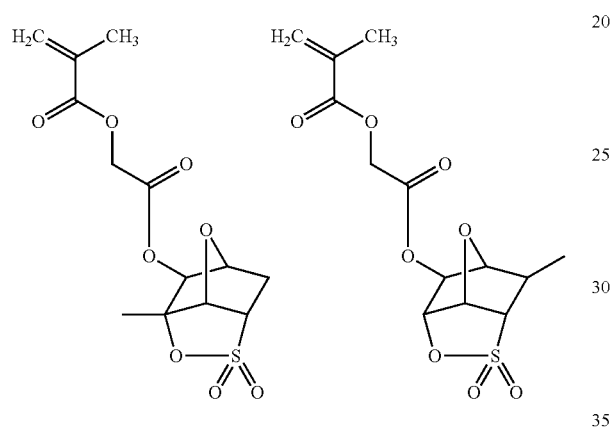
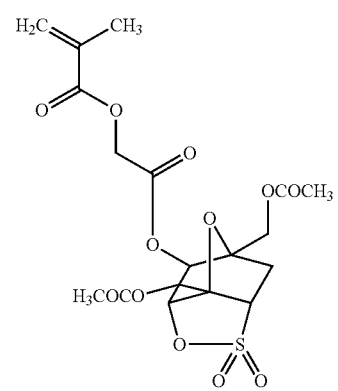
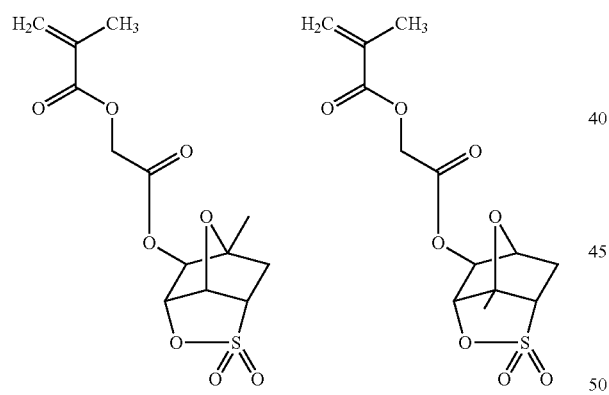
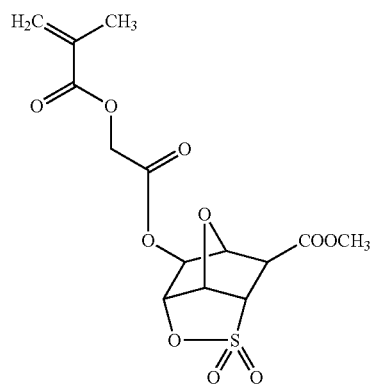
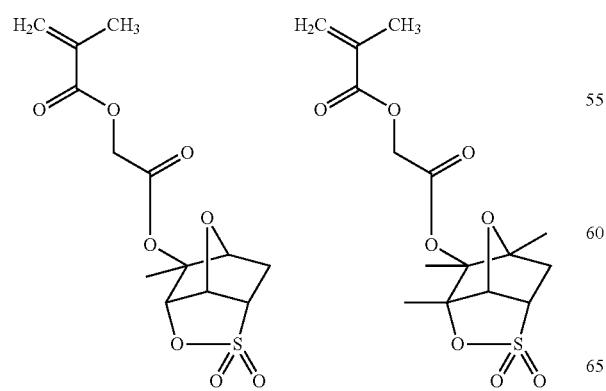
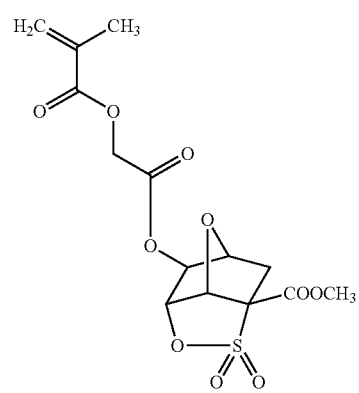

95
-continued
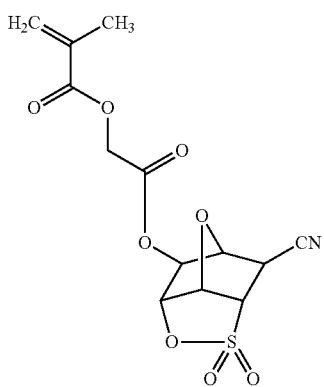
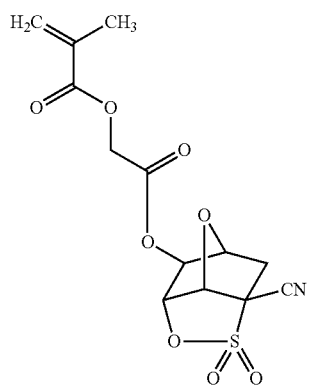
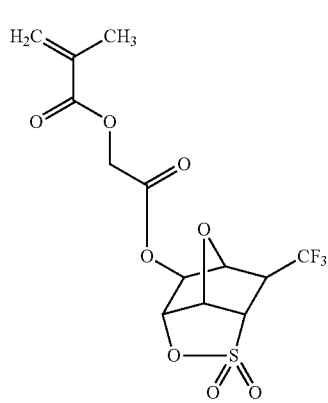
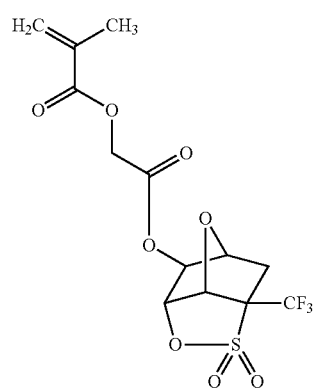
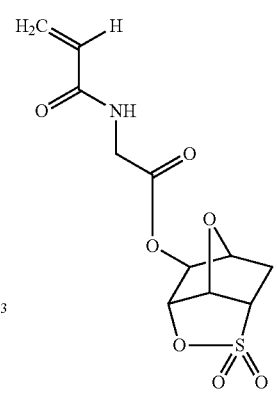
96
-continued
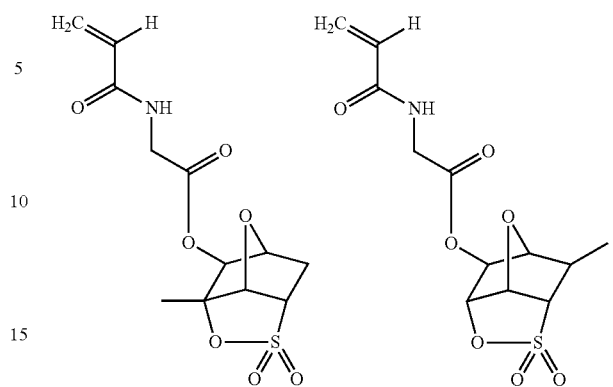
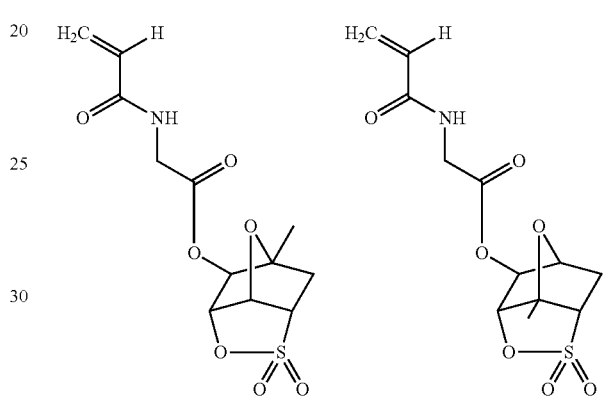
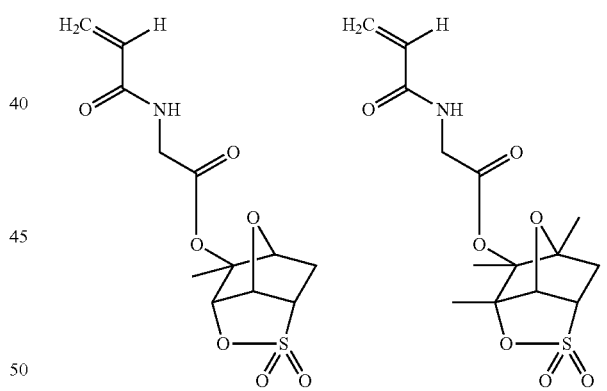
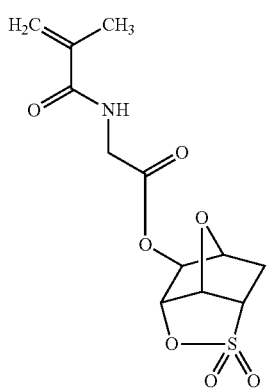
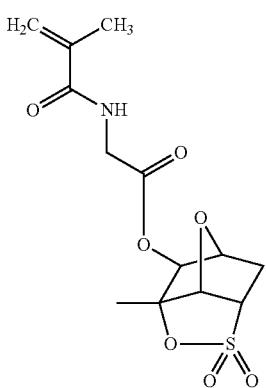

97
-continued
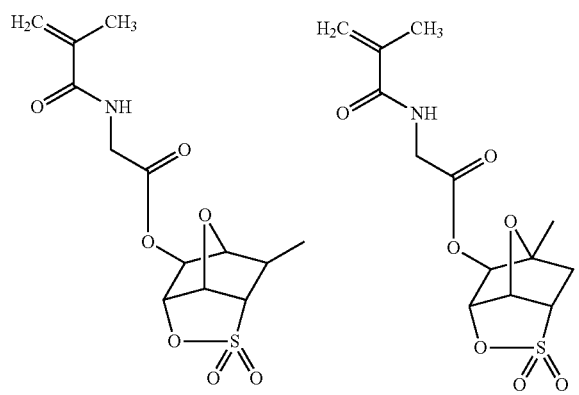
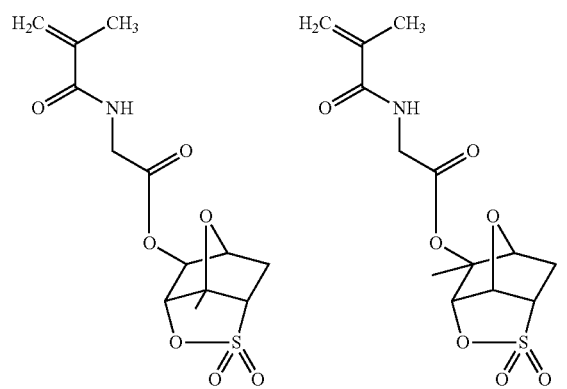
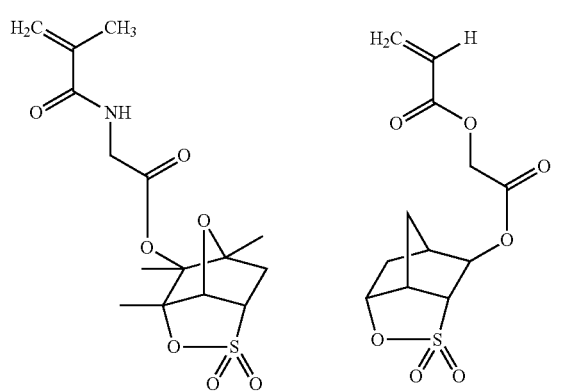
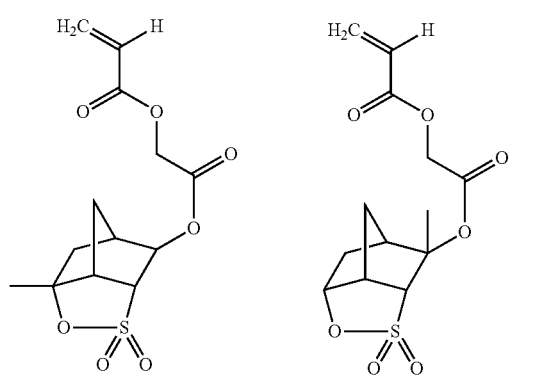
98
-continued
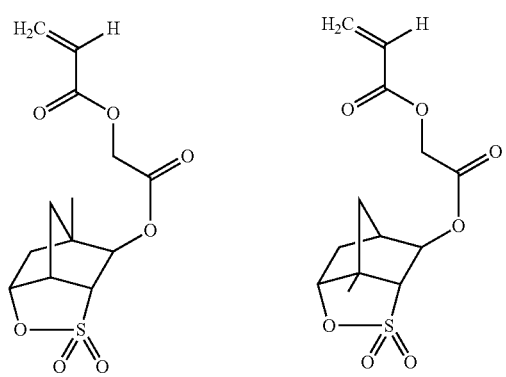
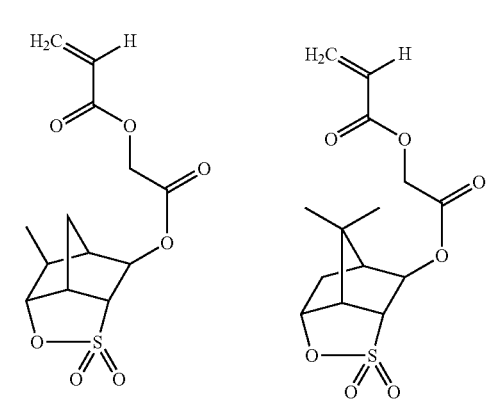
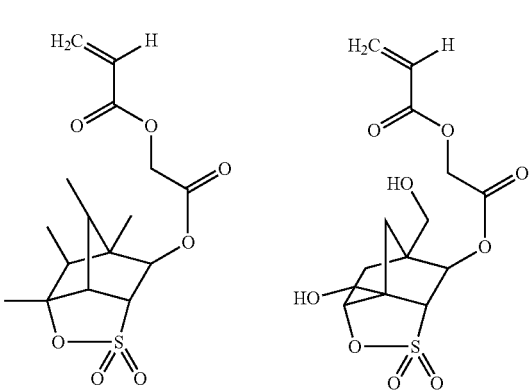
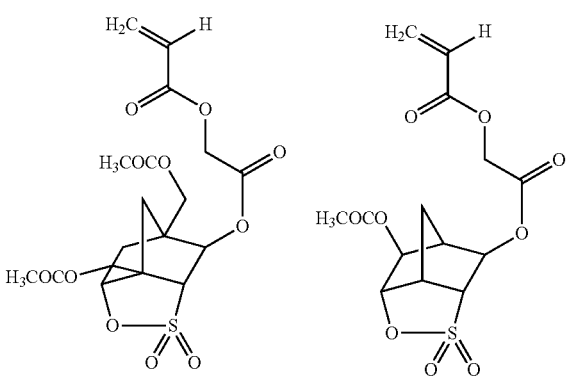

99
-continued
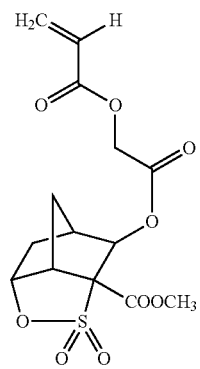 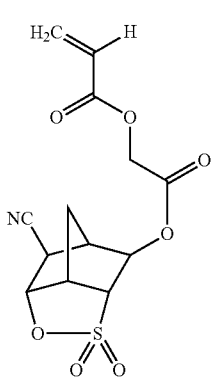
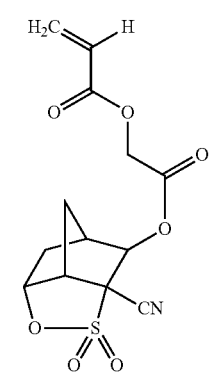 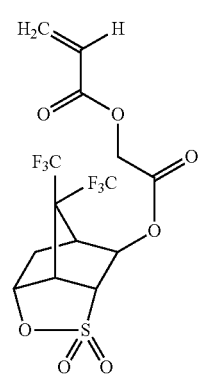
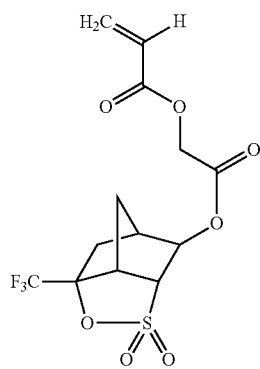 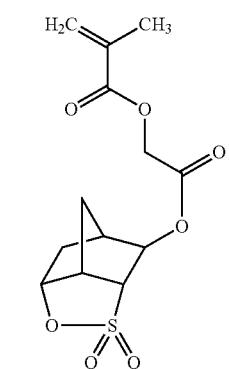
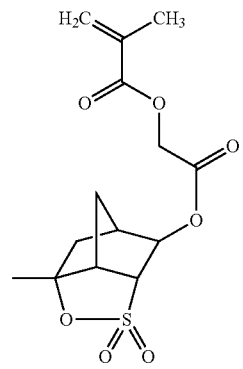 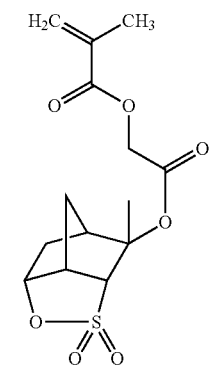
100
-continued
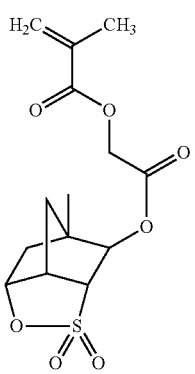 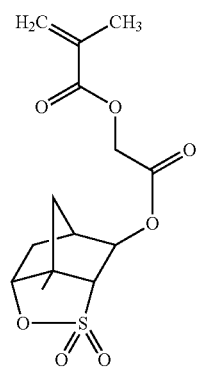
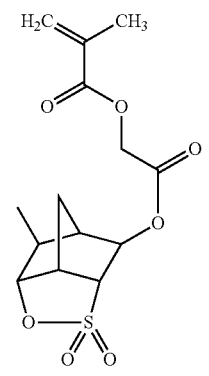 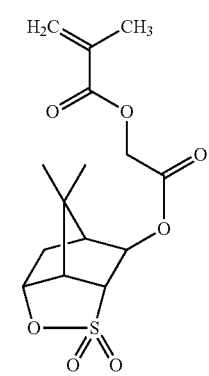
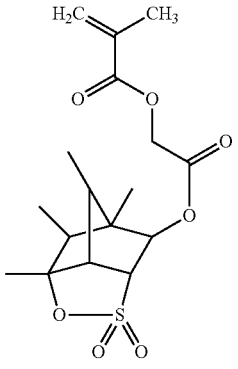 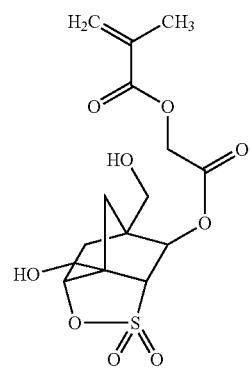
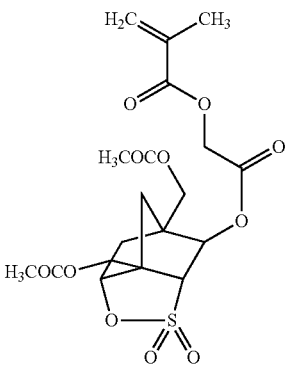 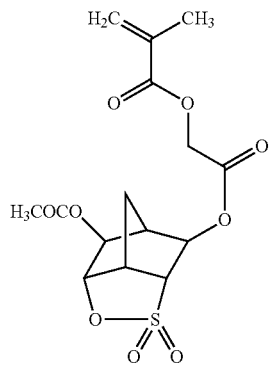

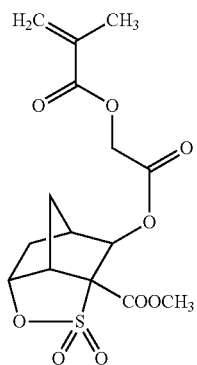 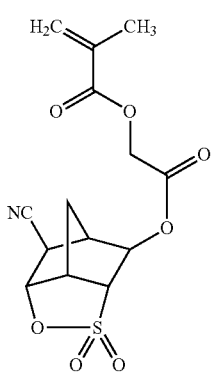 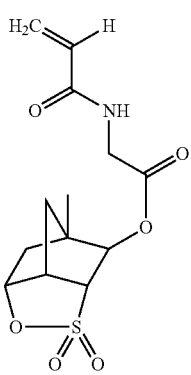 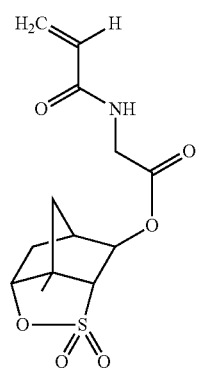
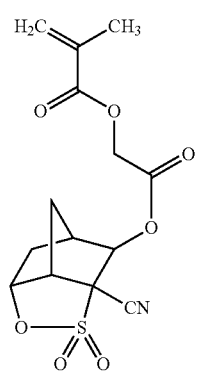 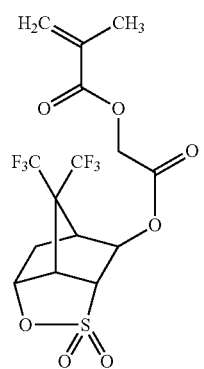 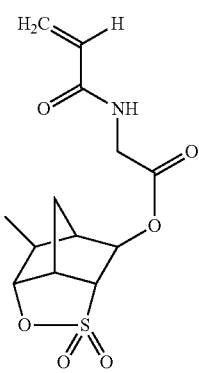 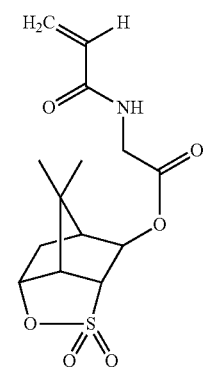
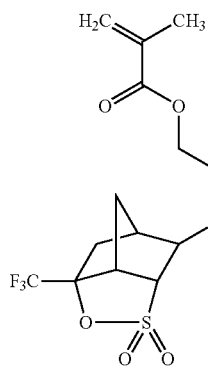 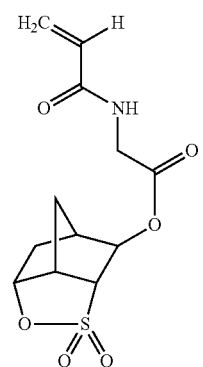 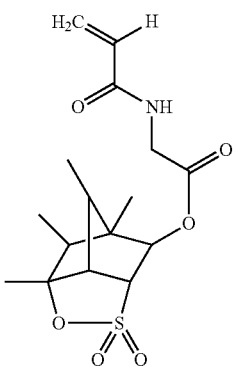 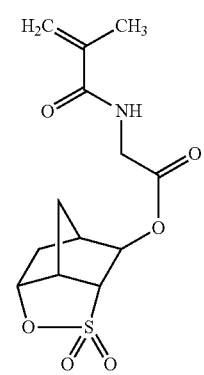
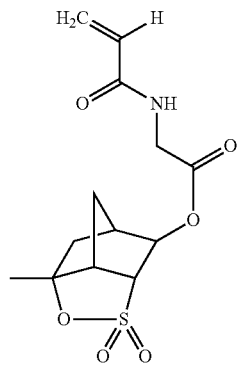 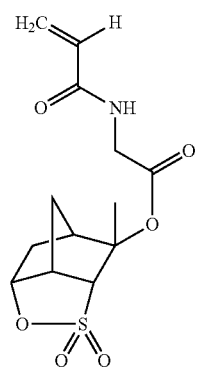 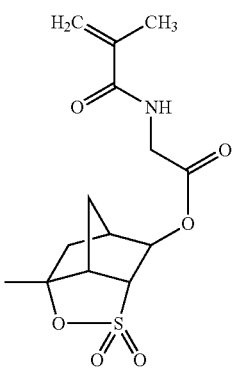 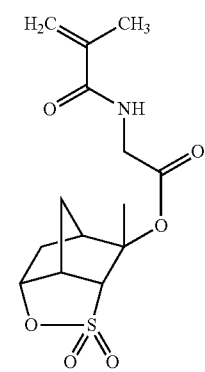

103
-continued
104
-continued
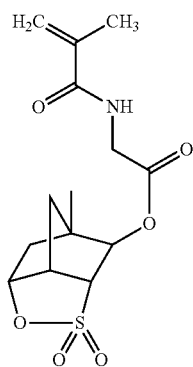 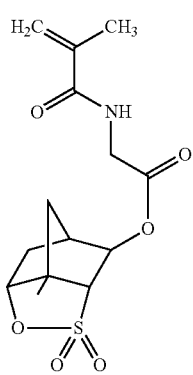 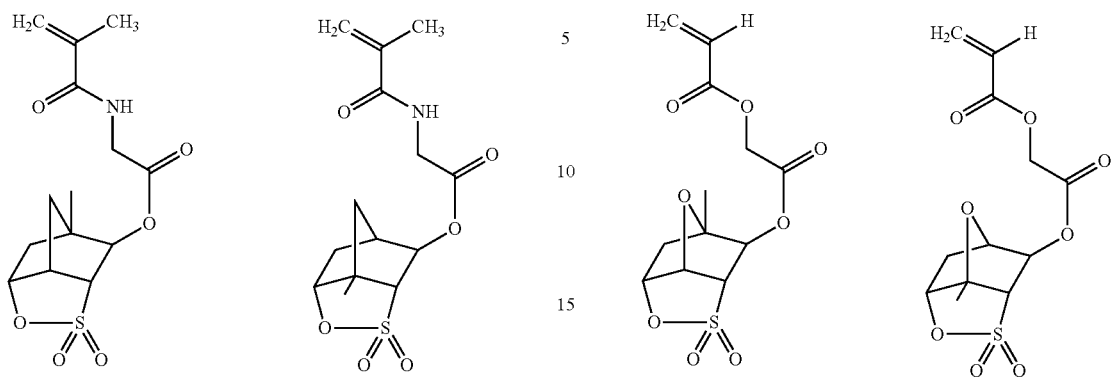
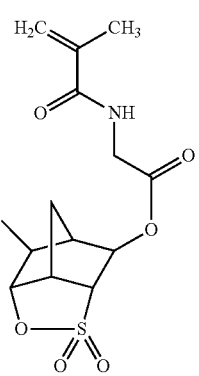 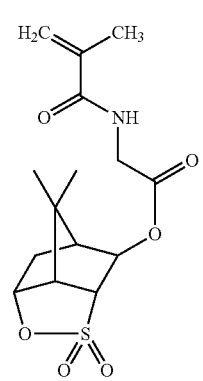 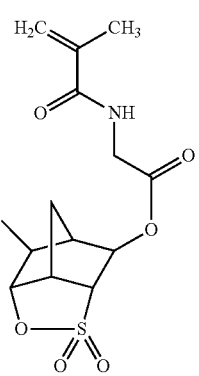 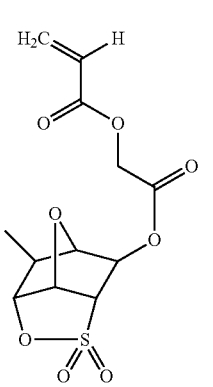
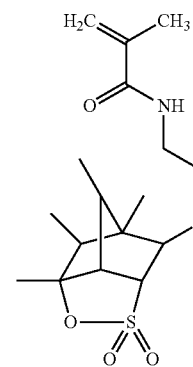 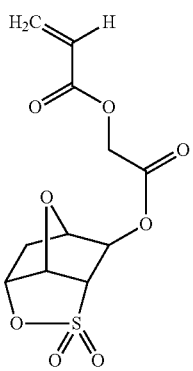 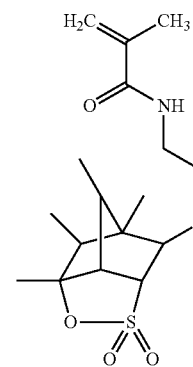 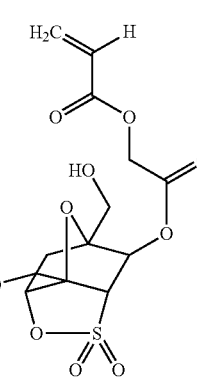
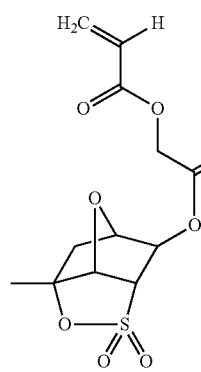 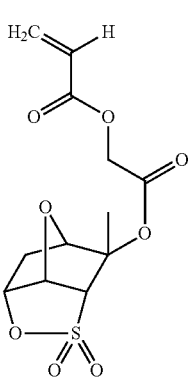 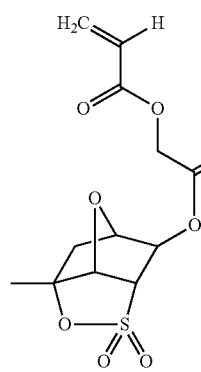 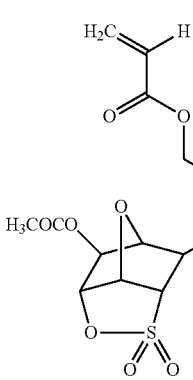

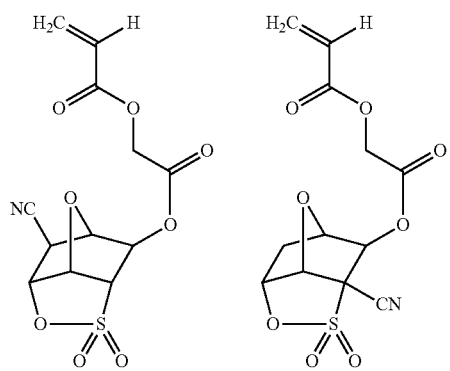
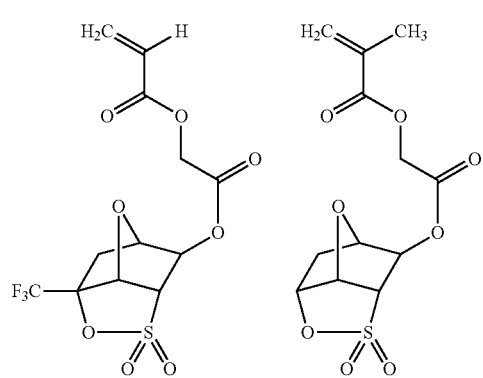
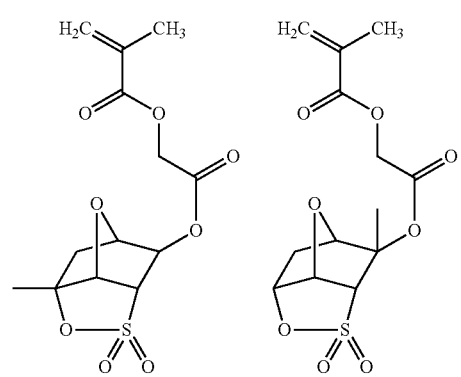
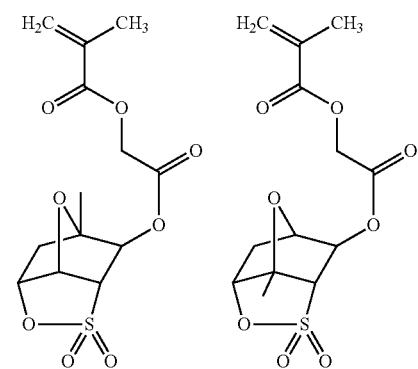
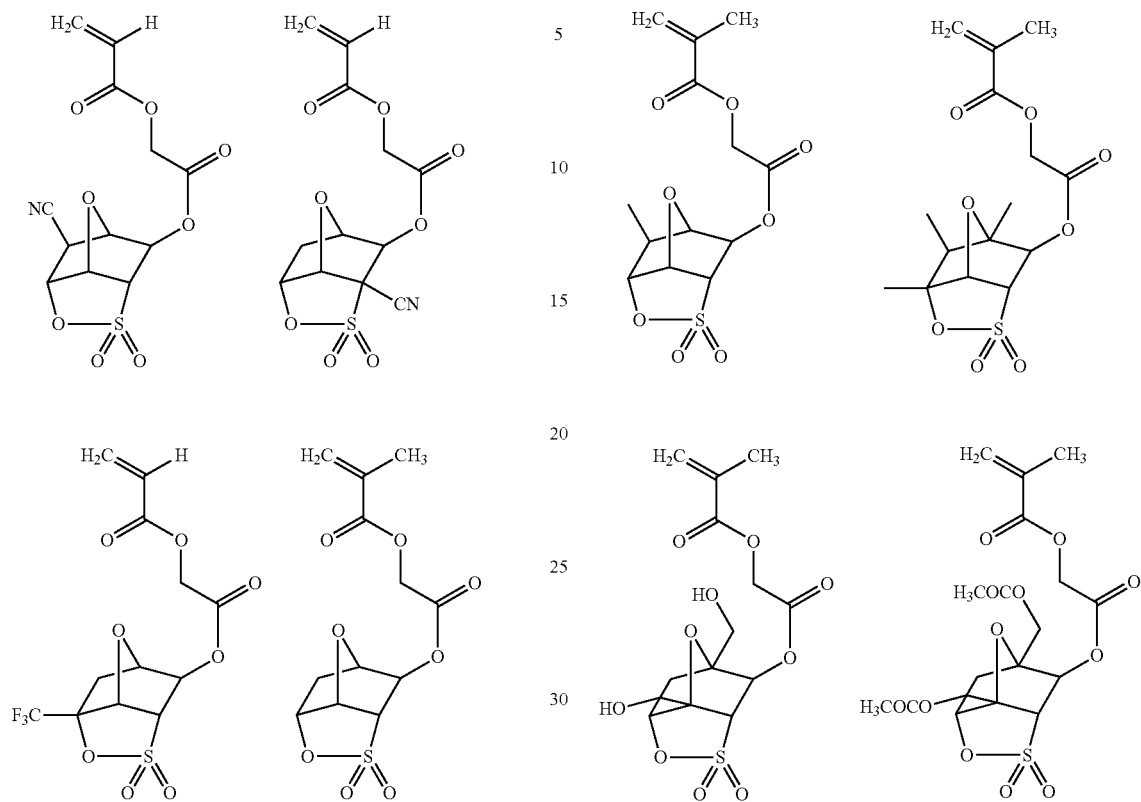

-continued

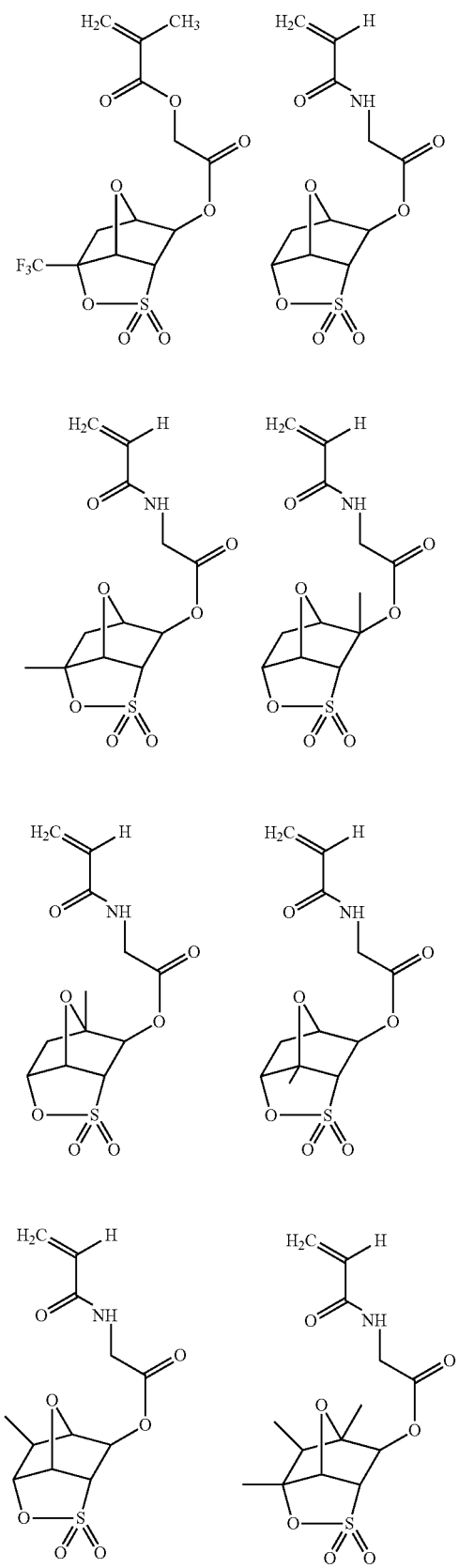

-continued

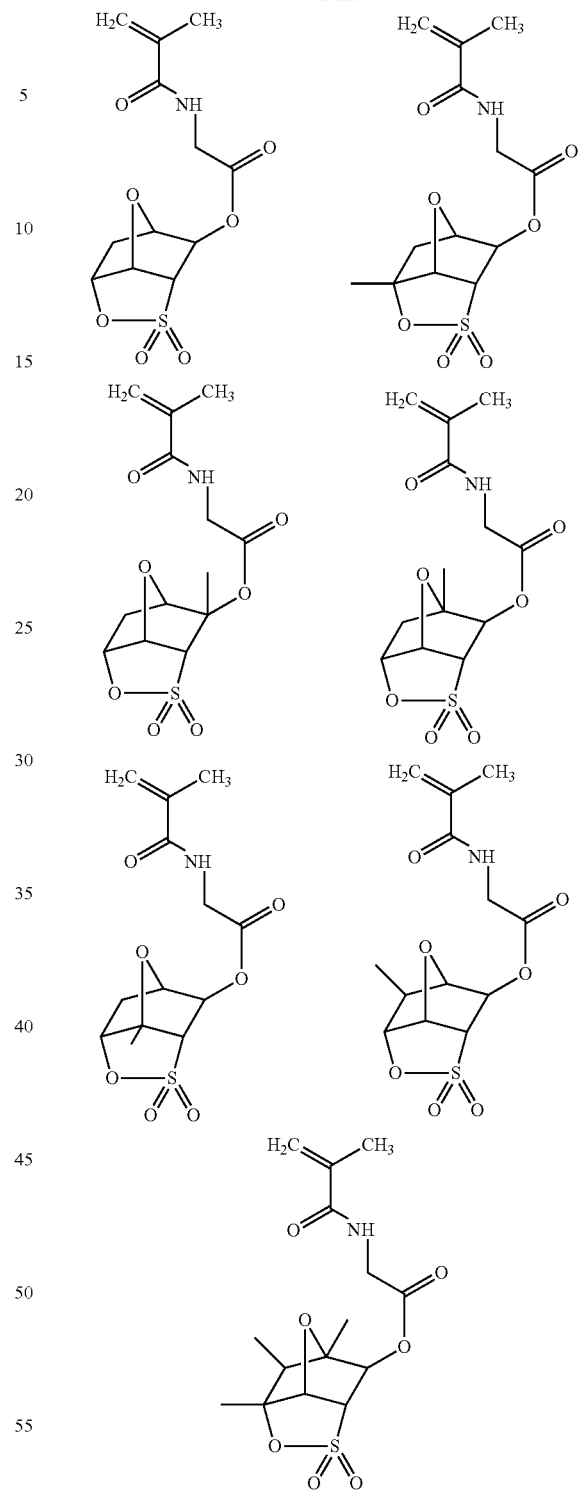

When the resin (AA) contains the structural unit derived from the monomer represented by the formula (a6-4), the content thereof is generally 2 to 40 mol %, preferably 3 to 35 mol %, and more preferably 5 to 30 mol %, with respect to the total structural units constituting the resin (AA).

Moreover, an acid-stable monomer (a7) containing a fluorine atom as follows is used for manufacturing the resin (AA),

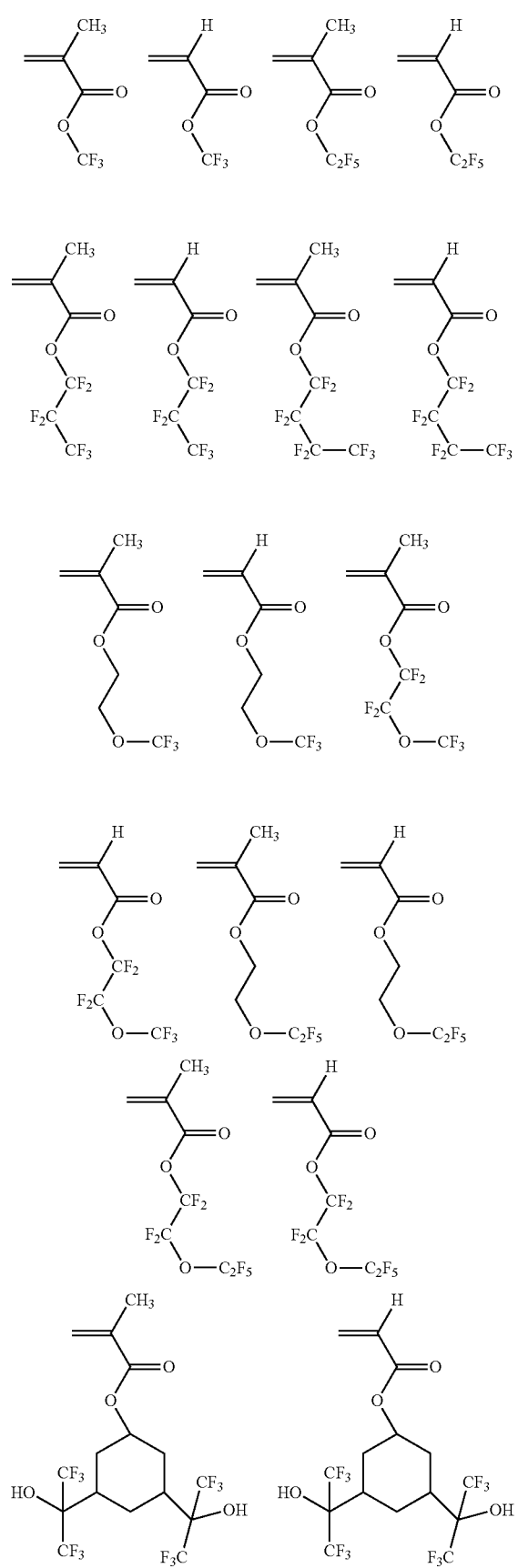
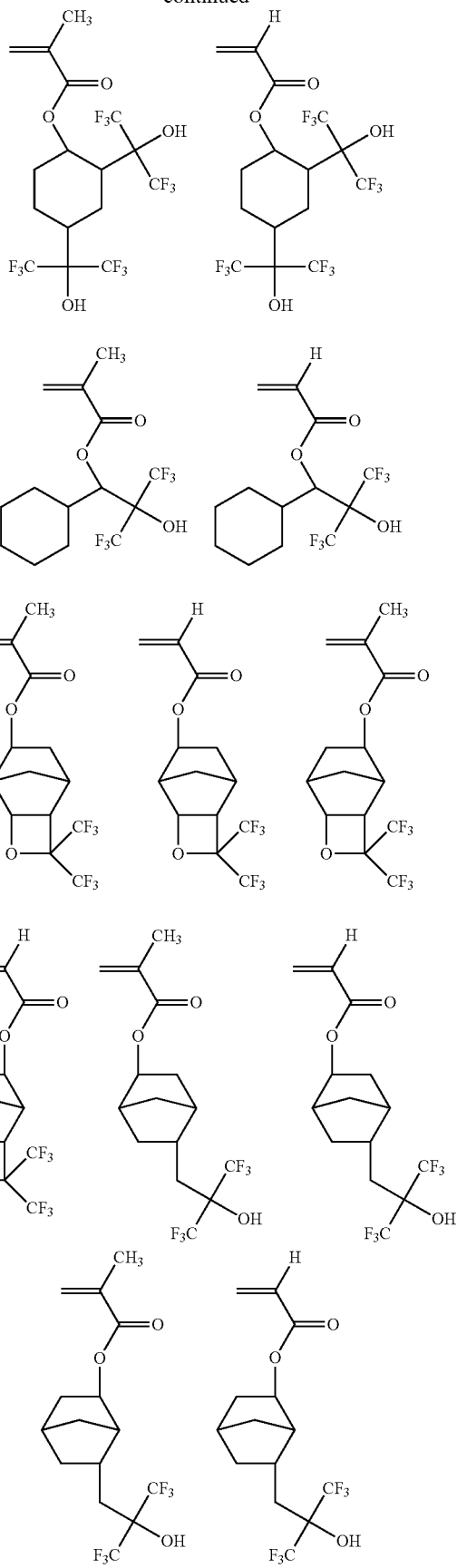

-continued

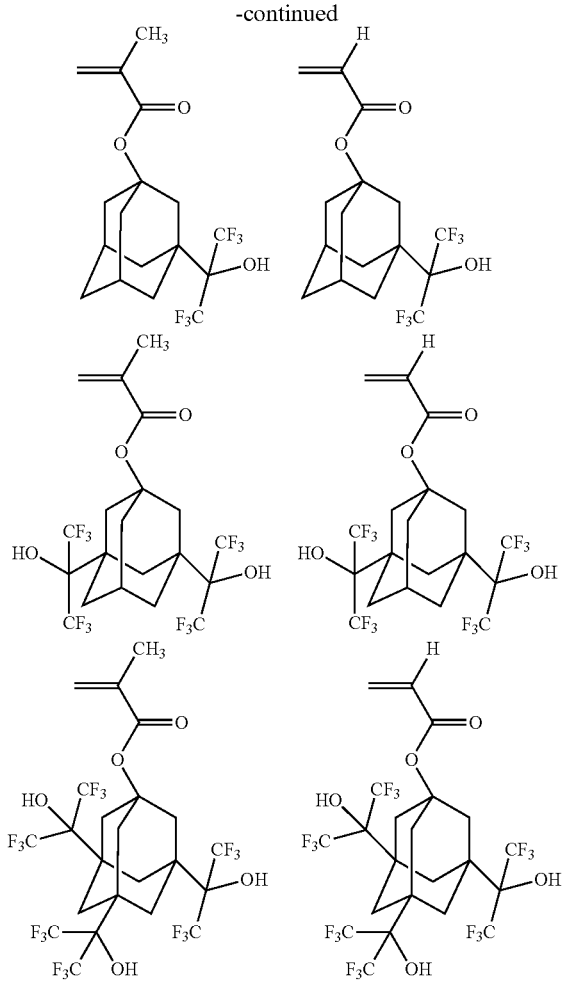

Among these, 5-(3,3,3-trifluoro-2-hydroxy-2-[trifluoromethyl]propyl) bicyclo[2.2.1]hept-2-yl(meth)acrylate, 6-(3,3,3-trifluoro-2-hydroxy-2-[trifluoromethyl]propyl) bicyclo[2.2.1]hept-2-yl(meth)acrylate, 4,4-bis(trifluoromethyl)-3-oxatricyclo[4.2.1.0$^{2,5}$]nonyl which have mono- or polyalicyclic hydrocarbon group are preferable.

When the resin (AA) contains the structural unit derived from the monomer represented by the formula (a7), the content thereof is generally 1 to 20 mol %, preferably 2 to 15 mol %, and more preferably 3 to 10 mol %, with respect to the total structural units constituting the resin (AA).

The resin (AA) may be an acid-labile resin having at least the structural unit derived from the compound (a) and the structural unit derived from the acid-labile monomer (a1).

The resin (AA) may be a copolymer polymerized at least the compound (a) and the monomer (a1), and the acid-stable monomer as needed, and preferably a copolymer polymerized the compound (a), the monomer (a1), and the acid-stable monomer (a2) and/or the acid-stable monomer (a3).

In the production of the resin (AA), the monomer (a1) used is preferably at least one of the monomer having the adamantyl group (a1-1) and the monomer having the cyclohexyl group (a1-2), and more preferably the monomer having the adamantyl group (a1-1).

The acid-stable monomer is preferably the monomer having the hydroxyadamantyl group (a2-1) and the acid-stable monomer (a3). The monomer having the lactone ring (a3) is preferably at least one of the monomer having the γ-butyrolactone ring (a3-1), and the monomer having the condensed ring of the γ-butyrolactone ring and the norbornene ring (a3-2).

When the resin (AA) is the copolymer of the compound (a), the monomer having the acid-labile group (a1-1) and the acid-stable monomer, the content of the monomer having the acid-stable group can be adjusted based on the monomer having the acid-labile group (a1). For example, the content of [the structural unit derived from the monomer having the acid-labile group (a1-1)]:[the structural unit derived from the monomer having the acid-stable group] is preferably 10 to 95 mol %: 90 to 5 mol %, and more preferably 20 to 85 mol %: 80 to 15 mol %, with respect to the total structural units constituting the resin (AA).

When the resin (AA) contain the structural unit derived from the monomer having an adamantyl group, the content of the structural unit derived from the monomer having an adamantyl group (in particular, the monomer having the acid-labile group (a1-1)) is preferably 15 mol % or more with respect to the monomer having the acid-labile group (a1). The more rate of the monomer having an adamantyl group increases, the more dry etching resistance of the resulting resist improves.

The resin (AA) can be produced by a known polymerization method, for example, radical polymerization method. The monomer may be used singly or mixture of two or more at producing the resin (AA).

The weight average molecular weight of the resin (AA) is preferably 2500 or more (more preferably 3000 or more, and still more preferably 3500 or more), and 50,000 or less (more preferably 30,000 or less, and still more preferably 10,000 or less). The weight average molecular weight is a value determined by gel permeation chromatography using polystyrene as the standard product. The detailed condition of this analysis is described in Examples.

<Resin (AB)>

The present resist composition may contain a resin having a structural unit derived from the compound (a) but not having the properties which is insoluble or poorly soluble in aqueous alkali solution before contacting with an acid but becomes soluble in aqueous alkali solution after contacting with an acid, such resin is referred to as "acid-stable resin", in particular, if the acid-stable resin contains the structural unit derived from the compound (a), hereinafter such acid-stable resin may be referred to as "resin (AB)". Also by containing the resin (AB) in the resist composition, a resist pattern can be produced from the resist composition with wide focus margin (DOF) and free-defects.

That is, the resin (AB) may be an acid-stable resin having only the structural unit derived from the compound (a) or an acid-stable resin having the structural unit derived from the compound (a) and the structural unit derived from the acid-stable monomer (preferably at least one the acid-stable monomer selected from the acid-stable monomers (a2) to (a7)). Among these, an acid-stable resin having the structural unit derived from the compound (a) and the structural unit derived from the acid-stable monomer (a4) or the structural unit derived from the acid-stable monomer (a5-1) is preferable.

When the resin (AB) having the structural unit derived from the monomer having the acid-stable group, the content of each structural unit may be the same range described above or may be set an arbitrarily range in consideration of the property of the resin.

The present resist composition may contain the resin (AB) in addition to the resin (AA), or in stead of the resin (AA). In the latter case, the resist composition preferably further includes a resin having a structural unit derived from the monomer containing the acid-labile group, that is, a rein having the above properties. Such resin is a resin free of a structural unit derived from the compound (a) but having the above properties, hereinafter such resin may be referred to as "resin (X)", as described below.

When the present resist composition contains the resin (AB) in addition to the resin (AA), the content of the resin (AB) is, for example, 0.1 to 20 parts by weight, with respect to 100 parts by weight of the resin (AA).

When the present resist composition contains the resin (AB) in combination with the resin (X), the content of the resin (AB) is, for example, 0.1 to 20 parts by weight, with respect to 100 parts by weight of the resin (X).

When the present resist composition contains the resin (AA) and the resin (X), the weight ratio of the resin (AA): the resin (X) may be 1:99 to 99.9:0.1, preferably 1:99 to 99:1.

The resin (AB) can also be produced by a known polymerization method, for example, radical polymerization method. The monomer may be used singly or mixture of two or more at producing the resin (AB).

The weight average molecular weight of the resin (AB) is preferably 8000 or more and 80,000 or less, more preferably 10,000 or more and 60,000 or less.

<Resin (X)>

As described above, when the resist composition contains the resin (AB), the resin (X) is preferably contained in the resist composition in combination with the resin (AB). Also, the resin (X) may be contained in the resist composition in addition to the resin (AA).

The resin (X) is preferably a copolymer polymerized at least the monomer (a1), and the acid-stable monomer (a2) and/or the acid-stable monomer (a3). In this case, the weight ratio of the structural unit derived from the monomer (a1): the structural unit derived from the monomer (a2) and the structural unit derived from the monomer (a3) may be 10:90 to 95:5.

In the production of the resin (X), the monomer (a1) used is preferably at least one of the monomer having the adamantyl group (a1-1) and the monomer having the cyclohexyl group (a1-2), and more preferably the monomer having the adamantyl group (a1-1).

The acid-stable monomer (a2) is preferably the monomer having the hydroxyadamantyl group (a2-1), and the acid-stable monomer having the lactone ring (a3) is preferably at least one of the monomer having the γ-butyrolactone ring (a3-1) and the monomer having the condensed ring of the γ-butyrolactone ring and the norbornene ring (a3-2).

The resin (X) can also be produced by a known polymerization method, for example, radical polymerization method. The monomer may be used singly or mixture of two or more at producing the resin (X).

The weight average molecular weight of the resin (X) is preferably 2500 or more (more preferably 3000 or more), and 50,000 or less (more preferably 30,000 or less).

<Resin Other than Resin (AA), Resin (AB) and Resin (X)>

The present resist composition may include an acid-stable resin having only a structural unit derived from an acid-stable monomer as an additive. Examples of such acid-stable resin include a resin having a structural unit derived from the acid-stable monomer (a4) and a structural unit derived from the acid-stable monomer (a5-1). In this case, the weight ratio of the structural unit derived from the monomer (a4): the structural unit derived from the monomer (a5-1) may be 0 to 100:100 to 0, and preferably 10:90 to 90:10.

When the resist composition contains such resin, the content thereof may be 20 weight % or less, preferably 15 weight % or less, and more preferably 10 weight % or less, with respect to 100 parts by weight of the total resin.

<Acid Generator (B1)>

An acid generator (B1) contained in the present resist composition is a compound represented by the formula (B1). In the acid generator (B1), electropositive $Z^+$ hereinafter may be referred to as "an organic cation", and electronegative one in which the organic cation has been removed from the compound may be referred to as "sulfonate anion".

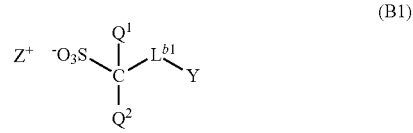

(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and the —$CH_2$— contained in the aliphatic hydrocarbon group may be replaced by —O— or —CO—;

Y represents an optionally substituted $C_1$ to $C_{18}$ aliphatic hydrocarbon group or an optionally substituted $C_3$ to $C_{18}$ alicyclic hydrocarbon group, and a —$CH_2$— contained in the aliphatic hydrocarbon group and alicyclic hydrocarbon group may be replaced by —O—, —CO— or —$SO_2$—; and $Z^+$ represents an organic cation.

Examples of the perfluoroalkyl group of $Q^1$ and $Q^2$ include trifluoromethyl, perfluoroethyl, perfluoropropyl, perfluoroisopropyl, perfluorobutyl, perfluoro-sec-butyl, perfluoro-tert-butyl, perfluoropentyl and perfluorohexyl groups.

Among these, $Q^1$ and $Q^2$ independently are preferably trifluoromethyl or fluorine atom, and more preferably both a fluorine atom. This can result in a broader focus margin at producing a resist pattern.

Examples of the a divalent aliphatic hydrocarbon group of $L^{b1}$ include;

a linear chain alkanediyl group such as methylene, ethylene, propane-1,3-diyl, propane-1,2-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl groups, ethan-1,1-diyl, propane-1,1-diyl and propane-2,2-diyl groups;

a branched chain alkanediyl group such as a group in which a linear chain alkanediyl group is bonded a side chain of a $C_1$ to $C_4$ alkyl group such as methyl, ethyl, propyl, isopropyl, butyl, sec-butyl and tert-butyl, for example, butan-1,3-diyl, 2-methylpropane-1,3-diyl, 2-methylpropane-1,2-diyl, pentane-1,4-diyl, 2-methylbutane-1,4-diyl groups;

a mono-alicyclic hydrocarbon group such as cyclobutan-1,3-diyl, cyclopentan-1,3-diyl, cyclohexane-1,2-diyl, 1-methylhexane-1,2-diyl, cyclohexane-1,4-diyl, cyclooctan-1,2-diyl, cyclooctan-1,5-diyl groups;

a poly-alicyclic hydrocarbon group such as norbornane-2,3-diyl, norbornane-1,4-diyl, norbornane-2,5-diyl, adamantane-1,5-diyl and adamantane-2,6-diyl groups; and a combination of two or more groups.

Examples of the aliphatic hydrocarbon group of $L^{b1}$ in which the —$CH_2$— contained in the aliphatic hydrocarbon group is replaced by —O— or —CO— include, for example, groups represented by the formula (b1-1) to the formula (b1-6). Among these, the groups represented by the formula (b1-

1) to the formula (b1-4) are preferable, and the group represented by the formula (b1-1) or the formula (b1-2) is more preferable.

In the formula (b1-1) to the formula (b1-6), the group is represented so as to correspond with two sides of the formula (B1), that is, the left side of the group bonds to $C(Q^1)(Q^2)$- and the right side of the group bonds to —Y (examples of the formula (b1-1) to the formula (b1-6) are the same as above). * represents a bond.

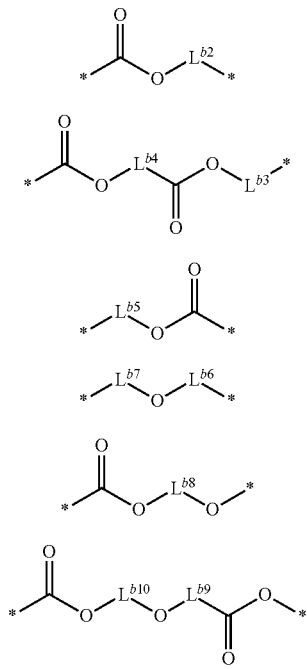

wherein $L^{b2}$ represents a single bond or a $C_1$ to $C_{15}$ aliphatic hydrocarbon group;

$L^{b3}$ represents a single bond or a $C_1$ to $C_{12}$ aliphatic hydrocarbon group;

$L^{b4}$ represents a $C_1$ to $C_{13}$ aliphatic hydrocarbon group, the total number of the carbon atoms in $L^{b3}$ and $L^{b4}$ is at most 13;

$L^{b5}$ represents a $C_1$ to $C_{15}$ aliphatic hydrocarbon group;

$L^{b6}$ and $L^{b7}$ independently represent a $C_1$ to $C_{15}$ aliphatic hydrocarbon group, the total number of the carbon atoms in $L^{b6}$ and $L^{b7}$ is at most 16;

$L^{b8}$ represents a $C_1$ to $C_{14}$ aliphatic hydrocarbon group;

$L^{b9}$ represents a single bond or a $C_1$ to $C_{11}$ aliphatic hydrocarbon group;

$L^{b10}$ represents a $C_1$ to $C_{12}$ aliphatic hydrocarbon group, the total number of the carbon atoms in $L^{b9}$ and $L^{b10}$ is at most 12.

The aliphatic hydrocarbon group is preferably a saturated aliphatic hydrocarbon group, and more preferably a liner or branched chain alkanediyl group, and may be mixed with a liner, a branched or a cyclic saturated hydrocarbon group.

Among these, the divalent group represented by the formula (b1-1) is preferable, and the divalent group represented by the formula (b1-1) in which $L^{b2}$ represents a single bond or a —$CH_2$— is more preferable.

Specific examples of the divalent group represented by the formula (b1-1) include groups below.

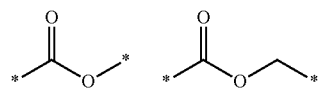

Specific examples of the divalent group represented by the formula (b1-2) include groups below.

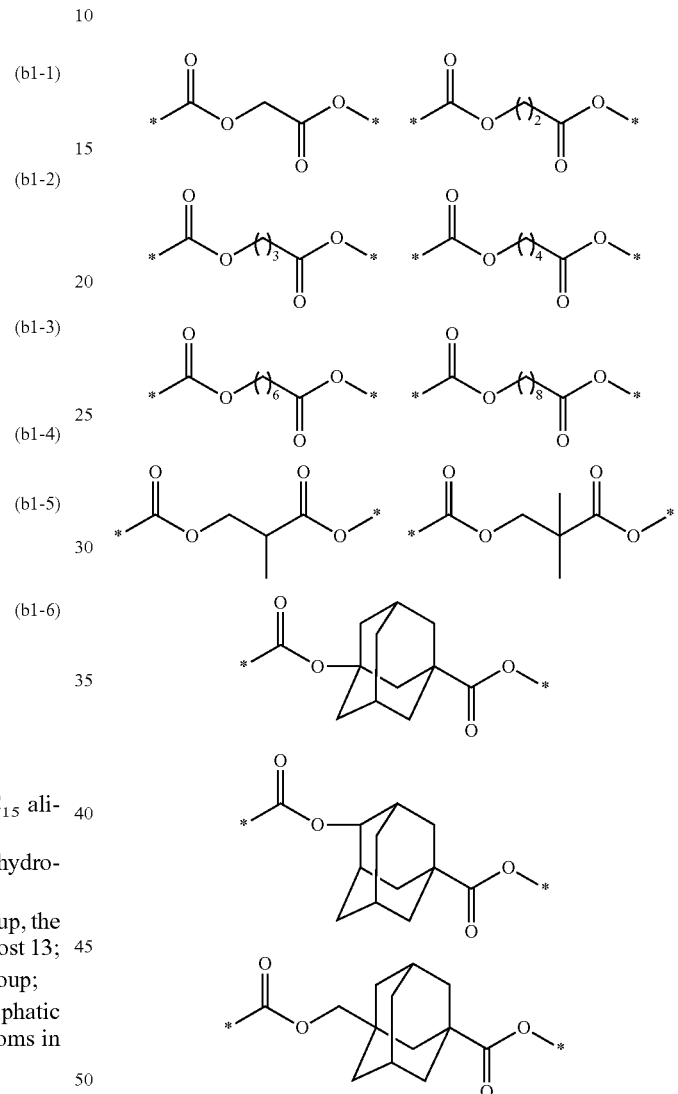

Specific examples of the divalent group represented by the formula (b1-3) include groups below.

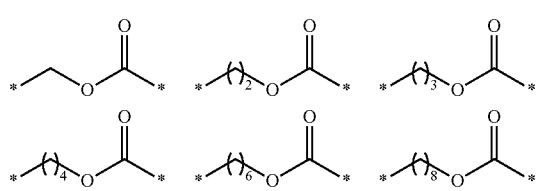

Specific examples of the divalent group represented by the formula (b1-4) include a group below.

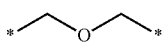

Specific examples of the divalent group represented by the formula (b1-5) include groups below.

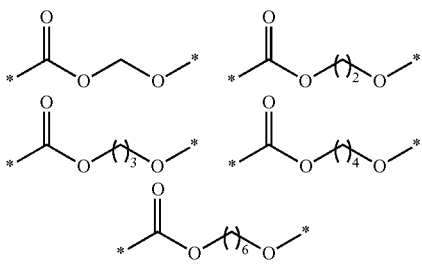

Specific examples of the divalent group represented by the formula (b1-6) include groups below.

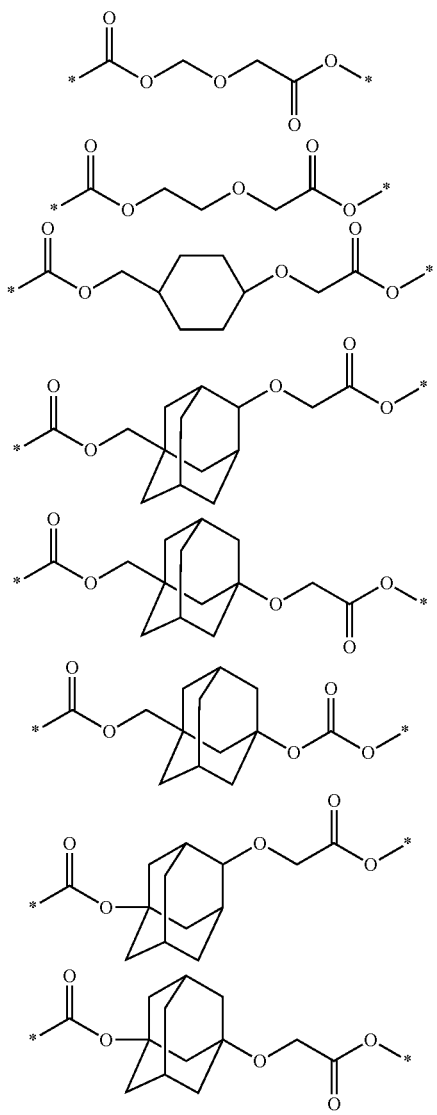

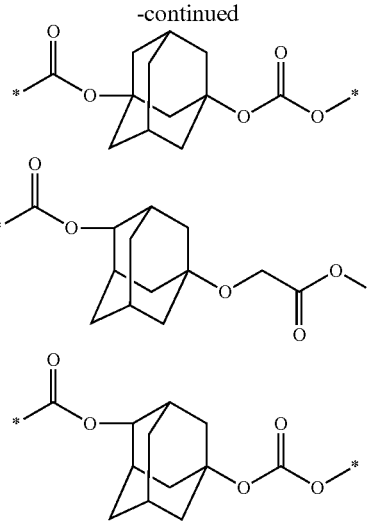

The aliphatic hydrocarbon group of $L^{a1}$ may have a substituent.

Examples of the substituent thereof include a halogen atom, a hydroxy group, a carboxy group, a $C_6$ to $C_{18}$ aromatic hydrocarbon group, a $C_7$ to $C_{21}$ aralkyl group, a $C_2$ to $C_4$ acyl group and a glycidyloxy group.

Examples of the aromatic hydrocarbon group include phenyl, naphthyl, p-methylphenyl, p-tert-butylphenyl, p-adamantylphenyl, tolyl, xylyl, cumenyl, mesityl, biphenyl, anthryl, phenanthryl, 2,6-diethylphenyl and 2-methyl-6-ethylphenyl groups.

Examples of the aralkyl group include benzyl, phenethyl, phenylpropyl, trityl, naphthylmethyl and naphthylethyl groups.

Examples of the acyl group include acetyl, propionyl and butyryl groups.

The aliphatic hydrocarbon group of Y is preferably a $C_1$ to $C_{18}$ alkyl group, a $C_3$ to $C_{18}$ alicyclic hydrocarbon group or a combination group thereof. In this case, total number of the carbon atom of the alkyl and alicyclic hydrocarbon groups is 4 to 18. Examples of the alkyl group include methyl, ethyl, propyl, butyl, heptyl and hexyl groups. The alkyl group is preferably a $C_1$ to $C_6$ alkyl group.

Examples of the alicyclic hydrocarbon group include a group represented by the formula (Y1) to the formula (Y11) as described below. The alicyclic hydrocarbon group is preferably a $C_3$ to $C_{12}$ alicyclic hydrocarbon group.

 (Y1)

 (Y2)

 (Y3)

 (Y4)

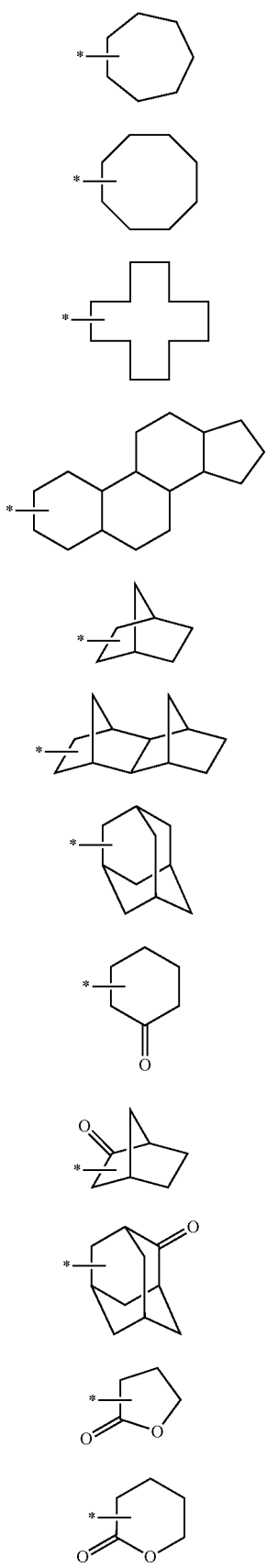
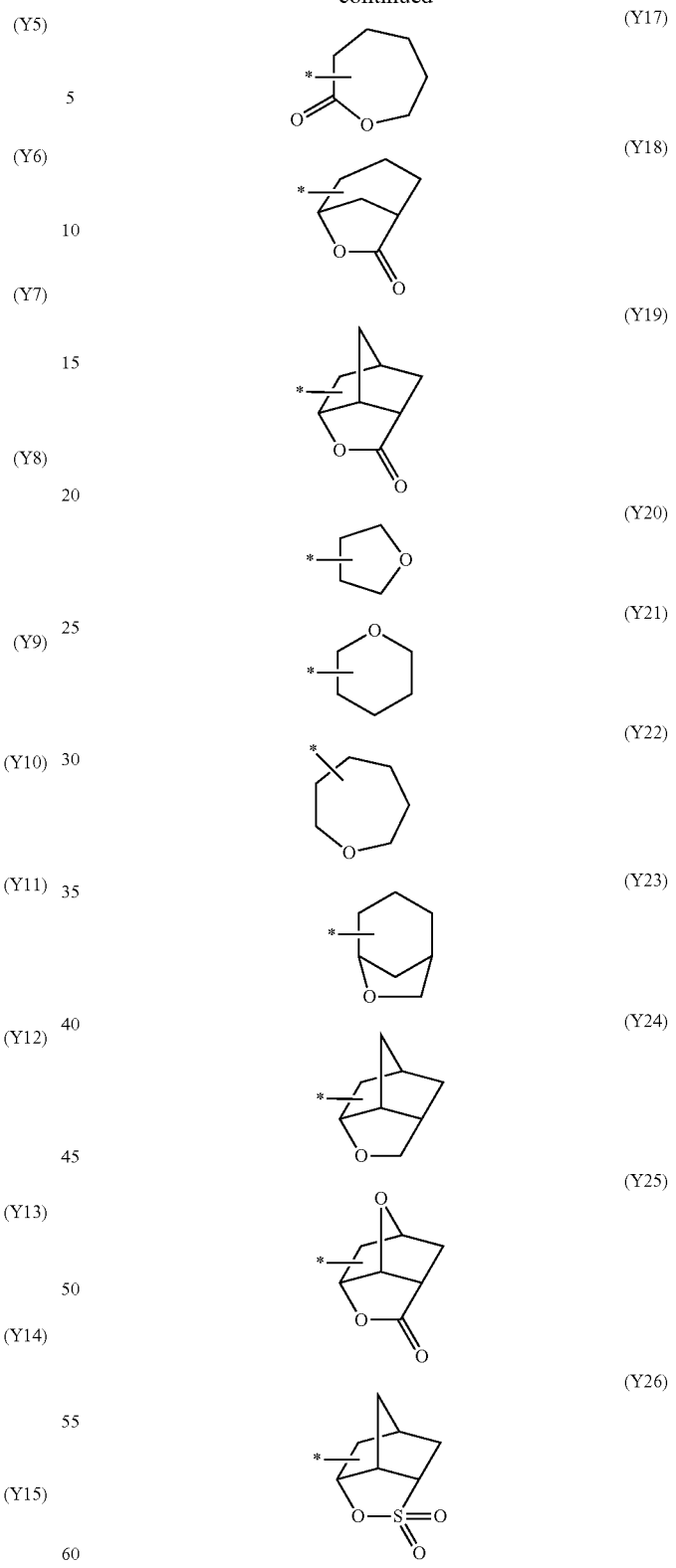
Examples of Y in which a —CH$_2$— contained in the aliphatic hydrocarbon group is replaced by —O—, —CO— or SO$_2$— include, for example,
a cyclic ether group (a group replaced one or two —CH$_2$— by one or two —O—), a cyclic ketone group (a group replaced one or two —CH$_2$— by one or two —CO—), a sultone ring group (a group replaced adjacent two —CH$_2$— by —O— and —SO$_2$—, respectively), or a lactone ring group (a group replaced adjacent two —CH$_2$— by —O— and —CO—, respectively).

Examples thereof include a group represented by the formula (Y12) to the formula (Y26) as described above.

Among these, the aliphatic hydrocarbon group of Y is preferably groups represented by the formula (Y1) to the formula (Y19), more preferably group represented by the formula (Y11), (Y14), (Y15), (Y16) or (Y19), and still more preferably group represented by the formula (Y11) or (Y14).

Examples of the substituent of Y include a halogen atom (other than a fluorine atom), a hydroxy group, a C$_1$ to C$_{12}$ alkoxy group, a C$_6$ to C$_{18}$ aromatic hydrocarbon group, a C$_7$ to C$_{21}$ aralkyl group, a C$_2$ to C$_4$ acyl group, a glycidyloxy group or a —(CH$_2$)$_{j2}$—O—CO—R$^{b1}$ group, wherein R$^{b1}$ represents a C$_1$ to C$_{16}$ hydrocarbon group, j2 represents an integer of 0 to 4. The aromatic hydrocarbon group and the aralkyl group may further have a substituent such as a C$_1$ to C$_6$ alkyl group, a halogen atom or a hydroxy group.

Examples of the alkoxyl group include methoxy, ethoxy, propoxy, butoxy, hexyloxy, octyloxy 2-ethylhexyloxy, nonyloxy, decyloxy, undecyloxy and dodecyloxy groups.

Examples of the hydrocarbon group of R$^{b1}$ include a C$_1$ to C$_{16}$ chain aliphatic hydrocarbon group, a C$_3$ to C$_{16}$ alicyclic hydrocarbon group and a C$_6$ to C$_{18}$ aromatic hydrocarbon group.

Examples of Y having alkyl group(s)-containing alicyclic hydrocarbon group include the groups below.

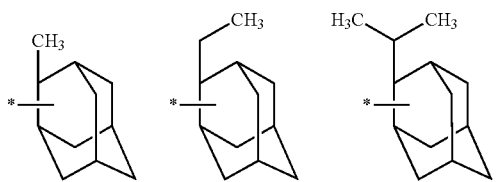

Examples of Y having a hydroxy group or a hydroxy group-containing alicyclic hydrocarbon group include the groups below.

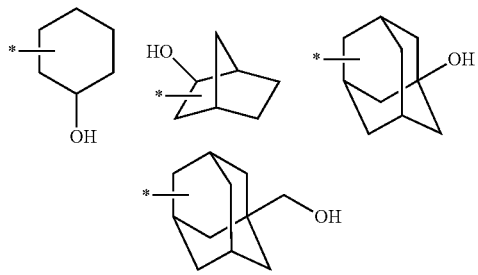

Examples of Y having an aromatic hydrocarbon group-containing alicyclic hydrocarbon group include the groups below.

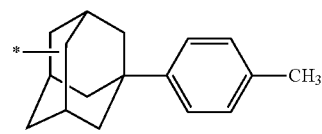

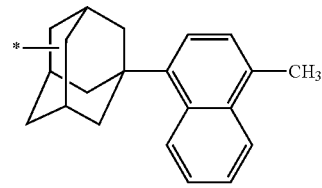

Examples of Y having a —(CH$_2$)$_{j2}$—O—CO—R$^{b1}$ group-containing alicyclic hydrocarbon group include the group below.

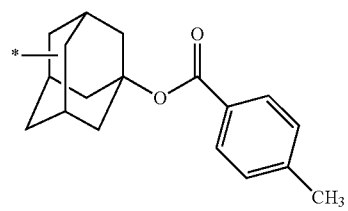

Y is preferably an adamantyl group which is optionally substituted, for example, a hydroxy group, and more preferably an adamantyl group and a hydroxyadamantyl group.

The sulfonate anion is preferably a divalent group represented by the formula (b1-1), and more preferably groups represented by the formula (b1-1-1) to the formula (b1-1-9).

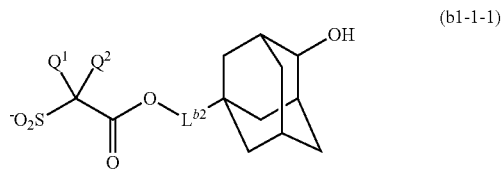
(b1-1-1)

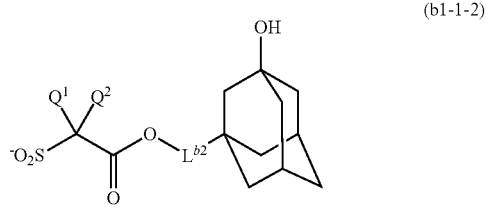
(b1-1-2)

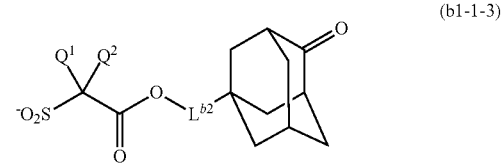
(b1-1-3)

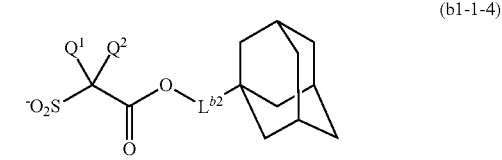
(b1-1-4)

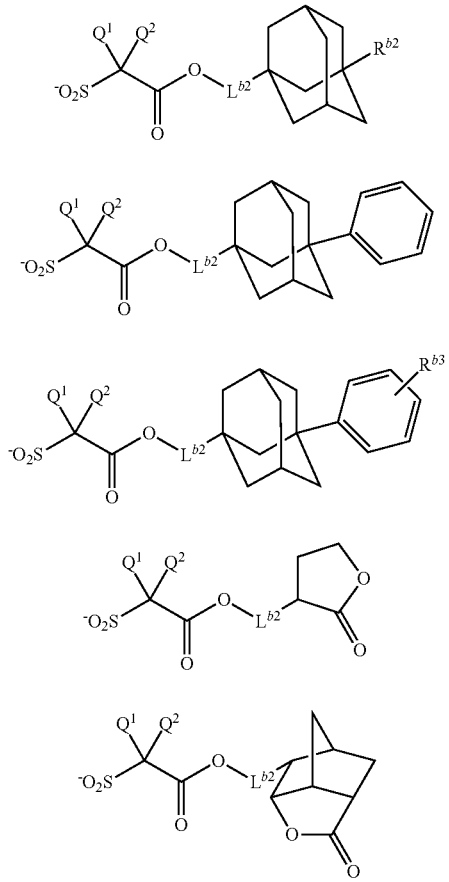

In the formula (b1-1-1) to the formula (b1-1-9), $Q^1$, $Q^2$ and $L^{b2}$ represent the same meaning as defined above (preferably both fluorine atom for $Q^1$ and $Q^2$, and preferably the group represented by the formula (b1-1) for $L^{b2}$). $R^{b2}$ and $R^{b3}$ independently represent a $C_1$ to $C_4$ aliphatic hydrocarbon group or a hydroxy group (preferably methyl group or a hydroxy group).

Examples of the sulfonate anion having a chain aliphatic hydrocarbon group or a non-substituted alicyclic hydrocarbon for Y, and a divalent group represented by the formula (b1-1) for $L^{b1}$ include anions below.

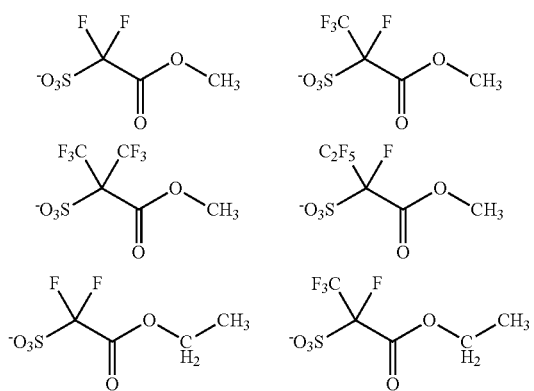

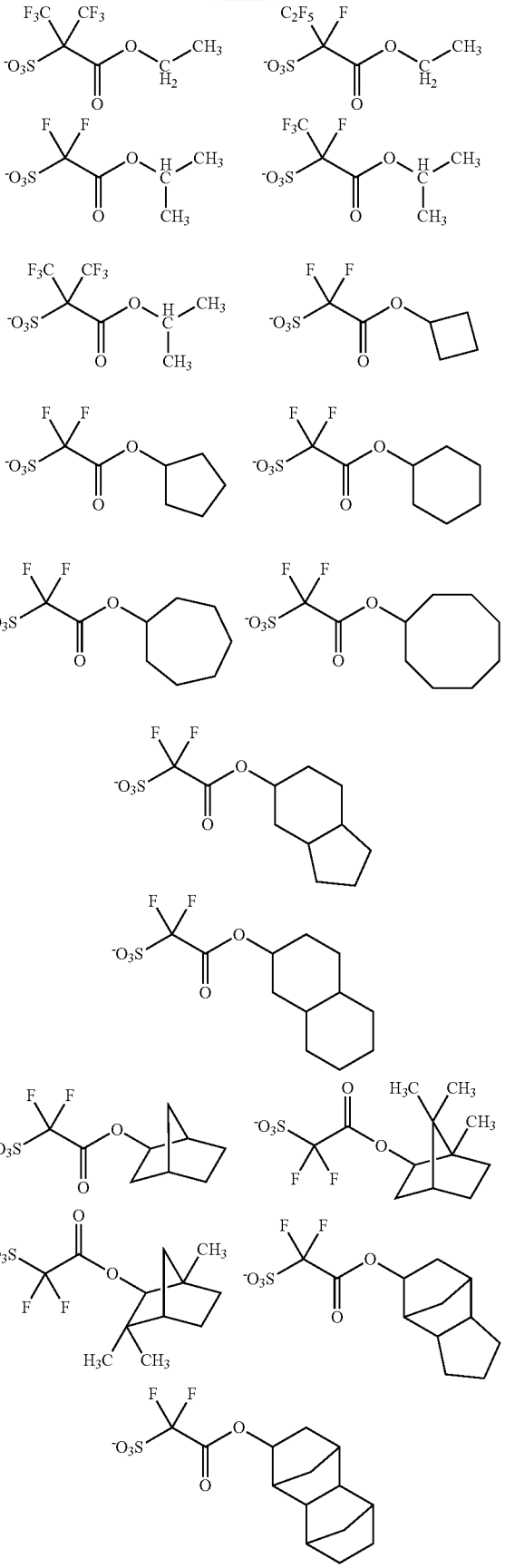

125
-continued
126
-continued
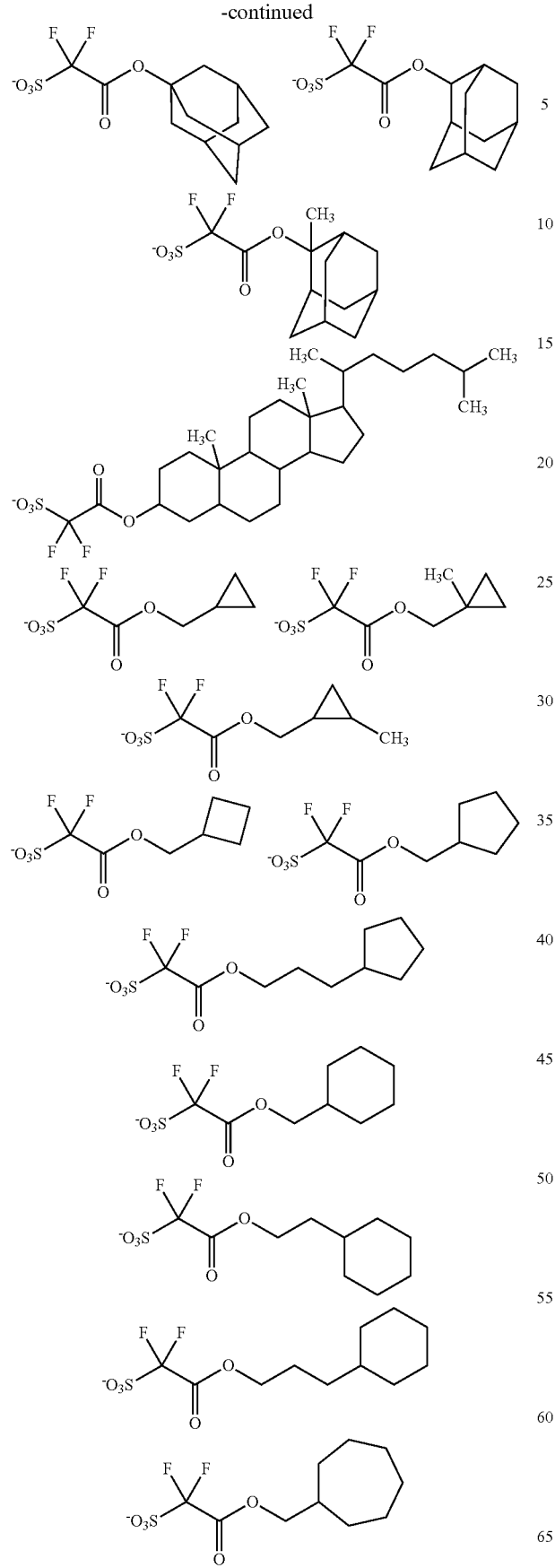
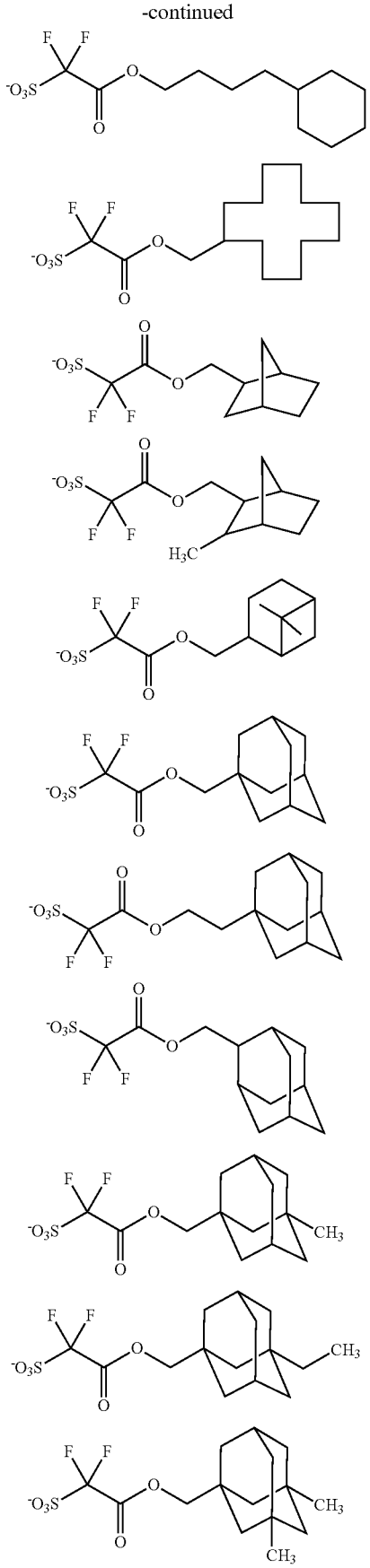

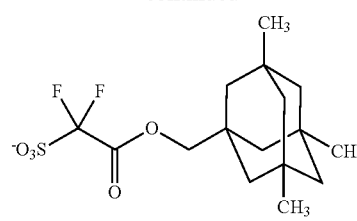
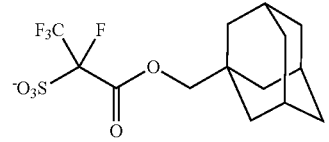
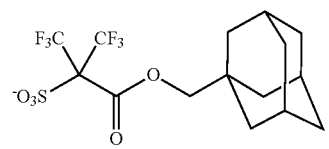
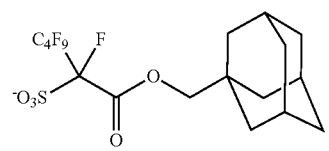
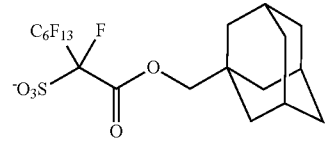
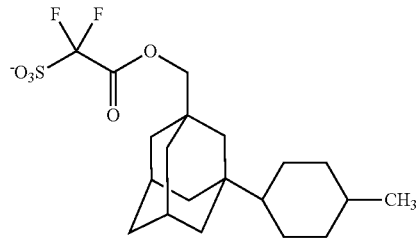
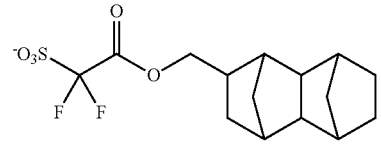
Examples of the sulfonate anion having an alicyclic hydrocarbon group substituted with a —$(CH_2)_{j2}$—CO—O—$R^{b1}$ group for Y, and a divalent group represented by the formula (b1-1) for $L^{b1}$ include anions below.
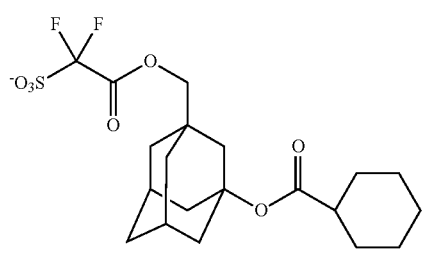
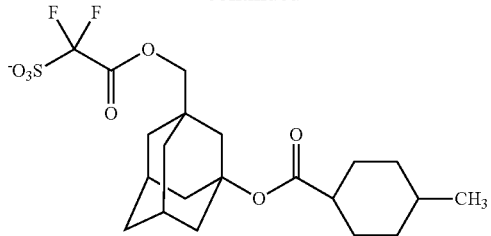
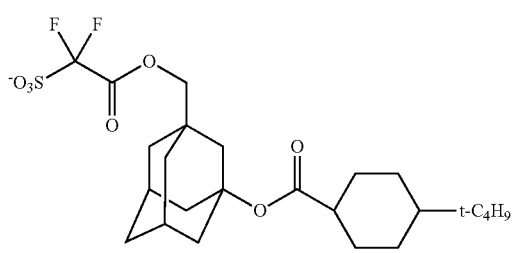
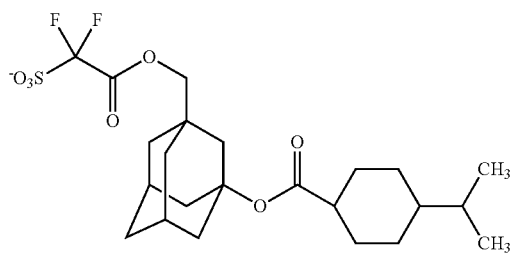
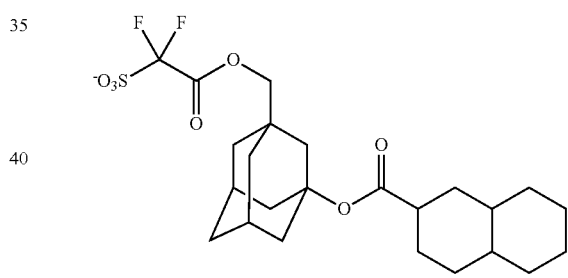
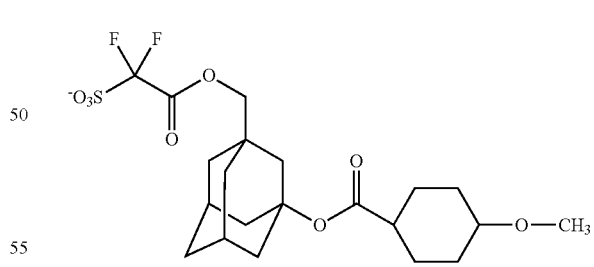
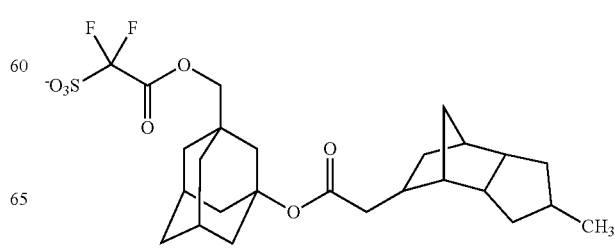

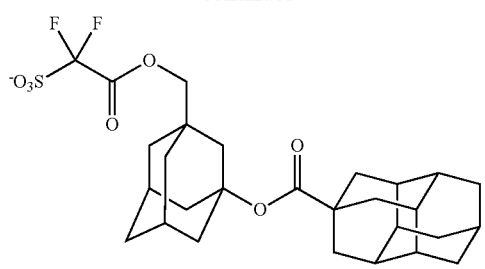
Examples of the sulfonate anion having an alicyclic hydrocarbon group substituted with a hydroxy group for Y, and a divalent group represented by the formula (b1-1) for $L^{b1}$ include anions below.
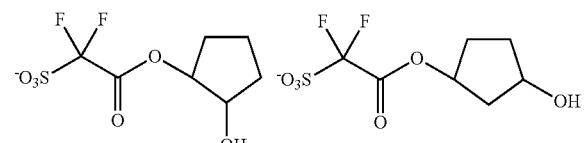
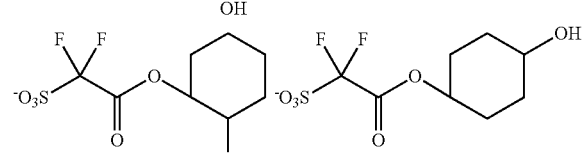
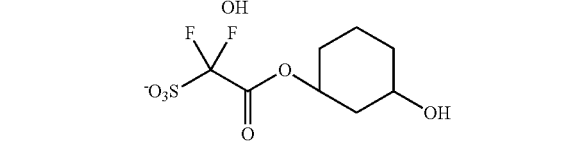
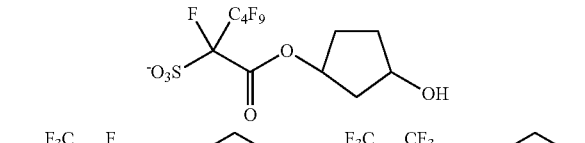
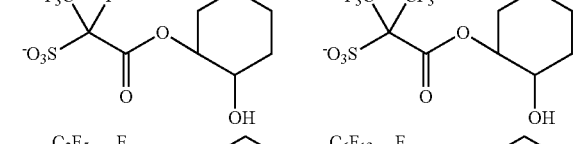
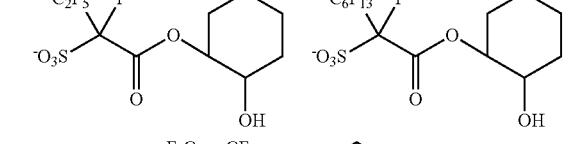
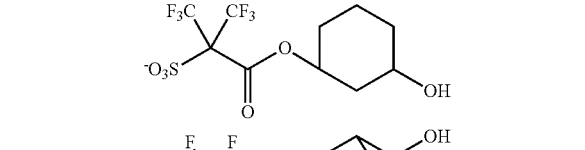
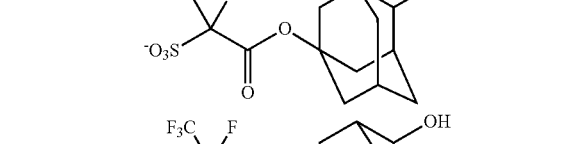
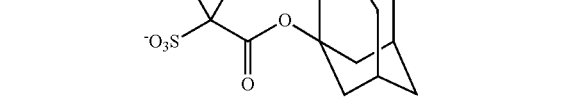
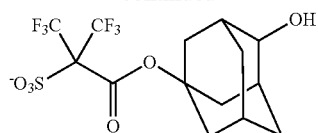
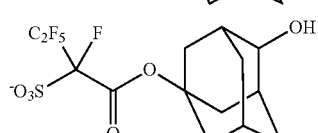
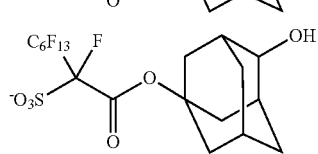
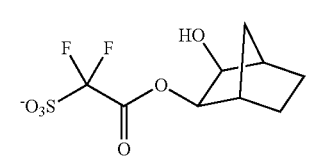
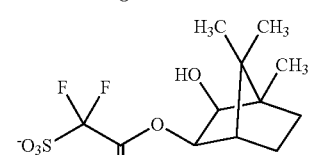
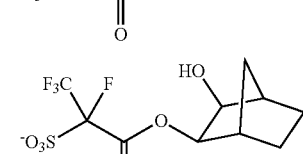
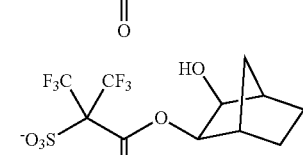
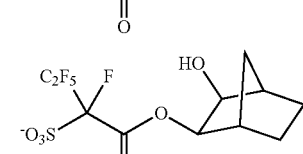
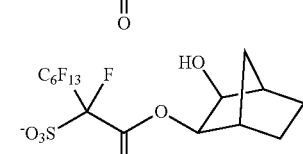
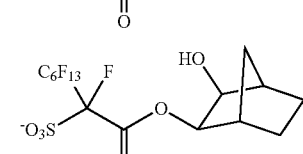
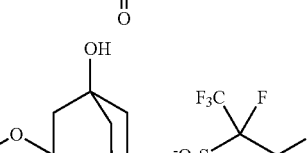
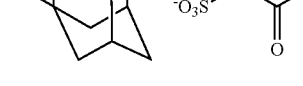

131
-continued
132
-continued
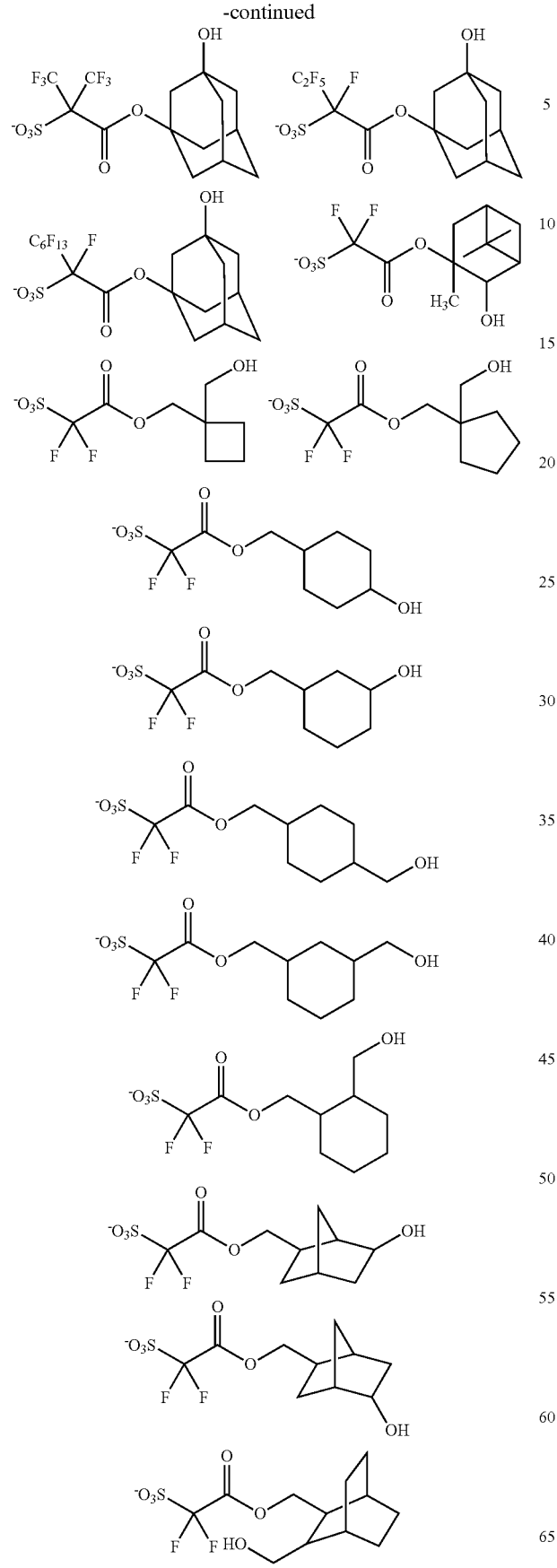
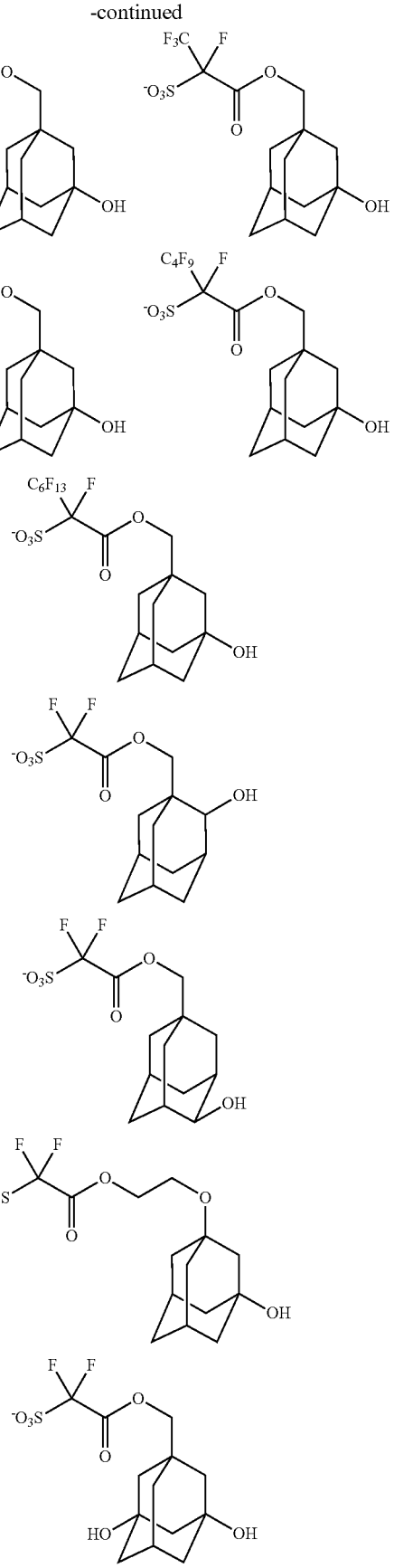

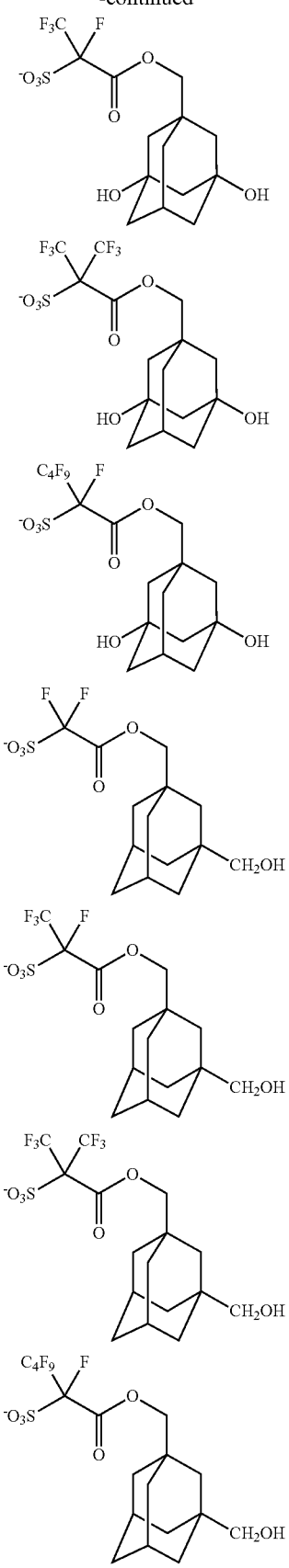
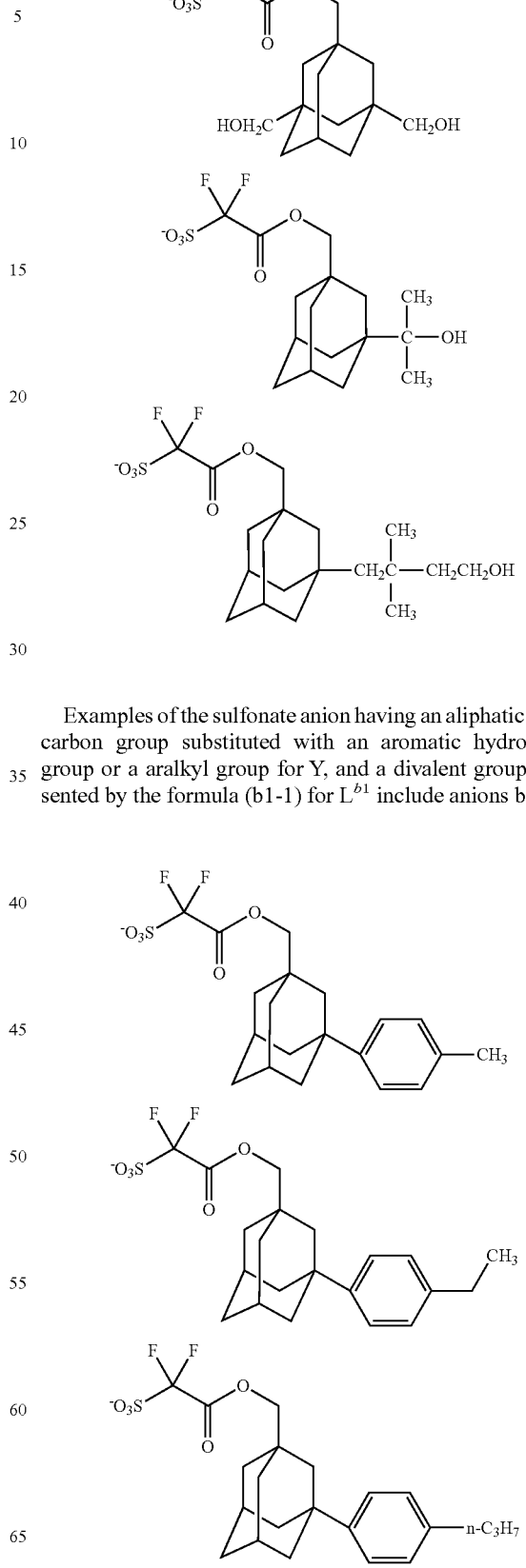
Examples of the sulfonate anion having an aliphatic hydrocarbon group substituted with an aromatic hydrocarbon group or a aralkyl group for Y, and a divalent group represented by the formula (b1-1) for $L^{b1}$ include anions below.

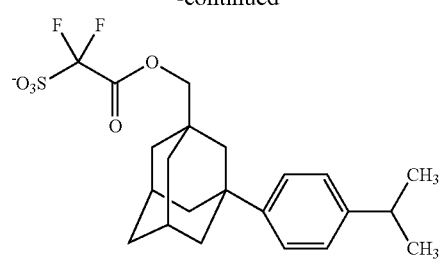
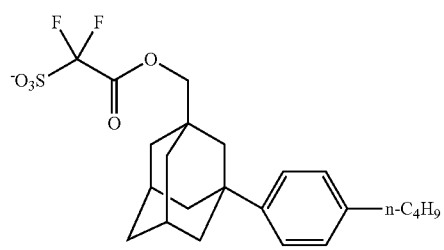
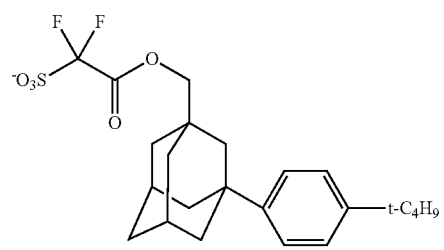
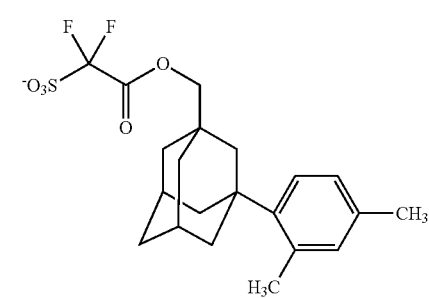
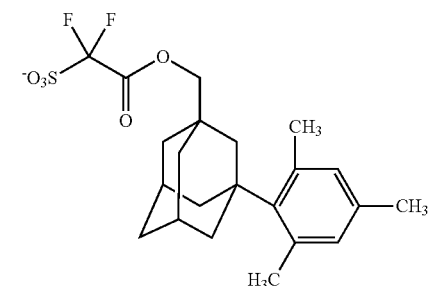
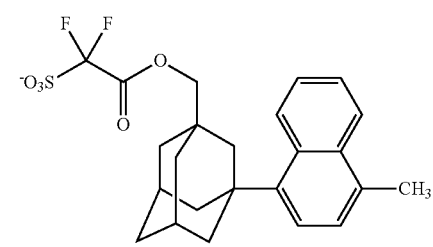
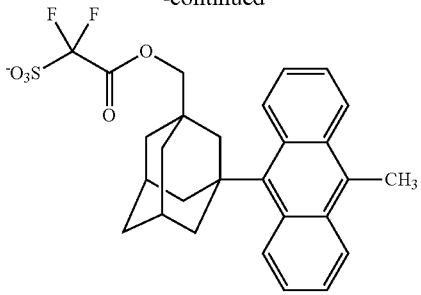
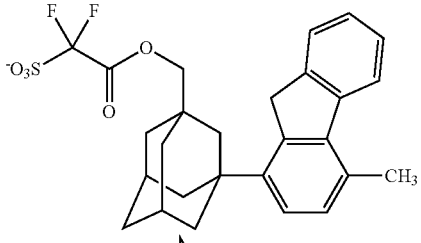
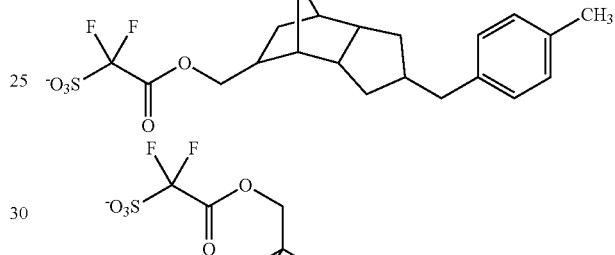
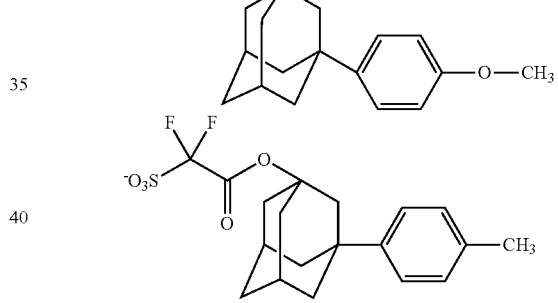
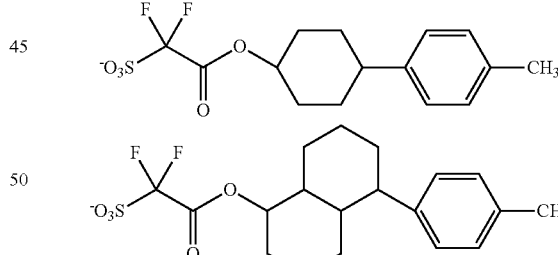
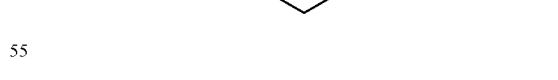
Examples of the sulfonate anion having a cyclic ether group for Y, and a divalent group represented by the formula (b1-1) for $L^{b1}$ include anion below.
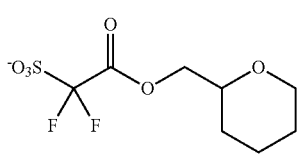

Examples of the sulfonate anion having a lactone ring for Y, and a divalent group represented by the formula (b1-1) for $L^{b1}$ include anions below.
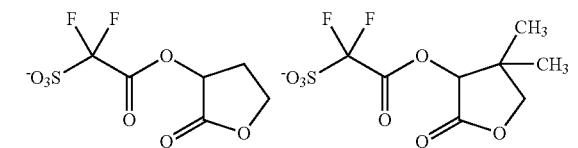
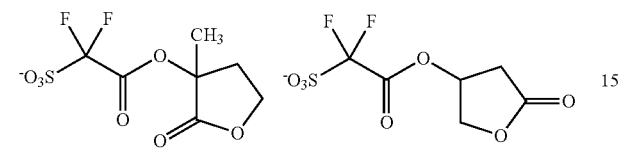
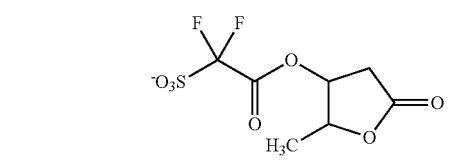
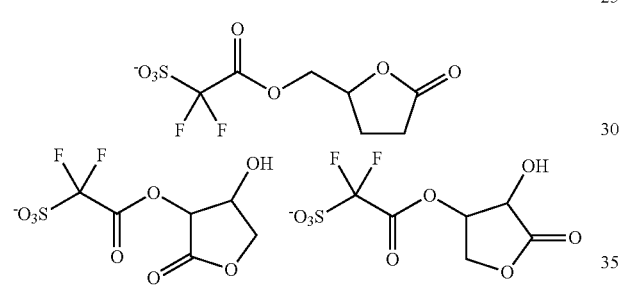
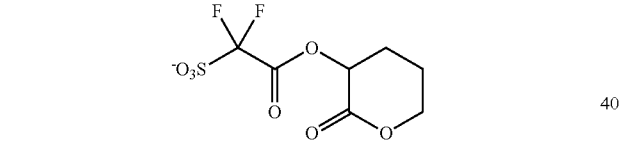
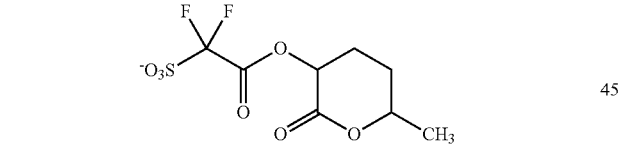
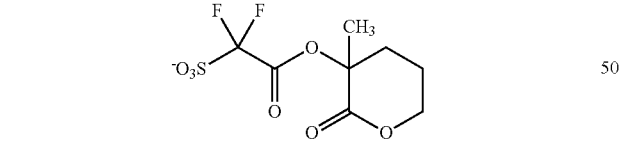
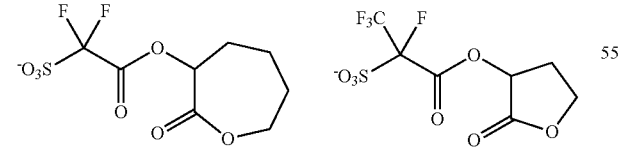
-continued
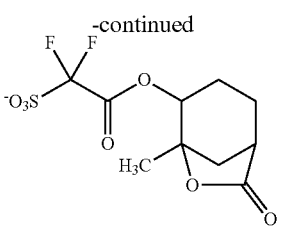
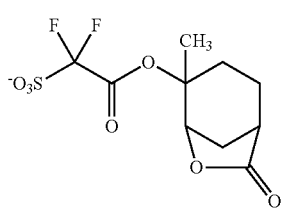
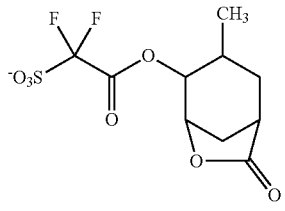
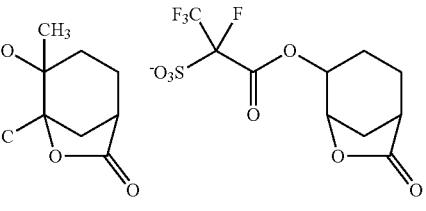
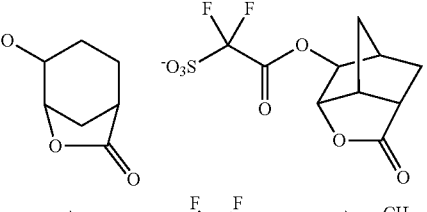
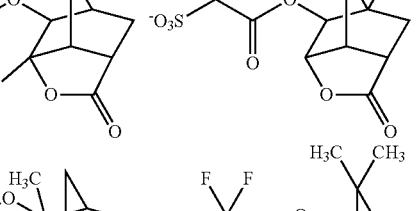
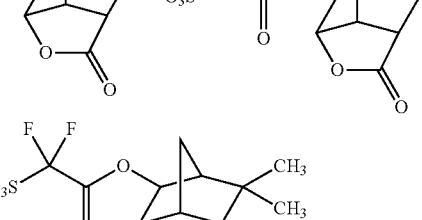

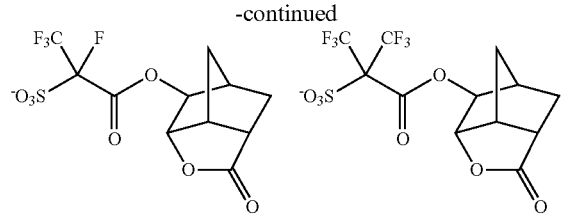
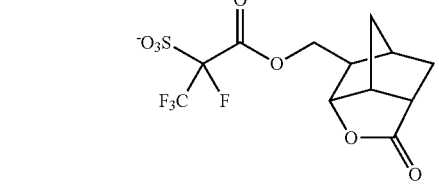
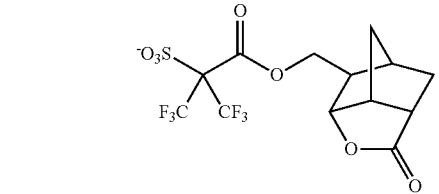
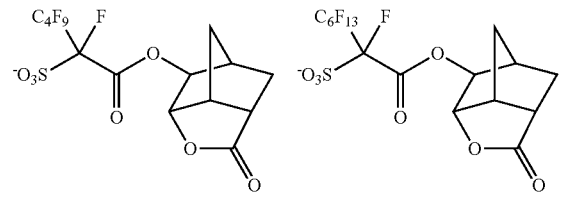
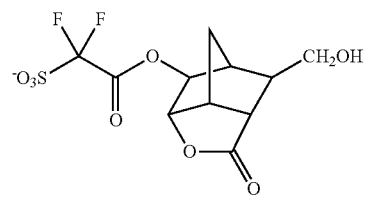
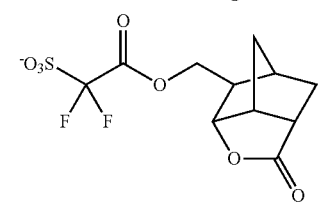
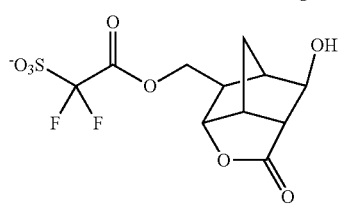
Examples of the sulfonate anion having a cyclic ketone group for Y, and a divalent group represented by the formula (b1-1) for $L^{b1}$ include anions below.
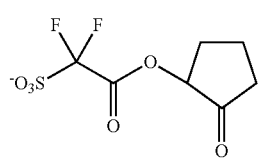
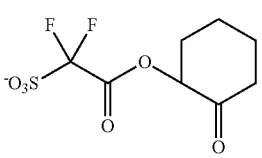
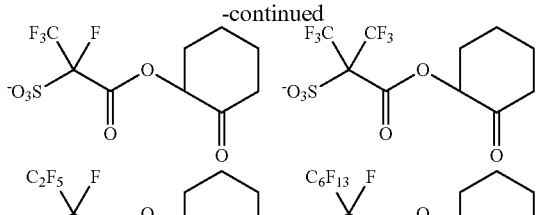
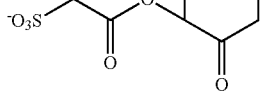
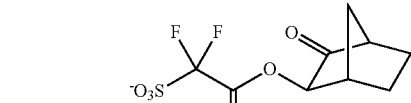
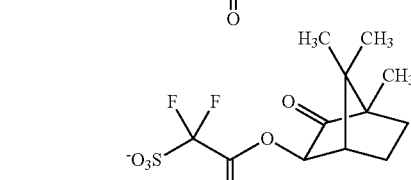
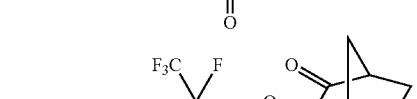
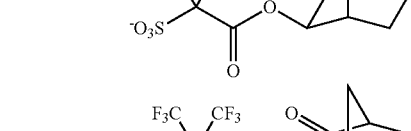
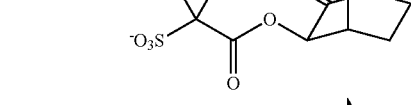
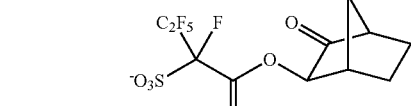
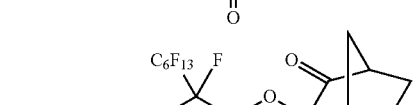
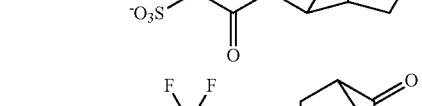
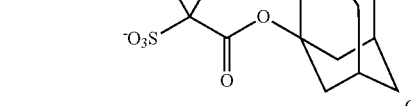
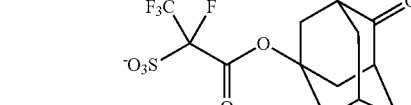
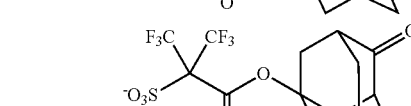
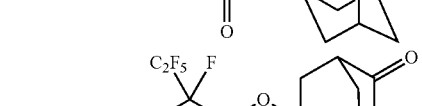
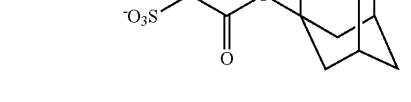

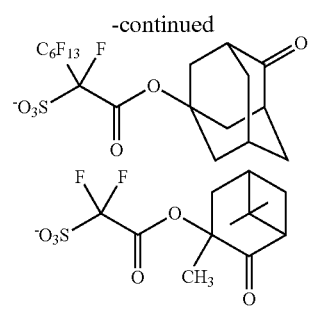
Examples of the sulfonate anion having a sultone ring group for Y, and a divalent group represented by the formula (b1-1) for $L^{b1}$ include anions below.
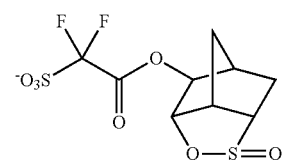 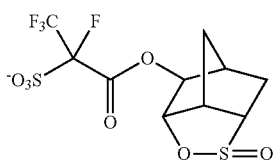
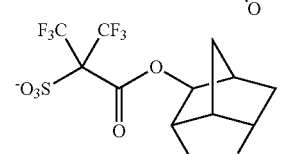 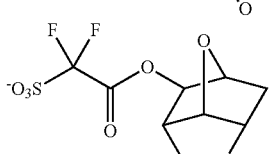
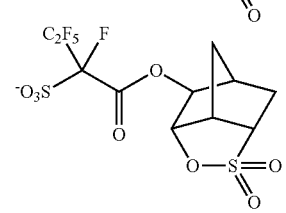
Examples of the sulfonate anion having a chain aliphatic hydrocarbon group or a non-substituted alicyclic hydrocarbon for Y, and a divalent group represented by the formula (b1-2) for $L^{b1}$ include anions below.
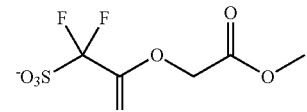
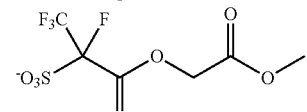
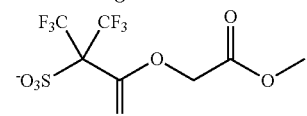
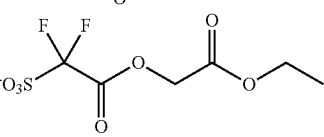
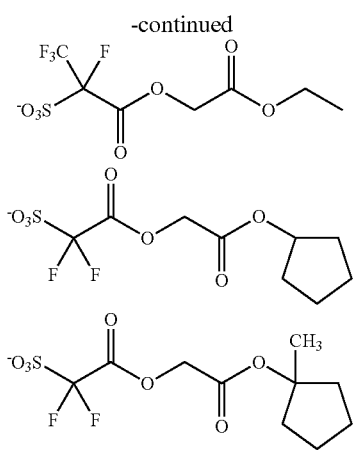
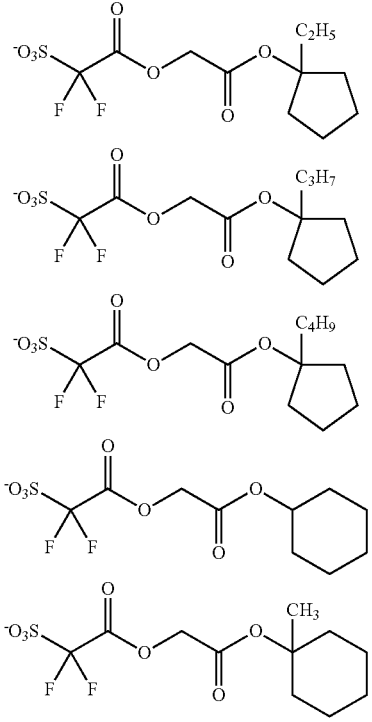
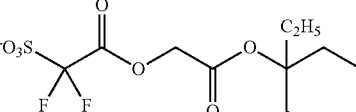
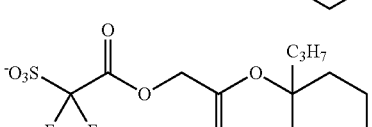
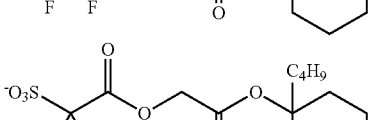
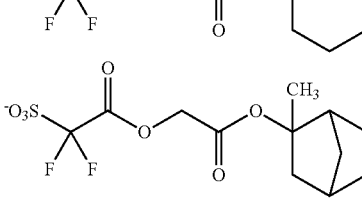

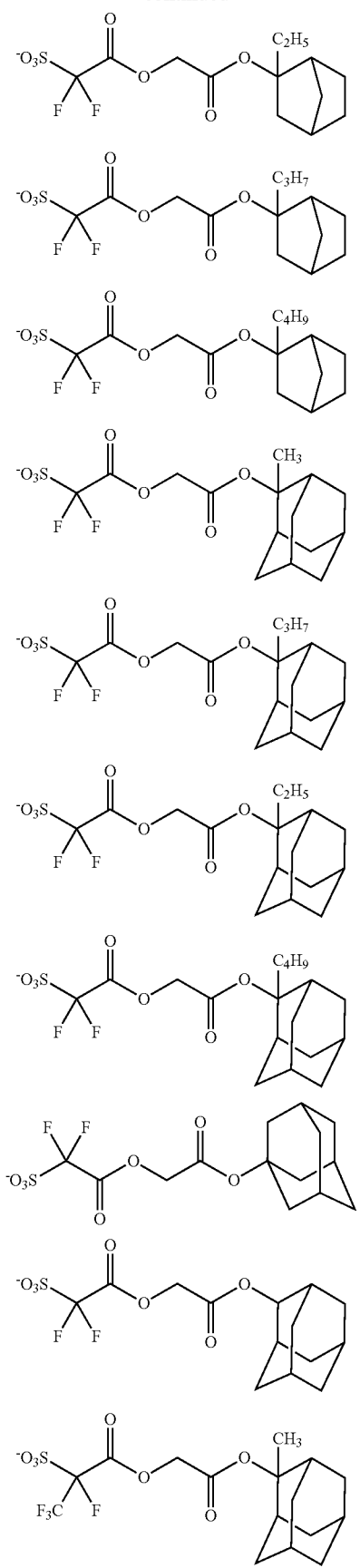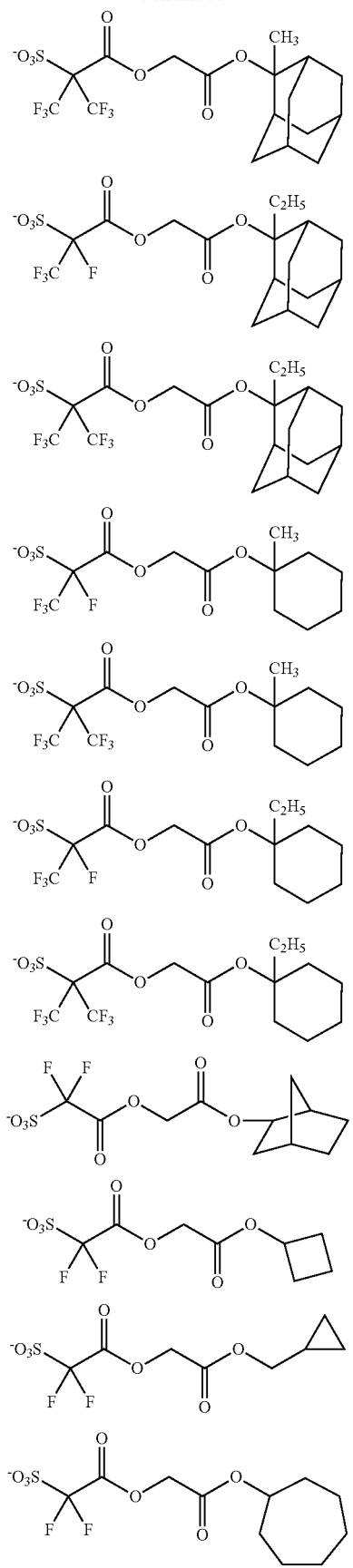

-continued
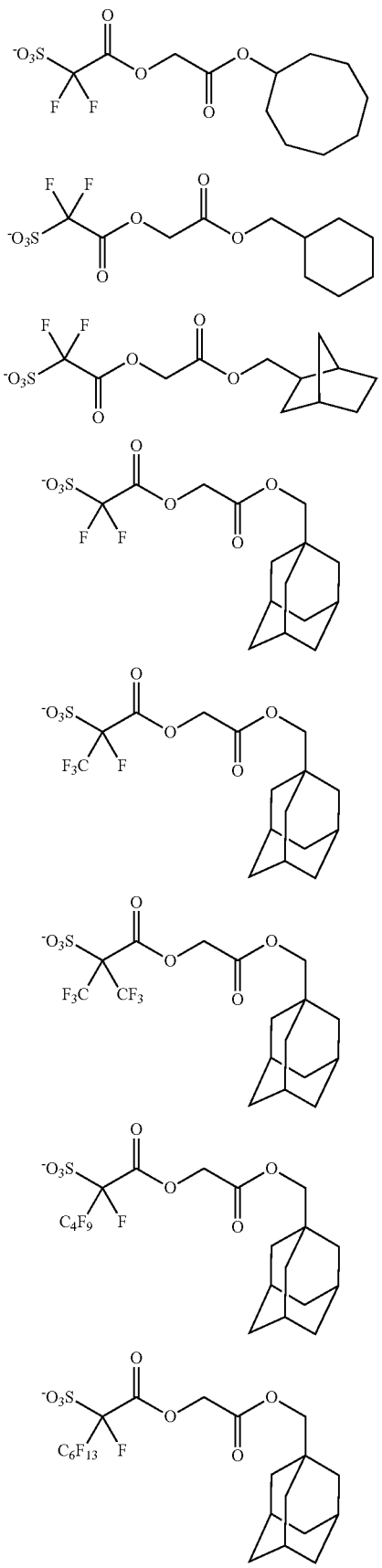
-continued
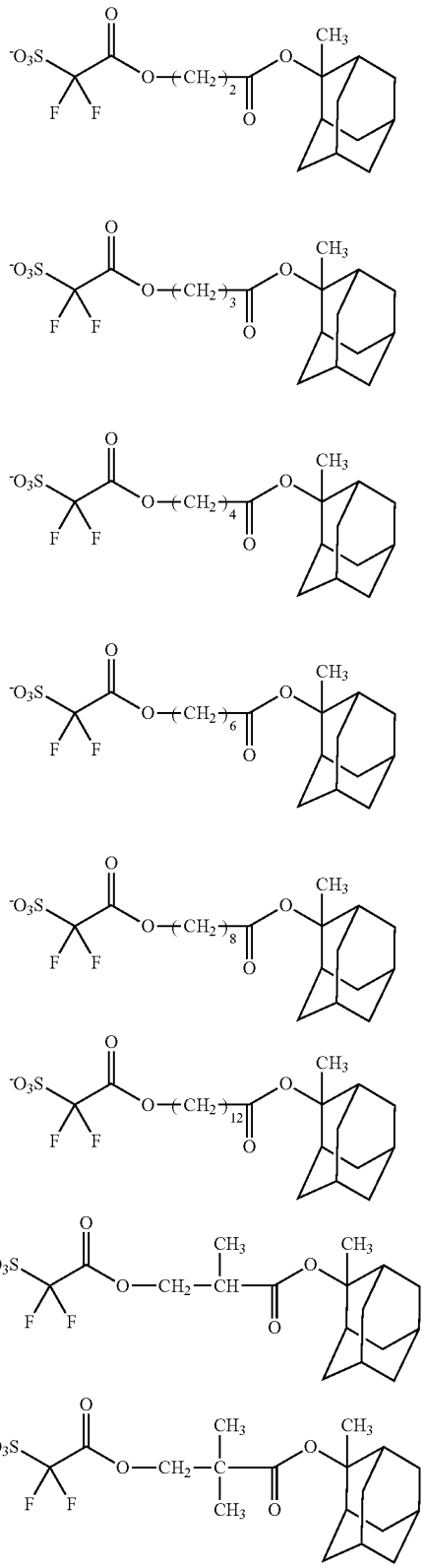
Examples of the sulfonate anion having an alicyclic hydrocarbon group substituted with a —$(CH_2)_{j2}$—CO—O—$R^{b1}$ group for Y, and a divalent group represented by the formula (b1-2) for $L^{b1}$ include anions below.

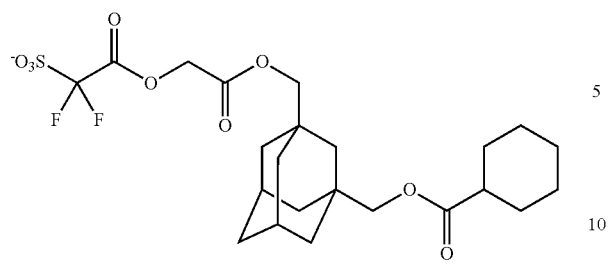
Examples of the sulfonate anion having an alicyclic hydrocarbon group substituted with a hydroxy group for Y, and a divalent group represented by the formula (b1-2) for $L^{b1}$ include anions below.
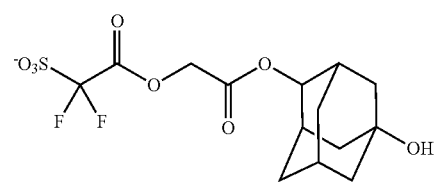
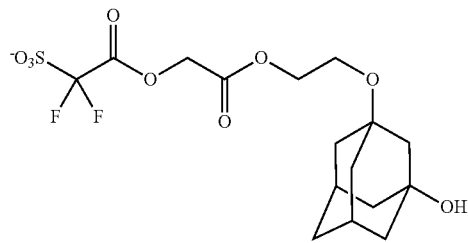
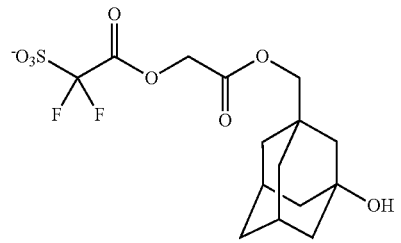
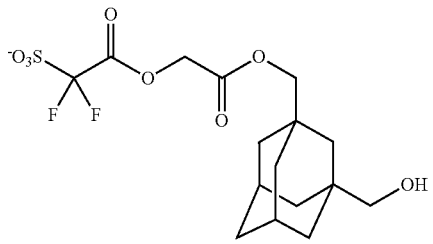
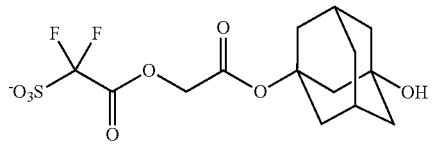
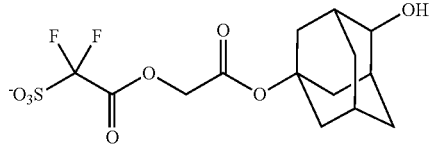
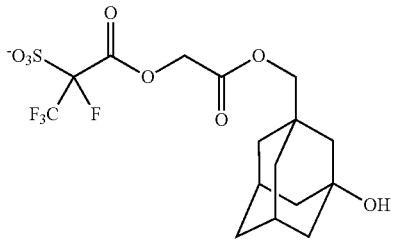
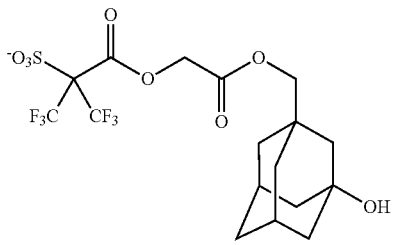
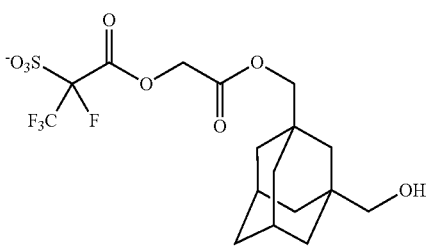
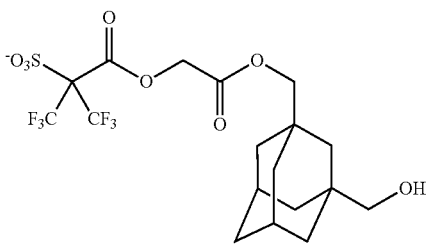
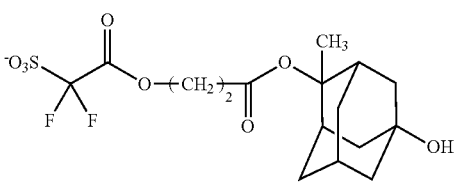
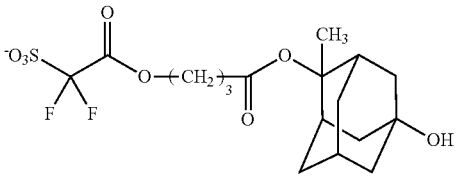
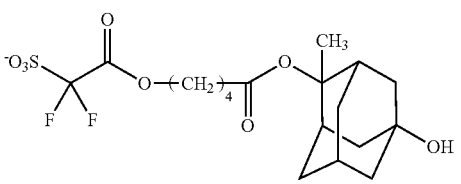
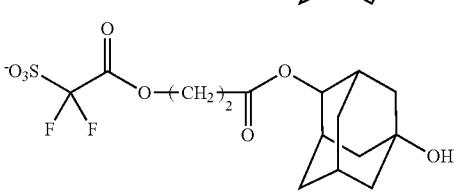

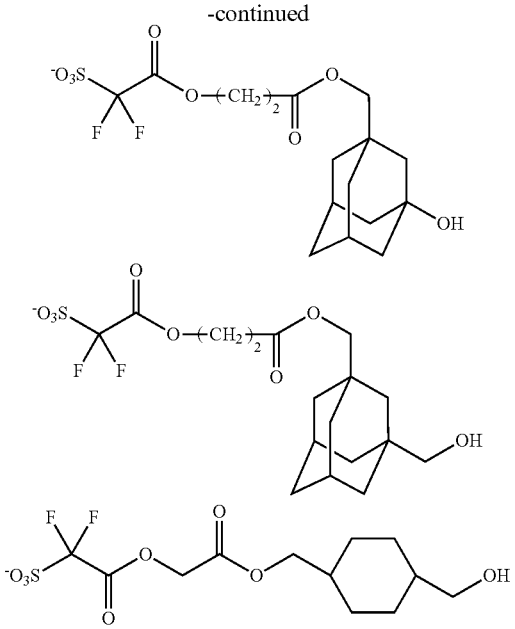

Examples of the sulfonate anion having an aliphatic hydrocarbon group substituted with an aromatic hydrocarbon group or a aralkyl group for Y, and a divalent group represented by the formula (b1-2) for $L^{b1}$ include anions below.

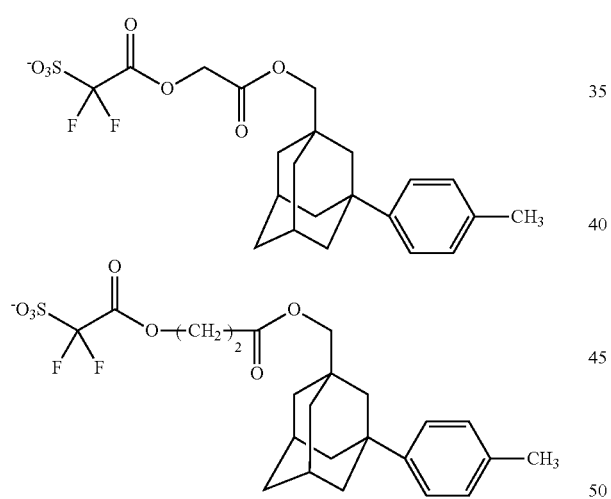

Examples of the sulfonate anion having a cyclic ether group for Y, and a divalent group represented by the formula (b1-2) for $L^{b1}$ include anion below.

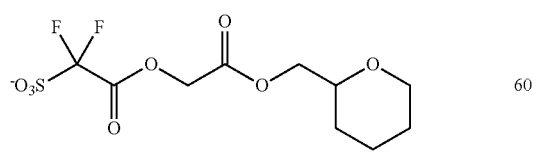

Examples of the sulfonate anion having a lactone ring for Y, and a divalent group represented by the formula (b1-2) for $L^{b1}$ include anions below.

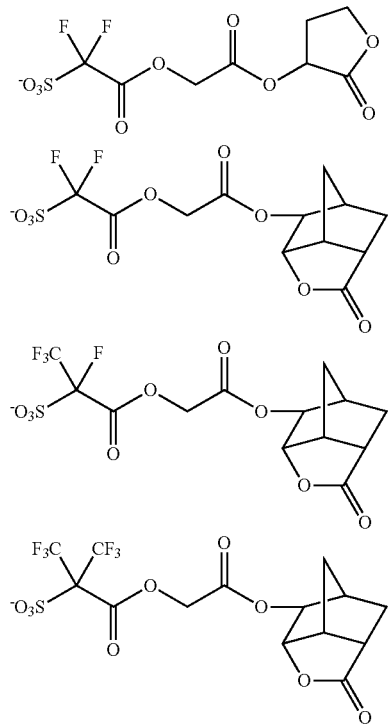
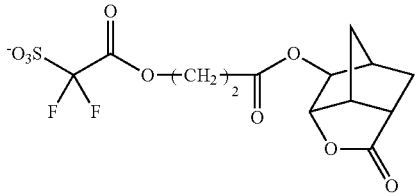
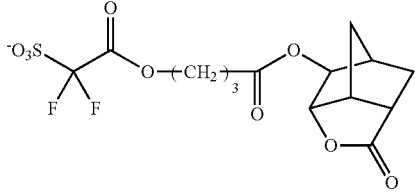
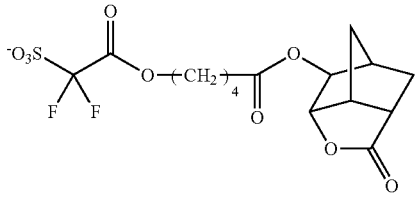
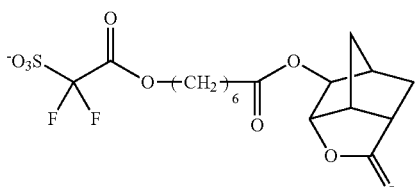
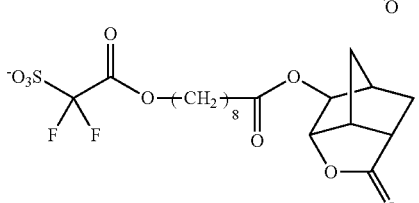

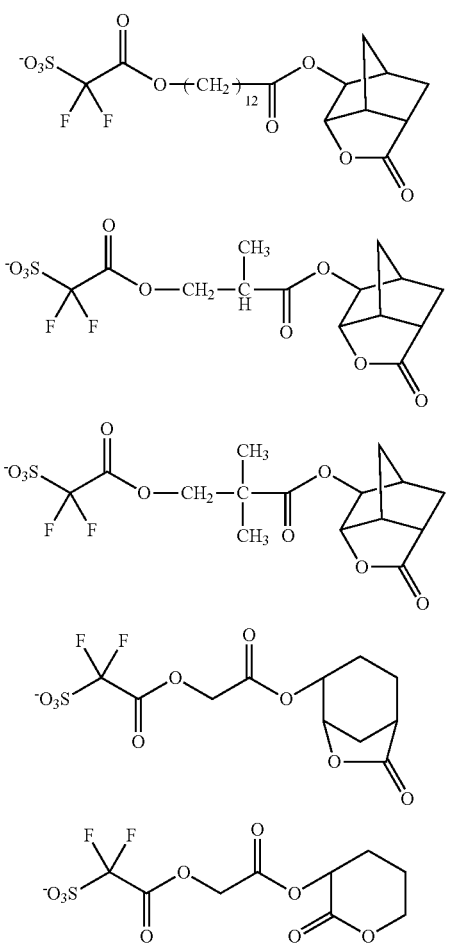
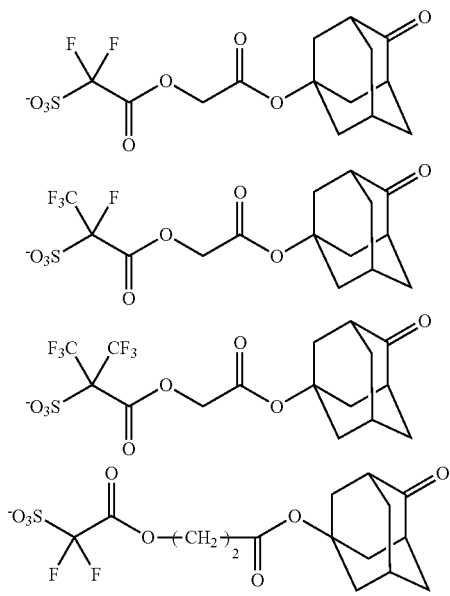
Examples of the sulfonate anion having a cyclic ketone group for Y, and a divalent group represented by the formula (b1-2) for $L^{b1}$ include anions below.
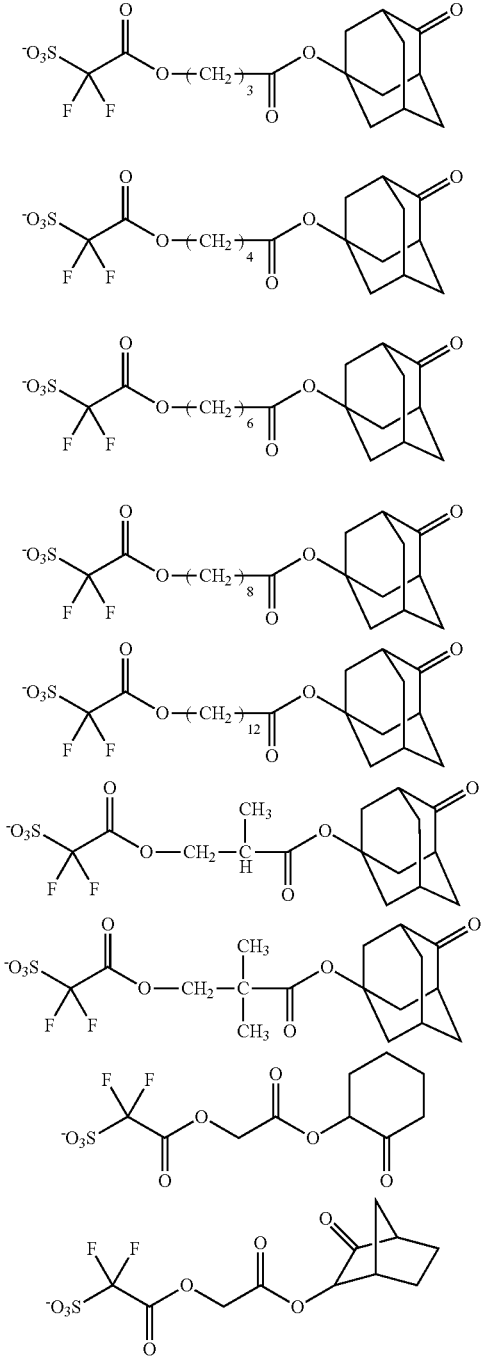
Examples of the sulfonate anion having a sultone ring group for Y, and a divalent group represented by the formula (b1-2) for $L^{b1}$ include anions below.
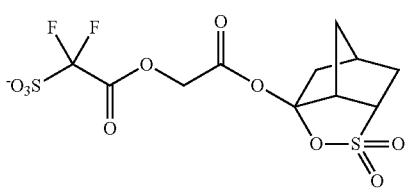

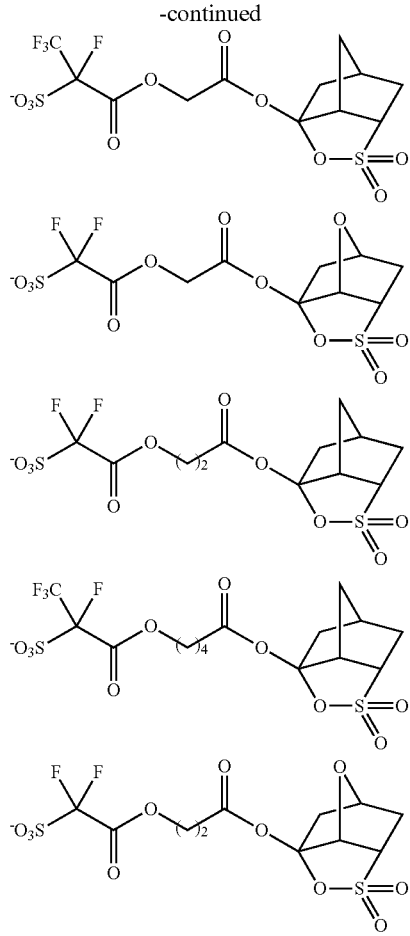

Examples of the sulfonate anion having a chain aliphatic hydrocarbon group for Y, and a divalent group represented by the formula (b1-3) for $L^{b1}$ include anions below.

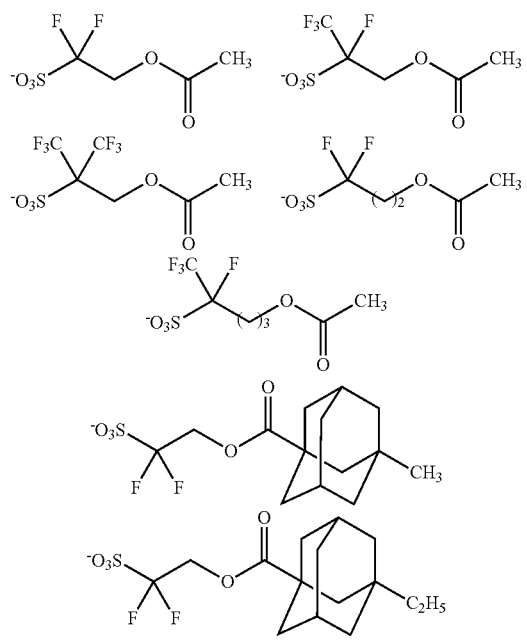

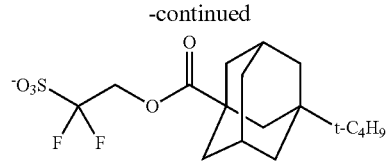

Examples of the sulfonate anion having an alicyclic hydrocarbon group substituted with an alkoxy group for Y, and a divalent group represented by the formula (b1-3) for $L^{b1}$ include anions below.

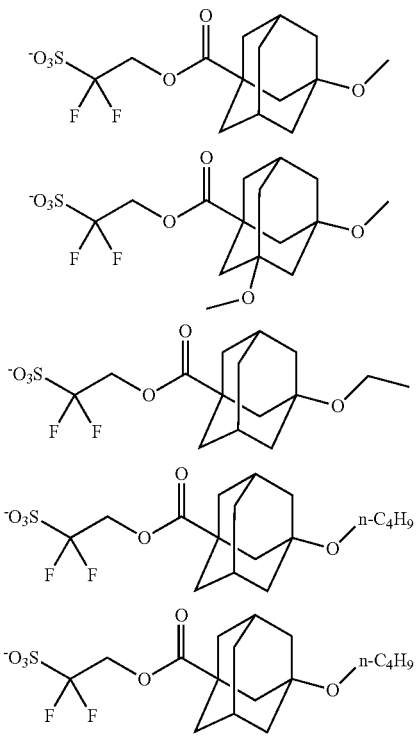

Examples of the sulfonate anion having an alicyclic hydrocarbon group substituted with a hydroxy group for Y, and a divalent group represented by the formula (b1-3) for $L^{b1}$ include anions below.

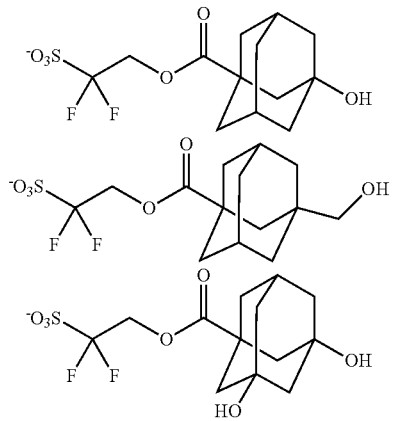

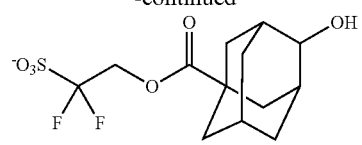

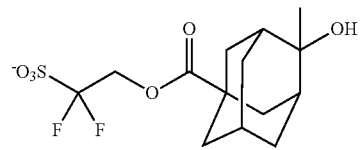

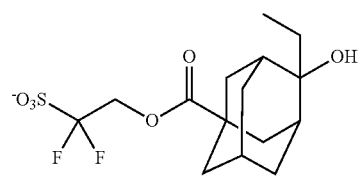

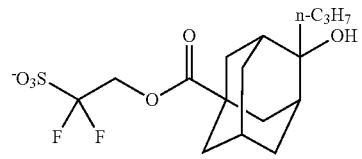

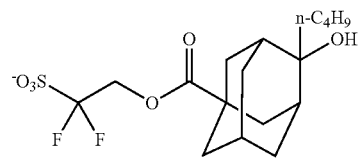

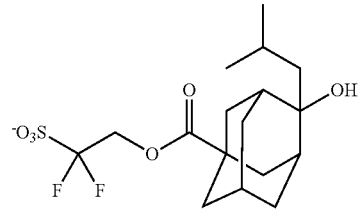

Examples of the sulfonate anion having a cyclic ketone group for Y, and a divalent group represented by the formula (b1-3) for $L^{b1}$ include anions below.

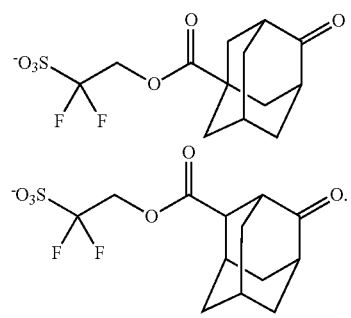

Examples of the sulfonate anion having a chain aliphatic hydrocarbon group for Y, and a divalent group represented by the formula (b1-4) for $L^{b1}$ include anion below.

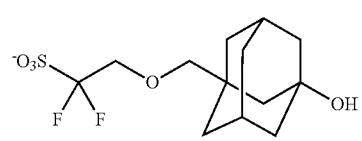

Examples of the sulfonate anion having an alicyclic hydrocarbon group substituted with an alkoxy group for Y, and a divalent group represented by the formula (b1-4) for $L^{b1}$ include anions below.

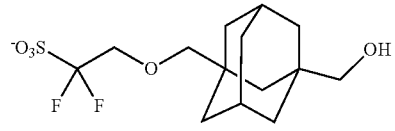

Examples of the sulfonate anion having an alicyclic hydrocarbon group substituted with a hydroxy group for Y, and a divalent group represented by the formula (b1-4) for $L^{b1}$ include anions below.

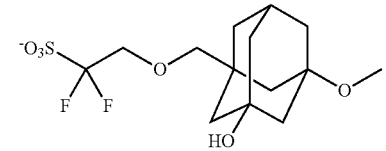

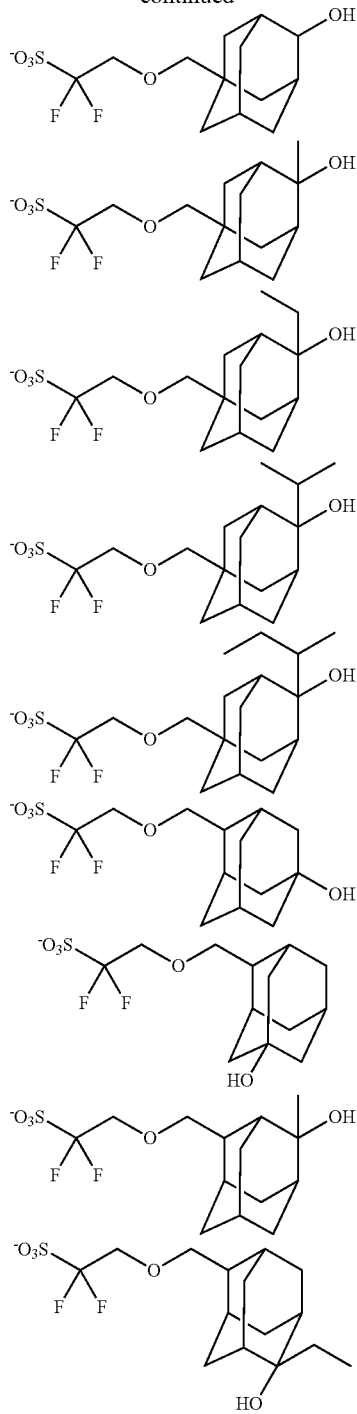

Examples of the sulfonate anion having a cyclic ketone group for Y, and a divalent group represented by the formula (b1-41 for $L^{b1}$ include anions below.

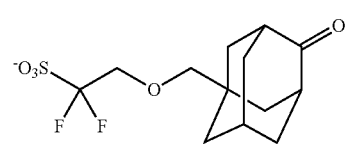

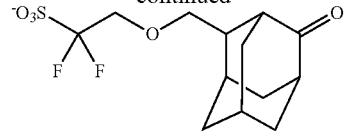

Among these, a sulfonate anion containing a divalent group represented by the formula (b1-1) for $L^{b1}$ is preferable. Specific examples of the preferable sulfonate anion include an anion below.

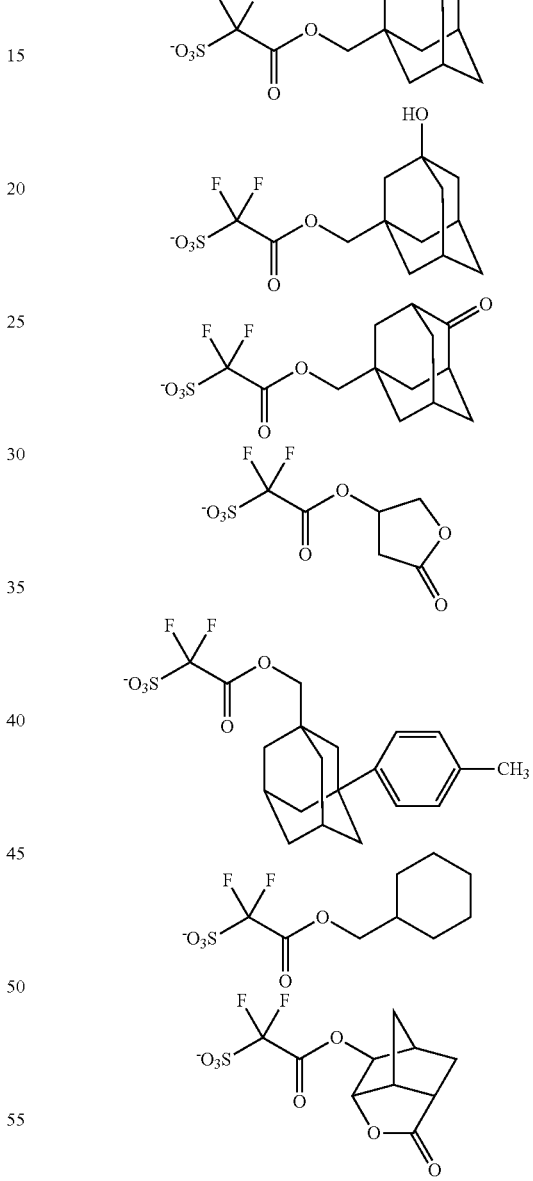

In particular, a sulfonate anion in which Y is an optionally substituted $C_3$ to $C_{18}$ alicyclic hydrocarbon group is more preferable.

Examples of the cation of the acid generator (B) include an onium cation, for example, sulfonium cation, iodonium cation, ammonium cation, benzothiazolium cation and phosphonium cation. Among these, sulfonium cation and iodonium cation are preferable, and organic cations represented by any of the formula (b2-1) to the formula (b2-4) are more preferable.

$Z^+$ of the formula (B1) is preferably represented by any of the formula (b2-1) to the formula (b2-4).

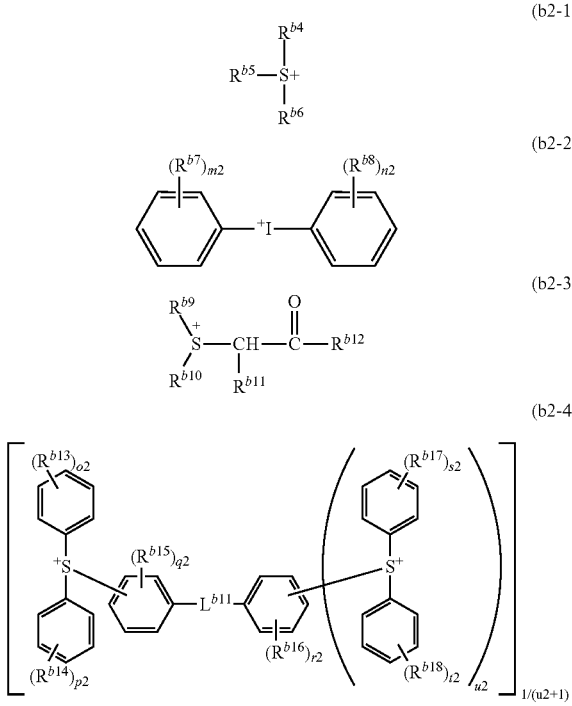

wherein $R^{b4}$ to $R^{b6}$ independently represent a $C_1$ to $C_{30}$ hydrocarbon group which includes a $C_1$ to $C_{30}$ alkyl group, a $C_3$ to $C_{18}$ alicyclic hydrocarbon group or a $C_6$ to $C_{18}$ aromatic hydrocarbon group, or two of $R^{b4}$ to $R^{b6}$ are bonded together to form a sulfur-containing ring, the alkyl group may be substituted with a hydroxy group, a $C_1$ to $C_{12}$ alkoxy group or a $C_6$ to $C_{18}$ aromatic hydrocarbon group, the alicyclic hydrocarbon group may be substituted with a halogen atom, a $C_2$ to $C_4$ acyl group and a glycidyloxy group, the aromatic hydrocarbon group may be substituted with a halogen atom, a hydroxy group, a $C_1$ to $C_{18}$ alkyl group, a $C_3$ to $C_{18}$ alicyclic hydrocarbon group or a $C_1$ to $C_{12}$ alkoxy group;

$R^{b7}$ and $R^{b8}$ in each occurrence independently represent a hydroxy group, a $C_1$ to $C_{12}$ alkyl group or a $C_1$ to $C_{12}$ alkoxyl group;

m2 and n2 independently represent an integer of 0 to 5;

$R^{b9}$ and $R^{b10}$ independently represent a $C_1$ to $C_{18}$ alkyl group or a $C_3$ to $C_{18}$ alicyclic hydrocarbon group;

$R^{b11}$ represents a hydrogen atom, a $C_1$ to $C_{18}$ alkyl group, a $C_3$ to $C_{18}$ alicyclic hydrocarbon group or a $C_6$ to $C_{18}$ aromatic hydrocarbon group;

$R^{b12}$ represents a $C_1$ to $C_{18}$ hydrocarbon group which includes a $C_1$ to $C_{18}$ alkyl group, a $C_3$ to $C_{18}$ alicyclic hydrocarbon group or a $C_6$ to $C_{18}$ aromatic hydrocarbon group, the aromatic hydrocarbon group may be substituted with a $C_1$ to $C_{12}$ alkyl group, a C1 to C12 alkoxy group, a $C_3$ to $C_{18}$ alicyclic hydrocarbon group or an alkyl carbonyloxy group;

$R^{b9}$ and $R^{b10}$ may be bonded to form a sulfur-containing $C_3$ to $C_{12}$ ring (preferably a $C_3$ to $C_7$ ring), and a —CH$_2$— contained in the rig may be replaced by —O—, —S— or —CO—;

$R^{b11}$ and $R^{b12}$ may be bonded to form a $C_4$ to $C_{12}$ ring (preferably a $C_4$ to $C_7$ ring) containing —CH—CO—, and a —CH$_2$— contained in the rig may be replaced by —O—, —S— or —CO—;

$R^{b13}$ to $R^{b18}$ in each occurrence independently represent a hydroxy group, a $C_1$ to $C_{12}$ alkyl group or a $C_1$ to $C_{12}$ alkoxy group;

$L^{b11}$ represents —S— or —O—;

o2, p2, s2 and t2 independently represent an integer of 0 to 5;

q2 or r2 independently represent an integer of 0 to 4;

u2 represents an integer of 0 or 1.

Examples of the alkyl group, the alicyclic hydrocarbon group, the aromatic hydrocarbon group, the alkoxyl group, the halogen atom and the acyl group include the same as defined above.

Examples of the alkylcarbonyloxy group methylcarobonyloxy, ethylcarobonyloxy, n-propylcarobonyloxy, isopropylcarobonyloxy, n-butylcarobonyloxy, sec-butylcarobonyloxy, tert-butylcarobonyloxy, pentylcarobonyloxy, hexylcarobonyloxy, octylcarobonyloxy, and 2-ethylhexylcarobonyloxy.

Examples of the preferred alkyl group include methyl, ethyl, propyl, butyl, hexyl, octyl, and 2-ethylhexyl groups, in particular, the alkyl group of $R^{b9}$ to $R^{b12}$ is preferably a $C_1$ to $C_{12}$ alkyl group.

Examples of the preferred alicyclic hydrocarbon group include a cyclopropyl, cyclobutyl, cyclopentyl, cyclohexyl, cycloheptyl, cyclodecyl, 2-alkyladamantane-2-yl, 1-adamantane-1-yl-1-alkyl and isobornyl groups, in particular, the alicyclic hydrocarbon group of $R^{b9}$ to $R^{b12}$ is preferably a $C_3$ to $C_{18}$ alicyclic hydrocarbon group and more preferably a $C_4$ to $C_{12}$ alicyclic hydrocarbon group.

Examples of the preferred aromatic hydrocarbon groups include phenyl, 4-methoxy phenyl, 4-etyhlphenyl, 4-tert-butylphenyl, 4-cyclohexylphenyl, 4-methoxyphenyl, biphenyl and naphthyl group.

Examples of the aromatic group substituted with an alkyl group typically represent an aralkyl group such as benzyl, phenethyl, phenylpropyl, trityl, naphthylmethyl and naphthylethyl groups.

Examples of the ring formed by $R^{b9}$ and $R^{b10}$ bonded together include thiolane-1-ium ring (tetrahydrothiophenium ring), thian-1-ium ring and 1,4-oxathian-4-ium ring.

Examples of the ring formed by $R^{b11}$ and $R^{b12}$ bonded together include oxocycloheptane ring, oxocyclohexane ring, oxonorbornane ring, and oxoadamantane ring.

Among the cations represented by the formula (b2-1) to the formula (b2-4), the cation represented by the formula (b2-1) is preferable, and triphenyl sulfonium cation (v2=w2=x2=0 in the formula (b2-1-1)) and tritolyl sulfonium cation (v2=w2=x2=1, and $R^{b19}$, $R^{b20}$ and $R^{b21}$ are a methyl group in the formula (b2-1-1)) are more preferable.

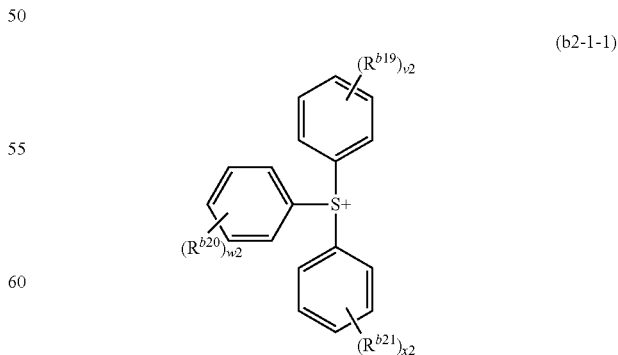

wherein $R^{b19}$ to $R^{b21}$ in each occurrence independently represent a halogen atom, a hydroxy group, a $C_1$ to $C_{18}$ aliphatic hydrocarbon group or a $C_1$ to $C_{12}$ alkoxy group, or two of $R^{b19}$ to $R^{b21}$ are bonded together to form a single bond, —O—, or a $C_1$ to $C_4$ divalent aliphatic hydrocarbon group, which form a sulfur-containing ring;

v2 to x2 independently represent an integer of 0 to 5.

The aliphatic hydrocarbon group is preferably a $C_1$ to $C_{12}$ alkyl group or a $C_3$ to $C_{18}$ alicyclic hydrocarbon group, more preferably a $C_1$ to $C_{12}$ aliphatic hydrocarbon group.

In the formula (b2-1-1), $R^{b19}$ to $R^{b21}$ independently preferably represent a halogen atom (and more preferably fluorine atom), a hydroxy group, a $C_1$ to $C_{12}$ alkyl group or a $C_1$ to $C_{12}$ alkoxy group or two of $R^{b19}$ to $R^{b21}$ are bonded together to form —O—, which form a sulfur-containing ring; and v2 to x2 independently represent preferably 0 or 1.

Specific examples of the cation of the formula (b2-1-1) include a cation below.

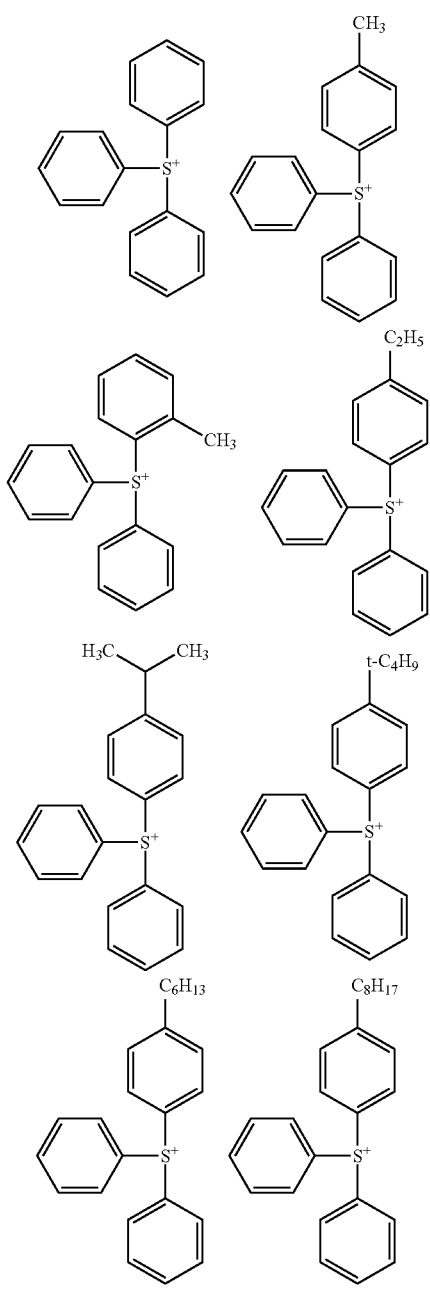

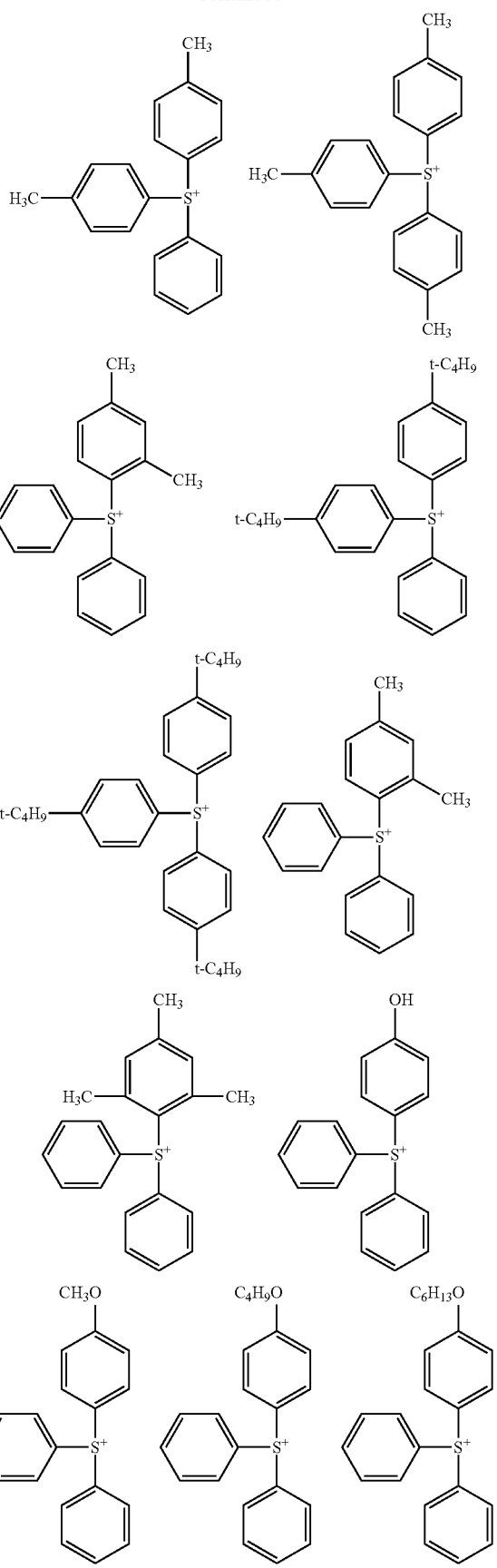

-continued

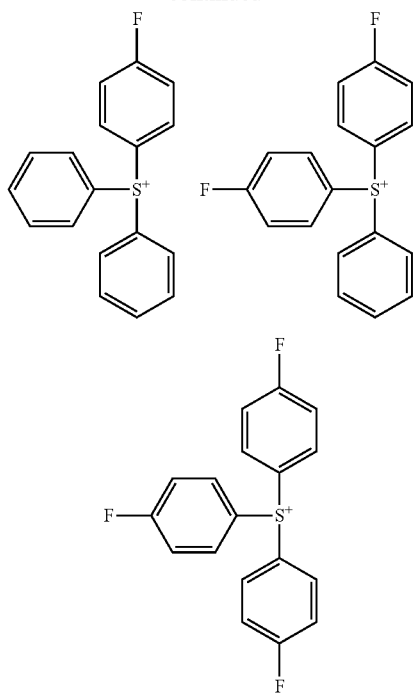

Specific examples of the cation, which is a sulfur-containing ring, of the formula (b2-1-1), include a cation below.

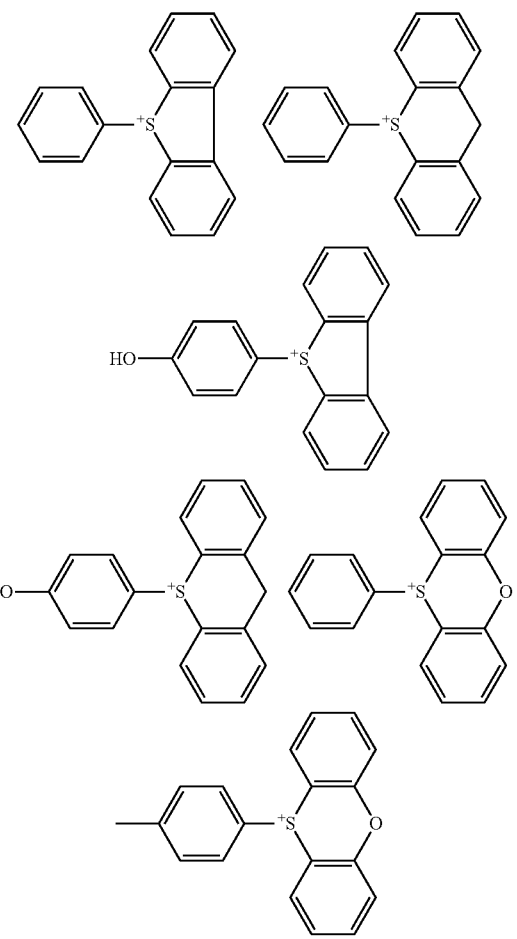

-continued

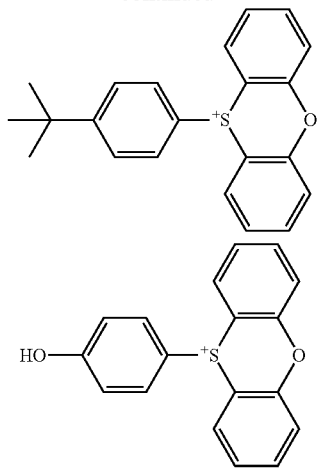

Specific examples of the cation, which is a sulfur-containing ring, of the formula (b2-1), include a cation below.

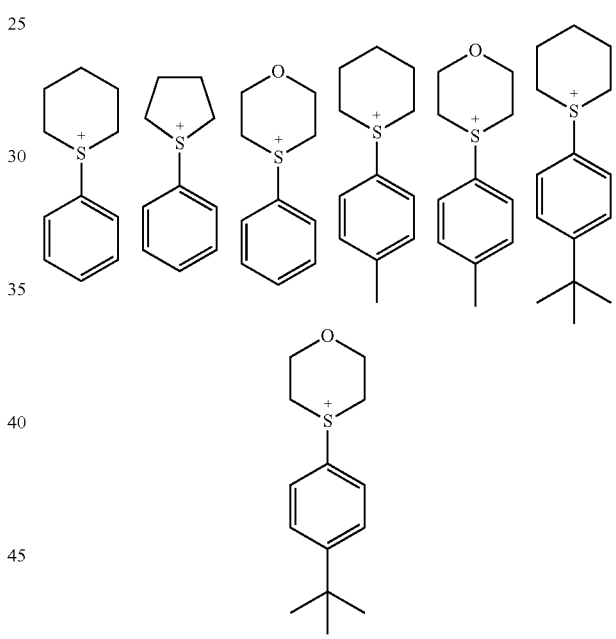

The resist composition including the acid generator (B1) having such organic cation can result in a good focus margin at producing the resist pattern.

Specific examples of the cation of the formula (b2-2) include a cation below.

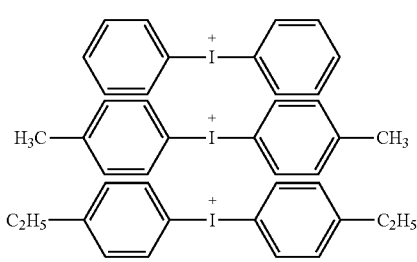

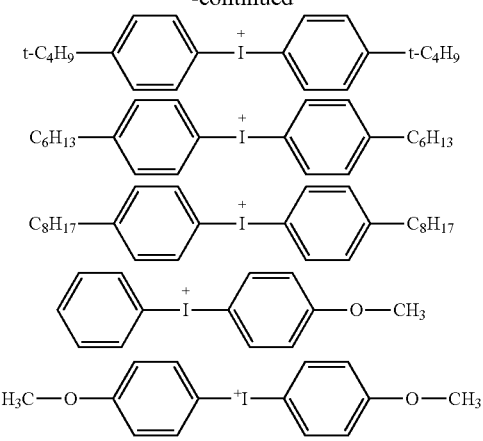
Specific examples of the cation of the formula (b2-3) include a cation below.
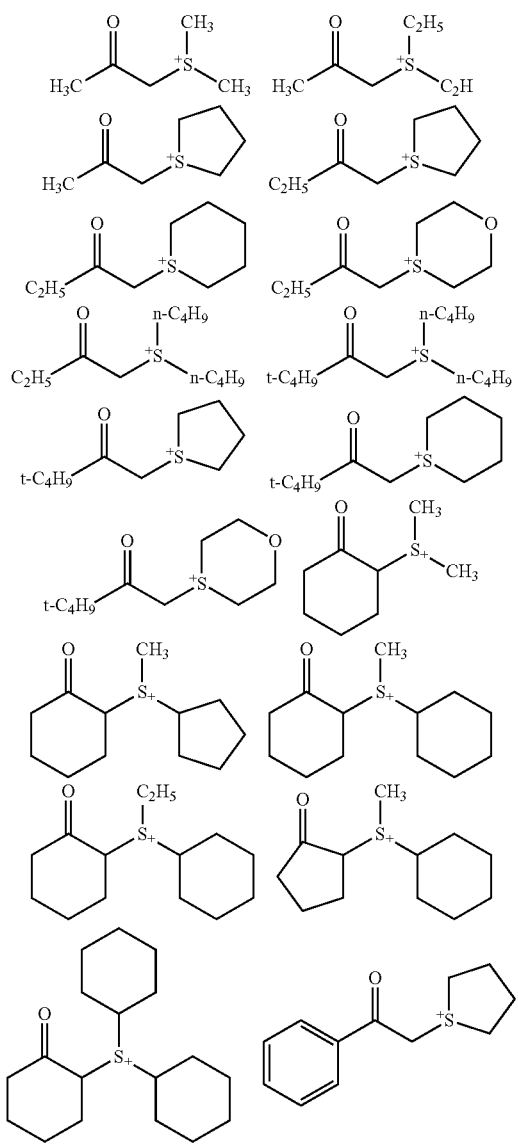
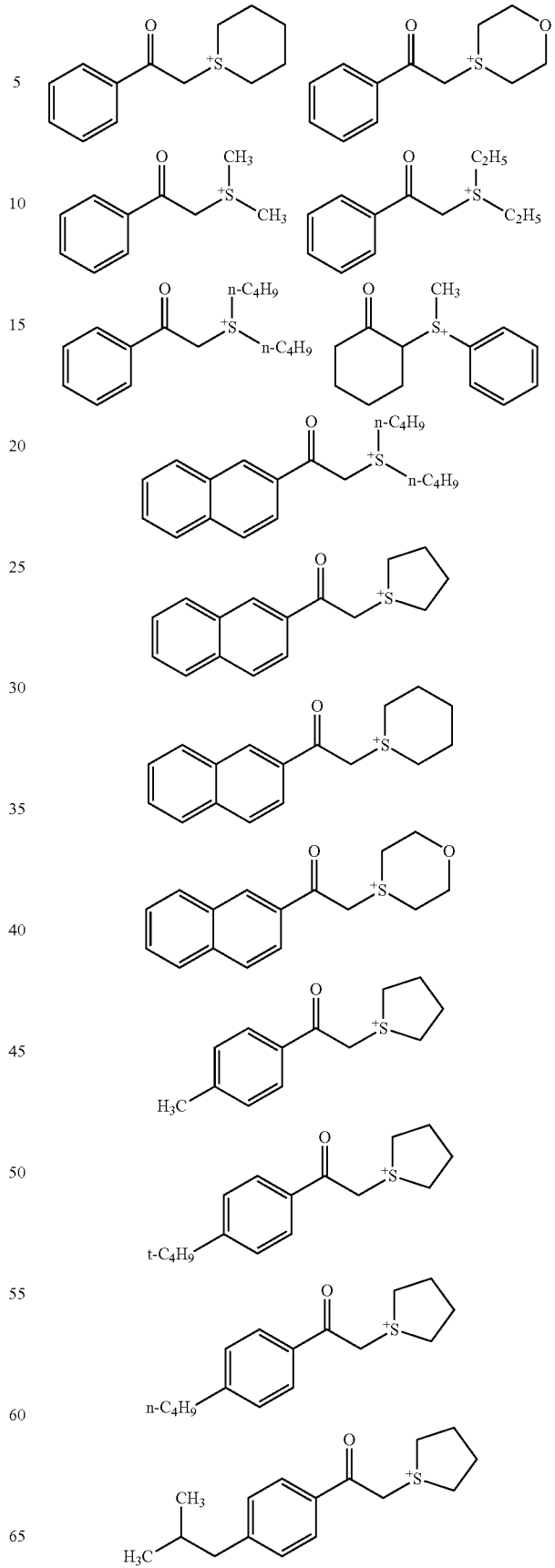

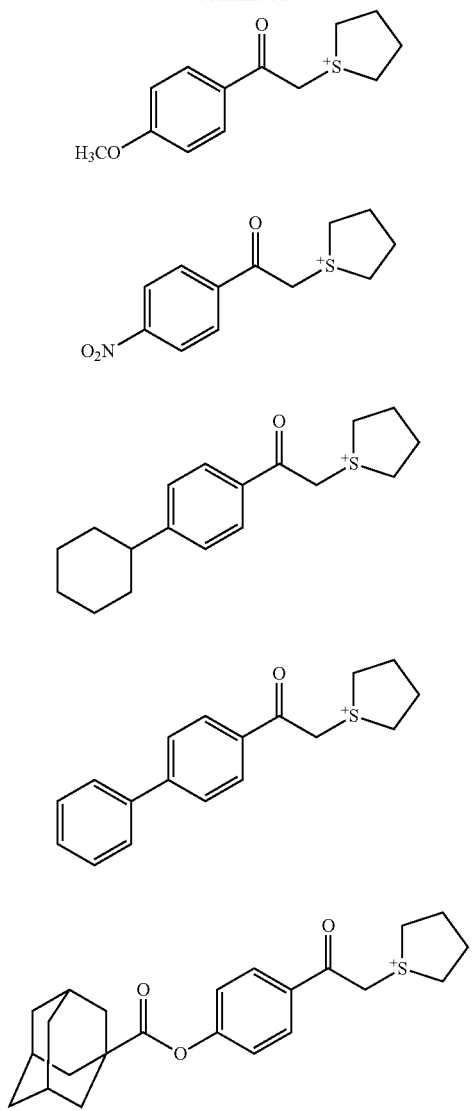
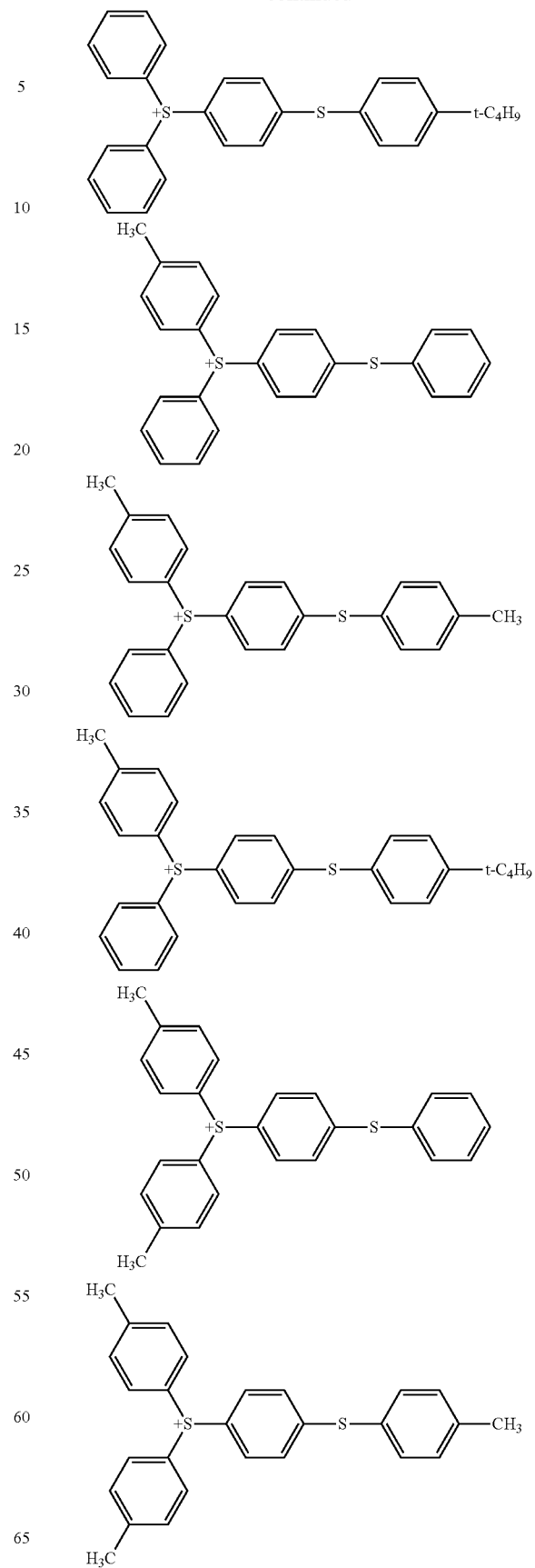
Specific examples of the cation of the formula (b2-4) include a cation below.
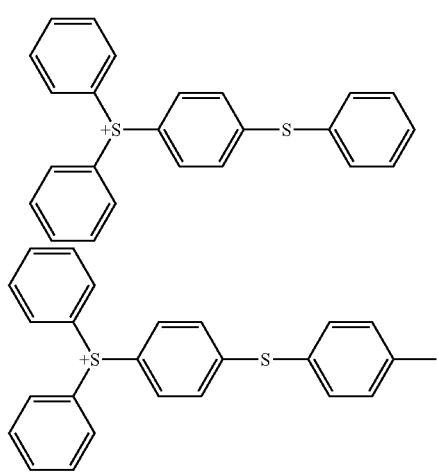

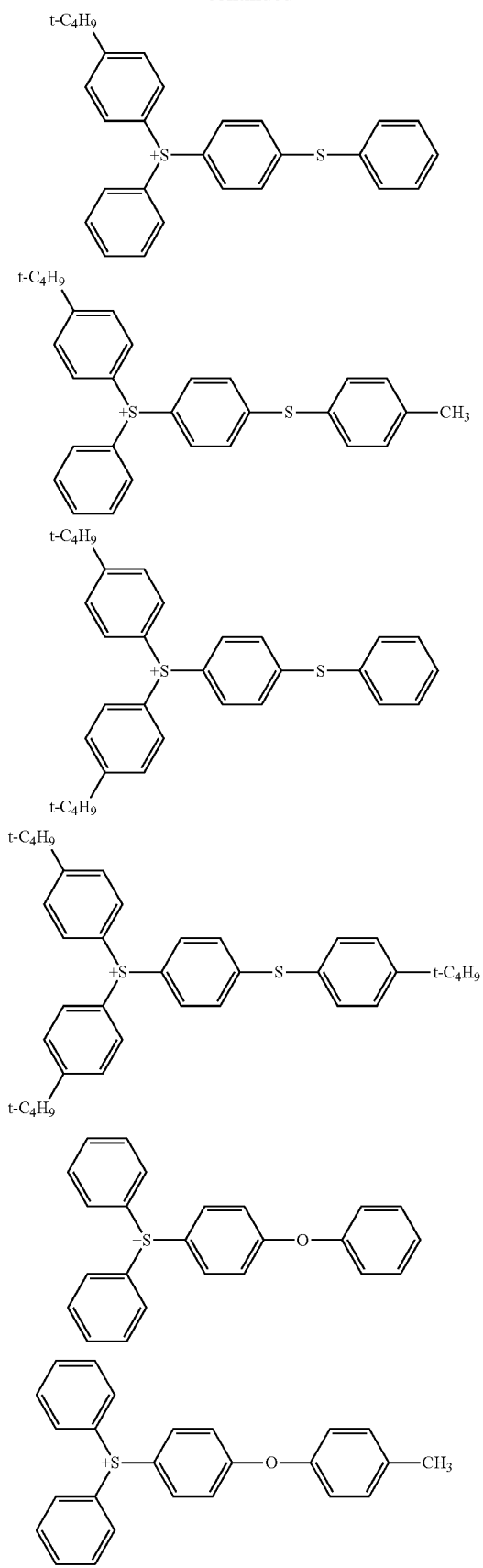

171
-continued
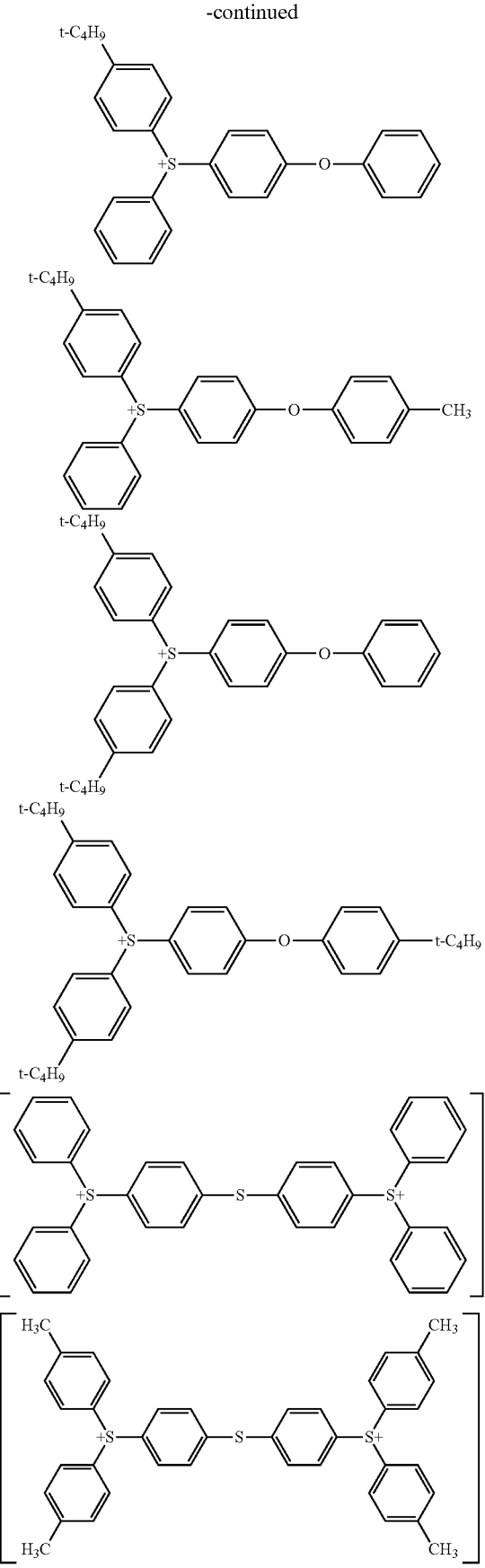
172
-continued
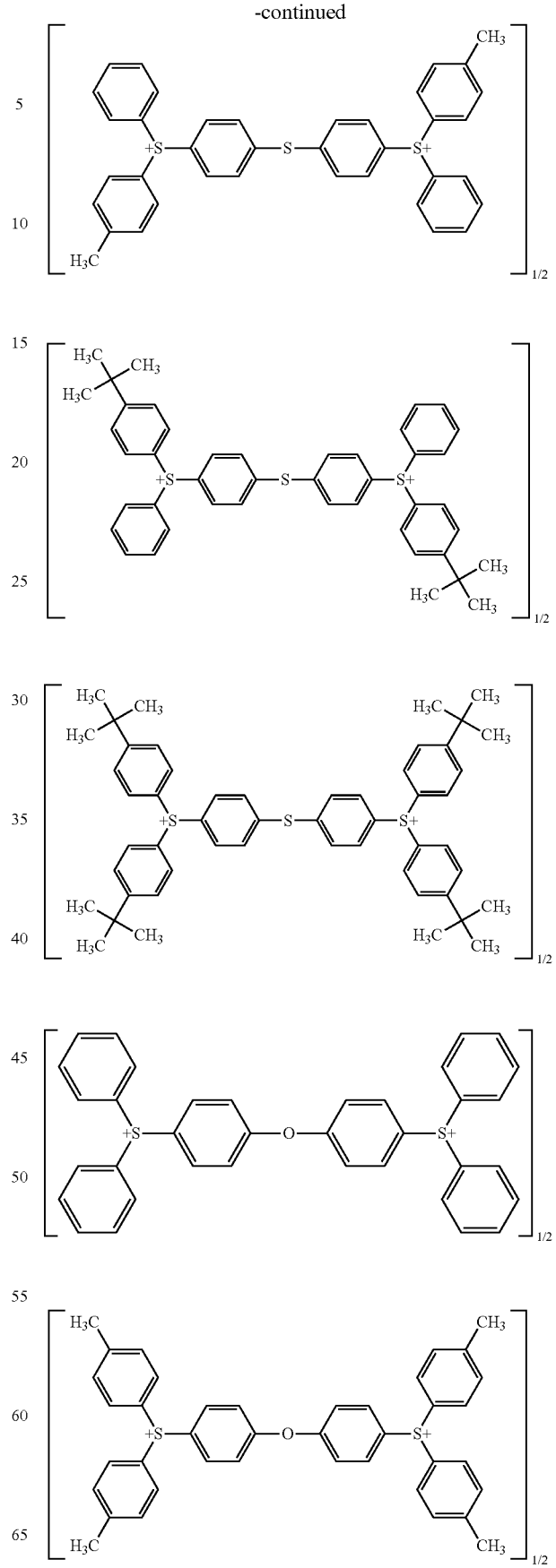

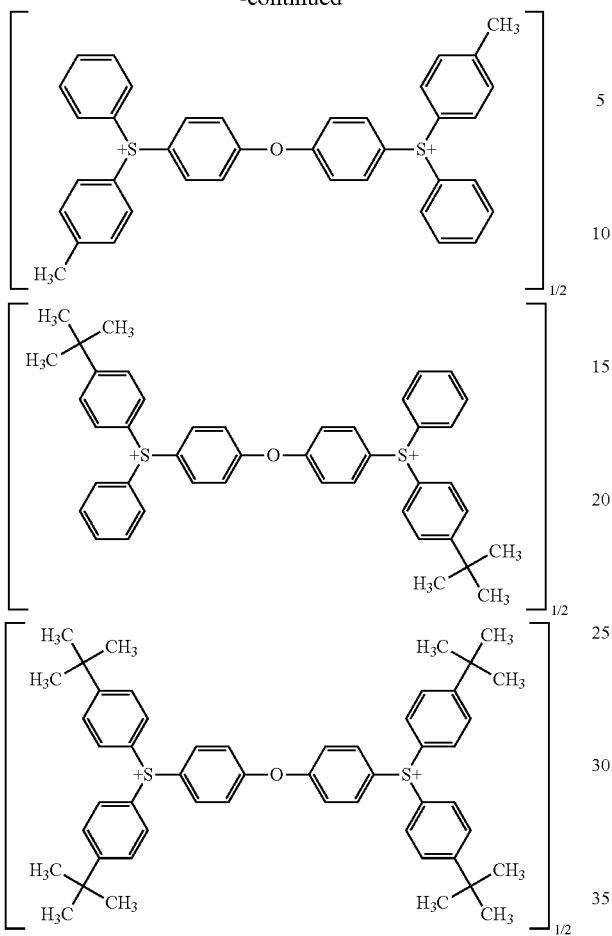

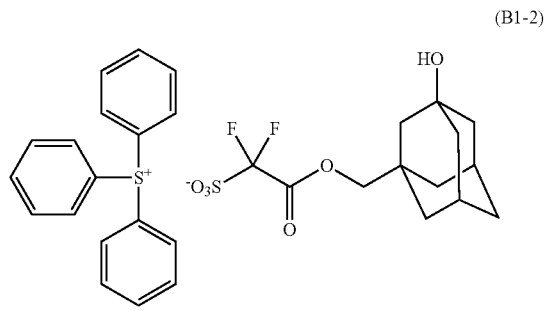

(B1-2)

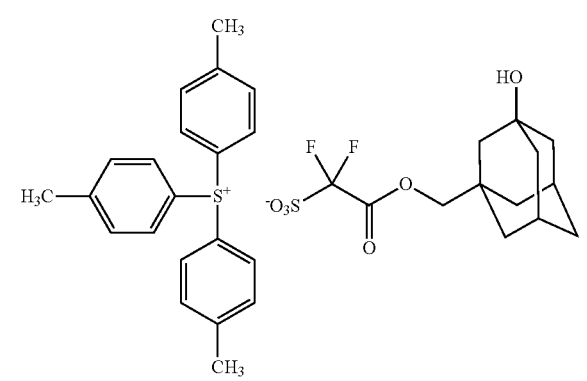

(B1-3)

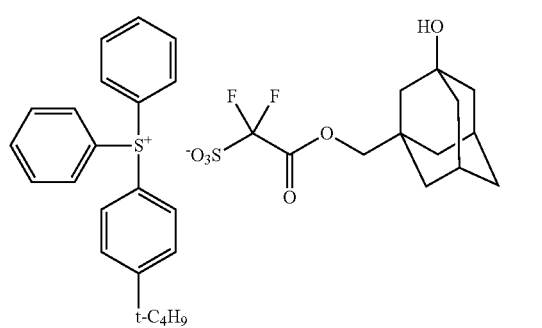

(B1-4)

The acid generator (B1) is a compound in combination of the above sulfonate anion and an organic cation.

The above sulfonate anion and the organic cation may optionally be combined, a combination of any of the anion represented by the formula (b1-1-1) to the formula (b1-1-9) and the cation represented by the formula (b2-1-1), as well as a combination of any of the anion represented by the formula (b1-1-3) to the formula (b1-1-5) and the cation represented by the formula (b2-3) are preferable.

Preferred acid generators (B1) are a salt represented by the formula (B1-1) to the formula (B1-17). Among these, the formulae (B1-1), (B1-2), (B1-3), (B1-6), (B1-11), (B1-12), (B1-13) and (B1-14) which contain triphenyl sulfonium cation or tritolyl sulfonium cation are preferable, and the formulae (B1-1), (B1-2), (B1-3), (B1-11) and (B1-12) are more preferable.

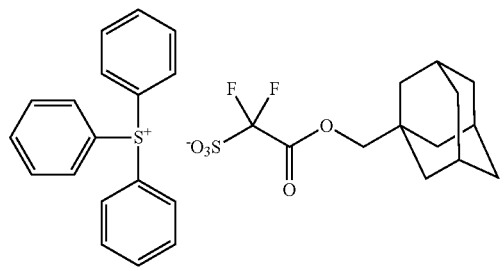

(B1-1)

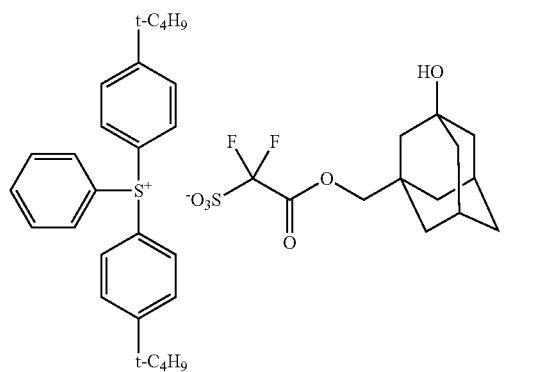

(B1-5)

(B1-6) 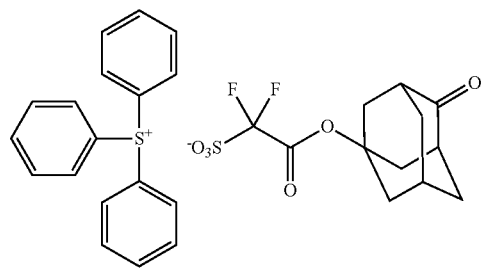
(B1-7) 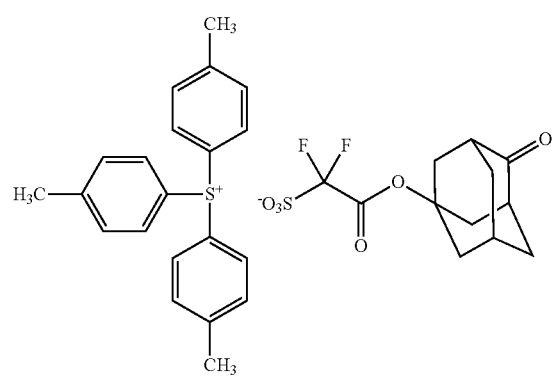
(B1-8) 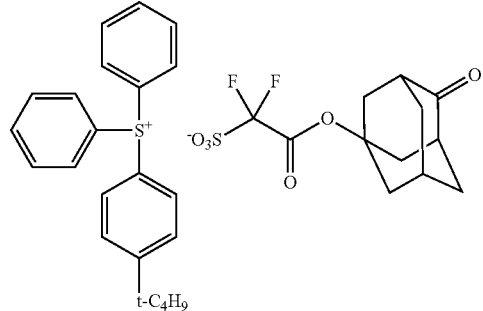
(B1-9) 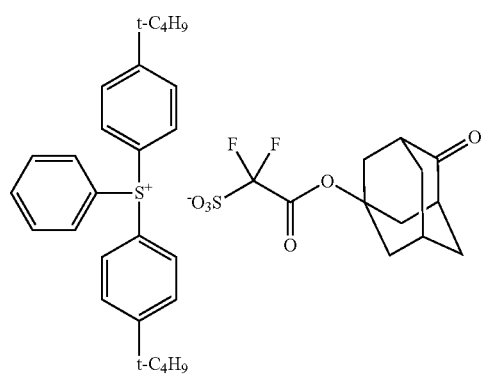
(B1-10) 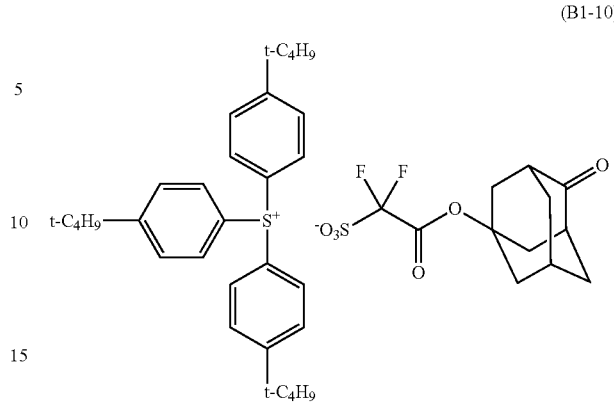
(B1-11) 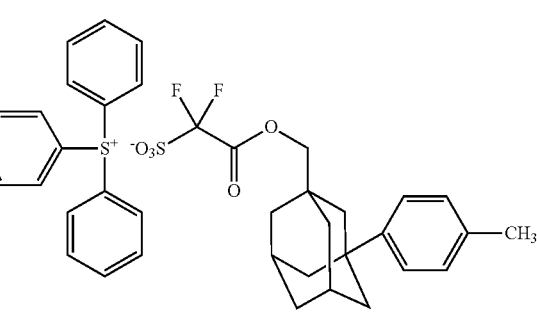
(B1-12) 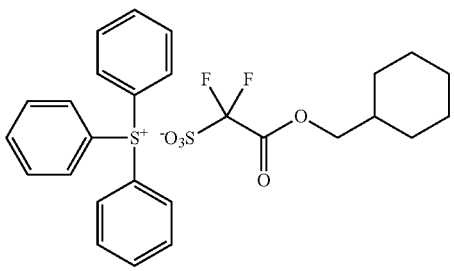
(B1-13) 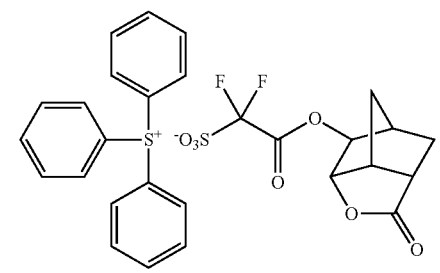
(B1-14) 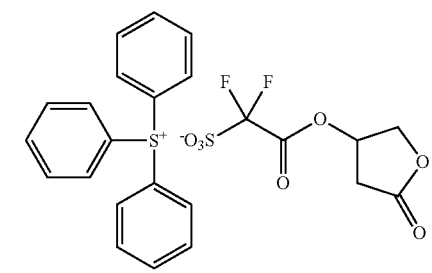

-continued

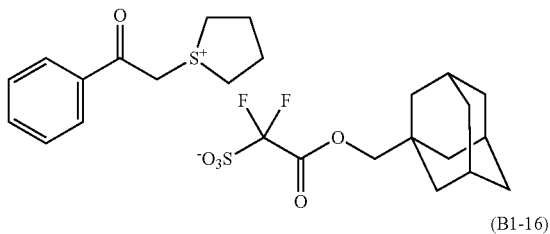
(B1-15)

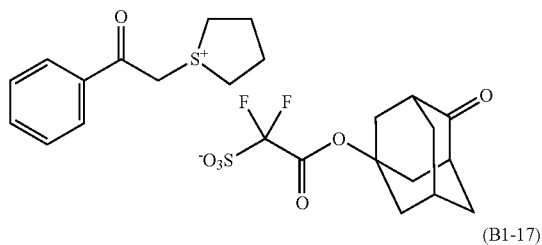
(B1-16)

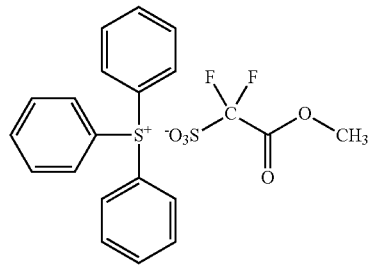
(B1-17)

<Basic Compound (Hereinafter May be Referred to as "Basic Compound (C)")>

The resist composition of the present invention may contain a basic compound (C). The basic compound (C) is a compound having a property to quench an acid generated from the acid generator, and called "quencher".

As the basic compounds (C), nitrogen-containing basic compounds (for example, amine and ammonium hydroxide) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and an heteroaromatic amine such as pyridine.

Preferred basic compounds (C) include an aromatic amine presented by the formula (C2), particularly an aromatic amine represented by the formula (C2-1).

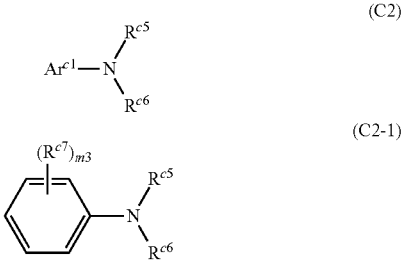

wherein $Ar^{c1}$ represents an aromatic hydrocarbon group;
$R^{c5}$ and $R^{c6}$ independently represent a hydrogen atom, an aliphatic hydrocarbon group (preferably a $C_1$ to $C_6$ chain aliphatic hydrocarbon group, i.e., alkyl group or $C_5$ to $C_{10}$ alicyclic hydrocarbon group, i.e., cycloalkyl group) or a aromatic hydrocarbon group, the hydrogen atom contained in the aliphatic hydrocarbon group, the alicyclic hydrocarbon group and the aromatic hydrocarbon group may be replaced by a hydroxy group, an amino group or a $C_1$ to $C_6$ alkoxyl group, the hydrogen atom contained in the amino group may be placed by a $C_1$ to $C_4$ alkyl group;

$R^{c7}$ in each occurrence independently represents a chain aliphatic hydrocarbon group (preferably a $C_1$ to $C_6$ alkyl), a $C_1$ to $C_6$ alkoxy group, an alicyclic hydrocarbon group (preferably a $C_5$ to $C_{10}$ alicyclic hydrocarbon group, and more preferably a $C_5$ to $C_{10}$ cycloalkyl) or a aromatic hydrocarbon group (preferably a $C_6$ to $C_{10}$ aromatic hydrocarbon group), the hydrogen atom contained in the aliphatic hydrocarbon group, the alkoxy group, the alicyclic hydrocarbon group and the aromatic hydrocarbon group may be replaced by a hydroxy group, an amino group or a $C_1$ to $C_6$ alkoxyl group, the hydrogen atom contained in the amino group may be placed by a $C_1$ to $C_4$ alkyl group;

m3 represents an integer of 0 to 3.

The aliphatic hydrocarbon group preferably has $C_1$ to $C_6$,
the alicyclic hydrocarbon group preferably has $C_5$ to $C_{10}$,
the aromatic hydrocarbon group preferably has $C_6$ to $C_{10}$; and
the alkoxy group preferably has $C_1$ to $C_6$.

Specific examples of the aromatic amine represented by the formula (C2) include 1-naphtylamine and 2-naphtylamine.

Specific examples of the aniline represented by the formula (C2-1) include aniline, diisopropylaniline, 2-, 3- or 4-methylaniline, 4-nitroaniline, N-methylaniline, N,N-dimethylaniline, and diphenylamine.

Also, examples of the basic compound (C) include compounds represented by the formula (C3) to the formula (C11);

(C3)

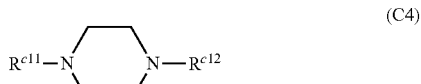
(C4)

(C5)

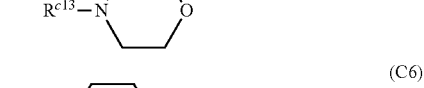
(C6)

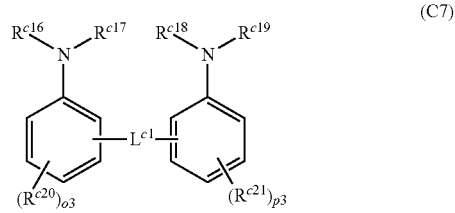
(C7)

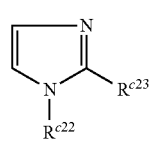 (C8)

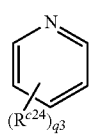 (C9)

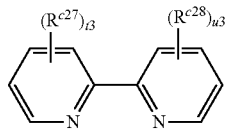 (C10)

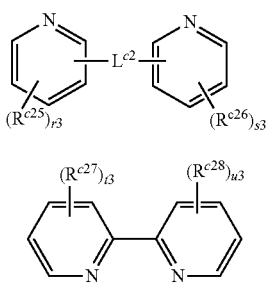 (C11)

wherein $R^{c8}$, $R^{c20}$, $R^{c21}$ and $R^{c23}$ independently represent any of the group as described in $R^{c7}$;

$R^{c24}$ to $R^{c28}$ in each occurrence independently represents any of the group as described in $R^{c7}$;

$R^{c9}$ to $R^{c14}$, $R^{c16}$ to $R^{c19}$ and $R^{c22}$ independently represent any of the group as described in $R^{c5}$ and $R^{c6}$;

o3 to u3 independently represent an integer of 0 to 3;

$R^{c15}$ in each occurrence independently represents an aliphatic hydrocarbon group (preferably a $C_1$ to $C_6$ aliphatic hydrocarbon group), an alicyclic hydrocarbon group (preferably a $C_3$ to $C_6$ alicyclic hydrocarbon group) or an alkanoyl group (preferably a C2 to C6 alkanoyl group);

Examples of the alkanoyl group include acetyl group, 2-methylacetyl group, 2,2-dimethylacetyl group, propionyl group, butyryl group, isobutyryl group, pentanoyl group, and 2,2-dimethylpropionyl group.

n3 represents an integer of 0 to 8;

$L^{c1}$ and $Lc^2$ independently represent a divalent aliphatic hydrocarbon group (preferably a $C_1$ to $C_6$ aliphatic hydrocarbon group, and more preferably a $C_1$ to $C_6$ alkanediyl group), —CO—, —C(=NH)—, —C(=NR$^{c3}$)—, —S—, —S—S— or a combination thereof;

$R^{c3}$ represents a $C_1$ to $C_4$ alkyl group.

Specific examples of the compound represented by the formula (C3) include, for example, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxyl)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Specific examples of the compound represented by the formula ($C_4$) include, for example, piperazine.

Specific examples of the compound represented by the formula (C5) include, for example, morpholine.

Specific examples of the compound represented by the formula (C6) include, for example, piperidine, a hindered amine compound having piperidine skeleton described in JP H11-52575-A.

Specific examples of the compound represented by the formula (C7) include, for example, 2,2'-methylenebisaniline.

Specific examples of the compound represented by the formula (C8) include, for example, imidazole and 4-methylimidazole.

Specific examples of the compound represented by the formula (C9) include, for example, pyridine and 4-methylpyridine.

Specific examples of the compound represented by the formula (C10) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine and 2,2'-dipicolylamine.

Specific examples of the compound represented by the formula (C11) include, for example, bipyridine.

Examples of the ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

Among these, diisopropylaniline (particularly 2,6-diisopropylaniline) is preferable as the basic compounds (C) contained in the present resist compound.

<Solvent (Hereinafter May be Referred to "Solvent (D)")>

The resist composition of the present invention may include a solvent (D). The solvent (D) can be preferably selected depending on the kinds and an amount of the resin (A) having the structural unit derived from the compound (a), i.e., the resin (AA) or the resin (AB), and a kind and an amount of the acid generator from a viewpoint of good coating properties.

Examples of the solvent (D) include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used singly or in combination with two or more.

<Other Ingredient (Hereinafter May be Referred to "Other Ingredient (F)")>

The resist composition can also include various additives as needed. Examples of the other ingredient (F) include sensitizers, dissolution inhibitors, surfactants, stabilizers and dyes.

<Preparing the Resist Composition>

The present resist composition can be prepared by mixing the resin (A), in particular the resin (AA), the acid generator (B1) and solvent (D), or by mixing the resin (A), in particular the resin (AA), the acid generator (B1), the basic compound (C) and solvent (D). When the resin (AB) is used as the resin (A), the resin (X) is also needed in stead of or in addition to the resin (AA) to mix described above. Further, the other ingredient (F) may be mixed therewith as needed. There is no particular limitation on the order of mixing, the mixing is performed in arbitrary order. The temperature of mixing may be adjusted to appropriate temperature from the range of 10 to 40° C. depending on the kinds of the resin having the structural unit derived from the compound (a) and solubility to the solvent (D) of the resin having the structural unit derived from the compound (a). The time of mixing may be adjusted to appropriate time from the range of 0.5 to 24 hours depending on the mixing temperature. There is no particular limitation on a tool for mixing, an agitation mixing may be adopted.

After mixing the resin (A), the acid generator (B) and the solvent (D) as well as the basic compound (C) or the other ingredient (F) used as needed, the present resist compositions can be prepared by filtering through a filter having about 0.01 to 0.2 µm pore diameter.

The resist composition of the present invention preferably contains 80 weight % or more of the resin (A) based on the total solid content of the resist composition, if the resin (AA) is used as the resin (A). In the specification, the term "solid content of the resist composition" means a total content of the all ingredients other than a solvent.

In the resist composition of the present invention, the content of the acid generator (B1) is preferably 1 parts by weight or more (and more preferably 3 parts by weight or more), and also preferably 30 parts by weight or less (and more preferably 25 parts by weight or less), with respect to 100 parts by weight of the resin (A).

When the resist composition includes the basic compound (C), the content thereof is preferably 0.01 to 1 weight % based on the total solid content of the resist composition.

The content of the solvent may be adjusted depending on the kinds of the resin (A), it may be 90 weight % or more, preferably 92 weight % or more, and more preferably 94 weight % or more, and also preferably 99.9 weight % or less and more preferably 99 weight % or less.

The resist composition in which the content of the solvent may be 90 weight % or more corresponds to the solid content of 10 weight % with respect to the total weight of the present resist composition. If the resist composition contain the solvent of such range, it is preferable for forming the thin resist film which can produce a composition layer of 30 to 300 nm thick.

The content of the resin (A), the acid generator (B) the basic compound (C) and solvent (D) can be adjusted depending on the each ingredient used at preparing the present resist composition, and can be measured with a known analytical method such as, for example, liquid chromatography and gas chromatography after preparing the present resist composition.

If the other ingredient (F) is used in the present resist composition, the content thereof can also be adjusted depending on the kinds thereof.

<Method for Producing Resist Pattern>

The method for producing resist pattern of the present invention includes steps of:

(1) applying the resist composition of the present invention onto a substrate;

(2) drying the applied composition to form a composition layer;

(3) exposing to the composition layer using an exposure apparatus;

(4) heating the exposed composition layer and, (5) developing the heated composition layer using a developing apparatus.

The application of the resist composition onto the substrate can generally be carried out through the use of a resist application device such as a spin coater known in the field of semiconductor microfabrication technique. The thickness of the applied resist composition layer can be adjusted by controlling the variable conditions of the resist application device. These conditions can be selected by carrying out a pre-experiment beforehand. The substrate can be selected from the various substrates to be intended to microfabricate. The substrate may be washed, and an organic antireflection film may be formed on the substrate by use of a commercially available antireflection composition, before application of the resist composition.

The drying the applied composition layer, for example, can be carried out using a heating device such as a hotplate (so-called "prebake"), a decompression device, or in combination thereof. Thus, the solvent evaporates from the resist composition and a composition layer with the solvent removed is formed. The condition of the heating device or the decompression device can be adjusted depending on the kinds of the solvent used conditions. The temperature in this case is generally the range of 50 to 200° C. Moreover, the pressure is generally the range of 1 to $1.0 \times 10^5$ Pa.

The composition layer obtained is generally exposed using an exposure apparatus or a liquid immersion exposure apparatus. The exposure is generally carried out through a mask that corresponds to the required pattern. Various types of exposure light source can be used, such as irradiation with ultraviolet lasers such as KrF excimer laser (wavelength: 248 nm), ArF excimer laser (wavelength: 193 nm), $F_2$ excimer laser (wavelength: 157 nm), or irradiation with far-ultraviolet wavelength-converted laser light from a solid-state laser source (YAG or semiconductor laser or the like) or vacuum ultraviolet harmonic laser light or the like. Also, the exposure device may be one which irradiates electron beam or extreme-ultraviolet (EUV) generated from plasma.

The composition layer may be produced an exposed portion and an unexposed portion by the above exposure carried out through the mask. In the exposed portion, the acid is produced from the acid generator contained in the resist composition corresponding to the energy of the exposure. Thus, the acid-labile group contained in the resin (AA) or the resin (X) is reacted with the acid to eliminate the protection group, as the results, the resin in the exposed portion of the composition layer becomes soluble in an alkali aqueous solution. On the other hand, in the unexposed portion, the resin (AA) or the resin (X) remains insoluble or poorly soluble in an alkali aqueous solution because of unexposure. In this way, the solubility to the alkali solution will be very different between the resist layer in the exposed portion and the resist layer in the unexposed portion.

After exposure, the composition layer is subjected to a heat treatment (so-called "post-exposure bake") to promote the deprotection reaction. The heating temperature is generally in the range of 50 to 200° C., preferably in the range of 70 to 150° C.

The composition layer is developed after the heat treatment, generally utilizing an alkaline developing solution using a developing apparatus. Here, for the alkaline developing solution, various types of aqueous alkaline solutions used in this field can be satisfactory. Examples include aqueous solutions of tetramethylammonium hydroxide and (2-hydroxyethyl)trimethylammonium hydroxide (common name: choline).

After developing, it is preferable to rinse with ultrapure water and to remove any residual water on the substrate and the pattern.

According to the method for producing resist pattern of the present invention, it is possible to produce a resist pattern with excellent DOF (wide DOF) as well as with defect-free in the pattern.

<Application>

The resist composition of the present invention are useful in the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in the semiconductor microfabrication and in manufacture of liquid crystals, thermal print heads for circuit boards and the like, and furthermore in other photofabrication processes, and they can be suitably used in a wide range of applications.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The structures of the compounds were verified by mass analysis (LC:Agil ent 1100 type, MASS:Agilent LC/MSD type or LC/MSD TOF type).

The weight average molecular weight is a value determined by gel permeation chromatography (Tosoh Co. ltd. HLC-8120GPC type, column: three of TSK gel Multipore HXL-M, solvent: tetrahydrofuran) using polystyrene as the standard product.

Column: TSKgel Multipore HxL-Mx3 connecting+ guardcolumn (Toso Co. ltd.)

Eluant: tetrahydrofuran

Flow rate: 1.0 mL/min

Detecting device: RI detector

Column temperature: 40° C.

Injection amount: 100 μL

Standard material for calculating molecular weight: standard polysthylene (Tosoh Co. ltd.)

Synthetic Example

Synthetic of the Resin

The monomers used the synthesis of the resin are shown below (H)
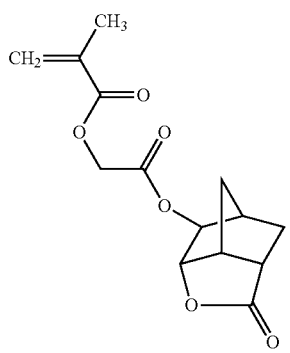

(I)
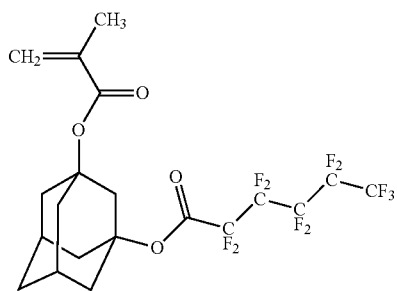

(J)
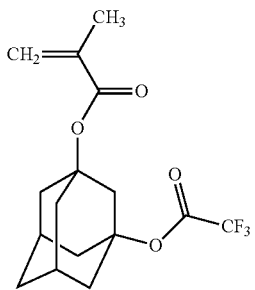

(K)
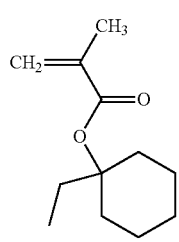

(L)
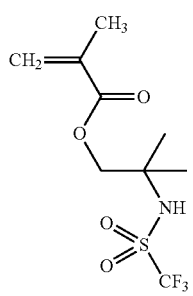

(M)
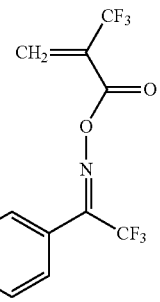

These monomers are referred to as "monomer A" to "monomer M".

Synthetic Example 1

Synthesis of Resin A1

Monomer E, monomer F, monomer G, monomer H and monomer I were mixed with mole ratio 40:10:17:30:3, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 62% yield of copolymer having a weight average molecular weight of about 7900. This copolymer, which had the structural units derived from the monomers of the following formula, was designated Resin A1.

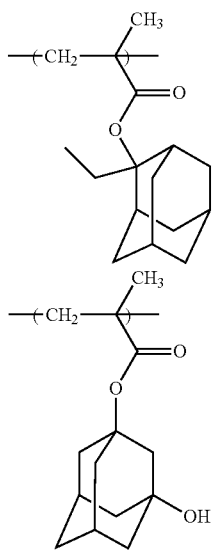

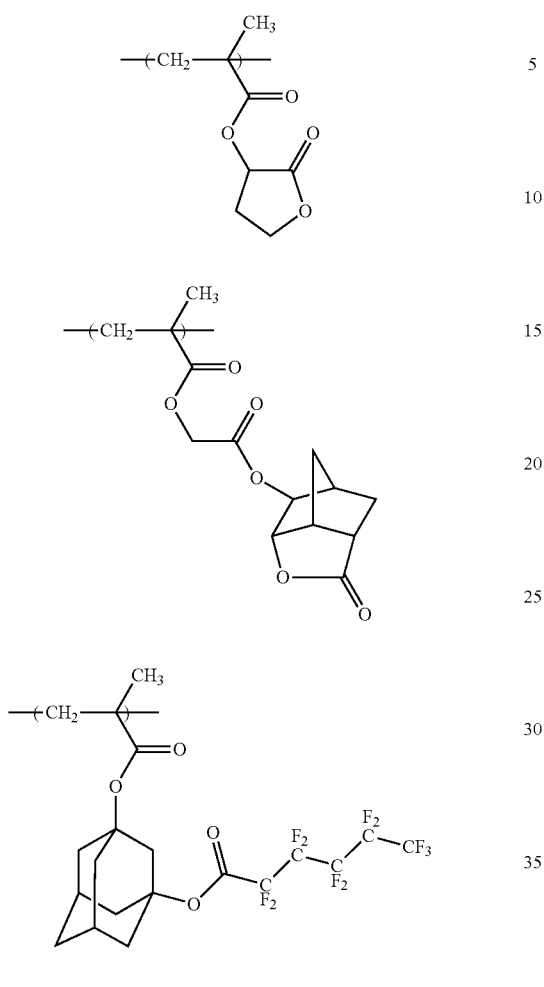

Synthetic Example 2

Synthesis of Resin A2

Monomer E, monomer F, monomer G, monomer H and monomer J were mixed with mole ratio 38:10:17:30:5, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 55% yield of copolymer having a weight average molecular weight of about 8200. This copolymer, which had the structural units derived from the monomers of the following formula, was designated Resin A2.

Synthetic Example 3

Synthesis of Resin A3

Monomer I and monomer L were mixed with mole ratio 30:70, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 0.7 mol % and 2.1 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 58% yield of copolymer having a weight average molecular weight of about 15000. This copolymer, which had the structural units derived from the monomers of the following formula, was designated Resin A3.

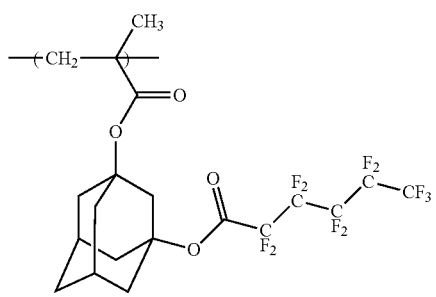

Synthetic Example 4

Synthesis of Resin A4

Monomer I and monomer M were mixed with mole ratio 50:50, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 0.7 mol % and 2.1 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 68% yield of copolymer having a weight average molecular weight of about 17000. This copolymer, which had the structural units derived from the monomers of the following formula, was designated Resin A4.

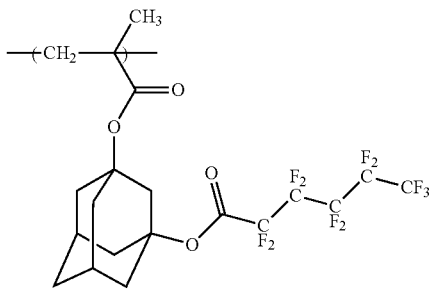

Synthetic Example 5

Synthesis of Resin A5

Monomer E, monomer K, monomer F, monomer H and monomer G were mixed with mole ratio 32:7:8:10:43, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 73° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 78% yield of copolymer having a weight average molecular weight of about 8900. This copolymer, which had the structural units derived from the monomers of the following formula, was designated Resin A5.

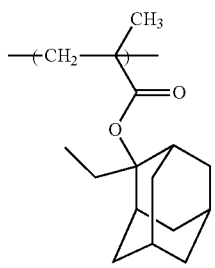

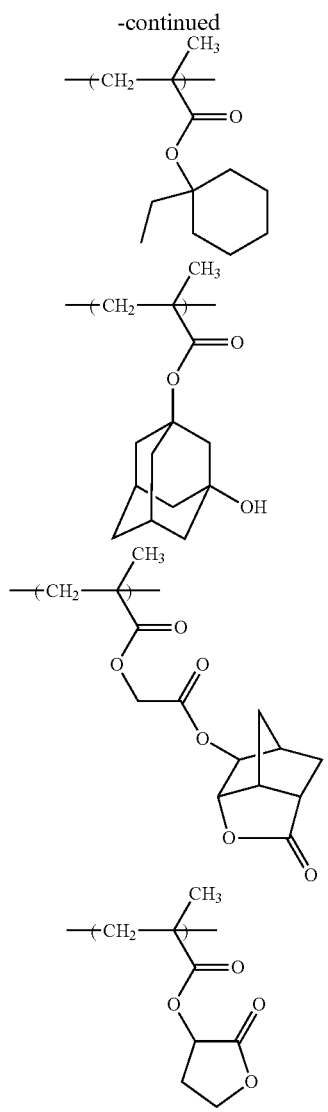

Synthetic Example 6

Synthesis of Resin A6

Monomer A, monomer B and monomer C were mixed with mole ratio 36:34:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1.5 mol % and 4.5 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 48% yield of copolymer having a weight average molecular weight of about 5000. This copolymer, which had the structural units derived from the monomers of the following formula, was designated Resin A6.

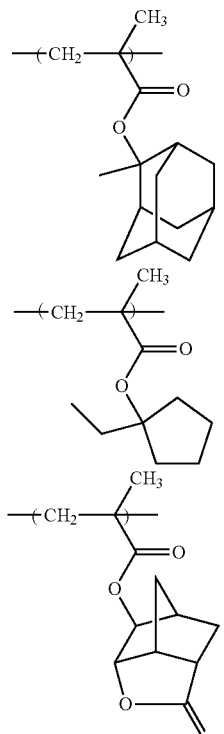

Synthetic Example 7

Synthesis of Resin A7

Monomer B and monomer D were mixed with mole ratio 70:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 58% yield of copolymer having a weight average molecular weight of about 6700. This copolymer, which had the structural units derived from the monomers of the following formula, was designated Resin A7.

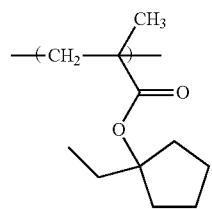

-continued

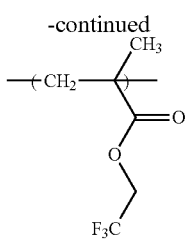

Synthetic Example 8

Synthesis of Resin A8

Monomer J and monomer L were mixed with mole ratio 35:65, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 0.7 mol % and 2.1 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 78% yield of copolymer having a weight average molecular weight of about 12000. This copolymer, which had the structural units derived from the monomers of the following formula, was designated Resin A8.

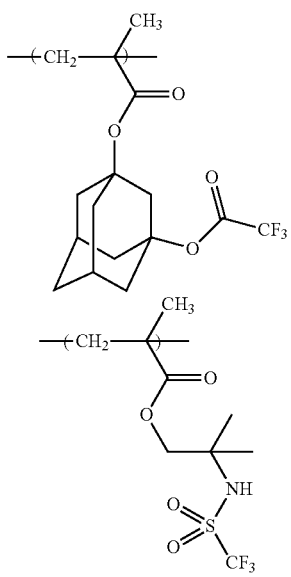

Synthetic Example 9

Synthesis of Resin A9

Monomer J and monomer L were mixed with mole ratio 40:60, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 0.7 mol % and 2.1 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 80% yield of copolymer having a weight average molecular weight of about 12000. This copolymer, which had the structural units derived from the monomers of the following formula, was designated Resin A9.

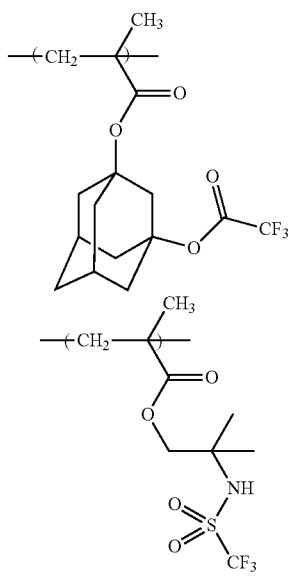

Synthetic Example 10

Synthesis of Resin A10

Monomer J and monomer L were mixed with mole ratio 45:55, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 0.7 mol % and 2.1 mol % respectively with respect to the entire amount of monomers, and the resultant mixture was heated for about 5 hours at 75° C. After that, the obtained reaction mixture was poured into a mixture of methanol and ion-exchanged water in large amounts to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, thereby resulting in 82% yield of copolymer having a weight average molecular weight of about 15000. This copolymer, which had the structural units derived from the monomers of the following formula, was designated Resin A10.

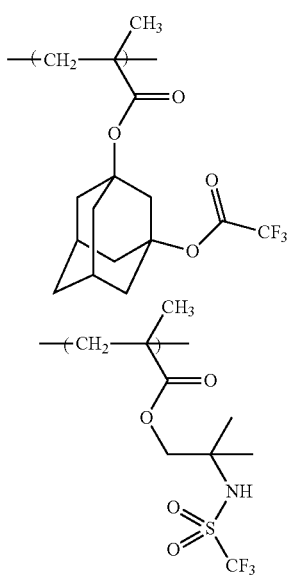

(Preparing Resist Composition)

Resist compositions were prepared by mixing and dissolving each of the components shown in Table 1, and then filtrating through a fluororesin filter having 0.2 μm pore diameter.

TABLE 1

| | Resin (parts) | Acid generator (parts) | Quencher (parts) | PB/PEB (° C./° C.) |
|---|---|---|---|---|
| Ex. 1 | A1 = 10 | B1 = 1.00 | C1 = 0.07 | 110/105 |
| Ex. 2 | A2 = 10 | B1 = 1.00 | C1 = 0.07 | 110/105 |
| Ex. 3 | A3/A5 = 0.2/10 | B1 = 1.00 | C1 = 0.07 | 110/105 |
| Ex. 4 | A4/A5 = 0.2/10 | B1 = 1.00 | C1 = 0.07 | 110/105 |
| Ex. 5 | A3/A6 = 0.2/10 | B1 = 1.00 | C1 = 0.07 | 115/110 |
| Ex. 6 | A3/A5 = 0.5/10 | B1 = 1.00 | C1 = 0.07 | 110/105 |
| Ex. 7 | A3/A5 = 0.7/10 | B1 = 1.00 | C1 = 0.07 | 110/105 |
| Ex. 8 | A8/A5 = 0.2/10 | B1 = 1.00 | C1 = 0.07 | 110/105 |
| Ex. 9 | A8/A5 = 0.5/10 | B1 = 1.00 | C1 = 0.07 | 110/105 |
| Ex. 10 | A8/A5 = 0.7/10 | B1 = 1.00 | C1 = 0.07 | 110/105 |
| Ex. 11 | A9/A5 = 0.7/10 | B1 = 1.00 | C1 = 0.07 | 110/105 |
| Ex. 12 | A10/A5 = 0.7/10 | B1 = 1.00 | C1 = 0.07 | 110/105 |
| Comp. Ex. 1 | A7/A6 = 0.2/10 | B2 = 1.00 | C1 = 0.07 | 115/110 |

<Resin>
A1 to A10: Resin A1 to Resin A10
<Acid Generator>

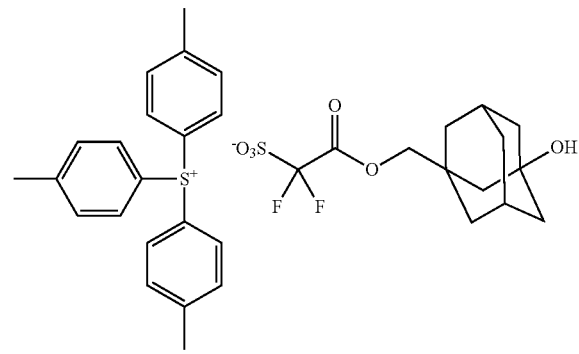

Acid generator B1

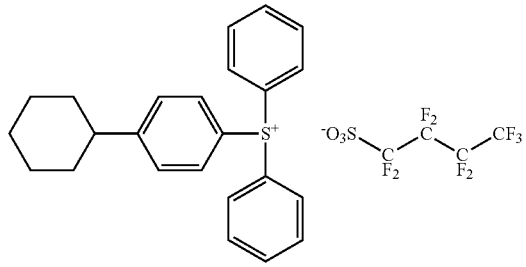

Acid generator B2

<Qencher>
C1: 2,6-diisopropylaniline,
<Solvent>

| Propylene glycol monomethyl ether acetate | 265.0 parts |
| Propylene glycol monomethyl ether | 20.0 parts |
| 2-Heptanone | 20.0 parts |
| γ-butyrolactone | 3.5 parts |

(Producing Resist Pattern 1)

The above resist compositions were applied thereon by spin coating so that the thickness of the resulting film became 150 nm after drying.

The obtained wafers were then pre-baked for 60 seconds on a direct hot plate at the temperatures given in the "PB" column in Table 1 to obtain a composition layer.

Thus obtained wafer which has been produced the composition layer is rinsed with water for 60 seconds using a developing machine (ACT-12, Tokyo electron Co. Ltd.).

Thereafter, number of defects was counted using a defect inspection (KLA-2360, KLA-Tencor Co. Ltd.)

Table 2 gives the there results.
(Producing Resist Pattern 2)

A composition for an organic antireflective film ("ARC-29", by Nissan Chemical Co. Ltd.) was applied onto silicon wafers and baked for 60 seconds at 205° C. to form a 78 nm thick organic antireflective film.

The above resist compositions were then applied thereon by spin coating so that the thickness of the resulting composition layer became 85 nm after drying.

The obtained wafers were then pre-baked for 60 seconds on a direct hot plate at the temperatures given in the "PB" column in Table 1 to form a composition layer.

Contact hole patterns were then exposed through stepwise changes in exposure quantity using an ArF excimer laser stepper for immersion lithography ("XT:1900Gi" by ASML Ltd.: NA=1.35, 3/42 annularX-Y polarization), on the wafers on which the composition layer had thus been formed. The ultrapure water was used for medium of immersion.

After the exposure, post-exposure baking was carried out by 60 seconds at the temperatures given in the "PEB" column in Table 1.

Then, puddle development was carried out with 2.38 wt % tetramethylammonium hydroxide aqueous solution for 60 seconds to obtain a resist pattern.

Effective sensitivity was represented as the exposure amount at which a 55 nm-hole diameter with the each resist pattern produced from the resist composition.

(Focus Margin (DOF) Evaluation)

The focus range within a hole diameter of the resist pattern of 55 nm±5% (57.5 to 52.5 nm) was set for an index (DOF)

when the resist pattern was formed using the mask in the effective sensitivity.

Table 2 gives the there results.

TABLE 2

|   | Defects | DOF |
| --- | --- | --- |
| Ex. 1 | 890 | 0.15 |
| Ex. 2 | 2200 | 0.12 |
| Ex. 3 | 230 | 0.24 |
| Ex. 4 | 350 | 0.18 |
| Ex. 5 | 780 | 0.15 |
| Ex. 6 | 200 | 0.21 |
| Ex. 7 | 140 | 0.18 |
| Ex. 8 | 380 | 0.24 |
| Ex. 9 | 280 | 0.24 |
| Ex. 10 | 200 | 0.24 |
| Ex. 11 | 150 | 0.24 |
| Ex. 12 | 130 | 0.21 |
| Comp. Ex. 1 | 12800 | 0.06 |

The resist pattern using the present resist composition (Examples 1 to 5) could be produced the resist pattern with less defects and it was possible to achieve wide DOF at producing the resist pattern.

Meanwhile, on the Comparative Example 1, there were numerous defects to the obtained resist pattern, and poor DOF at producing the resist pattern.

According to the resist composition of the present invention, it is possible to produce a resist pattern with excellent DOF (wide DOF) at producing the resist pattern, and with defect-free in the pattern.

What is claimed is:

1. A resist composition comprising;
(A) a resin having a structural unit derived from a compound represented by the formula (a) and a structural unit derived from a monomer having a group represented by the formula (3) or (4);
(B) an acid generator represented by the formula (B1), and
(X) a copolymer polymerized from
at least a monomer having an acid-labile group, and
an acid-stable monomer having a hydroxyl group and/or an acid-stable monomer having a lactone ring;

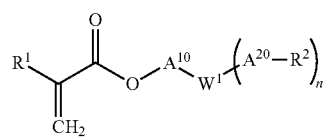

(a)

wherein $R^1$ represents a hydrogen atom or a methyl group;
$A^{10}$ represents a single bond, an optionally substituted $C_1$ to $C_6$ alkanediyl group or a group represented by the formula (a-1);
$W^1$ represents an optionally substituted $C_4$ to $C_{36}$ alicyclic hydrocarbon group selected from a group consisting of cyclopropyl, cyclobutyl, cyclopentyl, cyclohexyl, cycloheptyl, cyclooctyl, cyclononyl, cyclodecyl, norbornyl, 1-adamantyl, 2-adamantly) and isobornyl groups;
n represents 1 or 2;
$A^{20}$ in each occurrence independently represents one of the following groups:

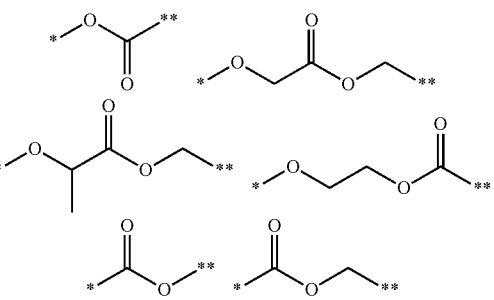

where * represents a bond to $W^1$ and ** represents a bond to $R^2$;
$R^2$ in each occurrence independently represents a $C_1$ to $C_{12}$ perfluoroalkyl group, at least one of the fluorine atom contained in the perfluoroalkyl group may be replaced by a hydroxy group or a hydroxymethyl group;

$$—A^{30}—(X^{10}—A^{31})_s—X^{11}—A^{32}—* \quad (a\text{-}1)$$

wherein s represents an integer of 0 to 3;
$X^{10}$ in each occurrence independently represents an oxygen atom, a carbonyl group, a carbonyloxy group or an oxycarbonyl group;
$X^{11}$ represents an oxygen atom, a carbonyl group, a carbonyloxy group or an oxycarbonyl group;
$A^{31}$ in each occurrence independently represents an optionally substituted $C_1$ to $C_{17}$ aliphatic hydrocarbon group;
$A^{30}$ represents an optionally substituted $C_1$ to $C_{17}$ aliphatic hydrocarbon group;
$A^{32}$ represents a single bond or an optionally substituted $C_1$ to $C_{17}$ aliphatic hydrocarbon group;
* represents a bond to $W^1$; and
provided that a total number of the carbon atom of $A^{30}$, $A^{31}$, $A^{32}$, $X^{10}$ and $X^{11}$ is 1 to 17;

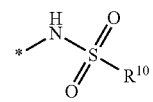

(3)

wherein $R^{10}$ represents a $C_1$ to $C_6$ fluorinated alkyl group;

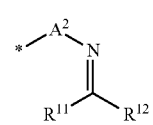

(4)

wherein $R^{11}$ represents an optionally substituted $C_6$ to $C_{12}$ aromatic hydrocarbon group;
$R^{12}$ represents an optionally substituted $C_1$ to $C_{12}$ hydrocarbon group, the hydrocarbon group may contain a hetero atom;
$A^2$ represents a single bond, —$(CH_2)_m$—$SO_2$—O—* or —$(CH_2)_m$—CO—O—*, the —$CH_2$— contained in the [—$(CH_2)_m$—] may be replaced by —O—, —CO— or —$SO_2$-sulfonyl group, a hydrogen atom contained in the [—$(CH_2)_m$] may be replaced by a fluorine atom;

m represents an integer 1 to 12;

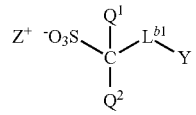
(B1)

wherein $Q^1$ and $Q^2$ independently represent a fluorine atom or a $C_1$ to $C_6$ perfluoroalkyl group;

$L^{b1}$ represents an optionally substituted $C_1$ to $C_{17}$ divalent aliphatic hydrocarbon group, and a —$CH_2$— contained in the aliphatic hydrocarbon group may be replaced by —O— or —CO—;

Y represents an optionally substituted $C_1$ to $C_{18}$ aliphatic hydrocarbon group or an optionally substituted $C_3$ to $C_{18}$ alicyclic hydrocarbon group, and a —$CH_2$— contained in the aliphatic hydrocarbon group and alicyclic hydrocarbon group may be replaced by —O—, —CO— or —$SO_2$—; and $Z^+$ represents an organic cation.

2. The resist composition according to claim 1, wherein the resin (A) is a resin having a structural unit derived from a compound in which $W^1$ is a alicyclic hydrocarbon group containing an adamantane ring or a cyclohexane ring in the formula (a).

3. The resist composition according to claim 1, wherein the acid generator (B) is a salt in which Y is an optionally substituted $C_3$ to $C_{18}$ alicyclic hydrocarbon group in the formula (B1).

4. A method for producing a resist pattern comprising steps of;
(1) applying the resist composition according to claim 1 onto a substrate;
(2) drying the applied composition to form a composition layer;
(3) exposing the composition layer;
(4) heating the exposed composition layer; and
(5) developing the heated composition layer.

* * * * *